US012519033B2

(12) United States Patent
Lee et al.

(10) Patent No.: US 12,519,033 B2

(45) Date of Patent: Jan. 6, 2026

(54) MICRO HEAT PIPE FOR USE IN SEMICONDUCTOR IC CHIP PACKAGE

(71) Applicant: iCometrue Company Ltd., Zhubei (TW)

(72) Inventors: Jin-Yuan Lee, HsinChu (TW); Mou-Shiung Lin, Hsinchu (TW); Ping-Jung Yang, HsinChu (TW)

(73) Assignee: iCometrue Company Ltd., Hsinchu County (TW)

( * ) Notice: Subject to any disclaimer, the term of this patent is extended or adjusted under 35 U.S.C. 154(b) by 850 days.

(21) Appl. No.: 17/571,450

(22) Filed: Jan. 8, 2022

(65) Prior Publication Data

US 2022/0223494 A1 Jul. 14, 2022

Related U.S. Application Data

(60) Provisional application No. 63/135,369, filed on Jan. 8, 2021.

(51) Int. Cl.
*H01L 23/427* (2006.01)
*F28D 15/04* (2006.01)
(Continued)

(52) U.S. Cl.
CPC ............ *H01L 23/427* (2013.01); *F28D 15/04* (2013.01); *H01L 21/4871* (2013.01); *H01L 25/105* (2013.01); *H01L 23/49827* (2013.01); *H01L 2225/1058* (2013.01); *H01L 2225/107* (2013.01); *H01L 2225/1094* (2013.01)

(58) Field of Classification Search
CPC ... H01L 23/427; H01L 21/04; H01L 21/4871; H01L 25/105; H01L 23/49827; H01L 2225/1058; H01L 2225/107; H01L 2225/1094; F28D 15/04
See application file for complete search history.

(56) References Cited

U.S. PATENT DOCUMENTS

| | | | |
|---|---|---|---|
| 4,841,355 | A | 6/1989 | Parks |
| 4,870,302 | A | 9/1989 | Freeman |

(Continued)

FOREIGN PATENT DOCUMENTS

| | | |
|---|---|---|
| CN | 103681367 | 3/2014 |
| CN | 104078453 | 10/2014 |

(Continued)

*Primary Examiner* — Timor Karimy

(57) ABSTRACT

A micro heat transfer component includes a bottom metal plate; a top metal plate; a plurality of sidewalls each having a top end joining the top metal plate and a bottom end joining the bottom metal plate, wherein the top and bottom metal plates and the sidewalls form a chamber in the micro heat transfer component; a plurality of metal posts in the chamber and between the top and bottom metal plates, wherein each of the metal posts has a top end joining the top metal plate and a bottom end joining the bottom metal plate; a metal layer in the chamber, between the top and bottom metal plates and intersecting each of the metal posts, wherein a plurality of openings are in the metal layer, wherein a first space in the chamber is between the metal layer and bottom metal plate and a second space in the chamber is between the metal layer and top metal plate; and a liquid in the first space in the chamber.

28 Claims, 73 Drawing Sheets

(51) Int. Cl.
*H01L 21/48* (2006.01)
*H01L 23/498* (2006.01)
*H01L 25/10* (2006.01)

(56) References Cited

U.S. PATENT DOCUMENTS 5,272,368 A 12/1993 Turner et al.
5,587,603 A 12/1996 Kowshik
5,592,102 A 1/1997 Lane et al.
5,689,195 A 11/1997 Cliff et al.
5,796,662 A 8/1998 Kalter et al.
6,020,633 A 2/2000 Erikson
6,034,542 A 3/2000 Ridgeway
6,167,558 A 12/2000 Trimberger
6,356,478 B1 3/2002 McCollum
6,388,466 B1 5/2002 Wittig et al.
6,404,226 B1 6/2002 Schadt
6,687,167 B2 2/2004 Guaitini et al.
6,798,240 B1 9/2004 Pedersen
6,812,086 B2 11/2004 Murthy et al.
6,828,823 B1 12/2004 Tsui
6,943,580 B2 9/2005 Lewis et al.
6,952,114 B2 10/2005 Turner
6,998,872 B1 2/2006 Chirania et al.
7,030,652 B1 4/2006 Lewis et al.
7,061,271 B1 6/2006 Young et al.
7,126,214 B2 10/2006 Huppenthal et al.
7,190,190 B1 3/2007 Camarota et al.
7,193,433 B1 3/2007 Young
7,219,237 B1 5/2007 Trimberger
7,366,306 B1 4/2008 Trimberger
7,385,417 B1 6/2008 Agrawal et al.
7,420,390 B1 9/2008 Hutton et al.
7,511,299 B1 3/2009 Alexander et al.
7,550,994 B1 6/2009 Camarota
7,579,681 B2 8/2009 Chia et al.
7,598,555 B1 10/2009 Papworth Parkin
7,653,891 B1 1/2010 Anderson et al.
7,747,025 B1 6/2010 Trimberger
7,853,799 B1 12/2010 Trimberger
7,933,140 B2 4/2011 Wang et al.
7,944,231 B2 5/2011 Javerliac
7,948,266 B2 5/2011 Schmit et al.
7,973,556 B1 7/2011 Noguera Serra et al.
7,977,783 B1 7/2011 Park et al.
8,064,224 B2 11/2011 Mahajan et al.
8,081,079 B1 12/2011 Camarota
8,159,268 B1 4/2012 Madurawe
8,243,527 B2 8/2012 Hung et al.
8,354,297 B2 1/2013 Pagaila et al.
8,378,407 B2 2/2013 Audzeyeu et al.
8,531,032 B2 9/2013 Yu et al.
8,546,955 B1 10/2013 Wu
8,592,886 B2 11/2013 Hsu et al.
8,709,865 B2 4/2014 Hu et al.
8,742,579 B2 6/2014 Pagaila et al.
8,786,060 B2 7/2014 Yen et al.
8,796,137 B2 8/2014 Pagaila et al.
8,866,292 B2 10/2014 Beer et al.
8,872,349 B2 10/2014 Chiu et al.
8,878,360 B2 11/2014 Meyer et al.
8,883,561 B2 11/2014 Park et al.
8,885,334 B1 11/2014 Baxter
8,895,440 B2 11/2014 Choi et al.
8,912,822 B2 12/2014 Yasuda
8,916,421 B2 12/2014 Gong et al.
8,941,230 B2 1/2015 Kyozuka et al.
8,952,489 B2 2/2015 Elian et al.
8,952,521 B2 2/2015 Wojnowski et al.
8,987,918 B2 3/2015 Razdan et al.
8,993,377 B2 3/2015 Koo et al.
9,003,221 B1 4/2015 Abugharbieh et al.
9,082,806 B2 7/2015 Lin et al.
9,106,229 B1 8/2015 Hutton
9,135,185 B2 9/2015 Loh et al.
9,147,638 B2 9/2015 Liu et al.
9,224,647 B2 12/2015 Koo et al.
9,225,512 B1 12/2015 Trimberger
9,252,127 B1 2/2016 Shen et al.
9,263,370 B2 2/2016 Shenoy et al.
9,281,254 B2 3/2016 Yu et al.
9,281,292 B2 3/2016 Hu et al.
9,324,672 B2 4/2016 Pagaila et al.
9,331,060 B2 5/2016 Otremba et al.
9,343,442 B2 5/2016 Chen et al.
9,349,703 B2 5/2016 Chiu et al.
9,349,713 B2 5/2016 Kim et al.
9,362,187 B2 6/2016 Ossimitz
9,368,458 B2 6/2016 Wu et al.
9,385,006 B2 7/2016 Lin
9,385,009 B2 7/2016 Lin et al.
9,385,105 B2 7/2016 Meyer et al.
9,396,998 B2 7/2016 Kurita et al.
9,397,050 B2 7/2016 Shin et al.
9,406,619 B2 8/2016 Pagaila et al.
9,406,658 B2 8/2016 Lee et al.
9,437,260 B2 9/2016 Prenat et al.
9,449,930 B2 9/2016 Kim et al.
9,455,218 B2 9/2016 Ooi et al.
9,508,626 B2 11/2016 Pagaila et al.
9,524,955 B2 12/2016 Huang et al.
9,543,276 B2 1/2017 Jee et al.
9,583,431 B1 2/2017 Rahman
9,593,009 B2 3/2017 Fuergut et al.
9,601,471 B2 3/2017 Zhai et al.
9,607,967 B1 3/2017 Shih
9,627,365 B1 4/2017 Yu et al.
9,640,259 B2 5/2017 Li et al.
9,679,863 B2 6/2017 Lin et al.
9,704,843 B2 7/2017 Kilger et al.
9,722,584 B1 8/2017 Chang et al.
9,735,113 B2 8/2017 Chi et al.
9,763,329 B1 9/2017 Mason
9,768,145 B2 9/2017 Yu et al.
9,773,757 B2 9/2017 Yu et al.
9,806,058 B2 10/2017 Wei et al.
9,812,337 B2 11/2017 Chen et al.
9,818,720 B2 11/2017 Wei et al.
9,831,148 B2 11/2017 Yu et al.
9,859,896 B1 1/2018 Gaide et al.
9,881,850 B2 1/2018 Yu et al.
9,887,206 B2 2/2018 Su et al.
9,893,732 B1 2/2018 Lewis
9,899,248 B2 2/2018 Yu et al.
9,899,355 B2 2/2018 Yuan et al.
9,935,113 B2 4/2018 Wu et al.
9,966,325 B2 5/2018 Beyne
9,985,006 B2 5/2018 Jeng et al.
9,997,464 B2 6/2018 Hsieh et al.
10,015,916 B1 7/2018 Karp
10,026,681 B2 7/2018 Ko et al.
10,033,383 B1 7/2018 Richter et al.
10,037,963 B2 7/2018 Chen et al.
10,038,647 B1 7/2018 Lesea
10,043,768 B2 8/2018 Meyer et al.
10,056,351 B2 8/2018 Yu et al.
10,056,907 B1 8/2018 Asnaashari
10,062,648 B2 8/2018 Hsieh et al.
10,062,651 B2 8/2018 Liang et al.
10,079,243 B2 9/2018 Ramkumar
10,109,559 B2 10/2018 Lin et al.
10,109,588 B2 10/2018 Jeong et al.
10,109,617 B2 10/2018 Lee et al.
10,153,222 B2 12/2018 Yu et al.
10,153,239 B2 12/2018 Wang et al.
10,157,828 B2 12/2018 Hsu et al.
10,157,849 B2 12/2018 Huang et al.
10,162,139 B1 12/2018 Wang et al.
10,163,798 B1 12/2018 Alur et al.
10,163,802 B2 12/2018 Lin et al.
10,177,188 B2 1/2019 Kang et al.
10,204,684 B2 2/2019 Widjaja
10,211,070 B2 2/2019 Lee et al.
10,211,182 B2 2/2019 Meyer et al.

(56) References Cited

U.S. PATENT DOCUMENTS 10,256,219 B2 4/2019 Chew
10,262,974 B2 4/2019 Yeh et al.
10,276,382 B2 4/2019 Hunt et al.
10,290,611 B2 5/2019 Yu et al.
10,325,882 B2 6/2019 Kang et al.
10,333,623 B1 6/2019 Liao et al.
10,340,249 B1 7/2019 Yu et al.
10,347,606 B2 7/2019 Yu et al.
10,373,885 B2 8/2019 Yu et al.
10,419,001 B2 9/2019 Jo et al.
10,431,536 B2 10/2019 Kim et al.
10,447,274 B2 10/2019 Lee et al.
10,476,505 B2 11/2019 Ngai
10,490,521 B2 11/2019 Hu et al.
10,490,540 B2 11/2019 Yu et al.
10,504,835 B1 12/2019 Wang et al.
10,510,634 B2 12/2019 Lin et al.
10,510,650 B2 12/2019 Yu et al.
10,510,721 B2 12/2019 Bhagavat et al.
10,522,449 B2 12/2019 Chen et al.
10,529,666 B2 1/2020 Yu et al.
10,535,638 B2 1/2020 Yeh et al.
10,541,227 B2 1/2020 Yeh et al.
10,541,228 B2 1/2020 Chen et al.
10,622,321 B2 4/2020 Yu et al.
10,741,537 B2 8/2020 Lu et al.
10,784,248 B2 9/2020 Yu et al.
10,797,031 B2 10/2020 Liao et al.
10,867,965 B2 12/2020 Shih et al.
10,867,978 B2 12/2020 Bhagavat et al.
10,892,011 B2 1/2021 Lin et al.
10,892,291 B2 1/2021 Chhun et al.
10,943,869 B2 3/2021 Zhai et al.
11,056,463 B2 7/2021 Takahashi et al.
11,114,408 B2 9/2021 Shen et al.
11,211,334 B2 12/2021 Lin et al.
11,217,368 B2 1/2022 Choa et al.
11,276,661 B2 3/2022 Fang
11,545,438 B2 1/2023 Hsieh et al.
11,587,894 B2 2/2023 Chen et al.
11,728,254 B2 8/2023 Hou et al.
2001/0045844 A1 11/2001 New et al.
2001/0051426 A1 12/2001 Pozder et al.
2002/0092307 A1 7/2002 Ghoshal
2003/0122578 A1 7/2003 Masui et al.
2004/0041584 A1 3/2004 Sunaga et al.
2004/0057677 A1* 3/2004 Jacobowitz .............. G02B 6/43
385/89
2004/0145850 A1 7/2004 Fukumoto et al.
2004/0222817 A1 11/2004 Madurawe
2005/0046002 A1 3/2005 Lee et al.
2005/0185457 A1 8/2005 Kim et al.
2005/0218929 A1 10/2005 Wang et al.
2006/0138509 A1 6/2006 Lee et al.
2007/0037379 A1 2/2007 Enquist et al.
2007/0164279 A1 7/2007 Lin et al.
2007/0166912 A1 7/2007 Fenigstein et al.
2007/0279987 A1 12/2007 Fang et al.
2009/0114971 A1 5/2009 Cai et al.
2009/0243650 A1 10/2009 Madurawe
2009/0243652 A1 10/2009 Dorairaj et al.
2009/0267238 A1 10/2009 Joseph
2010/0039136 A1 2/2010 Chua-Eoan et al.
2010/0133704 A1* 6/2010 Marimuthu ......... H01L 23/3128
257/E23.116
2010/0157669 A1 6/2010 Audzeyeu
2010/0283085 A1 11/2010 Bemanian
2010/0290191 A1* 11/2010 Lin ........................ H01L 24/82
361/764
2011/0026232 A1 2/2011 Lin et al.
2011/0221470 A1 9/2011 Javerliac et al.
2012/0193785 A1 8/2012 Lin et al.
2012/0217549 A1 8/2012 Widjaja
2013/0082399 A1 4/2013 Kim et al.
2013/0257477 A1 10/2013 Yasuda et al.
2013/0285253 A1 10/2013 Aoki et al.
2014/0017882 A1 1/2014 Lei
2014/0070380 A1 3/2014 Chiu et al.
2014/0070403 A1 3/2014 Pan et al.
2014/0131858 A1 5/2014 Pan et al.
2014/0183730 A1 7/2014 Hisano et al.
2014/0183731 A1 7/2014 Lin et al.
2014/0185264 A1 7/2014 Chen et al.
2014/0203412 A1 7/2014 Wang et al.
2014/0210097 A1 7/2014 Chen
2014/0254232 A1 9/2014 Wu
2014/0302659 A1 10/2014 Phatak
2014/0339692 A1 11/2014 Kim et al.
2015/0008957 A1 1/2015 Olgiati et al.
2015/0014844 A1 1/2015 Wu et al.
2015/0085560 A1 3/2015 Candelier et al.
2015/0116965 A1 4/2015 Kim et al.
2015/0227662 A1 8/2015 Lepercq
2015/0287672 A1 10/2015 Yazdani
2015/0327367 A1 11/2015 Shen
2016/0079205 A1 3/2016 Lin et al.
2016/0093572 A1 3/2016 Chen
2016/0118390 A1 4/2016 Liaw
2016/0133571 A1 5/2016 Lee et al.
2016/0141228 A1 5/2016 Leobandung
2016/0173101 A1 6/2016 Gao et al.
2016/0190113 A1 6/2016 Sharan et al.
2016/0217835 A1 7/2016 Blott et al.
2016/0351626 A1 12/2016 McCollum
2016/0372449 A1 12/2016 Rusu et al.
2017/0071552 A1 3/2017 Harpe et al.
2017/0117263 A1 4/2017 Yeh et al.
2017/0271248 A1 9/2017 Che et al.
2017/0301650 A1 10/2017 Yu
2017/0358557 A1 12/2017 Chen et al.
2018/0053730 A1 2/2018 Shao
2018/0061742 A1 3/2018 Ananiev
2018/0068937 A1 3/2018 Marimuthu et al.
2018/0076179 A1 3/2018 Hsu et al.
2018/0102776 A1 4/2018 Chandrasekar et al.
2018/0138101 A1 5/2018 Yu et al.
2018/0150667 A1 5/2018 Yu et al.
2018/0151477 A1 5/2018 Yu et al.
2018/0151501 A1 5/2018 Yu et al.
2018/0158746 A1 6/2018 Lin
2018/0165396 A1 6/2018 Lin et al.
2018/0174865 A1 6/2018 Yu et al.
2018/0204810 A1 7/2018 Yu et al.
2018/0204828 A1 7/2018 Yu et al.
2018/0210799 A1 7/2018 Gao
2018/0226349 A1 8/2018 Yu et al.
2018/0226371 A1 8/2018 Enquist
2018/0247905 A1 8/2018 Yu et al.
2018/0269188 A1 9/2018 Yu et al.
2018/0275193 A1 9/2018 Rouge et al.
2018/0284186 A1 10/2018 Chadha
2018/0286776 A1 10/2018 Yu et al.
2018/0301351 A1 10/2018 Yu et al.
2018/0301376 A1 10/2018 Shih et al.
2018/0350629 A1 12/2018 Liu et al.
2018/0350763 A1 12/2018 Yu et al.
2018/0358312 A1 12/2018 Yu et al.
2018/0374824 A1 12/2018 Yu et al.
2019/0013276 A1 1/2019 Lee et al.
2019/0019756 A1 1/2019 Yu et al.
2019/0020343 A1 1/2019 Lin et al.
2019/0051641 A1 2/2019 Lin et al.
2019/0057931 A1 2/2019 Hsu et al.
2019/0057932 A1 2/2019 Wu et al.
2019/0067152 A1 2/2019 Wuu et al.
2019/0097304 A1 3/2019 Hsiao et al.
2019/0129817 A1 5/2019 Zhuo
2019/0164834 A1 5/2019 Or-Bach et al.
2019/0221547 A1 7/2019 Drab et al.
2019/0238134 A1 8/2019 Lin et al.
2019/0238135 A1 8/2019 Lin et al.
2019/0245543 A1 8/2019 Lin et al.
2019/0253056 A1 8/2019 Lin et al.
2019/0304803 A1 10/2019 Hu et al.

(56) References Cited

U.S. PATENT DOCUMENTS

| | | | |
|---|---|---|---|
| 2019/0333871 | A1 | 10/2019 | Chen et al. |
| 2019/0347790 | A1 | 11/2019 | Lin et al. |
| 2019/0363715 | A1 | 11/2019 | Lin et al. |
| 2019/0371763 | A1 | 12/2019 | Agarwal et al. |
| 2019/0372574 | A1 | 12/2019 | Lin et al. |
| 2019/0393153 | A1 | 12/2019 | Yu et al. |
| 2020/0006274 | A1 | 1/2020 | Chiang et al. |
| 2020/0043853 | A1* | 2/2020 | Kim .................... H01L 21/6835 |
| 2020/0058617 | A1 | 2/2020 | Wu et al. |
| 2020/0058626 | A1 | 2/2020 | Tai et al. |
| 2020/0082885 | A1 | 3/2020 | Lin et al. |
| 2020/0111734 | A1 | 4/2020 | Lin et al. |
| 2020/0144224 | A1 | 5/2020 | Lin et al. |
| 2020/0161242 | A1 | 5/2020 | Lin et al. |
| 2020/0211922 | A1 | 7/2020 | Yu et al. |
| 2020/0243422 | A1 | 7/2020 | Kim et al. |
| 2020/0273775 | A1 | 8/2020 | Karhade et al. |
| 2020/0294923 | A1 | 9/2020 | Bhagavat et al. |
| 2020/0373215 | A1 | 11/2020 | Wu et al. |
| 2020/0395350 | A1 | 12/2020 | Wu et al. |
| 2020/0411443 | A1 | 12/2020 | Guo et al. |
| 2021/0005592 | A1 | 1/2021 | Lin et al. |
| 2021/0043557 | A1 | 2/2021 | Lin et al. |
| 2021/0050300 | A1 | 2/2021 | Lin et al. |
| 2021/0090983 | A1 | 3/2021 | Lin et al. |
| 2021/0159180 | A1 | 5/2021 | Zhai et al. |
| 2021/0217702 | A1 | 7/2021 | Dabral et al. |
| 2021/0232744 | A1 | 7/2021 | Lin et al. |
| 2022/0013504 | A1 | 1/2022 | Dabral et al. |
| 2022/0020729 | A1 | 1/2022 | Gao et al. |
| 2023/0014913 | A1 | 1/2023 | Chen et al. |
| 2023/0161120 | A1 | 5/2023 | Yu et al. |
| 2023/0352439 | A1 | 11/2023 | Chen et al. |
| 2023/0352471 | A1 | 11/2023 | Yu et al. |
| 2023/0387038 | A1 | 11/2023 | Hsieh et al. |
| 2024/0014111 | A1 | 1/2024 | Han et al. |

FOREIGN PATENT DOCUMENTS

| | | |
|---|---|---|
| CN | 104282650 | 1/2015 |
| CN | 105745752 | 7/2016 |
| CN | 104064556 | 4/2019 |
| TW | 200623398 | 7/2006 |
| TW | 200625573 | 7/2006 |
| TW | 201413842 | 4/2014 |
| WO | WO00/36748 | 6/2000 |
| WO | WO2005010976 | 2/2005 |
| WO | WO2016160063 | 10/2016 |
| WO | WO2018004092 | 1/2018 |

* cited by examiner

7201

MICRO HEAT PIPE FOR USE IN SEMICONDUCTOR IC CHIP PACKAGE

PRIORITY CLAIM

This application claims priority benefits from U.S. provisional application No. 63/135,369, filed on Jan. 8, 2021 and entitled "MICRO HEAT PIPE FOR USE IN SEMICONDUCTOR IC CHIP PACKAGE".

BACKGROUND OF THE DISCLOSURE

Field of the Disclosure

The present invention relates to a micro heat transfer component for use in the chip package. The micro heat transfer component may be also named as a micro heat pipe, micro heat transfer pipe, micro heat conduction pipe, micro heat conduction component, or micro thermal conduction component.

Brief Description of the Related Art

When the size and dimension of advanced chip package, in 2D planar or 3D stacking packages, is scaled down to ever smaller area and volume, removing heat generated from IC chips becomes an issue. The conventional heat spreaders and heat sinks may not be suitable for the miniaturized chip packages due to their lager dimension or size and insufficient heat transfer efficiency. A miniaturized micro heat transfer component is required for the scaled-down miniaturized chip package.

SUMMARY OF THE DISCLOSURE

One aspect of the disclosure provides a micro heat transfer component for use in a chip package, either single chip package or multichip package, wherein the multichip package may be in 2D planar or 3D stacking packages. The micro heat transfer components are fabricated by planar processes formed layer-by-layer on a panel or wafer substrate. The planar processes are similar to those used in the semiconductor IC wafer fabrication or the printed circuit board (PCB) panel fabrication; comprising metal electroplating, layer laminating, photolithography patterning, solder bonding process, and/or metal-to-metal direct (thermal and pressure) bonding. The micro heat transfer components are formed on a panel or wafer substrate, and then sawed, diced or separated to become a single micro heat transfer component.

Another aspect of the disclosure provides a micro heat transfer component having a top metal plate, a bottom metal plate and metal sidewalls to form, enclose and seal a chamber or cavity. The air in the chamber or cavity is exhausted to nearly vacuum, and a small amount of liquid (for example water, methanol, or ethanol) is enclosed and sealed in the chamber or cavity. A first (or lower) space of the chamber or cavity comprises the liquid, and is configured to contain the liquid in the first space and for the liquid to flow and spread fast from a liquid-rich region to a liquid-scarce region. A second (or upper) space of the chamber or cavity comprises a vapor of the liquid. The vapor moves from a high pressure (hot) region to a low pressure (cool) region in the second space, therefore, removing the heat from the heat generating source to the cool region. The liquid in the hot region of the first space is vaporized to become the vapor, therefore the hot region of the first space becomes liquid-scarce, and the liquid flows (based on the capillary mechanism) into the hot (liquid-scarce) region from the cold (liquid-rich) region of the first space. A complete heat removing cycle is established as follows: (i) the heat generating source (for example, generated by the IC chip in the chip package) vaporizes the liquid in the hot region of the first space to become the vapor in the hot region of the second space, (ii) the vapor in the hot (high pressure) region of the second space moves to the cool (low pressure) region of the second space by the heat convection mechanism, (iii) the heat in the cool region is dissipated or spread to an external environment, (iv) the vapor in the cool (low pressure) region of the second space is cooled down and condensed to become the liquid in cool (liquid-rich) region of the first space, (v) the liquid in the cool (liquid-rich) region of the first space flows to the hot (liquid-scarce) region of the first space. The total gas pressure in the chamber is mainly due to the partial pressure of the vapor of the liquid. For example, the partial pressure of the vapor of the liquid is greater than 99% or 95% of the total gas pressure in the chamber. The total gas pressure in the chamber is lower than 5 KPa or 20 KPa at 25 degrees Celsius.

Another aspect of the disclosure provides varieties of miniaturized chip packages using the micro heat transfer component. The dimension, size, area and volume of the varieties of the chip packages continues scaling down. The micro heat transfer component is suitable for miniaturized chip packages. The varieties of miniaturized chip packages comprise single chip packages or multichip packages, wherein the multichip packages comprise 2D horizontal planar multichip packages or 3D vertical stacking multichip packages. The micro heat transfer component may be at the bottom and/or top of the chip packages. The micro heat transfer component may be embedded in the chip packages, for example, located between two IC chips, in a vertical direction, in a vertical stacking multichip package.

Another aspect of the disclosure provides the micro heat transfer component for use in an electronic device or component requiring a small size and weight, for example, for use as or in a portable device. The electronic device or component may comprise IC chip packages and passive devices assembled on a printed circuit board (PCB). For example, one or a plurality of IC chip packages (for example, the Ball-Grid Array (BGA) packages) and/or one or a plurality of passive devices are assembled on the PCB using Surface-Mounted Technology (SMT). A piece of the micro heat transfer component is attached to the backside of the one or the plurality of IC chip packages, which generates heat and becomes a hot region on or over the PCB board. The piece of the micro heat transfer component extends from the hot region to the other regions of the PCB board, and may be over or covering other components on the PCB board. The piece of the micro heat transfer component spreads or transfers heat from the hot region to the other regions of the PCB board or even extending beyond the edge of the PCB board.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIGS. 9A-1 and 9D-1 are schematically top views showing steps illustrated in FIGS. 9A and 9D for a process for fabricating a first type of skeleton for a first type of micro heat pipe in accordance with an embodiment of the present application, wherein FIG. 9A is a schematically cross-sectional view cut along a cross-sectional line B-B in FIG. 9A-1 and FIG. 9D is a schematically cross-sectional view cut along a cross-sectional line C-C in FIG. 9D-1.

FIGS. 10A-1, 10B-1 and 10E-1 are schematically top views showing steps illustrated in FIGS. 10A, 10B and 10E for a process for fabricating a second type of skeleton for a first type of micro heat pipe in accordance with an embodiment of the present application, wherein FIG. 10A is a schematically cross-sectional view cut along a cross-sectional line D-D in FIG. 10A-1, FIG. 10B is a schematically cross-sectional view cut along a cross-sectional line E-E in FIG. 10B-1 and FIG. 10E is a schematically cross-sectional view cut along a cross-sectional line F-F in FIG. 10E-1.

FIGS. 12A-1 and 12C-1 are schematically top views showing steps illustrated in FIGS. 12A and 12C for a process for fabricating a fourth type of skeleton for a first type of micro heat pipe in accordance with an embodiment of the present application, wherein FIG. 12A is a schematically cross-sectional view cut along a cross-sectional line G-G in FIG. 12A-1 and FIG. 12C is a schematically cross-sectional view cut along a cross-sectional line H-H in FIG. 12C-1.

FIG. 13C-1 is a schematically top view showing the step illustrated in FIG. 13C for a process for fabricating a fifth type of skeleton for a first type of micro heat pipe in accordance with an embodiment of the present application, wherein FIG. 13C is a schematically cross-sectional view cut along a cross-sectional line I-I in FIG. 13C-1.

FIG. 14C-1 is a schematically top view showing the step illustrated in FIG. 14C for a process for fabricating a sixth type of skeleton for a first type of micro heat pipe in accordance with an embodiment of the present application, wherein FIG. 14C is a schematically cross-sectional view cut along a cross-sectional line N-N in FIG. 14C-1.

FIG. 15B-1 is a schematically top view showing the step illustrated in FIG. 15B for a process for fabricating an eighth type of skeleton for a first type of micro heat pipe in accordance with an embodiment of the present application, wherein FIG. 15B is a schematically cross-sectional view cut along a cross-sectional line J-J in FIG. 15B-1.

FIG. 17B-1 is a schematically top view showing steps illustrated in FIG. 17B for a process for fabricating a first type of micro heat pipe for a second alternative in accordance with an embodiment of the present application, wherein FIG. 17B is a schematically cross-sectional view cut along a cross-sectional line K-K in FIG. 17B-1.

FIG. 19B-1 is a schematically top view showing steps illustrated in FIG. 19B for a process for fabricating a first type of micro heat pipe for a fourth alternative in accordance with an embodiment of the present application, wherein FIG. 19B is a schematically cross-sectional view cut along a cross-sectional line L-L in FIG. 19B-1.

FIG. 21D-1 is a schematically top view showing steps illustrated in FIG. 21D for a process for fabricating a first type of micro heat pipe for a sixth alternative in accordance with an embodiment of the present application, wherein FIG. 21D is a schematically cross-sectional view cut along a cross-sectional line M-M in FIG. 21D-1.

FIG. 23B-1 is a schematically top view showing steps illustrated in FIG. 23B for a process for fabricating a first type of micro heat pipe for an eighth alternative in accordance with an embodiment of the present application, wherein FIG. 23B is a schematically cross-sectional view cut along a cross-sectional line O-O in FIG. 23B-1.

FIGS. 32A-32F are schematically cross-sectional views showing a process for fabricating a second type of micro heat pipe for first through seventh alternatives in accordance with an embodiment of the present application, wherein FIG. 32E is a schematically cross-sectional view cut along a cross-sectional line P-P in each of FIGS. 25-31 for the first example and FIG. 32F is a schematically cross-sectional view cut along a cross-sectional line Q-Q in each of FIGS. 25-30 for the first example.

FIGS. 33A-33D, 32E and 32F are schematically cross-sectional views showing a process for fabricating a second type of micro heat pipe for first through seventh alternatives in accordance with an embodiment of the present application, wherein FIGS. 25-31 are schematically top views showing steps illustrated in FIG. 32E for a second example, wherein FIG. 32E is a schematically cross-sectional view cut along a cross-sectional line P-P in each of FIGS. 25-31 for the second example and FIG. 32F is a schematically cross-sectional view cut along a cross-sectional line Q-Q in each of FIGS. 25-30 for the second example.

FIG. 33B-1 is a schematically top view showing steps illustrated in FIG. 33B for a process for fabricating a second type of micro heat pipe for the second alternative as seen in FIG. 26 in accordance with an embodiment of the present application, wherein FIG. 33B is a schematically cross-sectional view cut along a cross-sectional line R-R in FIG. 33B-1.

FIG. 33D-1 is a schematically top view showing steps illustrated in FIG. 33D for a process for fabricating a second type of micro heat pipe for the second alternative as seen in FIG. 26 in accordance with an embodiment of the present application, wherein FIG. 33D is a schematically cross-sectional view cut along a cross-sectional line S-S in FIG. 33D-1.

FIG. 45B is a schematically cross-sectional view showing an electronic assembly for a chip package and micro heat pipe in accordance with an embodiment of present application, wherein FIG. 45B is a schematically cross-sectional view cut along a cross-sectional line T-T in FIG. 45A.

Figure 1:
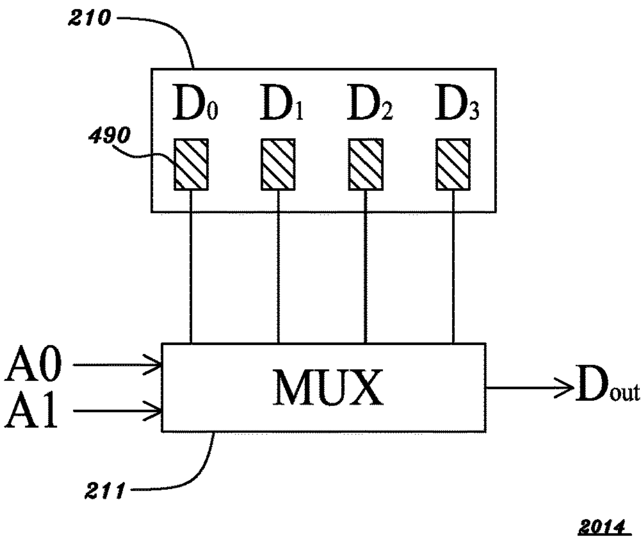
FIG. 1 is a schematic view showing a block diagram of a programmable logic cell in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification for Programmable Logic Blocks

FIG. 1 is a schematic view showing a block diagram of a programmable logic cell in accordance with an embodiment of the present application. Referring to FIG. 1, a programmable logic block (LB) or element may include one or a plurality of programmable logic cells (LC) 2014 each configured to perform logic operation on its input data set at its input points. Each of the programmable logic cells (LC) 2014 may include multiple memory cells 490, i.e., configuration-programming-memory (CPM) cells, each configured to save or store one of resulting values of a look-up table (LUT) 210 and a selection circuit 211, such as multiplexer (MUXER), having a first set of two input points arranged in parallel for a first input data set, e.g., A0 and A1, and a second set of four input points arranged in parallel for a second input data set, e.g., D0, D1, D2 and D3, each associated with one of the resulting values or programming codes of the look-up table (LUT) 210. The selection circuit 211 is configured to select, in accordance with its first input data set associated with the input data set of said each of the programmable logic cells (LC) 2014, a data input, e.g., D0, D1, D2 or D3, from its second input data set as a data output Dout at its output point acting as a data output of said each of the programmable logic cells (LC) 2014 at an output point of said each of the programmable logic cells (LC) 2014.

Referring to FIG. 1, the selection circuit 211 may have the second input data set, e.g., D0, D1, D2 and D3, each associated with a data output, i.e., configuration-programming-memory (CPM) data, of one of the memory cells 490, i.e., configuration-programming-memory (CPM) cells. For each of the programmable logic cells (LC) 2014, each of the resulting values or programing codes of its look-up table (LUT) 210 stored in one of its memory cells 490 that may be of a first type, i.e., volatile memory cell such as static random-access memory (SRAM) cell, may be associated with data saved or stored in a non-volatile memory cell, such as ferroelectric random-access-memory (FRAM) cell, magnetoresistive random access memory (MRAM) cell, resistive random access memory (RRAM) cell, anti-fuse or e-fuse. Alternatively, for each of the programmable logic cells (LC) 2014, each of its memory cells 490 may be of a second type, i.e., non-volatile memory cell composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor.

Referring to FIG. 1, each of the programmable logic cells (LC) 2014 may have the memory cells 490, i.e., configuration-programming-memory (CPM) cells, configured to be programed to store or save the resulting values or programing codes of the look-up table (LUT) 210 to perform the logic operation, such as AND operation, NAND operation, OR operation, NOR operation, EXOR operation or other Boolean operation, or an operation combining two or more of the above operations. For this case, each of the programmable logic cells (LC) 2014 may perform the logic operation on its input data set, e.g., A0 and A1, at its input points as a data output Dout at its output point. For more elaboration, each of the programmable logic cells (LC) 2014 may include the number $2^n$ of memory cells 490, i.e., configuration-programming-memory (CPM) cells, each configured to save or store one of resulting values of the look-up table (LUT) 210 and the selection circuit 211 having a first set of the number n of input points arranged in parallel for a first input data set, e.g., A0-A1, and a second set of the number $2^n$ of input points arranged in parallel for a second input data set, e.g., D0-D3, each associated with one of the resulting values or programming codes of the look-up table (LUT) 210, wherein the number n may range from 2 to 8, such as 2 for this case. The selection circuit 211 is configured to select, in accordance with its first input data set associated with the input data set of said each of the programmable logic cells (LC) 2014, a data input, e.g., one of D0-D3, from its second input data set as a data output Dout at its output point acting as a data output of said each of the programmable logic cells (LC) 2014 at an output point of said each of the programmable logic cells (LC) 2014.

Specification for Programmable or Configurable Switch Cell

Figure 2:
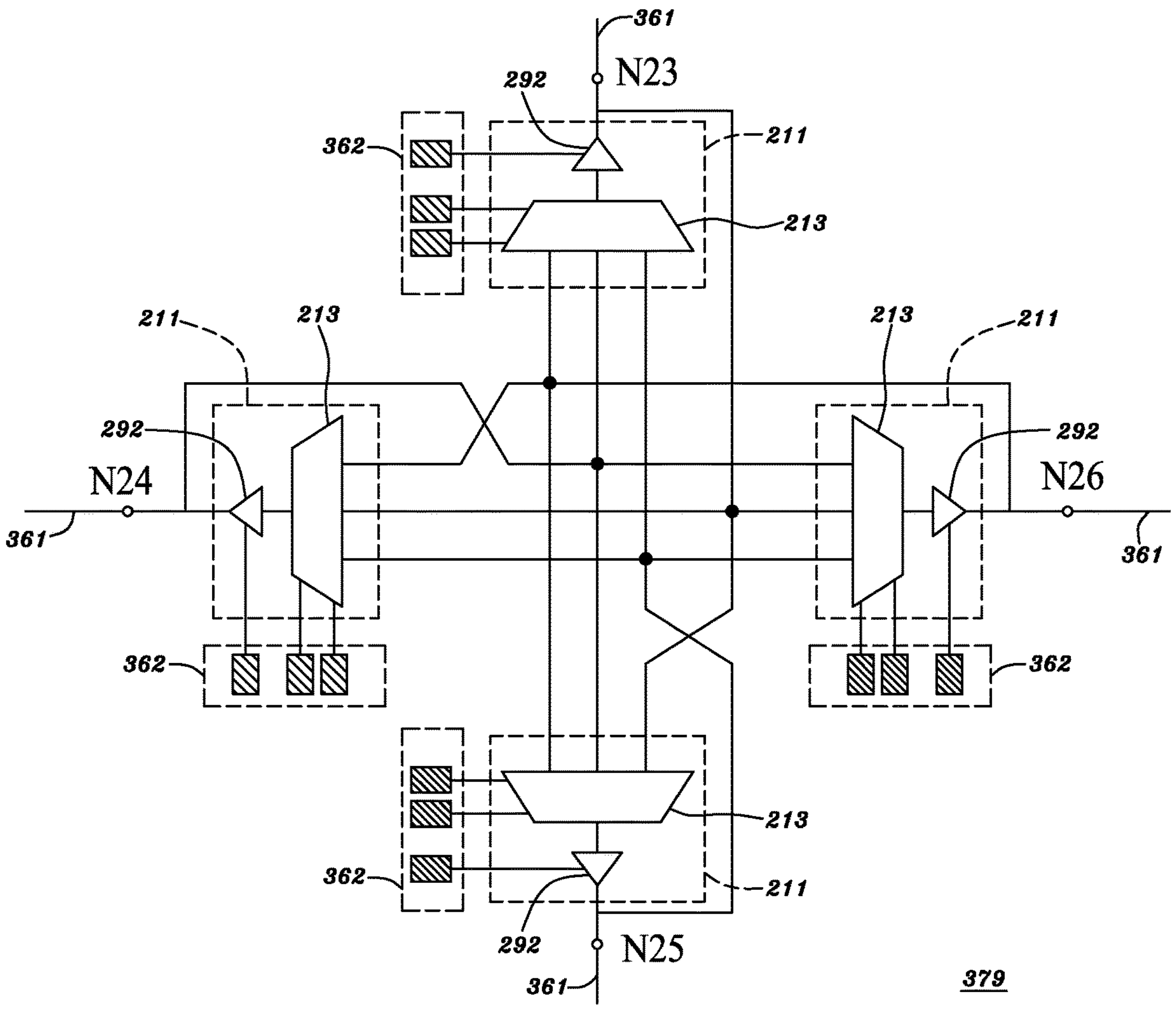
FIG. 2 is a circuit diagram illustrating programmable interconnects controlled by a programmable switch cell in accordance with an embodiment of the present application.

FIG. 2 is a circuit diagram illustrating programmable interconnects controlled by a programmable switch cell in accordance with an embodiment of the present application. Referring to FIG. 2, a cross-point switch may be provided for a programmable switch cell 379, i.e., configurable switch cell, including four selection circuits 211 at its top, bottom, left and right sides respectively, each having a multiplexer 213 and a pass/no-pass switch or switch buffer 292 coupling to the multiplexer 213 thereof, and four sets of memory cells 362 each configured to save or store programming codes to control the multiplexer 213 and pass/no-pass switch or switch buffer 292 of one of its four selection circuits 211. For the programmable switch cell 379, the multiplexer 213 of each of its four selection circuits 211 may be configured to select, in accordance with the first input data set thereof at the first set of input points thereof each associated with one of the programming codes saved or stored in its memory cells 362, a data input from the second input data set thereof at the second set of input points thereof as the data output thereof. The pass/no-pass switch 292 of each of its four selection circuits 211 is configured to control, in accordance with a first data input thereof associated with another of the programming codes saved or stored in its memory cells 362, coupling between the input point thereof for a second data input thereof associated with the data output of the multiplexer 213 of said each of its four selection circuits 211 and the output point thereof for a data output thereof and amplify the second data input thereof as the data output thereof to act as a data output of said each of its four selection circuits 211. Each of the second set of three input points of the multiplexer 213 of one of its four selection circuits 211 may couple to one of the second set of three input points of the multiplexer 213 of each of another two of its four selection circuits 211 and to one of the four programmable interconnects 361 coupling to the output point of the other of its four selection circuits 211. Each of the four programmable interconnects 361 may couple to the output point of one of its four selection circuits 211 and one of the second set of three input points of the multiplexer 213 of each of the other three of its four selection circuits 211. Thereby, for each of the four selection circuits 211 of the programmable switch cell 379, its multiplexer 213 may select, in accordance with the first input data set thereof at the first set of input points thereof, a data input from the second input data set thereof at the second set of three input points thereof coupling to respective three of four nodes N23-N26 coupling to respective three of four programmable interconnects 361 extending in four different directions respectively, and its second type of pass/no-pass switch 292 is configured to generate the data output of said each of the four selection circuits 211 at the other of the four nodes N23-N26 coupling to the other of the four programmable interconnects 361.

For example, referring to FIG. 2, for the top one of the four selection circuits 211 of the programmable switch cell 379, its multiplexer 213 may select, in accordance with the first input data set thereof at the first set of input points thereof each associated with one of the programming codes saved or stored in the memory cells 362 of the programmable switch cell 379, a data input from the second input data set thereof at the second set of three input points thereof coupling to the respective three nodes N24-N26 coupling to the respective three programmable interconnects 361 extending in left, down and right directions respectively, and its pass/no-pass switch 292 is configured, in accordance with another of the programming codes saved or stored in the memory cells 362 of the programmable switch cell 379, to or not to generate the data output of the top one of the four selection circuits 211 of the programmable switch cell 379 at the node N23 coupling to the programmable interconnect 361 extending in an up direction. Thereby, data from one of the four programmable interconnects 361 may be switched by the programmable switch cell 379 to be passed to another one, two or three of the four programmable interconnects 361.

Referring to FIG. 2, for the programmable switch cell 379, each of the programming codes saved or stored in one of the memory cells 362 that may be of a first type, i.e., volatile memory cell such as static random-access memory (SRAM) cell, may be associated with data saved or stored in a non-volatile memory cell, such as ferroelectric random-access-memory (FRAM) cell, magnetoresistive random access memory (MRAM) cell, resistive random access memory (RRAM) cell, anti-fuse or e-fuse. Alternatively, for the programmable switch cell 379, each of its memory cells 362 may be of a second type, i.e., non-volatile memory cell composed of one or more magnetoresistive random access memory (MRAM) cells, one or more resistive random access memory (RRAM) cells, one or more anti-fuses, one or more e-fuses, or a floating gate of a metal-oxide-semiconductor (MOS) transistor.

Specification for Semiconductor Integrated-Circuit (IC) Chip

1. First Type of Semiconductor Integrated-Circuit (IC) Chip

Figure 3A:
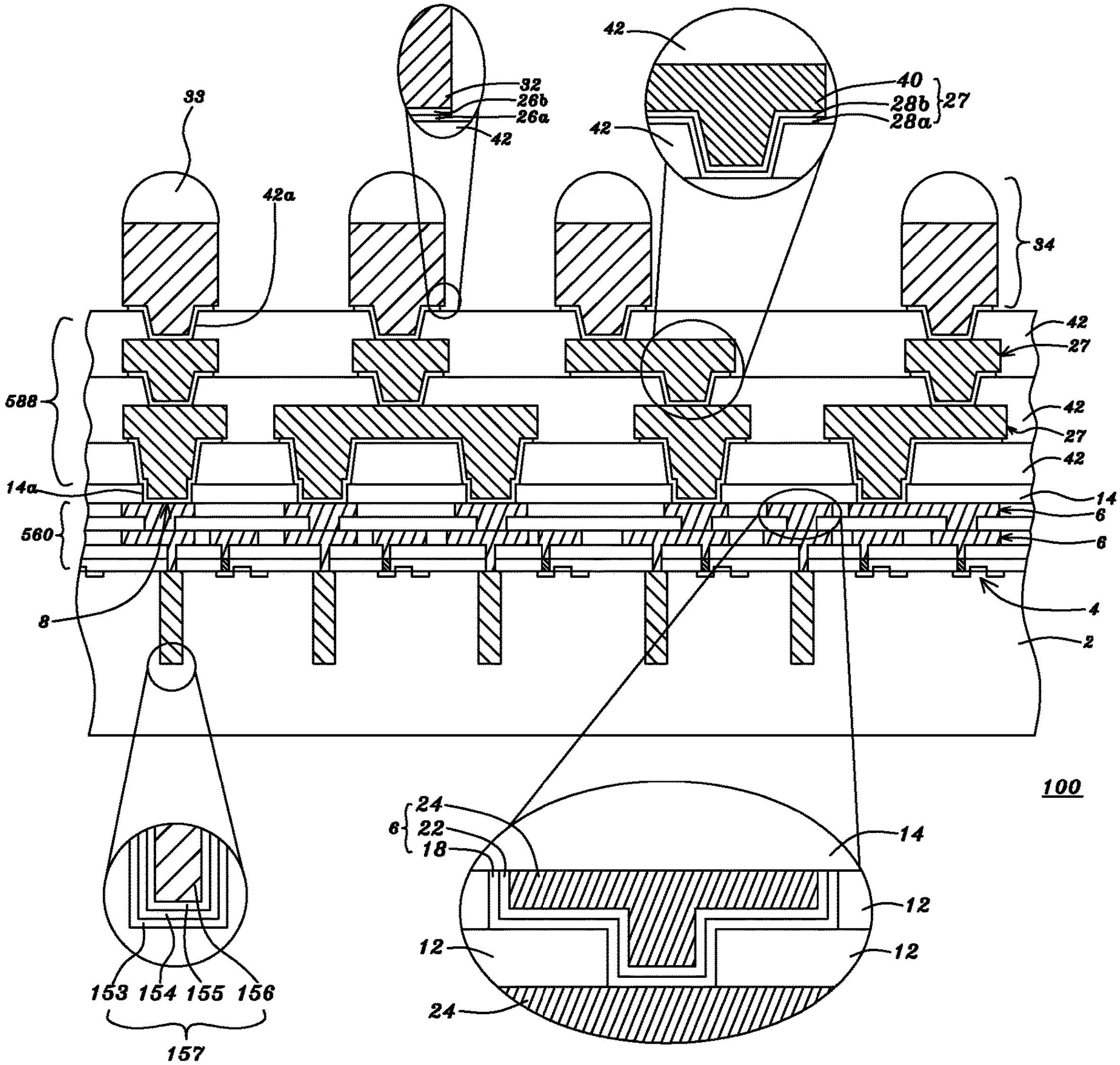
FIG. 3A is a schematically cross-sectional view showing a first type of semiconductor integrated-circuit (IC) chip in accordance with an embodiment of the present application.

FIG. 3A is a schematically cross-sectional view showing a first type of semiconductor integrated-circuit (IC) chip in accordance with an embodiment of the present application. Referring to FIG. 3A, a first type of semiconductor chip 100 may include (1) a semiconductor substrate 2, such as silicon substrate, (2) multiple semiconductor devices 4, such as transistors or passive devices, at an active surface of its semiconductor substrate 2, (3) multiple through silicon vias (TSVs) 157 each vertically extending through a blind hole in its semiconductor substrate 2, (3) a first interconnection scheme 560 on the semiconductor substrate 2, wherein its first interconnection scheme 560 may include multiple insulating dielectric layers 12 and multiple interconnection metal layers 6 each in neighboring two of the insulating dielectric layers 12, wherein each of its interconnection metal layers 6 may couple to one or more of its semiconductor devices 4 and one or more of its through silicon vias (TSVs) 157, wherein each of the interconnection metal layers 6 of its first interconnection scheme 560 is patterned with multiple metal pads, lines or traces 8 in an upper one of the neighboring two of the insulating dielectric layers 12 of its first interconnection scheme 560 and multiple metal vias 10 in a lower one of the neighboring two of the insulating dielectric layers 12 of its first interconnection scheme 560, wherein between each neighboring two of the interconnection metal layers 6 of its first interconnection scheme 560 is provided one of the insulating dielectric layers 12 of its first interconnection scheme 560, wherein an upper one of the interconnection metal layers 6 of its first interconnection scheme 560 may couple to a lower one of the interconnection metal layers 6 of its first interconnection scheme 560 through an opening in one of the insulating dielectric layers 12 of its first interconnection scheme 560 between the upper and lower ones of the interconnection metal layers 6 of its first interconnection scheme 560, (4) a passivation layer 14 on its first interconnection scheme 560, wherein the topmost one of the interconnection metal layers 6 of its first interconnection scheme 560 may have the metal pads 8 at bottoms of multiple openings **14*a* in the passivation layer 14, wherein the passivation layer 14 includes a mobile ion-catching layer or layers, for example, a combination of silicon nitride, silicon oxynitride, and/or silicon carbon nitride layer or layers deposited by a chemical vapor deposition (CVD) process, wherein the passivation layer 14 may include a silicon-nitride layer having a thickness of more than 0.3 micrometers, and alternatively the passivation layer 14 may include a polymer layer, such as polyimide, having a thickness between 1 and 5 micrometers, (5) a second interconnection scheme 588 optionally provided over the passivation layer 14, wherein its second interconnection scheme 588 may include one or more interconnection metal layers 27 coupling to the metal pads 8 of the topmost one of the interconnection metal layers 6 of its first interconnection scheme 560 through the openings 14*a* in its passivation layer 14, and one or more polymer layers 42, i.e., insulating dielectric layers, each between neighboring two of the interconnection metal layers 27 of its second interconnection scheme 588, under a bottommost one of the interconnection metal layers 27 of its second interconnection scheme 588 or over a topmost one of the interconnection metal layers 27 of its second interconnection scheme 588, wherein an upper one of the interconnection metal layers 27 of its second interconnection scheme 588 may couple to a lower one of the interconnection metal layers 27 of its second interconnection scheme 588 through an opening in one of the polymer layers 42 of its second interconnection scheme 588 between the upper and lower ones of the interconnection metal layers 27 of its second interconnection scheme 588, wherein the topmost one of the interconnection metal layers 27 of its second interconnection scheme 588 may have multiple metal pads at bottoms of multiple openings 42*a* in the topmost one of the polymer layers 42 of its second interconnection scheme 588, and (6) multiple micro-bumps or micro-pads 34 on the metal pads of the topmost one of the interconnection metal layers 27 of its second interconnection scheme 588 at the bottoms of the openings 42*a* in the topmost one of the polymer layers 42 of its second interconnection scheme 588, or, in the case that its second interconnection scheme 588 is not provided, on the metal pads of the topmost one of the interconnection metal layers 6 of its first interconnection scheme 560 at the bottoms of the openings 14*a* in its passivation layer 14**.

Referring to FIG. 3A, for the first type of semiconductor chip 100, each of its through silicon vias (TSVs) 157 may couple to one or more of its semiconductor devices 4 through one or more of the interconnection metal layers 6 of its first interconnection scheme 560. Each of its through silicon vias (TSVs) 157 may include (1) an insulating lining layer 153, such as a layer of thermally grown silicon oxide ($SiO_2$), a layer of CVD silicon nitride ($Si_3N_4$) or a combination thereof, on a sidewall and bottom of each of the blind holes in its semiconductor substrate 2, (2) a copper layer 156 electroplated in said each of the blind holes in its semiconductor substrate 2, (3) an adhesion layer 154, such as a layer of titanium (Ti) or titanium nitride (TiN) having a thickness between 1 nm to 50 nm, on the insulating lining layer 153, between the insulating lining layer 153 and copper layer 156 and at a sidewall and bottom of the copper layer 156, and (4) a seed layer 155, such as a layer of copper having a thickness between 3 nm and 200 nm, between the adhesion layer 154 and copper layer 156 and at a sidewall and bottom of the copper layer 156.

Referring to FIG. 3A, for the first interconnection scheme 560 of the first type of semiconductor chip 100, one of the metal pads, lines or traces 8 of each of its interconnection metal layers 6 may have a thickness between 3 nm and 500 nm and may have a width between 3 nm and 500 nm. A space or pitch between neighboring two of the metal pads, lines or traces 8 of each of its interconnection metal layers 6 may be between 3 nm and 500 nm. Each of its insulating dielectric layers 12 may include a layer of silicon oxide, silicon oxynitride or silicon oxycarbide having a thickness between 3 nm and 500 nm. Each of its interconnection metal layers 6 may include (1) a copper layer 24 having lower portions in openings in a lower one of the insulating dielectric layers 12, such as SiOC layer having a thickness of between 3 nm and 500 nm, and upper portions having a thickness of between 3 nm and 500 nm over the lower one of the insulating dielectric layers 12 and in openings in an upper one of the insulating dielectric layers 12, (2) an adhesion layer 18, such as titanium or titanium nitride having a thickness of between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12. For an example, the first interconnection scheme 560 may be formed with one or more passive devices, such as resistors, capacitors or inductors.

Referring to FIG. 3A, for the second interconnection scheme 588 of the first type of semiconductor chip 100, each of its interconnection metal layers 27 may include (1) a copper layer 40 having lower portions in openings in one of the polymer layers 42 having a thickness of between 0.3 μm and 20 μm, and upper portions having a thickness 0.3 μm and 20 μm over said one of the polymer layers 42, (2) an adhesion layer **28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40** may have a sidewall not covered by the adhesion layer 28*a*. Each of its interconnection metal layers 27 may have a metal line or trace with a thickness between, for example, 0.3 μm and 40 μm, 0.5 μm and 30 μm, 1 μm and 20 μm, 1 μm and 15 μm, 1 μm and 10 μm, or 0.5 μm to 5 μm, or greater than or equal to 0.3 μm, 0.7 μm, 1 μm, 2 μm, 3 μm, 5 μm, 7 μm or 10 μm and a width between, for example, 0.3 μm and 40 μm, 0.5 μm and 30 μm, 1 μm and 20 μm, 1 μm and 15 μm, 1 μm and 10 μm, or 0.5 μm to 5 μm, or greater than or equal to 0.3 μm, 0.7 μm, 1 μm, 2 μm, 3 μm, 5 μm, 7 μm or 10 μm. Each of its polymer layer 42 may be a layer of polyimide, BenzoCycloButene (BCB), parylene, polybenzoxazole (PBO), epoxy-based material or compound, photo epoxy SU-8, elastomer or silicone, having a thickness between, for example, 0.3 μm and 50 μm, 0.3 μm and 30 μm, 0.5 μm and 20 μm, 1 μm and 10 μm, or 0.5 um and 5 μm, or thicker than or equal to 0.3 μm, 0.5 μm, 0.7 μm, 1 μm, 1.5 μm, 2 μm, 3 μm or 5 μm. One of its interconnection metal layers 27 may have two planes used respectively for power and ground planes of a power supply and/or used as a heat dissipater or spreader for the heat dissipation or spreading, wherein each of the two planes may have a thickness, for example, between 5 μm and 50 μm, 5 μm and 30 μm, 5 μm and 20 μm, or 5 μm and 15 μm, or greater than or equal to 5 μm, 10 μm, 20 μm, or 30 μm. The two planes may be layout as interlaced or interleaved shaped structures in a plane or may be layout in a fork shape.

Alternatively, referring to FIG. 3A, each of the first and second interconnection schemes 560 and 588 may be formed with one or more passive devices, such as resistors, capacitors or inductors.

Referring to FIG. 3A, for the first type of semiconductor chip 100, its micro-bumps or micro-pads 34 may be of various types, mentioned as below: A first type of micro-bump or micro-pad 34 may include (1) an adhesion layer 26*a*, such as titanium (Ti) or titanium nitride (TiN) layer having a thickness between 1 nm and 50 nm, on the topmost one of the interconnection metal layers 27 of its second interconnection scheme 588 or, in the case that its second interconnection scheme 588 is not formed, on one of the metal pads 8 of its first interconnection scheme 560, (2) a seed layer 26*b*, such as copper, on its adhesion layer 26*a* and (3) a copper layer 32 having a thickness between 1 μm and 60 μm on its seed layer 26*b*.

Alternatively, a second type of micro-bump or micro-pad 34 may include the adhesion layer 26*a*, seed layer 26*b* and copper layer 32 as mentioned for the first type of micro-bump or micro-pad 34, and may further include a tin-containing solder cap 33 made of tin or a tin-silver alloy having a thickness between 1 μm and 50 μm on its copper layer 32.

Figure 6A:
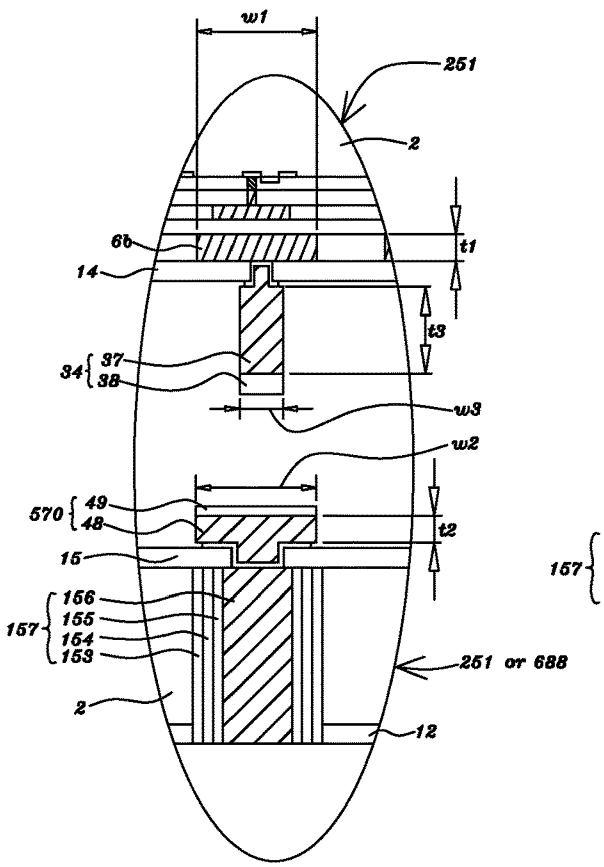
FIGS. 6A and 6B are schematically cross-sectional views showing a process of bonding a thermal compression bump to a thermal compression pad in accordance with an embodiment of the present application.
Figure 6B:
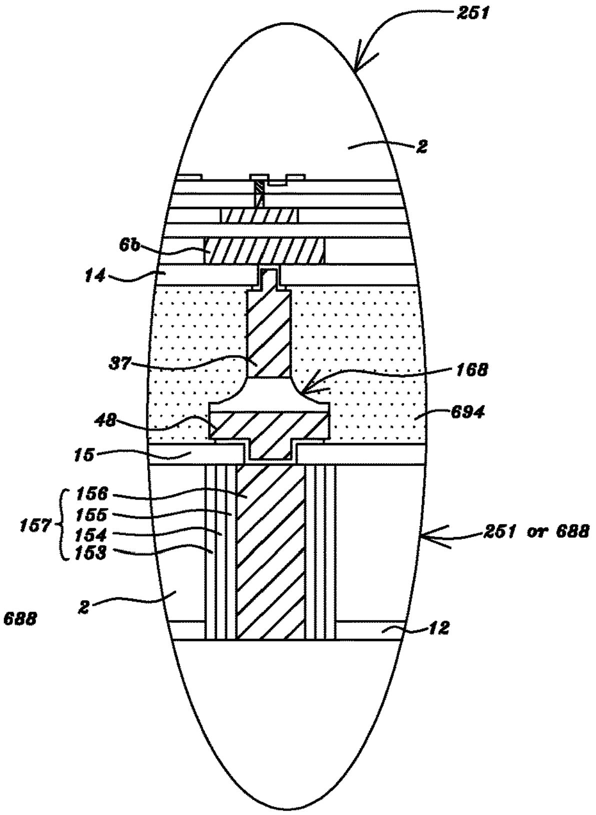

Alternatively, a third type of micro-bump or micro-pad 34 may be a thermal compression bump, including the adhesion layer 26*a* and seed layer 26*b* as mentioned for the first type of micro-bump or micro-pad 34, and may further include, as seen in any of FIGS. 6A and 6B, a copper layer 37 having a thickness t3 between 2 μm and 20 μm and a largest transverse dimension w3, such as diameter in a circular shape, between 1 μm and 25 μm on its seed layer 26*b* and a solder cap 38 made of a tin-silver alloy, a tin-gold alloy, a tin-copper alloy, a tin-indium alloy, indium or tin, which has a thickness between 1 μm and 15 μm and a largest transverse dimension, such as diameter in a circular shape, between 1 μm and 15 μm on its copper layer 37. A pitch between neighboring two of the third type of micro-bumps or micro-pads 34 may be between 5 and 30 micrometers or between 10 and 25 micrometers.

Alternatively, a fourth type of micro-bump or micro-pad 34 may be a thermal compression pad, including the adhesion layer 26*a* and seed layer 26*b* as mentioned for the first type of micro-bump or micro-pad 34, and may further include, as seen in FIGS. 6A and 6B, a copper layer 48 having a thickness t2 between 1 μm and 20 μm or between 2 μm and 10 μm and a largest transverse dimension w2, such as diameter in a circular shape, between 5 μm and 50 μm, on its seed layer 26*b* and a solder cap 49 made of a tin-silver alloy, a tin-gold alloy, a tin-copper alloy, a tin-indium alloy, indium, tin or gold, which has a thickness between 0.1 μm and 5 μm on its copper layer 48. A pitch between neighboring two of the fourth type of micro-bumps or micro-pads 34 may be between 5 and 30 micrometers or between 10 and 25 micrometers.

2. Second Type of Semiconductor Integrated-Circuit (IC) Chip

Figure 3B:
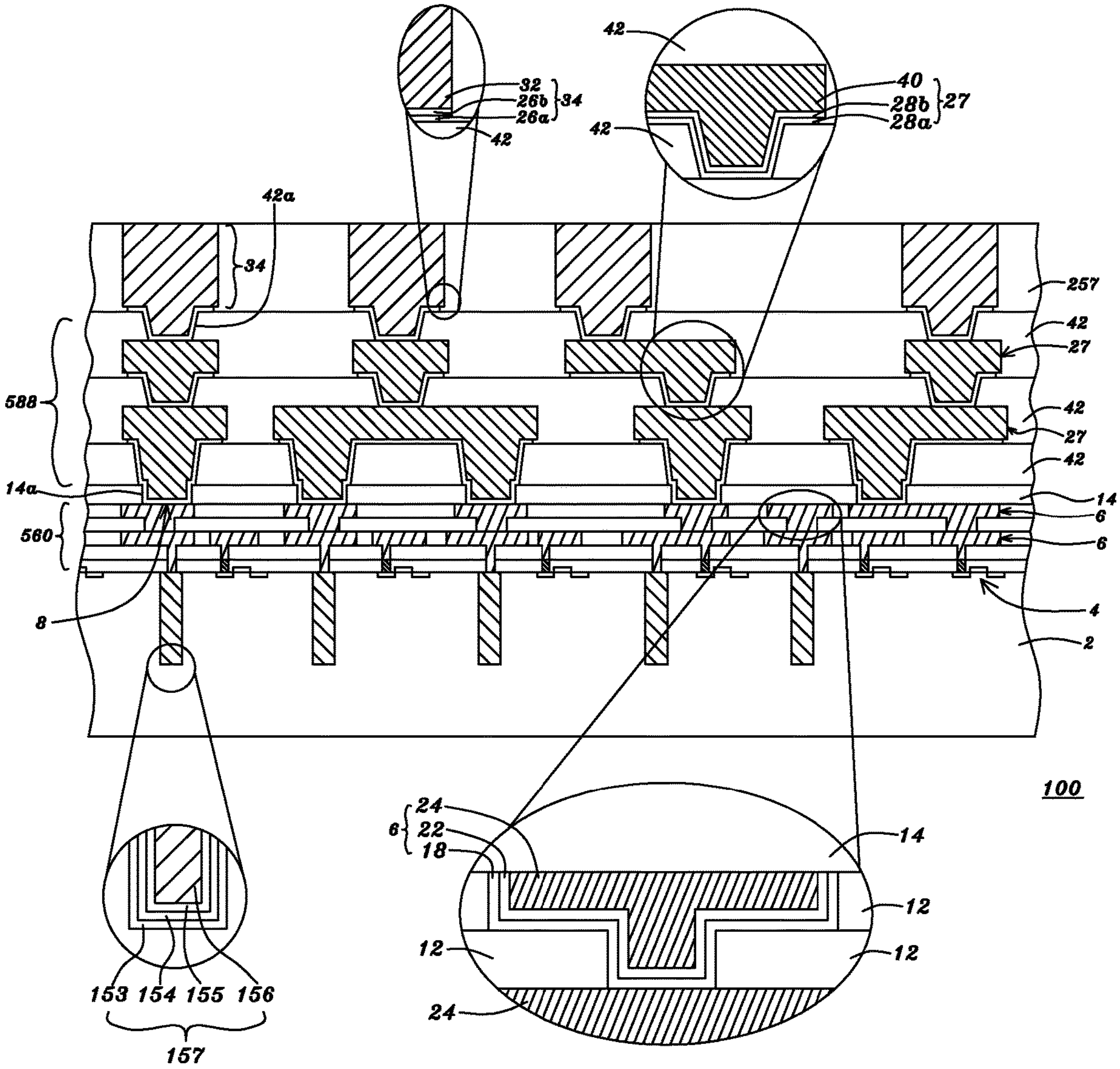
FIG. 3B is a schematically cross-sectional view showing a second type of semiconductor integrated-circuit (IC) chip in accordance with an embodiment of the present application.

FIG. 3B is a schematically cross-sectional view showing a second type of semiconductor integrated-circuit (IC) chip in accordance with an embodiment of the present application. Referring to FIG. 3B, a second type of semiconductor integrated-circuit (IC) chip 100 may have a similar structure to the first type of semiconductor integrated-circuit (IC) chip 100 illustrated in FIG. 3A. For an element indicated by the same reference number shown in FIGS. 3A and 3B, the specification of the element as seen in FIG. 3B may be referred to that of the element as illustrated in FIG. 3A. The difference between the first and second types of semiconductor integrated-circuit (IC) chips 100 is that the second type of semiconductor integrated-circuit (IC) chip 100 may further include an insulating dielectric layer 257, such as polymer layer, on the topmost one of the polymer layers 42 of its second interconnection scheme 588 or, in the case that its second interconnection scheme 588 is not formed, on its passivation layer 14. For the second type of semiconductor integrated-circuit (IC) chip 100, its micro-bumps or micro-pads 34 may be of the first type as illustrated in FIG. 3A, and its insulating dielectric layer 257 may cover a sidewall of the copper layer 32 of each of its micro-bumps or micro-pads 34, wherein its insulating dielectric layer 257 may have a top surface coplanar to a top surface of the copper layer 32 of each of its micro-bumps or micro-pads 34, wherein its insulating dielectric layer 257 may be, for example, polyimide, BenzoCycloButene (BCB), parylene, polybenzoxazole (PBO), epoxy-based material or compound, photo epoxy SU-8, elastomer, or silicone; its insulating dielectric layer 257 may be, for example, photosensitive polyimide/PBO PIMEL™ supplied by Asahi Kasei Corporation, Japan, or epoxy-based molding compounds, resins or sealants provided by Nagase ChemteX Corporation, Japan.

3. Third Type of Semiconductor Integrated-Circuit (IC) Chip

Figure 3C:
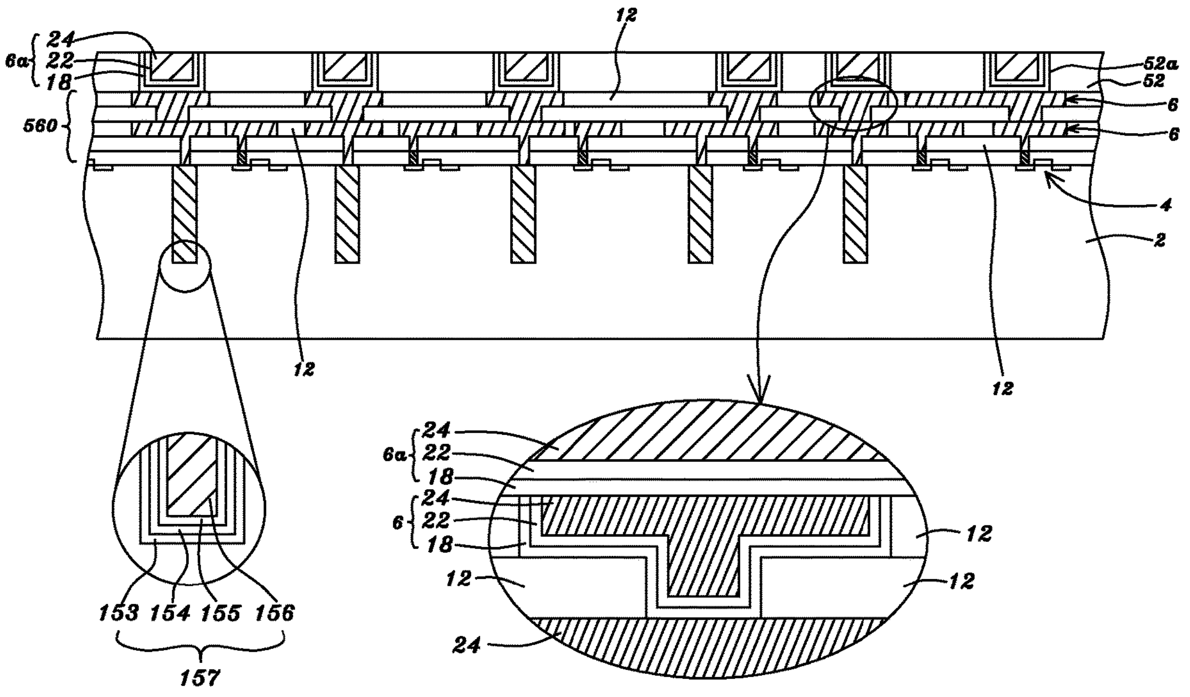
FIG. 3C is a schematically cross-sectional view showing a third type of semiconductor integrated-circuit (IC) chip in accordance with an embodiment of the present application.

FIG. 3C is a schematically cross-sectional view showing a third type of semiconductor integrated-circuit (IC) chip in accordance with an embodiment of the present application. Referring to FIG. 3C, a third type of semiconductor integrated-circuit (IC) chip 100 may have a similar structure to the first type of semiconductor integrated-circuit (IC) chip 100 illustrated in FIG. 3A. For an element indicated by the same reference number shown in FIGS. 3A and 3C, the specification of the element as seen in FIG. 3C may be referred to that of the element as illustrated in FIG. 3A. The difference between the first and third types of semiconductor integrated-circuit (IC) chips 100 is that the third type of semiconductor integrated-circuit (IC) chip 100 may be provided with (1) an insulating bonding layer 52 at its active side and on the topmost one of the insulating dielectric layers 12 of its first interconnection scheme 560 and (2)

multiple metal pads 6*a* at its active side and in multiple openings 52*a* in its insulating bonding layer 52 and on the topmost one of the interconnection metal layers 6 of its first interconnection scheme 560, instead of the passivation layer 14, second interconnection scheme 588 and micro-bumps or micro-pads 34 as seen in FIG. 3A. For the third type of semiconductor integrated-circuit (IC) chip 100, its insulating bonding layer 52 may include a silicon-oxide layer having a thickness between 0.1 and 2 μm. Each of its metal pads 6*a* may include (1) a copper layer 24 having a thickness of between 3 nm and 500 nm in one of the openings 52*a* in its insulating bonding layer 52, (2) an adhesion layer 18, such as titanium or titanium nitride having a thickness of between 1 nm and 50 nm, at a bottom and sidewall of the copper layer 24 of said each of its metal pads 6*a*, and (3) a seed layer 22, such as copper, between the copper layer 24 and adhesion layer 18 of said each of its metal pads 6*a*, wherein the copper layer 24 of said each of its metal pads 6*a* may have a top surface substantially coplanar with a top surface of the silicon-oxide layer of its insulating bonding layer 52.

Specification for Vertical-Through-Via (VTV) Connectors (Vertical-Interconnect-Elevator (VIE) Chips or Components)

A vertical-through-via (VTV) connector is provided with multiple vertical through vias (VTVs) for vertical connection to transmit signals or clocks or deliver power or ground in a vertical direction. The vertical-through-via (VTV) connector may be of various types mentioned as below:

1. First Type of Vertical-Through-Via (VTV) Connector

Figure 4A:
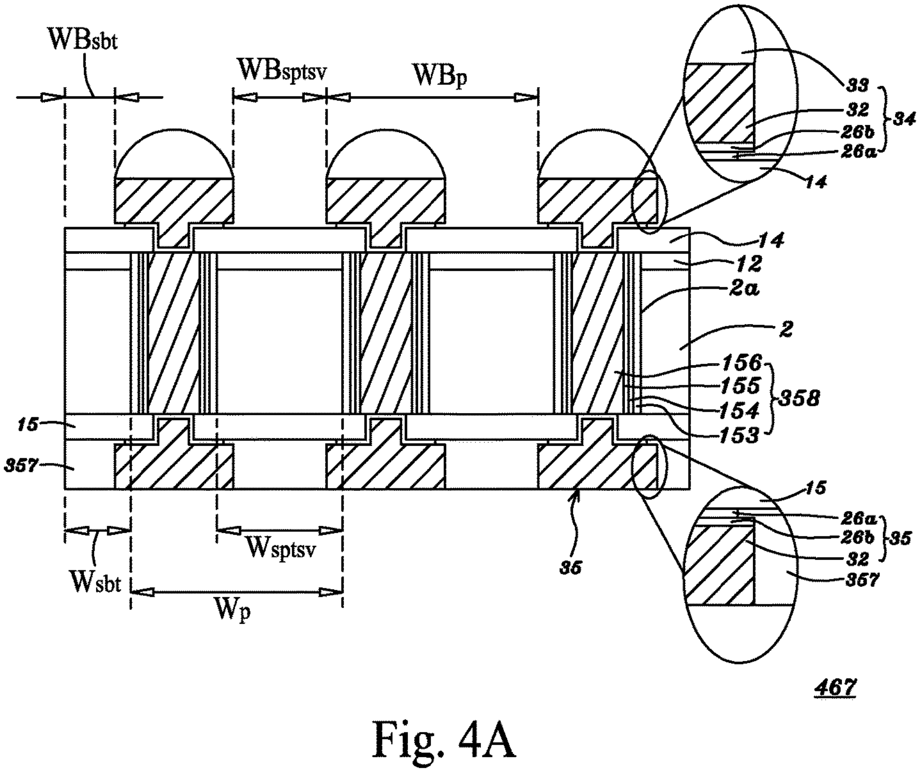
FIG. 4A is a schematically cross-sectional view showing a first type of vertical-through-via (VTV) connector in accordance with an embodiment of the present application.

FIG. 4A is a schematically cross-sectional view showing a first type of vertical-through-via (VTV) connector in accordance with an embodiment of the present application. Referring to FIG. 4A, a first type of vertical-through-via (VTV) connector 467 may include (1) a semiconductor substrate 2, such as silicon substrate, wherein the semiconductor substrate 2 may be replaced with a glass substrate, (2) an insulating dielectric layer 12 on its semiconductor substrate 2, wherein its insulating dielectric layer 12 may include a silicon-oxide layer having a thickness between 0.1 and 2 μm, (3) multiple vertical through vias (VTVs) 358 in its semiconductor substrate 2, wherein each of its vertical through vias (VTVs) 358 extends vertically through one of through holes in its semiconductor substrate 2 and insulating dielectric layer 12 and has a top surface substantially coplanar to a top surface of its insulating dielectric layer 12 and a bottom surface substantially coplanar to a bottom surface of its semiconductor substrate 2, wherein each of its vertical through vias (VTVs) 358 may have a depth between 30 μm and 200 μm or between 30 μm and 800 μm and a largest transverse dimension, such as diameter or width, between 2 μm and 20 μm or between 4 μm and 10 μm, (4) a passivation layer 14, i.e., insulating dielectric layer, on the top surface of its insulating dielectric layer 12, wherein its passivation layer 14 may include a silicon-nitride layer having a thickness of greater than 0.3 micrometers and, optionally, a polymer layer, such as polyimide, having a thickness between 1 and 5 micrometers on and at a top of the silicon-nitride layer of its passivation layer 14, wherein each of its vertical through vias (VTVs) 358 may have a top contact point at a bottom of one of multiple opening 14*a* in its passivation layer 14, wherein each of the openings 14*a* in its passivation layer 14 may have a largest transverse dimension, from a top view, between 0.5 and 20 micrometers or between 20 and 200 micrometers, (5) multiple micro-bumps or micro-pads 34 each on and at a top of the top contact point of one of its vertical through vias (VTVs) 358, (6) a passivation layer 15, i.e., insulating dielectric layer, on the bottom surface of its semiconductor substrate 2, wherein its passivation layer 15 may include a silicon-nitride layer having a thickness of greater than 0.3 micrometers and, optionally, a polymer layer, such as polyimide, having a thickness between 1 and 5 micrometers on and at a bottom of the silicon-nitride layer of its passivation layer 15, wherein each of its vertical through vias (VTVs) 358 may have a bottom contact point at a top of one of multiple opening 15*a* in its passivation layer 15, wherein each of the openings 15*a* in its passivation layer 15 may have a largest transverse dimension, from a bottom view, between 0.5 and 20 micrometers or between 20 and 200 micrometers, and (7) multiple micro-bumps or micro-pads 35 each on at a bottom of the bottom contact point of one of its vertical through vias (VTVs) 358, wherein each of its micro-bumps or micro-pads 35 may be aligned with one of its micro-bumps or micro-pads 34.

Referring to FIG. 4A, for the first type of vertical-through-via (VTV) connector 467, each of its vertical through vias (VTVs) 358 may be provided with (1) an insulating lining layer 153, such as a layer of thermally grown silicon oxide ($SiO_2$), a layer of CVD silicon nitride ($Si_3N_4$) or a combination thereof, on a sidewall of one of the through holes in its semiconductor substrate 2, (2) a copper layer 156 electroplated in said one of the through holes in its semiconductor substrate 2, (3) an adhesion layer 154, such as a layer of titanium (Ti) or titanium nitride (TiN) having a thickness between 1 nm to 50 nm, on the insulating lining layer 153, between the insulating lining layer 153 and copper layer 156 and at a sidewall of the copper layer 156, and (4) a seed layer 155, such as a layer of copper having a thickness between 3 nm and 200 nm, between the adhesion layer 154 and copper layer 156 and at the sidewall of the copper layer 156. Each of its micro-bumps or micro-pads 34 may have various types, i.e., first, second, third and fourth types, which may have the same specification as the first, second, third and fourth types of micro-bumps or micro-pads 34 respectively as illustrated in FIG. 3A, having the adhesion layer 26*a* formed on the top contact point of one of its vertical through vias (VTVs) 358. Each of its micro-bumps or micro-pads 35 may have the same specification as the first type of micro-bump or micro-pad 34 as illustrated in FIG. 3A, having the adhesion layer 26*a* formed on the bottom contact point of one of its vertical through vias (VTVs) 358. The first type of vertical-through-via (VTV) connector 467 may further include an insulating dielectric layer 357, such as polymer layer, on its passivation layer 15, wherein its insulating dielectric layer 357 may cover a sidewall of the copper layer 32 of each of its micro-bumps or micro-pads 35 and have a bottom surface coplanar to a bottom surface of the copper layer 32 of each of its micro-bumps or micro-pads 35, wherein its insulating dielectric layer 357 may be, for example, polyimide, BenzoCycloButene (BCB), parylene, polybenzoxazole (PBO), epoxy-based material or compound, photo epoxy SU-8, elastomer, or silicone; its insulating dielectric layer 357 may be, for example, photosensitive polyimide/PBO PIMEL™ supplied by Asahi Kasei Corporation, Japan, or epoxy-based molding compounds, resins or sealants provided by Nagase ChemteX Corporation, Japan.

Referring to FIG. 4A, for the first type of vertical-through-via (VTV) connector 467, a pitch $WB_p$ between each neighboring two of its micro-bumps or micro-pads 34 or 35 may range from 5 to 50 micrometers or from 5 to 20 micrometers or may be smaller than 50, 40 or 30 micrometers. A space $WB_{sptsv}$ between neighboring two of its micro-bumps or micro-pads 34 or 35 may range from 5 to 50 micrometers or from 5 to 20 micrometers or may be smaller than 50, 40 or 30 micrometers. A distance $WB_{sbt}$ between its edge and one of its micro-bumps or micro-pads 34 may be smaller than the space $WB_{sptsv}$ between neighboring two of its micro-bumps or micro-pads 34, and optionally its edge may be aligned with an edge of one of its micro-bumps or micro-pads 34; alternatively, the distance $WB_{sbt}$ between its edge and one of its micro-bumps or micro-pads 34 may be smaller than 50, 40 or 30 micrometers. A distance $WB_{sbt}$ between its edge and one of its micro-bumps or micro-pads 35 may be smaller than the space $WB_{sptsv}$ between neighboring two of its micro-bumps or micro-pads 35, and optionally its edge may be aligned with an edge of one of its micro-bumps or micro-pads 35; alternatively, the distance $WB_{sbt}$ between its edge and one of its micro-bumps or micro-pads 35 may be smaller than 50, 40 or 30 micrometers. A pitch $W_p$ between each neighboring two of its vertical through vias (VTVs) 358 may range from 5 to 50 micrometers or from 5 to 20 micrometers or may be smaller than 50, 40 or 30 micrometers. A space $W_{sptsv}$ between neighboring two of its vertical through vias (VTVs) 358 may range from 5 to 50 micrometers or from 5 to 20 micrometers or may be smaller than 50, 40 or 30 micrometers. A distance $W_{sbt}$ between its edge and one of its vertical through vias (VTVs) 358 may be smaller than the space $W_{sptsv}$ between neighboring two of its vertical through vias (VTVs) 358 and optionally its edge may be aligned with an edge of one of its vertical through vias (VTVs) 358; alternatively, the distance $W_{sbt}$ between its edge and one of its vertical through vias (VTVs) 358 may be smaller than 50, 40 or 30 micrometers.

2. Second Type of Vertical-Through-Via (VTV) Connector

Figure 4B:
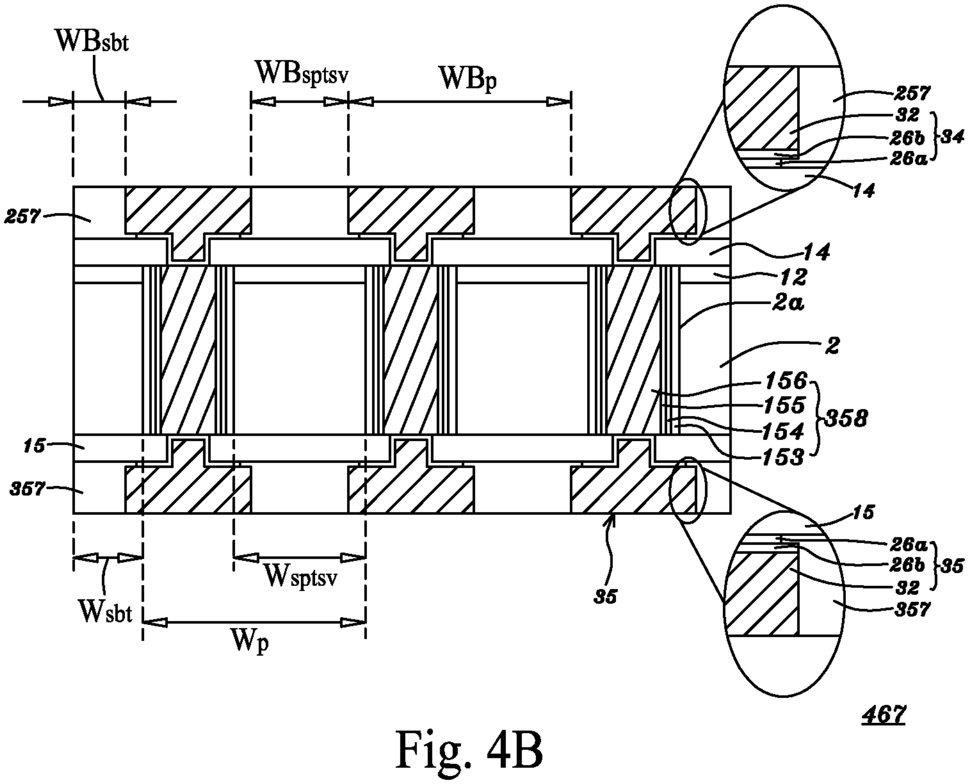
FIG. 4B is a schematically cross-sectional view showing a second type of vertical-through-via (VTV) connector in accordance with an embodiment of the present application.

FIG. 4B is a schematically cross-sectional view showing a second type of vertical-through-via (VTV) connector in accordance with an embodiment of the present application. Referring to FIG. 4B, a second type of vertical-through-via (VTV) connector 467 may have a similar structure to the first type of vertical-through-via (VTV) connector 467 illustrated in FIG. 4A. For an element indicated by the same reference number shown in FIGS. 4A and 4B, the specification of the element as seen in FIG. 4B may be referred to that of the element as illustrated in FIG. 4A. The difference between the first and second types of vertical-through-via (VTV) connectors 467 is that the second type of vertical-through-via (VTV) connector 467 may further include an insulating dielectric layer 257, such as polymer layer, on its passivation layer 14, wherein its insulating dielectric layer 257 may have the same specification as the insulating dielectric layer 257 of the second type of semiconductor integrated-circuit (IC) chip 100 illustrated in FIG. 3B. For the second type of vertical-through-via (VTV) connector 467, each of its micro-bumps or micro-pads 34 may have the same specification as the first type of micro-bumps or micro-pads 34 illustrated in FIG. 3A, and its insulating dielectric layer 257 may cover a sidewall of the copper layer 32 of each of its micro-bumps or micro-pads 34 and have a top surface coplanar to a top surface of the copper layer 32 of each of its micro-bumps or micro-pads 34.

3. Third Type of Vertical-Through-Via (VTV) Connector

Figure 4C:
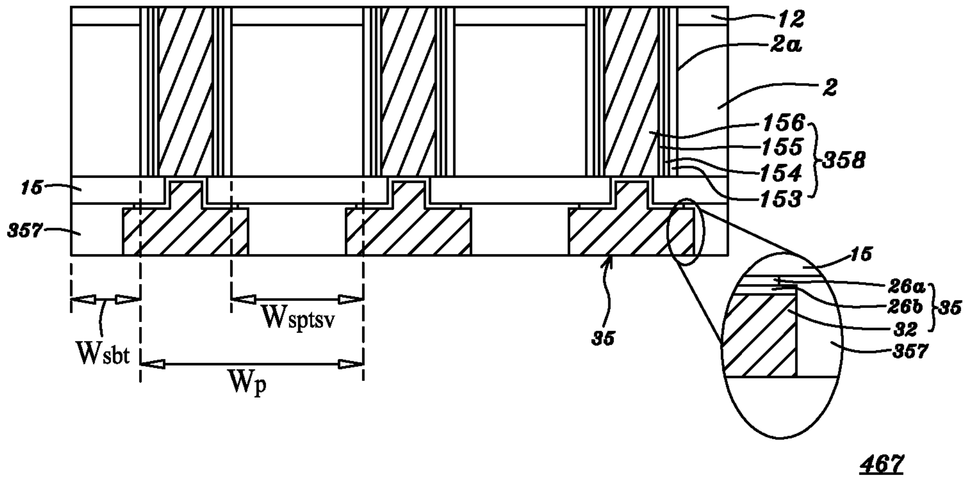
FIG. 4C is a schematically cross-sectional view showing a third type of vertical-through-via (VTV) connector in accordance with an embodiment of the present application.

FIG. 4C is a schematically cross-sectional view showing a third type of vertical-through-via (VTV) connector in accordance with an embodiment of the present application. Referring to FIG. 4C, a third type of vertical-through-via (VTV) connector 467 may have a similar structure to the first type of vertical-through-via (VTV) connector 467 illustrated in FIG. 4A. For an element indicated by the same reference number shown in FIGS. 4A and 4C, the specification of the element as seen in FIG. 4C may be referred to that of the element as illustrated in FIG. 4A. The difference between the first and third types of vertical-through-via (VTV) connectors 467 is that the third type of vertical-through-via (VTV) connector 467 may have none of the passivation layer 14 and micro-bumps or micro-pads 34 for the first type of vertical-through-via (VTV) connector 467 as illustrated in FIG. 4A, and the third type of vertical-through-via (VTV) connector 467 may include an insulating bonding layer 52 having the same specification as the insulating dielectric layer 12 of the first type of vertical-through-via (VTV) connector 467 as illustrated in FIG. 4A.

Referring to FIG. 4C, for the third type of vertical-through-via (VTV) connector 467, a pitch $WB_p$ between each neighboring two of its micro-bumps or micro-pads 35 may range from 5 to 50 micrometers or from 5 to 20 micrometers or may be smaller than 50, 40 or 30 micrometers. A space $WB_{sptsv}$ between neighboring two of its micro-bumps or micro-pads 35 may range from 5 to 50 micrometers or from 5 to 20 micrometers or may be smaller than 50, 40 or 30 micrometers. A distance $WB_{sbt}$ between its edge and one of its micro-bumps or micro-pads 35 may be smaller than the space $WB_{sptsv}$ between neighboring two of its micro-bumps or micro-pads 35, and optionally its edge may be aligned with an edge of one of its micro-bumps or micro-pads 35; alternatively, the distance $WB_{sbt}$ between its edge and one of its micro-bumps or micro-pads 35 may be smaller than 50, 40 or 30 micrometers. A pitch $W_p$ between each neighboring two of its vertical through vias (VTVs) 358 may range from 5 to 50 micrometers or from 5 to 20 micrometers or may be smaller than 50, 40 or 30 micrometers. A space $W_{sptsv}$ between neighboring two of its vertical through vias (VTVs) 358 may range from 5 to 50 micrometers or from 5 to 20 micrometers or may be smaller than 50, 40 or 30 micrometers. A distance $W_{sbt}$ between its edge and one of its vertical through vias (VTVs) 358 may be smaller than the space $W_{sptsv}$ between neighboring two of its vertical through vias (VTVs) 358 and optionally its edge may be aligned with an edge of one of its vertical through vias (VTVs) 358; alternatively, the distance $W_{sbt}$ between its edge and one of its vertical through vias (VTVs) 358 may be smaller than 50, 40 or 30 micrometers.

Specification for Memory Module or Unit

1. First Type of Memory Module or Unit

Figure 5A:
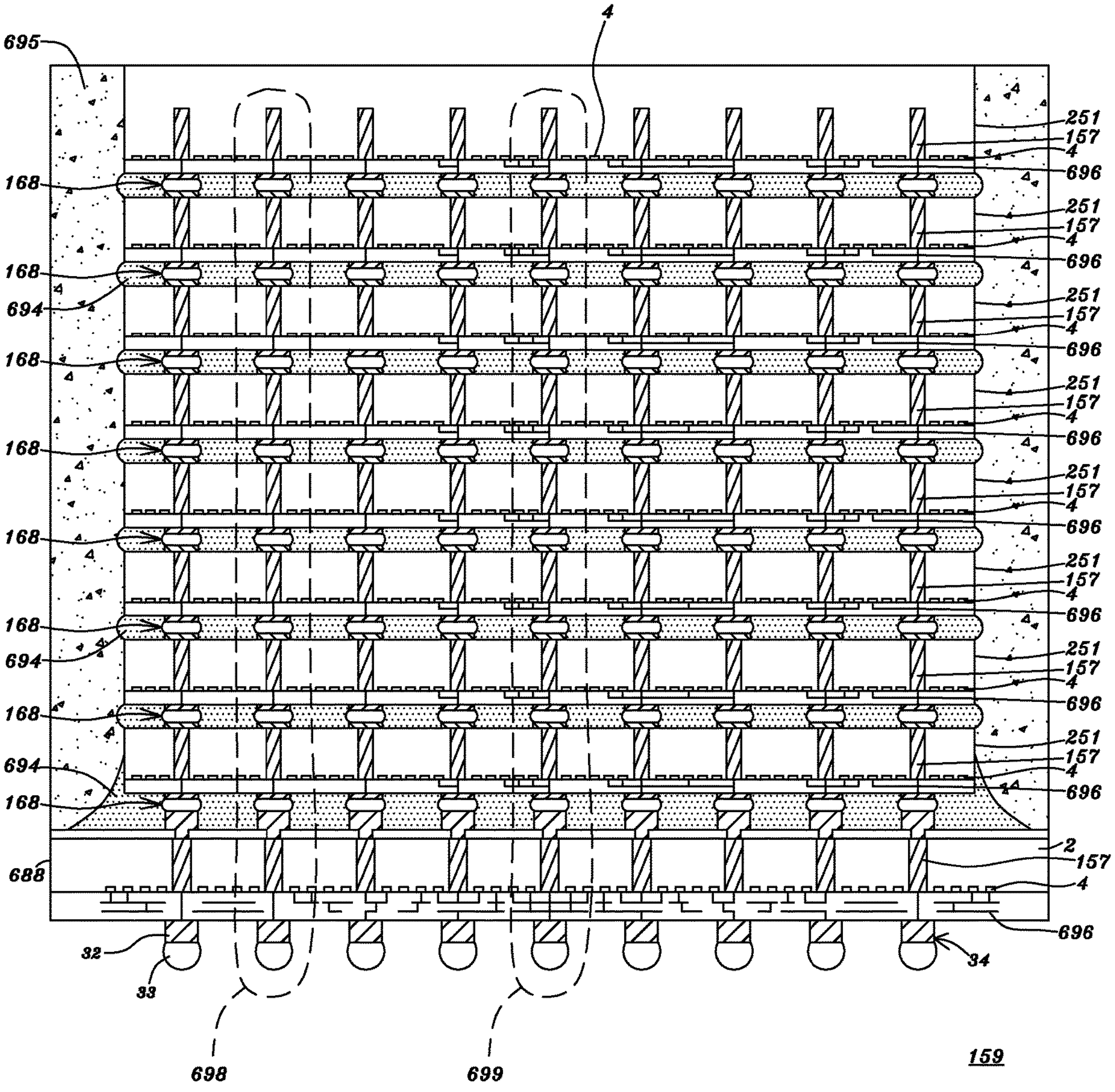
FIGS. 5A-5D are schematically cross-sectional views showing first through fourth types of memory modules in accordance with an embodiment of the present application.

FIG. 5A is a schematically cross-sectional view showing a first type of memory module in accordance with an embodiment of the present application. Referring to FIG. 5A, a memory module 159 may include (1) multiple memory chips 251, such as volatile-memory (VM) integrated circuit (IC) chips for a VM module, dynamic-random-access-memory (DRAM) IC chips for a high-bitwidth memory (HBM) module, statistic-random-access-memory (SRAM) IC chips for a SRAM module, magnetoresistive random-access-memory (MRAM) IC chips for a MRAM module, resistive random-access-memory (RRAM) IC chips for a RRAM module, ferroelectric random-access-memory (FRAM) IC chips for a FRAM module or phase change random access memory (PCM) IC chips for a PCM module, vertically stacked together, wherein the number of its memory chips 251 may have the number equal to or greater than 2, 4, 8, 16, 32, (2) a control chip 688, i.e., ASIC or logic chip, under its memory chips 251 stacked thereover, and (3) multiple bonded metal bumps or contacts 168 between neighboring two of its memory chips 251 and between the bottommost one of its memory chips 251 and its control chip 688.

Referring to FIG. 5A, each of the memory chips 251 and control chip 688 may be provided with the same specification as the first type of semiconductor integrated-circuit (IC) chip 100 illustrated in FIG. 3A and turned upside down. For an element indicated by the same reference number shown in FIGS. 3B and 5A, the specification of the element as seen in FIG. 5A may be referred to that of the element as illustrated in FIG. 3B. Referring to FIGS. 3B and 5A, for each of the memory chips 251 and control chip 688 of the first type of memory module 159, its semiconductor substrate 2 may be ground or polished from a top surface thereof at its backside, other than the topmost one of the memory chips 251, to have a top surface of the copper layer 156 of each of its through silicon vias (TSVs) 157 exposed at its backside, wherein the top surface of the copper layer 156 of each of its through silicon vias (TSVs) 157 may be coplanar to the top surface of its semiconductor substrate 2, and each of its through silicon vias (TSVs) 157 may be aligned with one of its micro-bumps or micro-pads 34.

FIGS. 6A and 6B are schematically cross-sectional views showing a process of bonding a thermal compression bump to a thermal compression pad in accordance with an embodiment of the present application. Referring to FIGS. 3B, 5A, 6A and 6B, each of upper ones of the memory chips 251 may be bonded to a lower one of the memory chips 251 or to the control chip 688. Each of the lower ones of the memory chips 251 and the control chip 688 may be formed with (1) a passivation layer 15 on the top surface of its semiconductor substrate 2 at its backside as seen in FIGS. 6A and 6B, wherein each opening 15*a* in its passivation layer 15 may be aligned with the top surface of the copper layer 156 of one of its through silicon vias (TSVs) 157 and its passivation layer 15 may have the same specification as the passivation layer 14 as illustrated in FIG. 3A, and (2) multiple micro-bumps or micro-pads 570 each on the top surface of the copper layer 156 of one of its through silicon vias (TSVs) 157, wherein each of its micro-bumps or micro-pads 570 may be of one of the first through fourth types having the same specifications as the first through fourth types of micro-bumps or micro-pads 34 as illustrated in FIG. 3A respectively, having the adhesion layer 26*a* formed on the top surface of the copper layer 156 of one of its through silicon vias (TSVs) 157.

For a first case, referring to FIGS. 5A, 6A and 6B, an upper one of the memory chips 251 may have the third type of micro-bumps or micro-pads 34 to be bonded to the fourth type of micro-bumps or micro-pads 570 of a lower one of the memory chips 251 or the control chip 688. For example, the third type of micro-bumps or micro-pads 34 of the upper one of the memory chips 251 may have the solder caps 38 to be thermally compressed, at a temperature between 240 and 300 degrees Celsius, at a pressure between 0.3 and 3 MPa and for a time period between 3 and 15 seconds, onto the metal caps 49 of the fourth type of micro-bumps or micro-pads 570 of the lower one of the memory chips 251 or the control chip 688 into multiple bonded metal bumps or contacts 168 between the upper and lower ones of the memory chips 251 or between the upper one of the memory chips 251 and the control chip 688. A force applied to the upper one of the memory chips 251 in the thermal compression process may be substantially equal to the pressure times a contact area between one of the third type of micro-bumps or micro-pads 34 and one of the fourth type of micro-bumps or micro-pads 570 times the total number of the third type of micro-bumps or micro-pads 34 of the upper one of the memory chips 251. Each of the third type of micro-bumps or micro-pads 34 of the upper one of the memory chips 251 may have the copper layer 37 having the thickness t3 greater than the thickness t2 of the copper layer 48 of each of the fourth type of micro-bumps or micro-pads 570 of the lower one of the memory chips 251 or the control chip 688 and having the largest transverse dimension w3 equal to between 0.7 and 0.1 times of the largest transverse dimension w2 of the copper layer 48 of each of the fourth type of micro-bumps or micro-pads 570 of the lower one of the memory chips 251 or the control chip 688. Alternatively, each of the third type of micro-bumps or micro-pads 34 may be provided with the copper layer 37 having a cross-sectional area equal to between 0.5 and 0.01 times of the cross-sectional area of the copper layer 48 of each of the fourth type of micro-bumps or micro-pads 570 of the lower one of the memory chips 251 or the control chip 688. For example, for the upper one of the memory chips 251, its third type of micro-bumps or micro-pads 34 may be formed respectively on a front surface of the metal pads 6*b* provided by the frontmost one of the interconnection metal layers 27 of its second interconnection scheme 588 or by, if the second interconnection scheme 588 is not provided, the frontmost one of the interconnection metal layers 6 of its first interconnection scheme 560, wherein each of the metal pads 6*b* may have a thickness t1 between 1 and 10 micrometers or between 2 and 10 micrometers and a largest transverse dimension w1, such as diameter in a circular shape, between 1 μm and 25 μm and each of its third type of micro-bumps or micro-pads 34 may be provided with the copper layer 37 having the thickness t3 greater than the thickness t1 of its metal pads 6*b* and having the largest transverse dimension w3 equal to between 0.7 and 0.1 times of the largest transverse dimension w1 of its metal pads 6*b*; alternatively, each of its third type of micro-bumps or micro-pads 34 may be provided with the copper layer 37 having a cross-sectional area equal to between 0.5 and 0.01 times of the cross-sectional area of its metal pads 6*b*. A bonded solder between the copper layers 37 and 48 of each of the bonded metal bumps or contacts 168 may be mostly kept on a top surface of the copper layer 48 of one of the fourth type of micro-bumps or micro-pads 570 of the lower one of the memory chips 251 or the control chip 688 and extends out of the edge of the copper layer 48 of said one of the fourth type of micro-bumps or micro-pads 570 of the lower one of the memory chips 251 or the control chip 688 less than 0.5 micrometers. Thus, a short between neighboring two of the bonded metal bumps or contacts 168 even in a fine-pitched fashion may be avoided.

Alternatively, for a second case, referring to FIG. 5A, an upper one of the memory chips 251 may have the second type of micro-bumps or micro-pads 34 to be bonded to the first type of micro-bumps or micro-pads 570 of a lower one of the memory chips 251 or the control chip 688. For example, the second type of micro-bumps or micro-pads 34 of the upper one of the memory chips 251 may have the solder caps 33 to be bonded onto the copper layer 32 of the first type of micro-bumps or micro-pads 570 of the lower one of the memory chips 251 or the control chip 688 into multiple bonded metal bumps or contacts 168 between the upper and lower ones of the memory chips 251 or between the upper one of the memory chips 251 and the control chip 688. Each of the second type of micro-bumps or micro-pads 34 of the upper one of the memory chips 251 may have the copper layer 32 having a thickness greater than that of the copper layer 32 of each of the first type of micro-bumps or micro-pads 570 of the lower one of the memory chips 251 or the control chip 688.

Alternatively, for a third case, referring to FIG. 5A, an upper one of the memory chips 251 may have the first type of micro-bumps or micro-pads 34 to be bonded to the second type of micro-bumps or micro-pads 570 of a lower one of the memory chips 251 or the control chip 688. For example, the first type of micro-bumps or micro-pads 34 of the upper one of the memory chips 251 may have the electroplated metal layer 32, e.g. copper layer, to be bonded onto the solder caps 33 of the second type of micro-bumps or micro-pads 570 of the lower one of the memory chips 251 or the control chip 688 into multiple bonded metal bumps or contacts 168 between the upper and lower ones of the memory chips 251 or between the upper one of the memory chips 251 and the control chip 688. Each of the first type of micro-bumps or micro-pads 34 of the upper one of the memory chips 251 may have the copper layer 32 having a thickness greater than that of the copper layer 32 of each of the second type of micro-bumps or micro-pads 570 of the lower one of the memory chips 251 or the control chip 688.

Alternatively, for a fourth case, referring to FIG. 5A, an upper one of the memory chips 251 may have the second type of micro-bumps or micro-pads 34 to be bonded to the second type of micro-bumps or micro-pads 570 of a lower one of the memory chips 251 or the control chip 688. For example, the second type of micro-bumps or micro-pads 34 of the upper one of the memory chips 251 may have the solder caps 33 to be bonded onto the solder caps 33 of the second type of micro-bumps or micro-pads 570 of the lower one of the memory chips 251 or the control chip 688 into multiple bonded metal bumps or contacts 168 between the upper and lower ones of the memory chips 251 or between the upper one of the memory chips 251 and the control chip 688. Each of the second type of micro-bumps or micro-pads 34 of the upper one of the memory chips 251 may have the copper layer 32 having a thickness greater than that of the copper layer 32 of each of the second type of micro-bumps or micro-pads 570 of the lower one of the memory chips 251 or the control chip 688.

Referring to FIG. 5A, each of the through silicon vias (TSVs) 157 of each of the memory chips 251 and control chip 688, other than the topmost one of the memory chips 251, may be aligned with and connected to one of the bonded metal bumps or contacts 168 at the backside thereof. The through silicon vias (TSVs) 157 of the memory chips 251, which are aligned in a vertical direction, may couple to each other or one another through the bonded metal bumps or contacts 168 therebetween aligned with the through silicon vias (TSVs) 157 thereof in the vertical direction. Each of the memory chips 251 and control chip 688 may include multiple interconnects 696 each provided by the interconnection metal layers 6 of its first interconnection scheme 560 and/or the interconnection metal layers 27 of its second interconnection scheme 588 to connect one or more of its through silicon vias (TSVs) 157 to one or more of the bonded metal bumps or contacts 168 at its bottom surface. An underfill 694, e.g., polymer layer, may be provided between each neighboring two of the memory chips 251 to enclose the bonded metal bumps or contacts 168 therebetween and between the bottommost one of the memory chips 251 and the control chip 688 to enclose the bonded metal bumps or contacts 168 therebetween. A molding compound 695, e.g. a polymer, may be formed around the memory chips 251 and over the control chip 688, wherein the topmost one of the memory chips 251 may have a top surface coplanar with a top surface of the molding compound 695.

Referring to FIG. 5A, for the first type of memory module 159, each of its memory chips 251 may have a data bit-width, equal to or greater than 64, 128, 256, 512, 1024, 2048, 4096, 8K, or 16K, with external circuits of the first type of memory module 159 via the micro-bumps or micro-pads 34 of its control chip 688.

The first type of memory module 159 may include multiple vertical interconnects 699 each composed of one of the through silicon vias (TSVs) 157 of each of the memory chips 251 and control chip 688 of the first type of memory module 159, wherein the through silicon vias (TSVs) 157 for each of the vertical interconnects 699 of the first type of memory module 159 may be aligned with each other or one another and connected to one or more transistors of the semiconductor devices 4 of each of the memory chips 251 and control chip 688 of the first type of memory module 159. The first type of memory module 159 may further include multiple dedicated vertical bypasses 698 each composed of one of the through silicon vias (TSVs) 157 of each of the memory chips 251 and control chip 688 of the first type of memory module 159, wherein the through silicon vias (TSVs) 157 for each of the dedicated vertical bypasses 698 of the first type of memory module 159 may be aligned with each other or one another but not connected to any transistor of each of the memory chips 251 and control chip 688 of the first type of memory module 159. Each of the memory chips 251 and control chip 688 may be provided with one or more small I/O circuits, each having driving capability, loading, output capacitance or input capacitance between 0.05 pF and 2 pF, or 0.05 pF and 1 pF, or smaller than 2 pF or 1 pF, coupling to one of the vertical interconnects 699 of the first type of memory module 159; alternatively each of the small input/output (I/O) circuits may have an I/O power efficiency smaller than 0.5 pico-Joules per bit, per switch or per voltage swing, or between 0.01 and 0.5 pico-Joules per bit, per switch or per voltage swing, coupling to one of the vertical interconnects 699 of the first type of memory module 159.

Referring to FIG. 5A, the control chip 688 may be configured to control data access to the memory chips 251. The control chip 688 may be used for buffering and controlling the memory chips 251. Each of the through silicon vias (TSVs) 157 of the control chip 688 may be aligned with and connected to one of the micro-bumps or micro-pads 34 of the control chip 688 at the bottom surface thereof.

2. Second Type of Memory Module or Unit

Figure 5B:
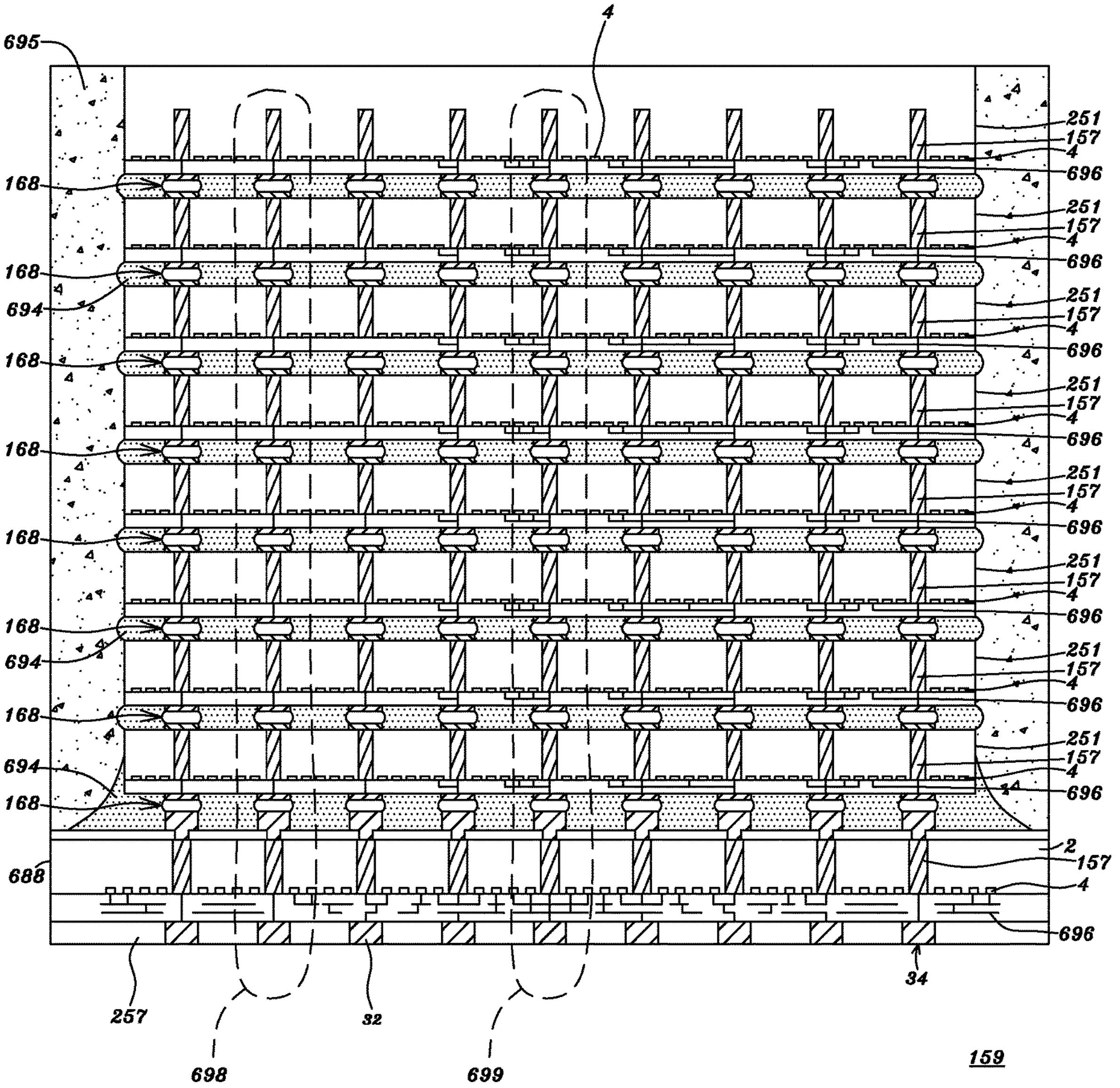

FIG. 5B is a schematically cross-sectional view showing a second type of memory module in accordance with an embodiment of the present application. Referring to FIG. 5B, a second type of memory module 159 may have a similar structure to the first type of memory module 159 as illustrated in FIG. 5A. For an element indicated by the same reference number shown in FIGS. 5A and 5B, the specification of the element as seen in FIG. 5B may be referred to that of the element as illustrated in FIG. 5A. The difference between the first and second types of memory modules 159 is mentioned as below: for the second type of memory module 159, its control chip may further include an insulating dielectric layer 257, such as polymer layer, on the bottommost one of the polymer layers 42 of the second interconnection scheme 588 of its control chip 688 or, in the case that the second interconnection scheme 588 of its control chip 688 is not formed, on and under the passivation layer 14 of its control chip 688. The micro-bumps or micro-pads 34 of its control chip 688 may be of the first type as illustrated in FIG. 3A, and the insulating dielectric layer 257 of its control chip 688 may cover a sidewall of the copper layer 32 of each of the micro-bumps or micro-pads 34 of its control chip 688, wherein the insulating dielectric layer 257 of its control chip 688 may have a bottom surface coplanar to a bottom surface of the copper layer 32 of each of the micro-bumps or micro-pads 34 of its control chip 688.

The insulating dielectric layer 257 of its control chip 688 may have the same specification as the insulating dielectric layer 257 of the second type of semiconductor integrated-circuit (IC) chip 100 illustrated in FIG. 3B.

3. Third Type of Memory Module or Unit

Figure 5C:
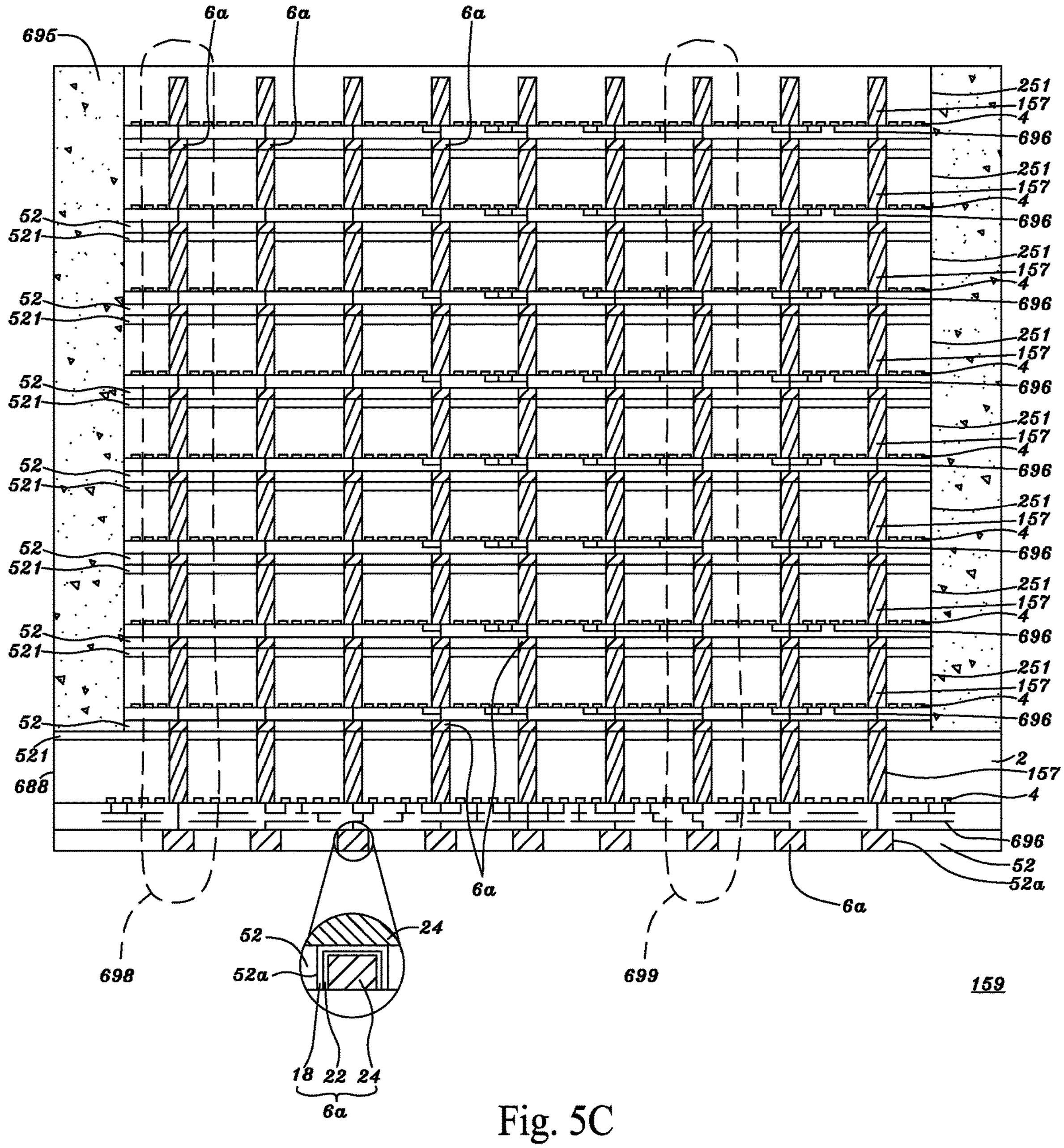
Figure 6D:
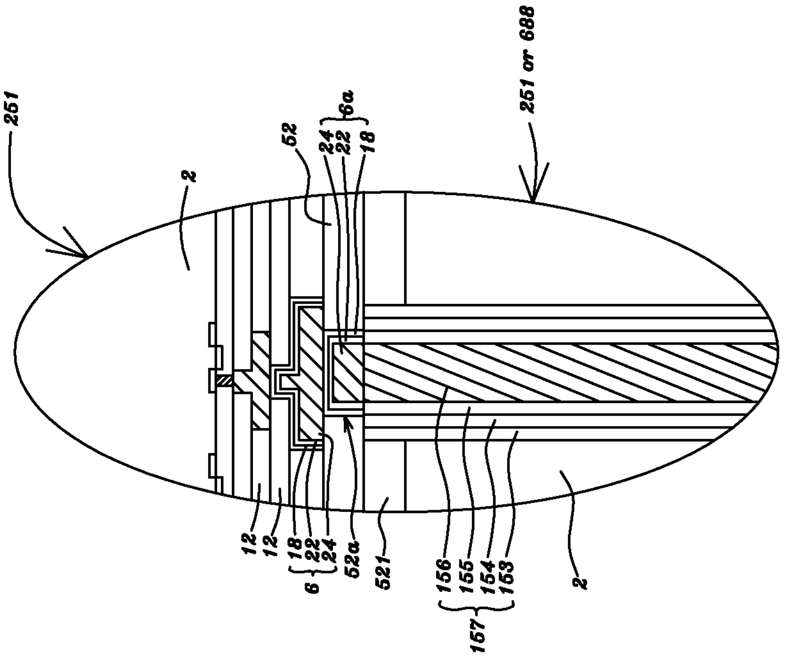
FIGS. 6C and 6D are schematically cross-sectional views showing a direct bonding process in accordance with an embodiment of the present application.
Figure 6C:
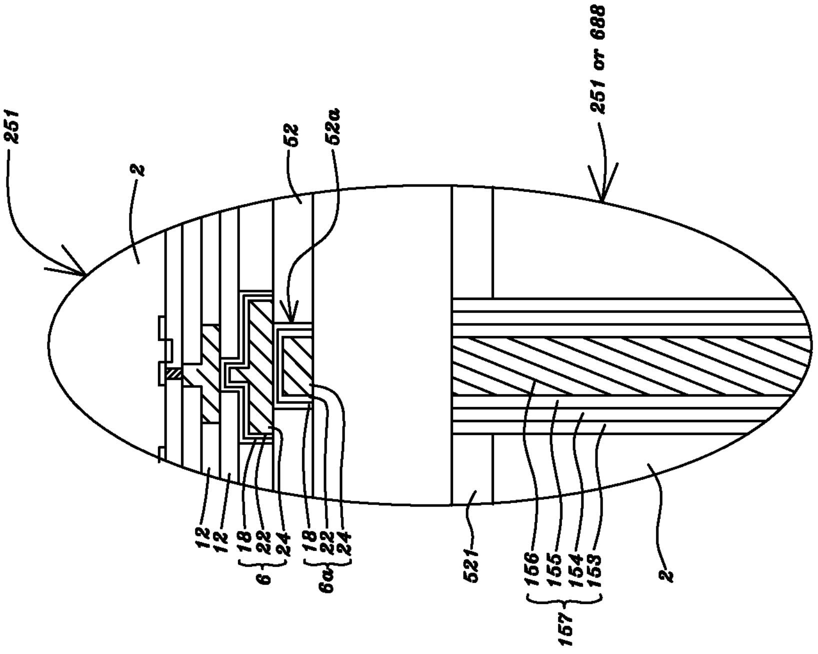

FIG. 5C is a schematically cross-sectional view showing a third type of memory module in accordance with an embodiment of the present application. Referring to FIG. 5C, a third type of memory module 159 may have a similar structure to the first type of memory module 159 illustrated in FIG. 5A. For an element indicated by the same reference number shown in FIGS. 5A and 5C, the specification of the element as seen in FIG. 5C may be referred to that of the element as illustrated in FIG. 5A. The difference between the first and third types of memory modules 159 is that a direct bonding process may be performed for the third type of memory module 159 as seen in FIG. 5C. FIGS. 6C and 6D are schematically cross-sectional views showing a direct bonding process in accordance with an embodiment of the present application. Referring to FIG. 5C, each of the memory chips 251 and control chip 688 may have the same specification as the third type of semiconductor integrated-circuit (IC) chip 100 illustrated in FIG. 3C and turned upside down. For an element indicated by the same reference number shown in FIGS. 3C and 5C, the specification of the element as seen in FIG. 5C may be referred to that of the element as illustrated in FIG. 3C. Referring to FIGS. 3C and 5C, for each of the memory chips 251 and control chip 688 of the third type of memory module 159, its semiconductor substrate 2 may be ground or polished from a top surface thereof at its backside, other than the topmost one of the memory chips 251, to have a top surface of the copper layer 156 of each of its through silicon vias (TSVs) 157 exposed at its backside, wherein the top surface of the copper layer 156 of each of its through silicon vias (TSVs) 157 may be coplanar to the top surface of its semiconductor substrate 2, and each of its through silicon vias (TSVs) 157 may be aligned with one of its metal pads 6*a*.

Referring to FIGS. 3C, 5C, 6C and 6D, each of upper ones of the memory chips 251 may be bonded to a lower one of the memory chips 251 or to the control chip 688. Each of the lower ones of the memory chips 251 and the control chip 688 may be formed with an insulating bonding layer 521 on the top surface of its semiconductor substrate 2 at its backside as seen in FIGS. 6C and 6D, wherein its insulating bonding layer 521 may include a silicon-oxide layer having a thickness between 0.1 and 2 μm, wherein its insulating bonding layer 521 may have a top surface coplanar to the top surface of the copper layer 156 of each of its through silicon vias (TSVs) 157.

Referring to FIGS. 5C, 6C and 6D, an upper one of the memory chips 251 may join a lower one of the memory chips 251 or the control chip 688 by (1) activating a joining surface, i.e., silicon oxide, of the insulating bonding layer 52 at the active side of the upper one of the memory chips 251 and a joining surface, i.e., silicon oxide, of the insulating bonding layer 521 at the backside of the lower one of the memory chips 251 or the control chip 688 with nitrogen plasma for increasing hydrophilic property thereof, (2) next rinsing the joining surface of the insulating bonding layer 52 at the active side of the upper one of the memory chips 251 and the joining surface of the insulating bonding layer 521 at the backside of the lower one of the memory chips 251 or the control chip 688 with deionized water for water adsorption and cleaning, (3) next placing the upper one of the memory chips 251 onto the lower one of the memory chips 251 or the control chip 688 with each of the metal pads 6*a* at the active side of the upper one of the memory chips 251 in contact with one of the through silicon vias (TSVs) 157 of the lower one of the memory chips 251 and control chip 688 and with the joining surface of the insulating bonding layer 52 at the active side of the upper one of the memory chips 251 in contact with the joining surface of the insulating bonding layer 521 at the backside of the lower one of the memory chips 251 or the control chip 688, and (4) next performing a direct bonding process including (a) oxide-to-oxide bonding at a temperature between 100 and 200 degrees Celsius and for a time period between 5 and 20 minutes to bond the joining surface of the insulating bonding layer 52 at the active side of the upper one of the memory chips 251 to the joining surface of the insulating bonding layer 521 at the backside of the lower one of the memory chips 251 or the control chip 688 and (b) copper-to-copper bonding at a temperature between 300 and 350 degrees Celsius and for a time period between 10 and 60 minutes to bond the copper layer 24 of each of the metal pads 6*a* at the active side of the upper one of the memory chips 251 to the copper layer 156 of one of the through silicon vias (TSVs) 157 of the lower one of the memory chips 251 or the control chip 688, wherein the oxide-to-oxide bonding may be caused by water desorption from reaction between the joining surface of the insulating bonding layer 52 at the active side of the upper one of the memory chips 251 and the joining surface of the insulating bonding layer 521 at the backside of the lower one of the memory chips 251 or the control chip 688, and the copper-to-copper bonding may be caused by metal inter-diffusion between the copper layer 24 of the metal pads 6*a* at the active side of the upper one of the memory chips 251 and the copper layer 156 of the through silicon vias (TSVs) 157 of the lower one of the memory chips 251 or the control chip 688.

4. Fourth Type of Memory Module or Unit

Figure 5D:
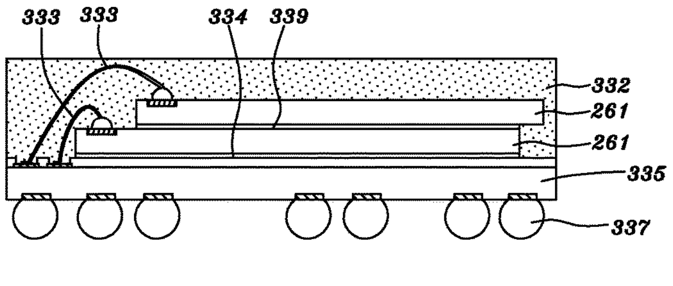

FIG. 5D is a schematically cross-sectional view showing a fourth type of memory module in accordance with an embodiment of the present application. Referring to FIG. 5D, a fourth type of memory module 159 may include (1) multiple memory integrated-circuit (IC) chips 261 stacked with each other and mounted to each other via an adhesive layer 339 such as silver paste or an heat conductive paste, wherein an upper one of its memory integrated-circuit (IC) chips 261 may overhang from an edge of a lower one of its memory integrated-circuit (IC) chips 261, wherein each of its memory integrated-circuit (IC) chips 261 may be a non-volatile memory (NVM) integrated-circuit (IC) chip, such as NAND flash chip, NOR flash chip, magnetoresistive random-access-memory (MRAM) integrated-circuit (IC) chip, resistive random access memory (RRAM) integrated-circuit (IC) chip, phase-change random-access-memory (PCM) integrated-circuit (IC) chip or ferroelectric-random-access-memory (FRAM) integrated-circuit (IC) chip, or a volatile memory (VM) integrated-circuit (IC) chip, such as high bandwidth dynamic random-access-memory (DRAM) or high bandwidth static random-access-memory (SRAM) chip, wherein for a case each of its memory integrated-circuit (IC) chips 261 may be a high bandwidth dynamic random-access-memory (DRAM) chip, or for another case the lower one of its memory integrated-circuit (IC) chips 261 may be a high bandwidth dynamic random-access-memory (DRAM) chip and the upper one of its memory integrated-circuit (IC) chips 261 may be a NAND flash chip or NOR flash chip, (2) a circuit board or ball-grid-array (BGA) substrate 335 having multiple patterned metal layers and multiple polymer layers, i.e., insulating dielectric layers, (not shown) each between neighboring two of the patterned metal layers of its circuit board or ball-grid-array (BGA) substrate 335, wherein its circuit board or ball-grid-array (BGA) substrate 335 is arranged under its memory integrated-circuit (IC) chips 261 to have the lower one of its memory integrated-circuit (IC) chips 261 to be attached to a top surface thereof via an adhesive layer 334 such as silver paste or an heat conductive paste, (3) multiple wirebonded wires 333 each coupling one of its memory integrated-circuit (IC) chips 261 to the topmost one of the patterned metal layers of its circuit board or ball-grid-array (BGA) substrate 335, (4) a molded polymer 332 over a top surface of its circuit board or ball-grid-array (BGA) substrate 335, encapsulating its memory integrated-circuit (IC) chips 261 and wirebonded wires 333 and (5) a plurality of solder balls 337 each attached to the bottommost one of the patterned metal layers of its circuit board or ball-grid-array (BGA) substrate 335.

Specification for Optical Input/Output (I/O) Module or Unit

First Type of Optical Input/Output (I/O) Module

Figure 5E:
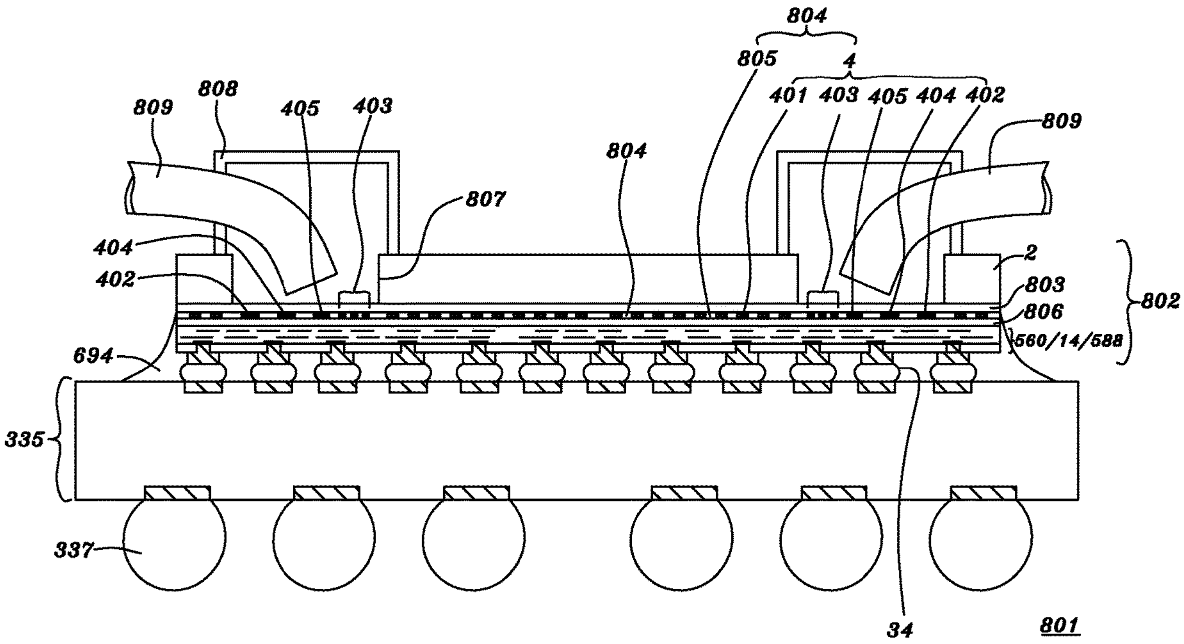
FIG. 5E is a schematically cross-sectional view showing a first type of optical input/output (I/O) module in accordance with an embodiment of the present application.

FIG. 5E is a schematically cross-sectional view showing a first type of optical input/output (I/O) module in accordance with an embodiment of the present application. Referring to FIG. 5E, a first type of optical input/output (I/O) module 801 may include an optical input/output (I/O) chip 802 having the same specification as the first type of semiconductor integrated-circuit (IC) chip 100 illustrated in FIG. 3A to be turned upside down, wherein its optical input/output (I/O) chip 802 may further include (1) an insulating layer 803, such as a layer of silicon dioxide, on a bottom surface of the semiconductor substrate 2 thereof, such as silicon substrate, (2) a device layer 804 on a bottom surface of the insulating layer 803 thereof, wherein the device layer 804 may include a semiconductor layer 805, such as silicon layer, on the bottom surface of the insulating layer 803 thereof, and the semiconductor devices 4 of its optical input/output (I/O) chip 802 may include a plurality of transistors 401, optical waveguides 402, optical grating couplers 403, optical transmitters or modulators 404 and photodetectors 405 each having a portion formed in the semiconductor layer 805 of the device layer 804 thereof, wherein the device layer 804 may be provided with an insulating isolator in the semiconductor layer 805 thereof and between each neighboring two of the transistors 401, optical waveguides 402, optical grating couplers 403, optical transmitters or modulators 404 and photodetectors 405 thereof, and (4) an insulating layer 806, such as a layer of silicon dioxide, on a bottom surface of the semiconductor layer 805 thereof. For the first type of optical input/output (I/O) module 801, the first interconnection scheme 560 of its optical input/output (I/O) chip 802 may be formed on a bottom surface of the insulating layer 806 of its optical input/output (I/O) chip 802, the passivation layer 14 of its optical input/output (I/O) chip 802 may be formed on the bottom surface of the first interconnection scheme 560 of its optical input/output (I/O) chip 802, and optionally the second interconnection scheme 588 of its optical input/output (I/O) chip 802 may be formed on the bottom surface of the passivation layer 14 of its optical input/output (I/O) chip 802, as illustrated in FIG. 3A. Further, for the first type of optical input/output (I/O) module 801, each of the first, second, third or fourth type of micro-bumps or micro-pads 34 of its optical input/output (I/O) chip 802 may be formed on the bottommost one of the interconnection metal layers 27 of the second interconnection scheme 588 of its optical input/output (I/O) chip 802 or, in the case that the second interconnection scheme 588 of its optical input/output (I/O) chip 802 is not formed, on a bottom surface of one of the metal pads 8 of the first interconnection scheme 560 of its optical input/output (I/O) chip 802, as illustrated in FIG. 3A. For the first type of optical input/output (I/O) module 801, a plurality of through holes 807 may be further formed extending vertically through the semiconductor substrate 2 of its optical input/output (I/O) chip 802, exposing the oxide layer 803 of its optical input/output (I/O) chip 802, wherein each of the through holes 807 in the semiconductor substrate 2 of its optical input/output (I/O) chip 802 may be aligned with and arranged vertically over one or a plurality of the optical waveguides 402 of its optical input/output (I/O) chip 802, one or a plurality of the optical grating couplers 403 of its optical input/output (I/O) chip 802, one or a plurality of the optical transmitters or modulators 404 of its optical input/output (I/O) chip 802 and one or a plurality of the photodetectors 405 of its optical input/output (I/O) chip 802.

Referring to FIG. 5E, the optical input/output (I/O) module 801 may further include (1) a circuit board or ball-grid-array (BGA) substrate 335 having multiple patterned metal layers and multiple polymer layers, i.e., insulating dielectric layers, (not shown) each between neighboring two of the patterned metal layers of its circuit board or ball-grid-array (BGA) substrate 335, wherein its circuit board or ball-grid-array (BGA) substrate 335 is arranged under its optical input/output (I/O) chip 802 to have each of the first, second, third or fourth type of micro-bumps or micro-pads 34 of its optical input/output (I/O) chip 802 to be bonded to a top surface of the topmost one of the patterned metal layers of its circuit board or ball-grid-array (BGA) substrate 335, (2) an underfill 694, e.g., polymer layer, between its optical input/output (I/O) chip 802 and circuit board or ball-grid-array (BGA) substrate 335 to enclose each of the first, second, third or fourth type of micro-bumps or micro-pads 34 of its optical input/output (I/O) chip 802, (3) multiple solder balls 337 each attached to the bottommost one of the patterned metal layers of its circuit board or ball-grid-array (BGA) substrate 335, (4) an optical fiber 809 in each of the through holes 807 in the semiconductor substrate 2 of its optical input/output (I/O) chip 802, whereby input optical signals transmitted or received from the optical fiber 809 may optically couple to the optical waveguides 402, optical grating couplers 403 and photodetectors 405 of its optical input/output (I/O) chip 802, which are aligned with and vertically under said each of the through holes 807 in the semiconductor substrate 2 of its optical input/output (I/O) chip 802, and the optical transmitters or modulators 404 aligned with and vertically under said each of the through holes 807 in the semiconductor substrate 2 of its optical input/output (I/O) chip 802 may generate output optical signals optically coupling to the optical fiber 809, and (5) a cover 808 covering a top of each of the through holes 807 in the semiconductor substrate 2 of its optical input/output (I/O) chip 802 and fixing each of the optical fibers 809 to its optical input/output (I/O) chip 802.

Second Type of Optical Input/Output (I/O) Module

Figure 5F:
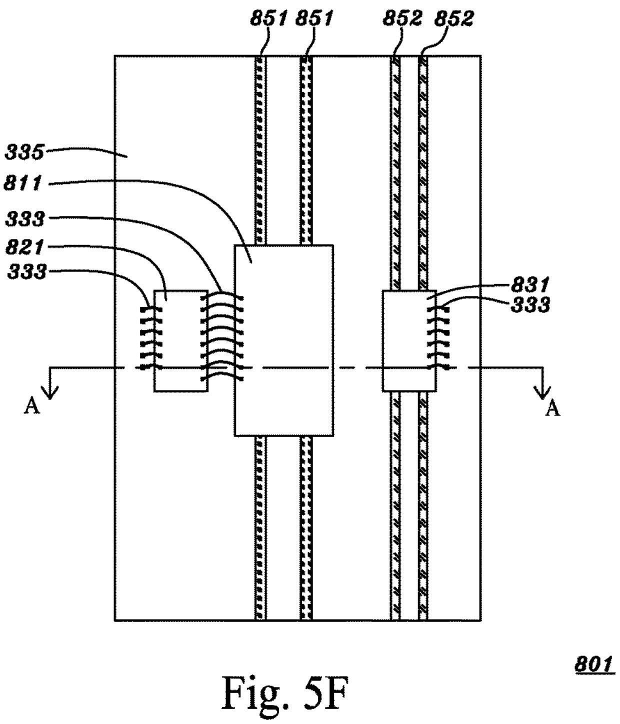
FIG. 5F is a schematically top view showing a second type of optical input/output (I/O) module in accordance with an embodiment of the present application.
Figure 5G:
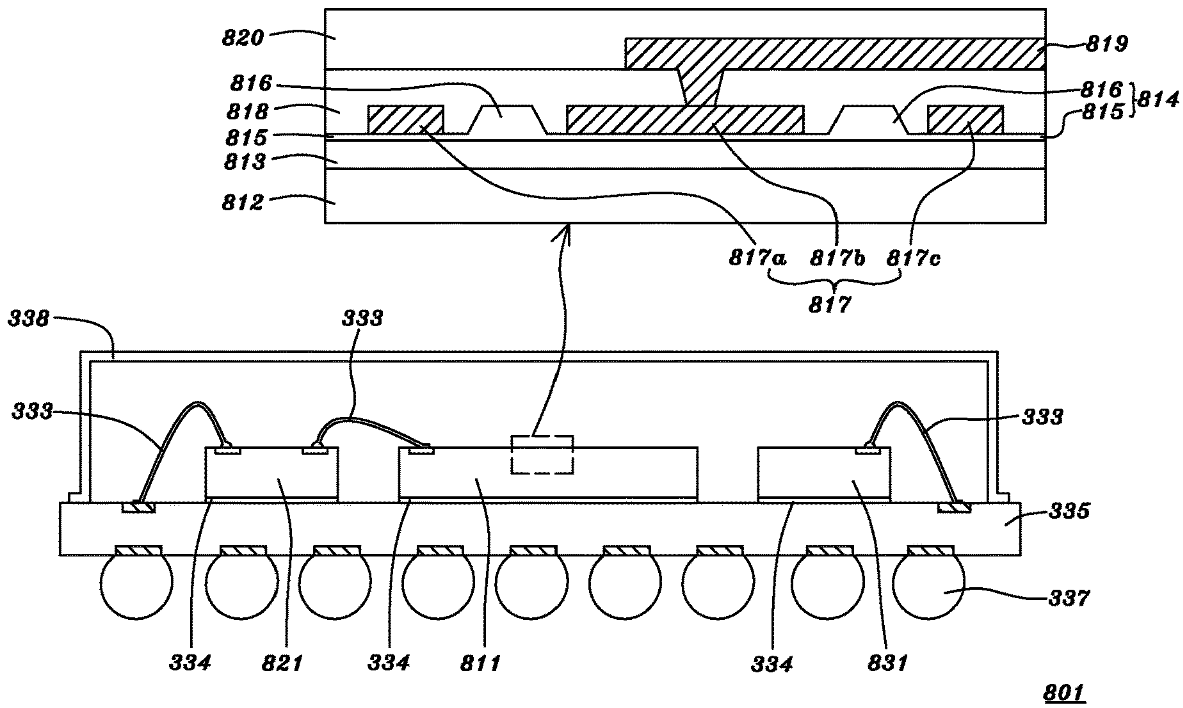
FIG. 5G is a schematically cross-sectional view showing a second type of optical input/output (I/O) module cutting along a cross-sectional line A-A shown in FIG. 5F in accordance with an embodiment of the present application.

FIG. 5F is a schematically top view showing a second type of optical input/output (I/O) module in accordance with an embodiment of the present application. FIG. 5G is a schematically cross-sectional view showing a second type of optical input/output (I/O) module cutting along a cross-sectional line A-A shown in FIG. 5F in accordance with an embodiment of the present application. Referring to FIGS. 5F and 5G, a second type of optical input/output (I/O) module 801 may include (1) a circuit board or ball-grid-array (BGA) substrate 335 having multiple patterned metal layers and multiple polymer layers, i.e., insulating dielectric layers, (not shown) each between neighboring two of the patterned metal layers of its circuit board or ball-grid-array (BGA) substrate 335, (2) three semiconductor integrated-circuit (IC) chips 811, 821 and 831 each having a bottom surface attached to a top surface of its circuit board or ball-grid-array (BGA) substrate 335 via an adhesive layer 334 such as silver paste or an heat conductive paste, (3) multiple wirebonded wires 333 each coupling one of its semiconductor integrated-circuit (IC) chips 821 and 831 to the topmost one of the patterned metal layers of its circuit board or ball-grid-array (BGA) substrate 335 or coupling its semiconductor integrated-circuit (IC) chip 811 to its semiconductor integrated-circuit (IC) chip 821, (4) a cover 338 attached to the top surface of its circuit board or ball-grid-array (BGA) substrate 335, wherein a cavity in its cover 338 may accommodate each of its semiconductor integrated-circuit (IC) chips 811, 821 and 831 and each of its wirebonded wires 333 and (5) a plurality of solder balls 337 each attached to the bottommost one of the patterned metal layers of its circuit board or ball-grid-array (BGA) substrate 335.

Referring to FIGS. 5F and 5G, for the second type of optical input/output (I/O) module 801, its semiconductor integrated-circuit (IC) chip 811 may include (1) a semiconductor substrate 812, such as silicon substrate, (2) an insulating layer 813, such as a layer of silicon dioxide, on a top surface of the semiconductor substrate 812, (3) a film 814 of lithium niobate ($LiNbO_3$) on a top surface of the insulating layer 813, wherein the film 814 of lithium niobate ($LiNbO_3$) may include a planar bottom portion 815 on the top surface of the insulating layer 813 and two fins 816 substantially extending in parallel in a direction into the paper and protruding from a top surface of the planar bottom portion 815, (4) a patterned metal layer 817, such as gold layer, on the top surface of the planar bottom portion 815, wherein the patterned metal layer 817 may include three discrete metal sheets 817*a*, 817*b* and 817*c* with a gap between each neighboring two thereof accommodating one of the two fins 816 of the film 814 of lithium niobate ($LiNbO_3$), (5) an insulating dielectric layer 818, such as silicon dioxide, on the patterned metal layer 817 and the two fins 816 of the film 814 of lithium niobate ($LiNbO_3$), wherein the insulating dielectric layer 818 may have a portion in a gap between each of the two fins 816 of the film 814 of lithium niobate ($LiNbO_3$) of its semiconductor integrated-circuit (IC) chip 811 and each neighboring one of the three discrete metal sheets 817*a*, 817*b* and 817*c* of the patterned metal layer 817, and wherein three openings (only one shown) in the insulating dielectric layer 818 may be formed over the three discrete metal sheets 817*a*, 817*b* and 817*c* of the patterned metal layer 817, (6) a patterned metal layer 819, such as gold layer, on a top surface of the insulating dielectric layer 818, wherein the patterned metal layer 819 may include a first metal piece coupling to a middle one of the three discrete metal sheets of the patterned metal layer 816 through one of the three openings in the insulating dielectric layer 818 and a second metal piece (not shown) coupling to left and right ones of the three discrete metal sheets of the patterned metal layer 817 through two of the three openings in the insulating dielectric layer 818 respectively and (7) an insulating dielectric layer 820, such as silicon dioxide, on the patterned metal layer 819 and insulating dielectric layer 818, wherein two openings (not shown) in the insulating dielectric layer 820 may be formed over the first and second metal pieces of the patterned metal layer 819 respectively, and thereby two of its wirebonded wires 333 may be bonded onto the first and second metal pieces of the patterned metal layer 819 respectively to couple the first and second metal pieces of the patterned metal layer 819 to its semiconductor integrated-circuit (IC) chip 821. Thereby, for the second type of optical input/output (I/O) module 801, its semiconductor integrated-circuit (IC) chip 811 may be configured for modulating output optical signals into an optical carrier transmitted in the two fins 816 of the film 814 of lithium niobate ($LiNbO_3$) of its semiconductor integrated-circuit (IC) chip 811 by applying two electrical voltages V1 and V2, such as voltages of power supply and ground reference, to the first and second metal pieces of the patterned metal layer 819 of its semiconductor integrated-circuit (IC) chip 811 to horizontally deform the two fins 816 of the film 814 of lithium niobate ($LiNbO_3$) of its semiconductor integrated-circuit (IC) chip 811. The two fins 816 of the film 814 of lithium niobate ($LiNbO_3$) of its semiconductor integrated-circuit (IC) chip 811 may optically couple with one or a plurality of optical fibers 851.

Referring to FIGS. 5F and 5G, for the second type of optical input/output (I/O) module 801, its semiconductor integrated-circuit (IC) chip 821 is an optical driver configured for generating, in accordance with output electrical signals transmitted from the patterned metal layers of its circuit board or ball-grid-array (BGA) substrate 335 through one or more of its wirebonded wires 333, the two electrical voltages V1 and V2 to be applied to the first and second metal pieces of the patterned metal layer 818 of its semiconductor integrated-circuit (IC) chip 811 through said two of its wirebonded wires 333 respectively.

Referring to FIGS. 5F and 5G, for the second type of optical input/output (I/O) module 801, its semiconductor integrated-circuit (IC) chip 831 is a gallium-arsenide (GaAs) integrated-circuit (IC) chip used as an optical receiver configured for detecting or receiving input optical signals transmitted from one or a plurality of optical fibers 852 and transforming the input optical signals into input electrical signals to be transmitted to the patterned metal layers of its circuit board or ball-grid-array (BGA) substrate 335 through one or more of its wirebonded wires 333.

Specification for Sub-System Module or Unit

1. First Type of Sub-System Module or Unit

Figure 7A:
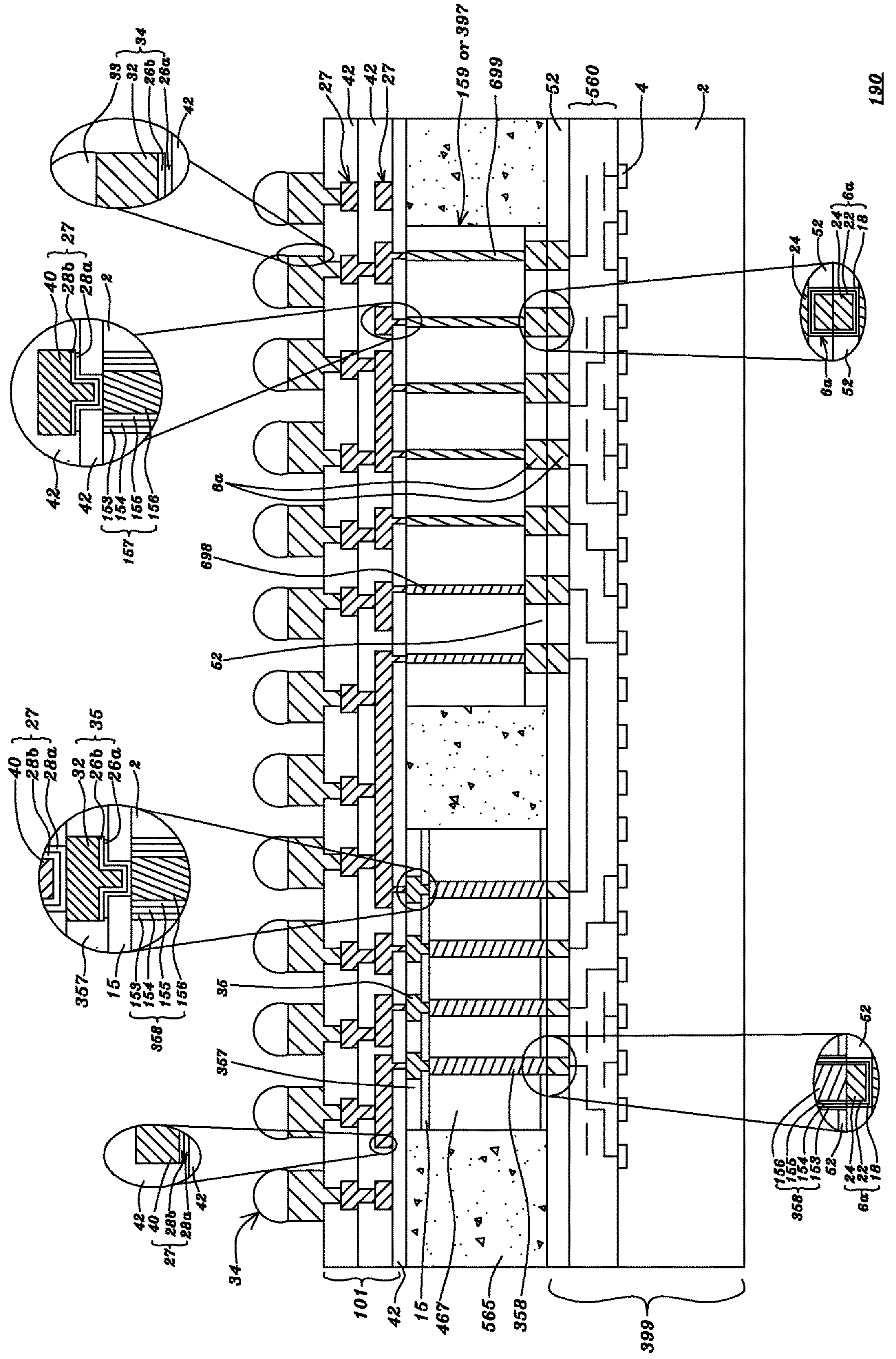
FIG. 7A is a schematically cross-sectional view showing a first type of sub-system module in accordance with an embodiment of the present application.

FIG. 7A is a schematically cross-sectional view showing a first type of sub-system module in accordance with an embodiment of the present application. Referring to FIG. 7A, a first type of sub-system module 190 may include an application specific integrated-circuit (ASIC) chip 399 having the same specification as the third type of semiconductor integrated-circuit (IC) chip 100 illustrated in FIG. 3C, wherein the application specific integrated-circuit (ASIC) chip 399 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example.

Referring to FIG. 7A, the first type of sub-system module 190 may include a memory module 159 having the same specification as the third type of memory module 159 illustrated in FIG. 5C to be bonded to its application specific integrated-circuit (ASIC) chip 399 using an oxide-to-oxide and metal-to-metal direct bonding method. The oxide-to-oxide and metal-to-metal direct bonding method may include (1) oxide-to-oxide bonding the insulating bonding layer 52 of its memory module 159 to the insulating bonding layer 52 of its application specific integrated-circuit (ASIC)

chip 399, and (2) metal-to-metal bonding, e.g., copper-to-copper bonding, the metal pads 6*a*, such as copper pads, of its memory module 159 to the metal pads 6*a*, such as copper pads, of its application specific integrated-circuit (ASIC) chip 399. The control chip 688 of its memory module 159 may have the semiconductor devices 4 such as transistors at the active surface of the semiconductor substrate 2 thereof as illustrated in FIG. 5C, and the active surface of the semiconductor substrate 2 of the control chip 688 of its memory module 159 may face an active surface of the semiconductor substrate 2 of its application specific integrated-circuit (ASIC) logic chip 399, wherein its application specific integrated-circuit (ASIC) logic chip 399 may have the semiconductor devices 4 such as transistors at the active surface of the semiconductor substrate 2 thereof as illustrated in FIG. 3C. Alternatively, its memory module 159 may be replaced with a known-good memory or application-specific-integrated-circuit (ASIC) chip 397, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, power-management integrated-circuit (IC) chip or analog integrated-circuit (IC) chip. For the first type of sub-system module 190, its known-good memory or application-specific-integrated-circuit (ASIC) chip 397 in case of replacing its memory module 159 may have the same specification as the third type of semiconductor integrated-circuit (IC) chip 100 illustrated in FIG. 3C, and may be bonded to its application specific integrated-circuit (ASIC) chip 399 using an oxide-to-oxide and metal-to-metal direct bonding method. The oxide-to-oxide and metal-to-metal direct bonding method may include (1) oxide-to-oxide bonding the insulating bonding layer 52 at the active side of its known-good memory or application-specific-integrated-circuit (ASIC) chip 397 to the insulating bonding layer 52 of its application specific integrated-circuit (ASIC) chip 399, and (2) metal-to-metal bonding, e.g., copper-to-copper bonding, the metal pads 6*a*, such as copper pads, at the active side of its known-good memory or application-specific-integrated-circuit (ASIC) chip 397 to the metal pads 6*a*, such as copper pads, of its application specific integrated-circuit (ASIC) chip 399. For the first type of sub-system module 190, its known-good memory or ASIC chip 397 in case of replacing its memory module 159 may have the semiconductor devices 4 such as transistors at the active surface of the semiconductor substrate 2 thereof as illustrated in FIG. 3C, and the active surface of the semiconductor substrate 2 of its known-good memory or ASIC chip 397 may face an active surface of the semiconductor substrate 2 of its application specific integrated-circuit (ASIC) logic chip 399, wherein its application specific integrated-circuit (ASIC) logic chip 399 may have the semiconductor devices 4 such as transistors at the active surface of the semiconductor substrate 2 thereof as illustrated in FIG. 3C. For the first type of sub-system module 190, its known-good memory or ASIC chip 397 may be used as the auxiliary and cooperating (AC) integrated-circuit (IC) chip for supporting and co-working with its application specific integrated-circuit (ASIC) logic chip 399.

Alternatively, for the first type of sub-system module 190, its memory module 159 may have the same specification as the first type of memory module 159 illustrated in FIG. 5A, its known-good memory or ASIC chip 397 in case of replacing its memory module 159 may have the same specification as the first type of semiconductor integrated-circuit chip 100 illustrated in FIG. 3A and its application specific integrated-circuit (ASIC) chip 399 may have the same specification as the first type of semiconductor integrated-circuit (IC) chip as illustrated in FIG. 3A, wherein its memory module 159, or known-good memory or ASIC chip 397 in case of replacing its memory module 159, may be provided with the first, second, third or fourth type of micro-bumps or micro-pads 34 each bonded to one of the first, second, third or fourth type of micro-bumps or micro-pads 34 of its application specific integrated-circuit (ASIC) chip 399 to form a bonded metal bump or contact 168 therebetween by a step for one of the first through fourth cases as illustrated in FIGS. 5A, 6A and 6B in which its memory module 159, or known-good memory or ASIC chip 397 in case of replacing its memory module 159, may be considered as the upper one of the memory chips 251 of the memory module 159 illustrated in FIGS. 5A, 6A and 6B, and its application specific integrated-circuit (ASIC) chip 399 may be considered as the lower one of the memory chips 251 or the control chip 688 of the memory module 159 illustrated in FIGS. 5A, 6A and 6B. In this case, the first type of sub-system module 190 may further include an underfill, e.g., polymer layer, between its memory module 159, or known-good memory or ASIC chip 397 in case of replacing its memory module 159, and application specific integrated-circuit (ASIC) chip 399, covering a sidewall of each of its bonded metal bumps or contacts 168 between its memory module 159, or known-good memory or ASIC chip 397 in case of replacing its memory module 159, and application specific integrated-circuit (ASIC) chip 399.

Referring to FIG. 7A, the first type of sub-system module 190 may include a vertical-through-via (VTV) connector 467 having the same specification as the third type of vertical-through-via (VTV) connector 467 illustrated in FIG. 4C to be turned upside down, provided with the insulating bonding layer 52 bonded to the insulating bonding layer 52 of its application specific integrated-circuit (ASIC) chip 399 by oxide-to-oxide bonding and the vertical through vias (VTVs) 358 bonded to the metal pads 6*a* of its application specific integrated-circuit (ASIC) chip 399 by metal-to-metal bonding, e.g., copper-to-copper bonding.

Referring to FIG. 7A, the first type of sub-system module 190 may include a polymer layer 565, e.g., resin or compound, on the insulating bonding layer 52 of its application specific integrated-circuit (ASIC) chip 399, wherein its polymer layer 565 has a portion between its memory module 159, or its known-good memory or ASIC chip 397 in case of replacing its memory module 159, and its vertical-through-via (VTV) connector 467, and its polymer layer 565 has a top surface coplanar to a top surface of its memory module 159, or a top surface of its known-good memory or ASIC chip 397 in case of replacing its memory module 159, and a top surface of its vertical-through-via (VTV) connector 467. Its polymer layer 565 may be, for example, polyimide, BenzoCycloButene (BCB), parylene, polybenzoxazole (PBO), epoxy-based material or compound, photo epoxy SU-8, elastomer, or silicone. For more elaboration, its polymer layer 565 may be, for example, photosensitive polyimide/PBO PIMEL™ supplied by Asahi Kasei Corporation, Japan, or epoxy-based molding compounds, resins or sealants provided by Nagase ChemteX Corporation, Japan.

Referring to FIG. 7A, for the first type of sub-system module 190, its memory module 159, or its known-good memory or ASIC chip 397 in case of replacing its memory module 159, may be ground or polished from the backside thereof such that the insulating lining layer 153, adhesion layer 154 and seed layer 155 of the topmost one of the memory chips 251 of its memory module 159 at the backside thereof, or the insulating lining layer 153, adhesion layer 154 and seed layer 155 of its known-good memory or ASIC chip 397 in case of replacing its memory module 159, may be removed. Thus, a top surface of the copper layer 32 of each of the micro-bumps or micro-pads 35 of its vertical-through-via (VTV) connector 467 and, optionally, a backside of the copper layer 156 of each of the through silicon vias (TSVs) 157 of the topmost one of the memory chips 251 of its memory module 159, or a backside of the copper layer 156 of each of the through silicon vias (TSVs) 157 of its known-good memory or ASIC chip 397 in case of replacing its memory module 159, may be coplanar to a top surface of the insulating dielectric layer 357 of its vertical-through-via (VTV) connector 467, a top surface of the semiconductor substrate 2 of the topmost one of the memory chips 251 of its memory module 159, or a top surface of the semiconductor substrate 2 of its known-good memory or ASIC chip 397 in case of replacing its memory module 159, and the top surface of its polymer layer 565. The insulating lining layer 153, adhesion layer 154 and seed layer 155 of each of the through silicon vias (TSVs) 157 of the topmost one of the memory chips 251 of its memory module 159, or the insulating lining layer 153, adhesion layer 154 and seed layer 155 of each of the through silicon vias (TSVs) 157 of its known-good memory or ASIC chip 397 in case of replacing its memory module 159, may be left at a sidewall of the copper layer 156 of each of the through silicon vias (TSVs) 157 of the topmost one of the memory chips 251 of its memory module 159, or a sidewall of the copper layer 156 of each of the through silicon vias (TSVs) 157 of its known-good memory or ASIC chip 397 in case of replacing its memory module 159.

Referring to FIG. 7A, the first type of sub-system module 190 may include a frontside interconnection scheme for a device (FISD) 101 on its memory module 159, or its known-good memory or ASIC chip 397 in case of replacing its memory module 159, its vertical-through-via (VTV) connector 467 and its polymer layer 565. For the first type of sub-system module 190, its frontside interconnection scheme for a device (FISD) 101 may include (1) one or more interconnection metal layers 27 coupling to the micro-bumps or micro-pads 35 of its vertical-through-via (VTV) connector 467 and the through silicon vias (TSVs) 157 of the memory chips 251 and control chip 688 of its memory module 159, or the through silicon vias (TSVs) 157 of its known-good memory or ASIC chip 397 in case of replacing its memory module 159, and (2) one or more polymer layers 42, i.e., insulating dielectric layers, each between neighboring two of the interconnection metal layers 27 of its frontside interconnection scheme for a device (FISD) 101, between a bottommost one of the interconnection metal layers 27 of its frontside interconnection scheme for a device (FISD) 101 and a planar surface composed of the top surface of the insulating dielectric layer 357 of its vertical-through-via (VTV) connector 467, the top surface of the semiconductor substrate 2 of the topmost one of the memory chips 251 of its memory module 159, or the top surface of the semiconductor substrate 2 of its known-good memory or ASIC chip 397 in case of replacing its memory module 159, and the top surface of its polymer layer 565, or on and above a topmost one of the interconnection metal layers 27 of its frontside interconnection scheme for a device (FISD) 101, wherein the topmost one of the interconnection metal layers 27 of its frontside interconnection scheme for a device (FISD) 101 may have multiple metal pads at bottoms of multiple openings 42*a* in the topmost one of the polymer layers 42 of its frontside interconnection scheme for a device (FISD) 101. Each of the interconnection metal layers 27 of its frontside interconnection scheme for a device (FISD) 101 may have the same specification as that of the second interconnection scheme 588 of the first type of semiconductor integrated-circuit (IC) chip 100 as illustrated in FIG. 3A, and each of the polymer layers 42 of its frontside interconnection scheme for a device (FISD) 101 may have the same specification as that of the second interconnection scheme 588 of the first type of semiconductor integrated-circuit (IC) chip 100 as illustrated in FIG. 3A. Each of the interconnection metal layers 27 of its frontside interconnection scheme for a device (FISD) 101 may extend horizontally across an edge of its memory module 159, or its known-good memory or ASIC chip 397 in case of replacing its memory module 159, and an edge of its vertical-through-via (VTV) connector 467.

Referring to FIG. 7A, the first type of sub-system module 190 may include multiple micro-bumps or micro-pads 34, which may be of one of the first through fourth types having the same specification as the first through fourth types of micro-bumps or micro-pillars 34 as illustrated in FIG. 3A respectively, each having the adhesion layer 26*a* formed on one of the metal pads of the topmost one of the interconnection metal layers 27 of its frontside interconnection scheme for a device (FISD) 101 at the bottoms of the openings 42*a* in the topmost one of the polymer layers 42 of its frontside interconnection scheme for a device (FISD) 101.

Referring to FIG. 7A, for the first type of sub-system module 190, each of the memory chips 251 and control chip 688 of its memory module 159, or its known-good memory or ASIC chip 397 in case of replacing its memory module 159, may have multiple small I/O circuits each coupling to one of multiple small I/O circuits of its application specific integrated-circuit (ASIC) chip 399 through, in sequence, one of the bonded metal pads 6*a* of its memory module 159, or its known-good memory or ASIC chip 397 in case of replacing its memory module 159, and one of the bonded metal pads 6*a* of its application specific integrated-circuit (ASIC) chip 399 for data transmission with a data bit width of equal to or greater than 64, 128, 256, 512, 1024, 2048, 4096, 8K, or 16K, wherein each of the small I/O circuits of each of the memory chips 251 and control chip 688 of its memory module 159, or its known-good memory or ASIC chip 397 in case of replacing its memory module 159, and each of the small I/O circuits of its application specific integrated-circuit (ASIC) chip 399 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Alternatively, each of the small I/O circuits of each of the memory chips 251 and control chip 688 of its memory module 159, or its known-good memory or ASIC chip 397 in case of replacing its memory module 159, and each of the small I/O circuits of its application specific integrated-circuit (ASIC) chip 399 may have an I/O power efficiency smaller than 0.5 pico-Joules per bit, per switch or per voltage swing, or between 0.01 and 0.5 pico-Joules per bit, per switch or per voltage swing. Further, its application specific integrated-circuit (ASIC) chip 399 may include multiple programmable logic cells (LC) 2014 therein each as seen in FIG. 1 and multiple configurable switches 379 therein each as seen in FIG. 2, employed for a hardware accelerator or machine-learning operator. Further, its memory module 159, or its known-good memory or ASIC chip 397 in case of replacing its memory module 159, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store a password or key and a cryptography block or circuit configured (1) to encrypt, in accordance with the password or key, configuration data transmitted from or stored in the memory cells 490 for the look-up tables (LUT) 210 of the programmable logic cells (LC) 2014 of its application specific integrated-circuit (ASIC) logic chip 399 or the memory cells 362 of the programmable switch cells 379 of its application specific integrated-circuit (ASIC) logic chip 399 as encrypted configuration data to be passed to its micro-bumps or micro-pads 34 and (2) to decrypt, in accordance with the password or key, encrypted configuration data from its micro-bumps or micro-pads 34 as decrypted configuration data to be passed to and stored in the memory cells 490 for the look-up tables (LUT) 210 of the programmable logic cells (LC) 2014 of its application specific integrated-circuit (ASIC) logic chip 399 or the memory cells 362 of the programmable switch cells 379 of its application specific integrated-circuit (ASIC) logic chip 399. Further, its memory module 159, or its known-good memory or ASIC chip 397 in case of replacing its memory module 159, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store configuration data therein to be passed to the memory cells 490 for the look-up tables (LUT) 210 of the programmable logic cells (LC) 2014 of its application specific integrated-circuit (ASIC) logic chip 399 to be stored therein for programming or configuring the programmable logic cells (LC) 2014 of its application specific integrated-circuit (ASIC) logic chip 399 or to the memory cells 362 of the programmable switch cells 379 of its application specific integrated-circuit (ASIC) logic chip 399 to be stored therein for programming or configuring the programmable switch cells 379 of its application specific integrated-circuit (ASIC) logic chip 399. Further, its memory module 159, or its known-good memory or ASIC chip 397 in case of replacing its memory module 159, may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its application specific integrated-circuit (ASIC) logic chip 399.

Referring to FIG. 7A, for the first type of sub-system module 190, each of the memory chips 251 and control chip 688 of its memory module 159, or its known-good memory or ASIC chip 397 in case of replacing its memory module 159, may have multiple large input/output (I/O) circuits each coupling to one of its micro-bumps or micro-pads 34 for signal transmission or power or ground delivery through the interconnection metal layers 27 of its frontside interconnection scheme for a device (FISD) 101, wherein each of the large input/output (I/O) circuits of each of the memory chips 251 and control chip 688 of its memory module 159, or its known-good memory or ASIC chip 397 in case of replacing its memory module 159, may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of each of the memory chips 251 and control chip 688 of its memory module 159, or its known-good memory or ASIC chip 397 in case of replacing its memory module 159, may have an I/O power efficiency greater than 3, 5 or 10 pico-Joules per bit, per switch or per voltage swing. Further, its application specific integrated-circuit (ASIC) logic chip 399 may have multiple large input/output (I/O) circuits each coupling to one of its micro-bumps or micro-pads 34 for signal transmission or power or ground delivery through, in sequence, one of the vertical through vias (VTVs) 358 of its vertical-through-via (VTV) connector 467, or one of the dedicated vertical bypasses 698 of its memory module 159 as illustrated in FIG. 5C, or one of the through silicon vias (TSVs) 157 of its known-good memory or ASIC chip 397 in case of replacing its memory module 159, and the interconnection metal layers 27 of its frontside interconnection scheme for a device (FISD) 101, wherein said one of the dedicated vertical bypasses 698 is not connected to any transistor of each of the memory chips 251 and control chip 688 of its memory module 159, or said one of the through silicon vias (TSVs) 157 is not connected to any transistor of its known-good memory or ASIC chip 397 in case of replacing its memory module 159, wherein each of the large input/output (I/O) circuits of its application specific integrated-circuit (ASIC) logic chip 399 may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of its application specific integrated-circuit (ASIC) logic chip 399 may have an I/O power efficiency greater than 3, 5 or 10 pico-Joules per bit, per switch or per voltage swing. One of the vertical interconnects 699 of its memory module 159 as illustrated in FIG. 5C, or one of the through silicon vias (TSVs) 157 of its known-good memory or ASIC chip 397 in case of replacing its memory module 159, may couple to one of its micro-bumps or micro-pads 34 through the interconnection metal layers 27 of its frontside interconnection scheme for a device (FISD) 101 and to its application specific integrated-circuit (ASIC) chip 399 through one of the metal pads 6*a* of the control chip 688 of its memory module 159 as seen in FIG. 5C, or one of the metal pads 6*a* of its known-good memory or ASIC chip 397 in case of replacing its memory module 159.

Referring to FIG. 7A, for the first type of sub-system module 190, each of the memory chips 251 and control chip 688 of its memory module 159, or its known-good memory or ASIC chip 397 in case of replacing its memory module 159, may be implemented using a semiconductor node or generation less advanced than or equal to, or above or equal to 20 nm, 30 nm, 40 nm, 50 nm, 90 nm, 130 nm, 250 nm, 350 nm or 500 nm; while its application specific integrated-circuit (ASIC) logic chip 399 may be implemented using a semiconductor node or generation more advanced than or equal to, or below or equal to 20 nm or 10 nm, and for example using a semiconductor node or generation of 16 nm, 14 nm, 12 nm, 10 nm, 7 nm, 5 nm, 3 nm or 2 nm. The semiconductor technology node or generation used in each of the memory chips 251 and control chip 688 of its memory module 159, or its known-good memory or ASIC chip 397 in case of replacing its memory module 159, may be 1, 2, 3, 4, 5 or greater than 5 nodes or generations older, more matured or less advanced than that used in its application specific integrated-circuit (ASIC) logic chip 399. Transistors used in each of the memory chips 251 and control chip 688 of its memory module 159, or its known-good memory or ASIC chip 397 in case of replacing its memory module 159, may be provided with fully depleted silicon-on-insulator (FDSOI) metal-oxide-semiconductor field effect transistors (MOSFETs), partially depleted silicon-on-insulator (PD-SOI) MOSFETs or a planar MOSFETs. Transistors used in each of the memory chips 251 and control chip 688 of its memory module 159, or its known-good memory or ASIC chip 397 in case of replacing its memory module 159, may be different from that used in its application specific integrated-circuit (ASIC) logic chip 399; each of the memory chips 251 and control chip 688 of its memory module 159, or its known-good memory or ASIC chip 397 in case of replacing its memory module 159, may use planar MOSFETs, while its application specific integrated-circuit (ASIC) logic chip 399 may use fin field effect transistors (FINFETs) or gate-all-around field effect transistors (GAAFETs). A power supply voltage (Vcc) applied in each of the memory chips 251 and control chip 688 of its memory module 159, or its known-good memory or ASIC chip 397 in case of replacing its memory module 159, may be greater than or equal to 1.5, 2.0, 2.5, 3, 3.3, 4, or 5 voltages, while a power supply voltage (Vcc) applied in its application specific integrated-circuit (ASIC) logic chip 399 may be smaller than or equal to 1.8, 1.5 or 1 voltage. The power supply voltage applied in each of the memory chips 251 and control chip 688 of its memory module 159, or its known-good memory or ASIC chip 397 in case of replacing its memory module 159, may be higher than that applied in its application specific integrated-circuit (ASIC) logic chip 399. A gate oxide of a field effect transistor (FET) of each of the memory chips 251 and control chip 688 of its memory module 159, or its known-good memory or ASIC chip 397 in case of replacing its memory module 159, may have a physical thickness greater than or equal to 5 nm, 6 nm, 7.5 nm, 10 nm, 12.5 nm, or 15 nm, while a gate oxide of a field effect transistor (FET) of its application specific integrated-circuit (ASIC) logic chip 399 may have a physical thickness less than 4.5 nm, 4 nm, 3 nm or 2 nm. The thickness of the gate oxide of the field effect transistor (FET) of each of the memory chips 251 and control chip 688 of its memory module 159, or its known-good memory or ASIC chip 397 in case of replacing its memory module 159, may be greater than that of its application specific integrated-circuit (ASIC) logic chip 399.

For more elaboration, referring to FIG. 7A, for the first type of sub-system module 190, its known-good memory or ASIC chip 397 in case of replacing its memory module 159 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in an old technology node when its application specific integrated-circuit (ASIC) logic chip 399 is redesigned using a new technology node or for new application. Alternatively, its known-good memory or ASIC chip 397 in case of replacing its memory module 159 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in a new technology node when its application specific integrated-circuit (ASIC) logic chip 399 is redesigned using the new technology node for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example. Alternatively, each of the memory chips 251 and control chip 688 of its memory module 159, or its known-good memory or ASIC chip 397 in case of replacing its memory module 159, may use an old technology node to cooperate with its application specific integrated-circuit (ASIC) logic chip 399 manufactured using a new technology node. Alternatively, each of the memory chips 251 and control chip 688 of its memory module 159, or its known-good memory or ASIC chip 397 in case of replacing its memory module 159, may use an old technology node to cooperate with its application specific integrated-circuit (ASIC) logic chip 399 for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example. Alternatively, a technology process for forming its known-good memory or ASIC chip 397 in case of replacing its memory module 159 may not be compatible to that for forming its application specific integrated-circuit (ASIC) logic chip 399, wherein its known-good memory or ASIC chip 397 may be a high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip.

2. Second Type of Sub-System Module or Unit

Figure 7B:
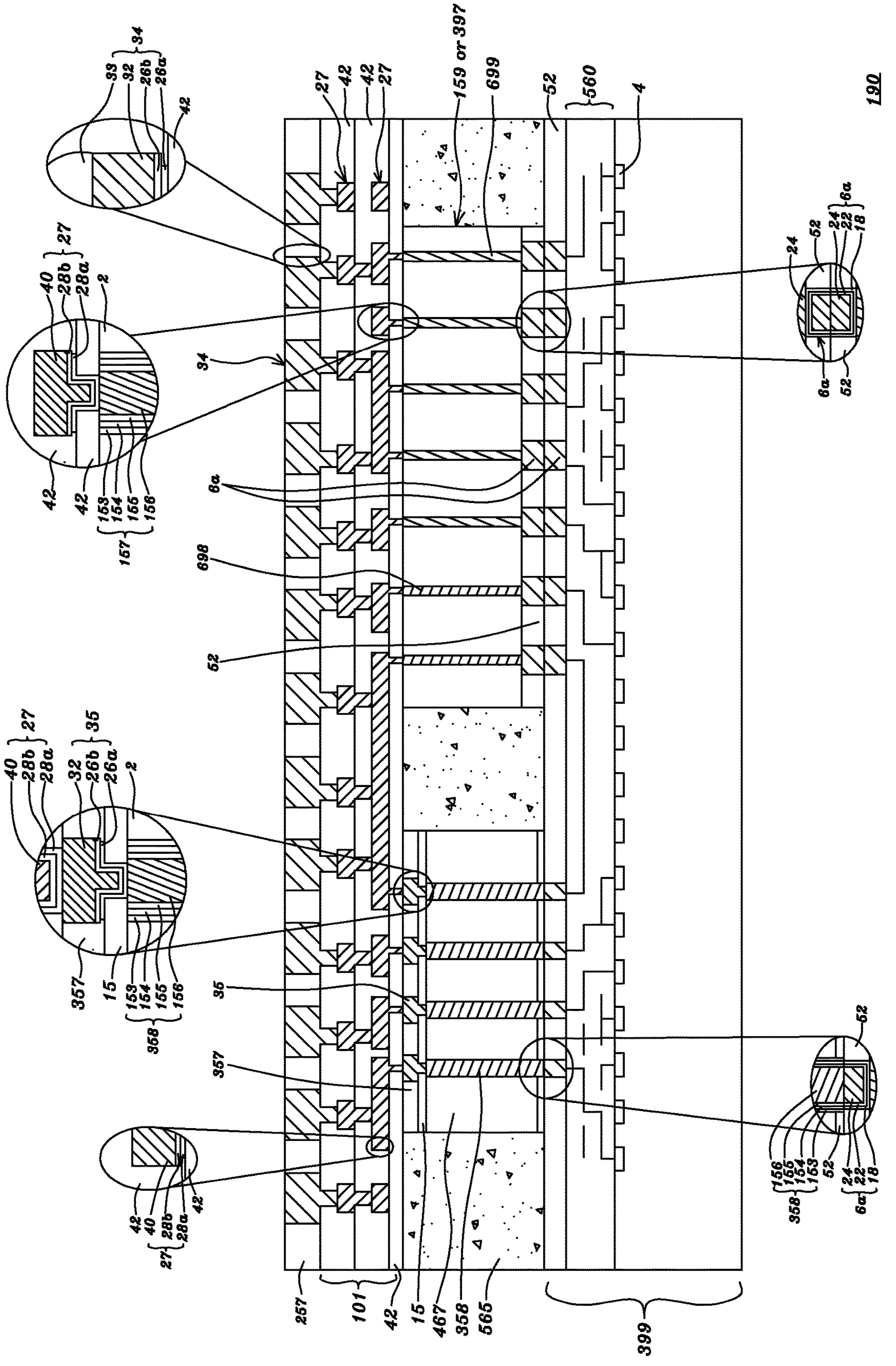
FIG. 7B is a schematically cross-sectional view showing a second type of sub-system module in accordance with an embodiment of the present application.

FIG. 7B is a schematically cross-sectional view showing a second type of sub-system module in accordance with an embodiment of the present application. Referring to FIG. 7B, a second type of sub-system module 190 may have a similar structure to the first type of sub-system module 190 illustrated in FIG. 7A. For an element indicated by the same reference number shown in FIGS. 7A and 7B, the specification of the element as seen in FIG. 7B may be referred to that of the element as illustrated in FIG. 7A. The difference between the first and second types of sub-system modules 190 is that the second type of sub-system module 190 may further include an insulating dielectric layer 257, such as polymer layer, on the topmost one of the polymer layers 42 of its frontside interconnection scheme for a device (FISD) 101. For the second type of sub-system module 190, its micro-bumps or micro-pads 34 may be of the first type as illustrated in FIGS. 3A and 7A, and its insulating dielectric layer 257 may cover a sidewall of the copper layer 32 of each of its first type of micro-bumps or micro-pads 34, wherein its insulating dielectric layer 257 may have a top surface coplanar to a top surface of the copper layer 32 of each of its first type of micro-bumps or micro-pads 34, wherein its insulating dielectric layer 257 may be, for example, polyimide, BenzoCycloButene (BCB), parylene, polybenzoxazole (PBO), epoxy-based material or compound, photo epoxy SU-8, elastomer, or silicone; its insulating dielectric layer 257 may be, for example, photosensitive polyimide/PBO PIMEL™ supplied by Asahi Kasei Corporation, Japan, or epoxy-based molding compounds, resins or sealants provided by Nagase ChemteX Corporation, Japan.

First Type of Micro Heat Pipe or Micro Heat Transfer Component

Specification for Heat-Transfer Mechanism for First Type of Micro Heat Pipe

Figure 8:
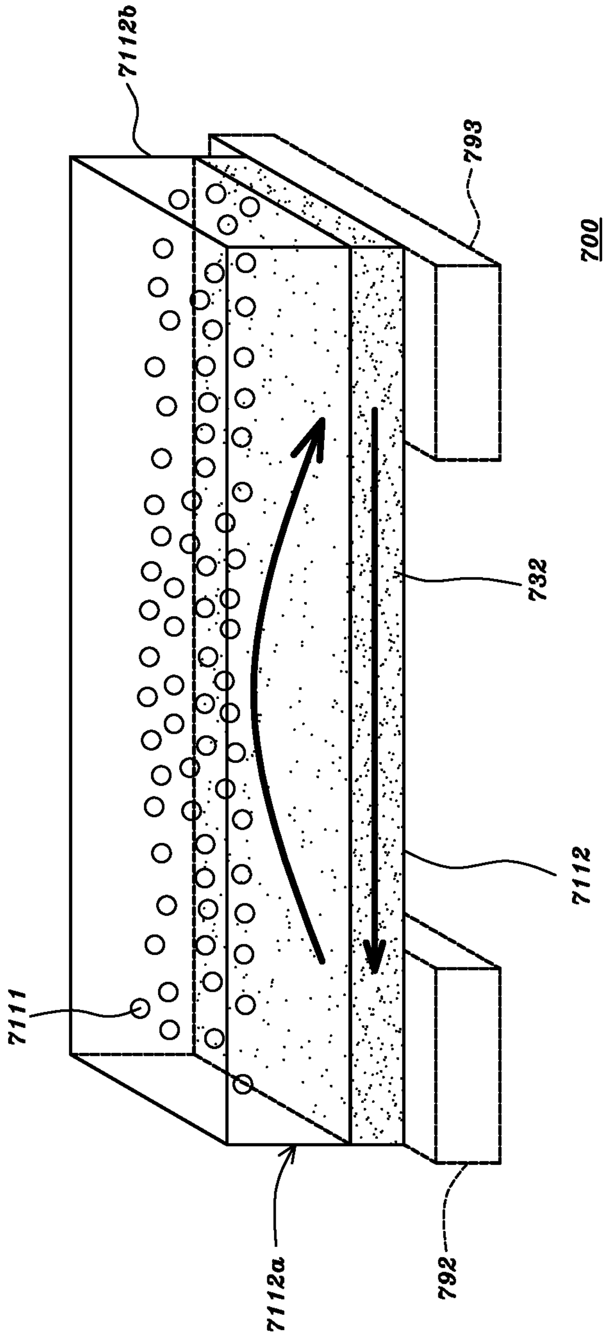
FIG. 8 is a schematically perspective view showing a heat-transfer mechanism for a first type of micro heat pipe in accordance with an embodiment of the present application.

FIG. 8 is a schematically perspective view showing a heat-transfer mechanism for a first type of micro heat pipe in accordance with an embodiment of the present application. Referring to FIG. 8, the first type of micro heat pipe 700 may be formed of copper or aluminum and with a chamber 7112 therein extending in a horizontal direction, and (2) a liquid 732 such as water, ethanol, methanol or a solution containing the above-mentioned materials sealed in the chamber 7112 and adapted to flow at an inner bottom side of the chamber 7112. The first type of micro heat pipe 700 may have a first end 7112*a* mounted to a hot region 792, where heat may be generated by a heat source such as semiconductor integrated-circuit chip, to absorb heat from the hot region 792 and a second end 7112*b* mounted to a cold region 793 to release heat to the cold region 793. Thereby, for the first type of micro heat pipe 700, its liquid 732 flowing at the inner bottom side of its chamber 7112 from its second end 7112*b* to its first end 7112*a* may be heated at its first end 7112*a* to absorb the heat from the hot region 792 such that its liquid 732 at its first end 7112*a* may have a relatively high vapor pressure to be vaporized into a vapor 7111 at an inner top side of its chamber 7112 and over its liquid 732. The vapor 7111 may flow at the inner top side of its chamber 7112 from its first end 7112*a* to its second end 7112*b* due to a difference between the vapor pressures of the liquid 732 at its first and second ends 7112*a* and 7112*b*. The vapor 7111 flowing from its first end 7112*a* to its second end 7112*b* may be condensed into the liquid 732 at its second end 7112*b*, and the heat contained in the vapor 7111 and liquid 732 at its second end 7112*b* may be released to the cold region 793. Hereby, heat may be transferred from the hot region 792 to the cold region 793.

Various Skeletons for First Type of Micro Heat Pipe

Specification for First Type of Skeleton for First Type of Micro Heat Pipe

Figures 1, 9A:
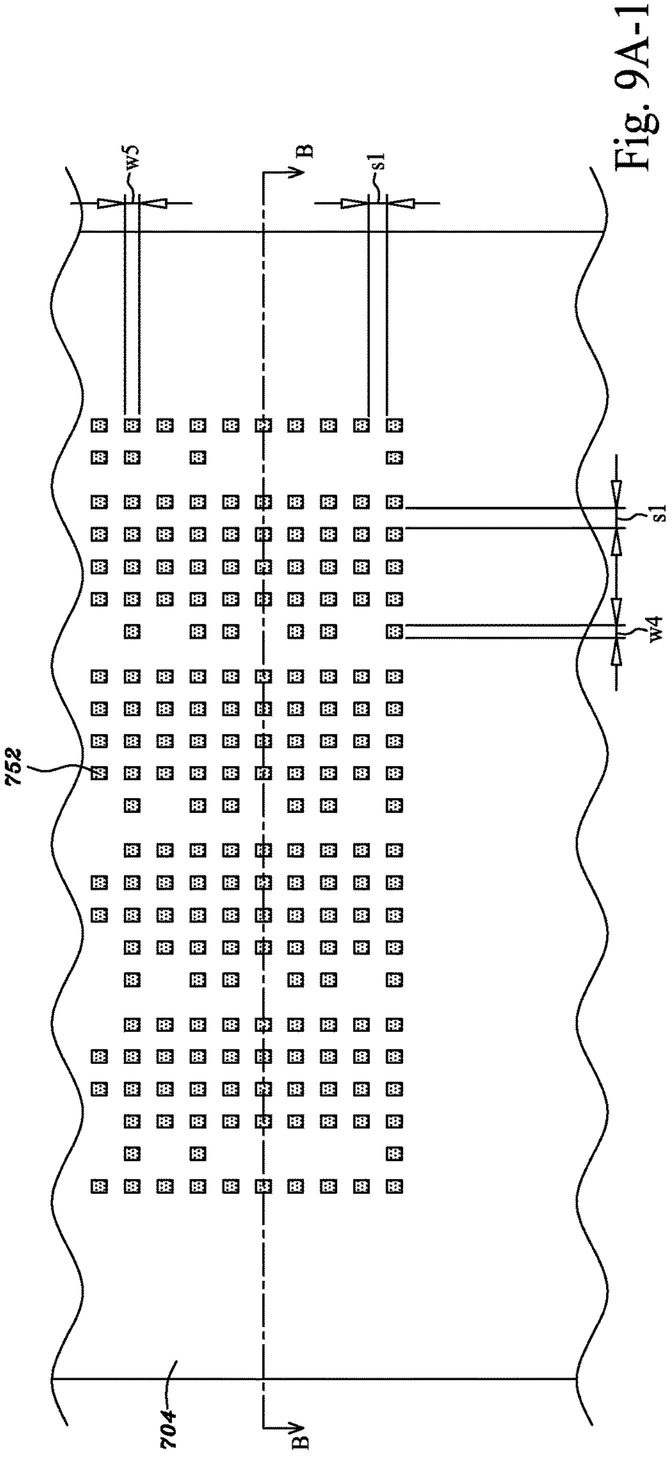
FIGS. 9A-9D are schematically cross-sectional views showing a process for fabricating a first type of skeleton for a first type of micro heat pipe in accordance with an embodiment of the present application.
Figure 9A:
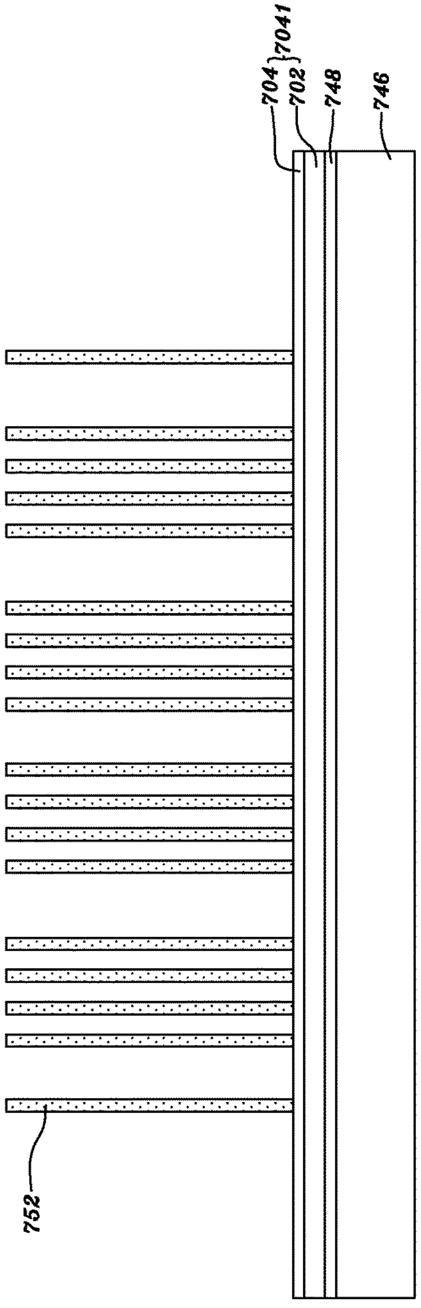
Figure 9B:
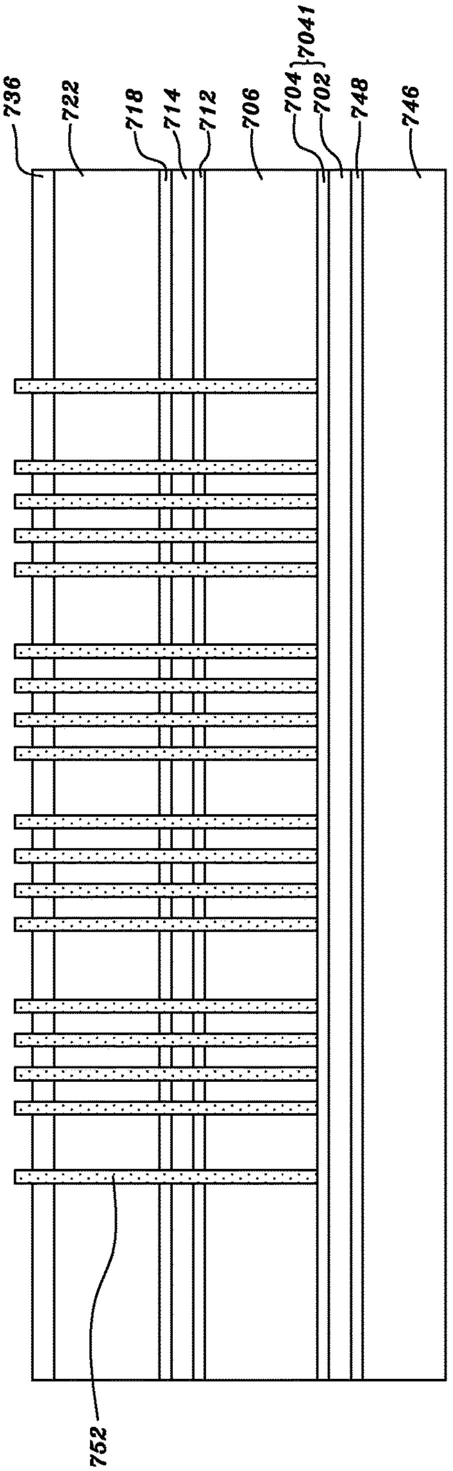
Figure 9C:
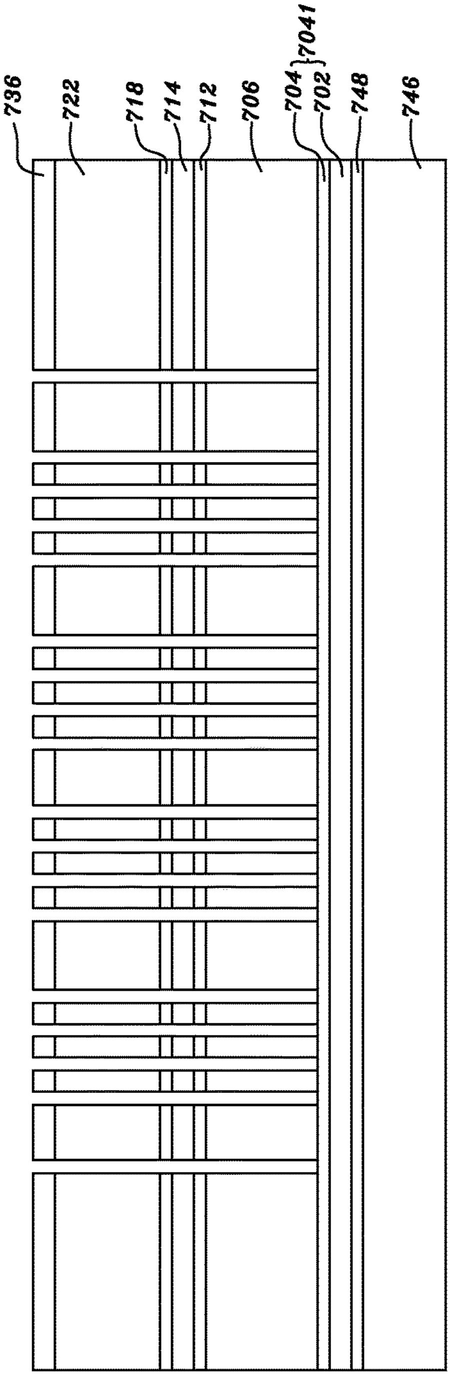
Figures 1, 9D:
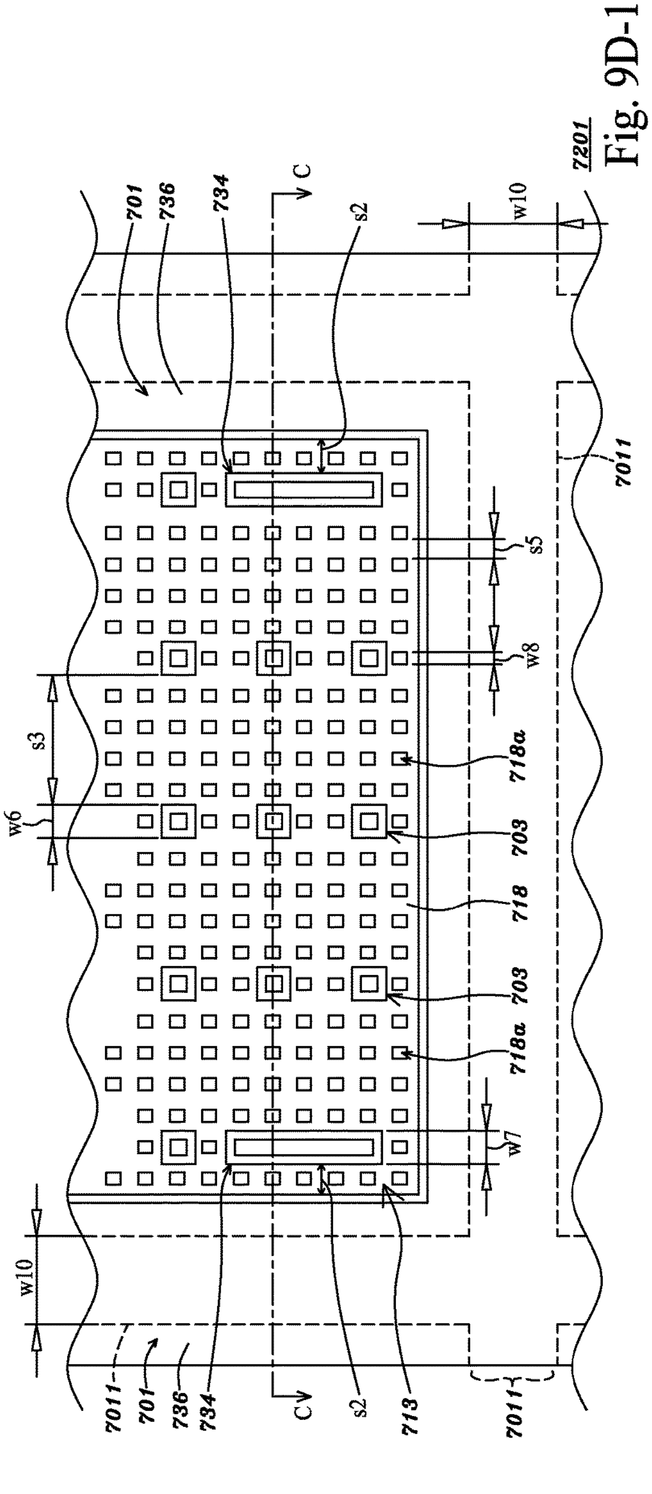
Figure 9D:
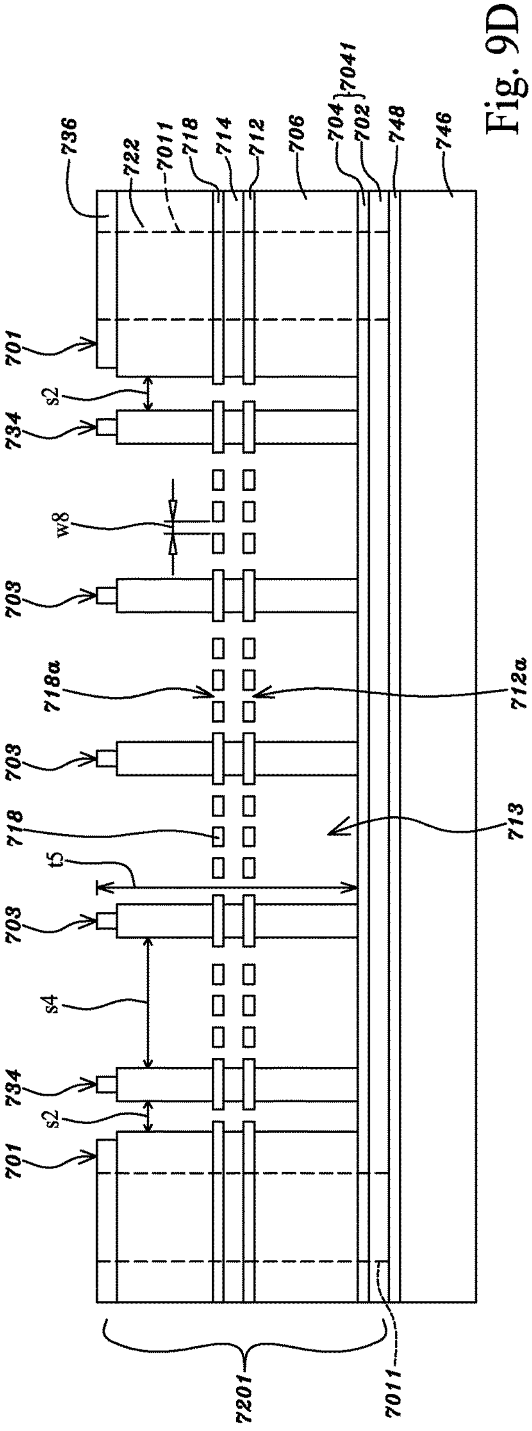

FIGS. 9A-9D are schematically cross-sectional views showing a process for fabricating a first type of skeleton for a first type of micro heat pipe in accordance with an embodiment of the present application. FIGS. 9A-1 and 9D-1 are schematically top views showing steps illustrated in FIGS. 9A and 9D for a process for fabricating a first type of skeleton for a first type of micro heat pipe in accordance with an embodiment of the present application, wherein FIG. 9A is a schematically cross-sectional view cut along a cross-sectional line B-B in FIG. 9A-1 and FIG. 9D is a schematically cross-sectional view cut along a cross-sectional line C-C in FIG. 9D-1. Referring to FIGS. 9A and 9A-1, a metal plate 702, such as copper foil or layer having a thickness between and including 5 and 100 micrometers, may be laminated on a temporary substrate 746 using a glue layer 748, wherein the temporary substrate 746 may be a silicon wafer or substrate, glass panel or substrate, ceramic substrate, plastic substrate or metal substrate. Next, a metal layer 704 of nickel, silver, cobalt, iron, or chromium with a thickness between and including 0.1 and 5 micrometers may be electroplated on the metal plate 702. The metal plate 702 and metal layer 704 are formed for a bottom metal plate 7041 of a first type of skeleton. Next, a photoresist layer 752 having a high aspect ratio may be laminated or spin coated with a thickness between and including 20 and 800 micrometers on the metal layer 704 and then patterned with multiple rectangular posts, each of which may have a width w4 between and including 1 and 10 micrometers, 2 and 50 micrometers or 10 and 100 micrometers and a length w5 between and including 1 and 10 micrometers, 2 and 50 micrometers or 10 and 100 micrometers, using a photolithography process, i.e., exposure and developing processes, to expose a first area of the metal layer 704, wherein the length w5 of each of the rectangular posts of the photoresist layer 752 may be equal to or greater than the width w4 of said each of the rectangular posts. A space s1 between neighboring two of the rectangular posts of the photoresist layer 752 in each of width and length directions may be between and including 1 and 30 micrometers.

Next, referring to FIG. 9B, a metal layer 706 of copper having a thickness between and including 5 and 50 micrometers may be electroplated on the first area of the metal layer 704 not covered by the photoresist layer 752. Next, a metal layer 712 of nickel, silver, cobalt, iron, or chromium having a thickness between and including 0.1 and 2 micrometers or 0.1 and 3 micrometers may be electroplated on the metal layer 706 not covered by the photoresist layer 752. Next, a metal layer 714 of copper having a thickness between and including 0.5 and 5 micrometers may be electroplated on the metal layer 712 not covered by the photoresist layer 752. Next, a metal layer 718 of nickel, silver, cobalt, iron, or chromium having a thickness between and including 0.1 and 5 micrometers or 0.1 and 3 micrometers may be electroplated on the metal layer 714 not covered by the photoresist layer 752. Next, a metal layer 722 of copper having a thickness between and including 50 and 800 micrometers may be electroplated on the metal layer 718 not covered by the photoresist layer 752. Next, a solder layer 736 of a tin-containing alloy having a thickness between and including 5 and 50 micrometers may be electroplated on the metal layer 722 not covered by the photoresist layer 752.

Next, referring to FIG. 9C, the photoresist layer 752 may be stripped to expose multiple second areas of the metal layer 704 not under the metal layer 706 to form multiple openings each in the metal layers 706, 712, 714, 718 and 722 and solder layer 736 and over one of the second areas of the metal layer 704.

Next, referring to FIGS. 9D and 9D-1, the metal layers 706, 714 and 722 of copper may be partially removed from the sidewalls of the openings in the metal layers 706, 714 and 722 by between 5 and 30 micrometers using a wet etching process with a solution containing water, $NH_3$ and CuO to form a cut recessed from the metal layers 712 and 718 such that multiple metal posts 703 of the first type of skeleton 7201 may be formed each with a first piece of each of the metal layers 706, 714 and 722 and a first piece of each of the metal layers 712 and 718 aligned with the first piece of each of the metal layers 706, 714 and 722, multiple metal guides 734 of the first type of skeleton 7201 may be formed each with a second piece of each of the metal layers 706, 714 and 722 and a second piece of each of the metal layers 712 and 718 aligned with the second piece of each of the metal layers 706, 714 and 722, and multiple partitioning walls 701 of the first type of skeleton may be formed each with a third piece of each of the metal layers 706, 714 and 722 and a third piece of each of the metal layers 712 and 718 aligned with the third piece of each of the metal layers 706, 714 and 722. Thereby, the partitioning walls 701 and bottom metal plate 7041 of the first type of skeleton 7201 may form multiple cavities 713 in the first type of skeleton 7201. Multiple openings 712*a* or 718*a* may be formed in each of the metal layers 712 and 718 such that each of the metal layers 712 and 718 is shaped like a metal mesh or net, wherein each of the openings 712*a* in the metal layer 712 may be aligned with one of the openings 718*a* in the metal layer 718. Next, the solder layer 736 may be partially removed using a wet etching process with concentrated nitric acid to be formed with (1) multiple first pieces each on one of the metal posts 703 of the first type of skeleton 7201 and with a sidewall recessed from a sidewall of the metal layer 722 of said one of the metal posts 703, (2) multiple second pieces each on one of the metal guides 734 of the first type of skeleton and with a sidewall recessed from a sidewall of the metal layer 722 of said one of the metal guides 734, and (3) multiple third pieces each on one of the partitioning walls 701 of the first type of skeleton 7201 and with a sidewall recessed from a sidewall of the metal layer 722 of said one of the partitioning walls 701. Next, an oxidation treatment may be performed for an exposed surface of the metal layers 704, 718 and 712.

Referring to FIGS. 9D and 9D-1, for the first type of skeleton 7201, the first piece of each of the metal layers 706, 714 and 722 for each of its metal posts 703 may have a width w6 between 20 and 200 micrometers. The second piece of each of the metal layers 706, 714 and 722 for each of its metal guides 734 may have a width w7 between 20 and 200 micrometers. Each of its partitioning walls 701 may have a scribe line 7011 extending along said each of its partitioning walls 701, wherein the scribe line 7011 may have a width w10 between 50 and 1000 micrometers reserved to be cut in the following process to fabricate a plurality of first type of micro heat pipes. A space s3 from the first piece of each of the metal layers 706, 714 and 722 for each of its metal posts 703 to the first piece of said each of the metal layers 706, 714 and 722 for another of its metal posts 703 neighboring said each of its metal posts 703 may be between 100 and 500 micrometers. A space s4 from the second piece of each of the metal layers 706, 714 and 722 for one of its metal guides 734 to the first piece of said each of the metal layers 706, 714 and 722 for one of its metal posts 703 neighboring said one of its metal guides 734 may be between 100 and 500 micrometers. Each of the openings 712*a* or 718*a* in each of the metal layers 712 and 718 for each of its metal meshes or nets may have a width w8 between and including 1 and 10 micrometers, 2 and 50 micrometers or 10 and 100 micrometers. A space s5 between neighboring two of the openings 712*a* or 718*a* in each of the metal layers 712 and 718 for each of its metal meshes or nets may be between and including 1 and 30 micrometers. A space s2 from the second piece of each of the metal layers 706, 714 and 722 for one of its metal guides 734 to the third piece of said each of the metal layers 706, 714 and 722 for one of its partitioning walls 701 neighboring said one of its metal guides 734 may be less than 20 or 30 micrometers or between 3 and 30 micrometers, and the space s2 may be used as a vertical liquid capillary or channel for liquid flow vertically by capillary effect or surface tension. The metal layer 702 for its bottom metal plate 7041 may have a thickness between and including 5 and 100 micrometers. The metal layer 704 for its bottom metal plate 7041 may have a thickness between and including 0.1 and 5 micrometers. The metal layer 706 for each of its metal posts 703, each of its metal guides 734 and each of its partitioning walls 701 may have a thickness between and including 5 and 50 micrometers to hold a space between the metal layer 712 for a lower one of its two metal meshes or nets and its bottom metal plate 7041 with a vertical distance therebetween that may be between and including 5 and 50 micrometers. The metal layer 712 for each of its metal posts 703, each of its metal guides 734 and each of its partitioning walls 701 may have a thickness between and including 0.1 and 2 micrometers or 0.1 and 3 micrometers, wherein the metal layer 712 intersects each of its metal posts 703, metal guides 734 and partitioning walls 701 to divide each of its metal posts 703, metal guides 734 and partitioning walls 701 into top and bottom portions. The metal layer 714 for each of its metal posts 703, each of its metal guides 734 and each of its partitioning walls 701 may have a thickness between and including 0.5 and 5 micrometers to hold a space between the metal layers 712 and 718 for its two metal meshes or nets with a vertical distance therebetween that may be between and including 0.5 and 5 micrometers. The metal layer 718 for each of its metal posts 703, each of its metal guides 734 and each of its partitioning walls 701 may have a thickness between and including 0.1 and 5 micrometers or 0.1 and 3 micrometers, wherein the metal layer 718 intersects each of its metal posts 703, metal guides 734 and partitioning walls 701 to divide each of its metal posts 703, metal guides 734 and partitioning walls 701 into top and bottom portions. The metal layer 722 for each of its metal posts 703, each of its metal guides 734 and each of its partitioning walls 701 may have a thickness between and including 50 and 800 micrometers. The solder layer 736 on each of its metal posts 703, each of its metal guides 734 and each of its partitioning walls 701 may have a thickness between and including 5 and 50 micrometers. Each of its metal posts 703, metal guides 734 and partitioning walls 701 may have a total vertical thickness t5 between and including 60 and 900 micrometers. Its bottom metal plate 7041 may have a thickness between and including 5 and 100 micrometers.

Specification for Second Type of Skeleton for First Type of Micro Heat Pipe

Figures 1, 10A:
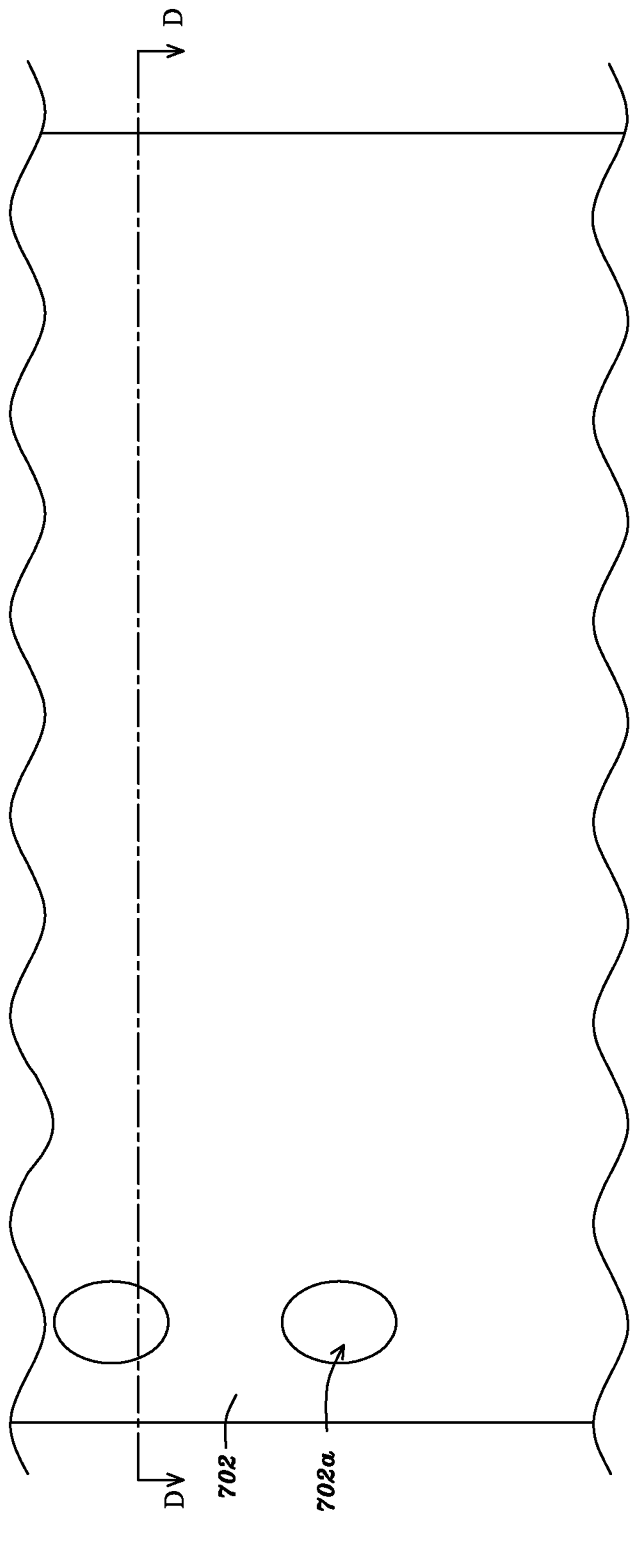
FIGS. 10A-10E are schematically cross-sectional views showing a process for fabricating a second type of skeleton for a first type of micro heat pipe in accordance with an embodiment of the present application.
Figure 10A:
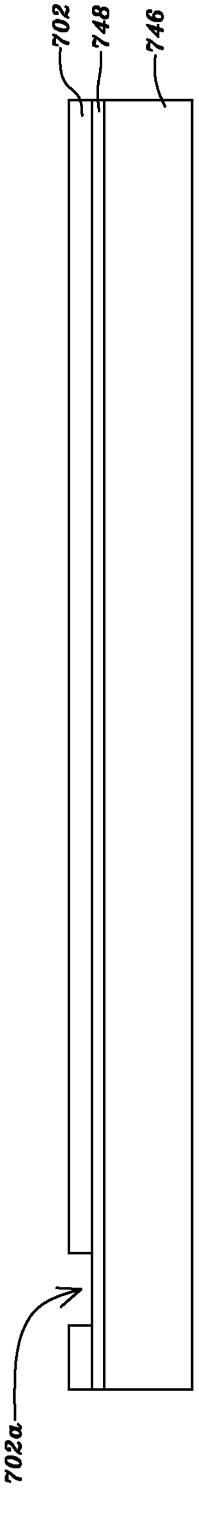
Figures 1, 10B:
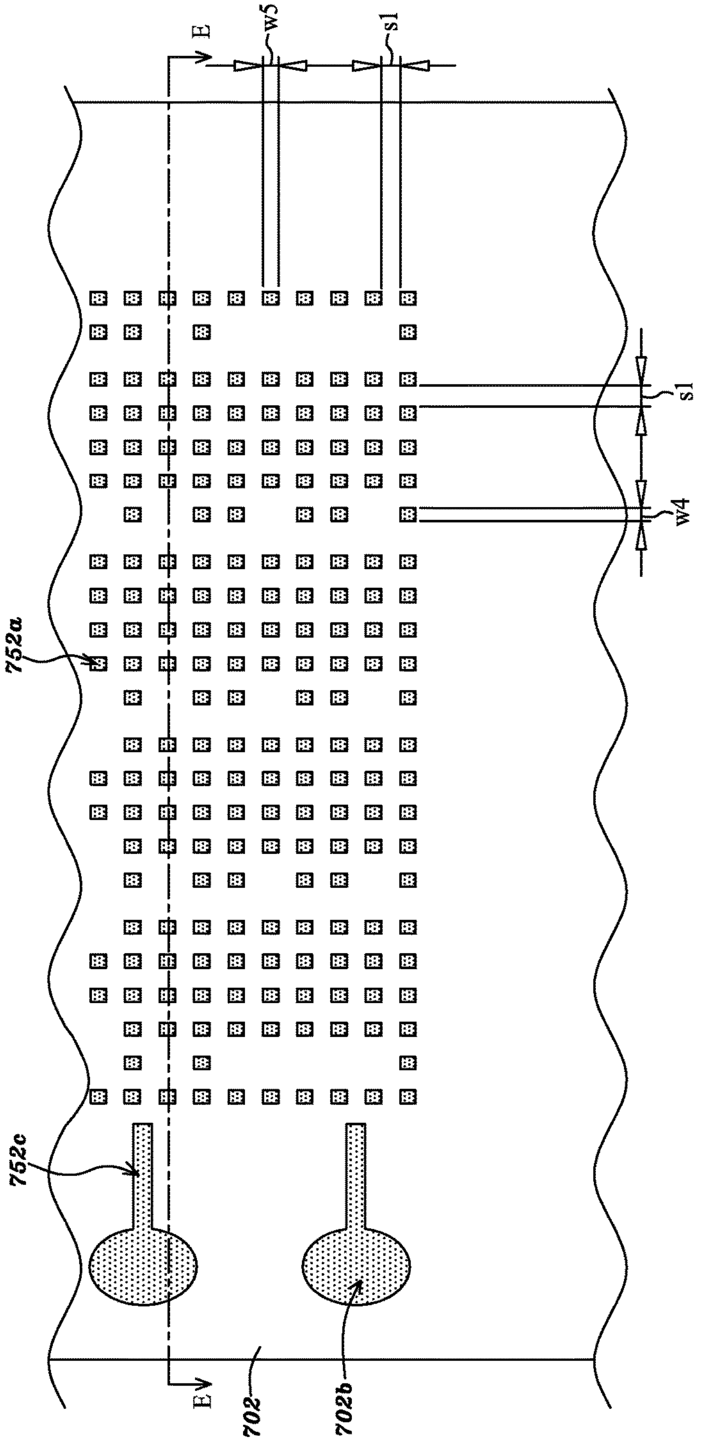
Figure 10B:
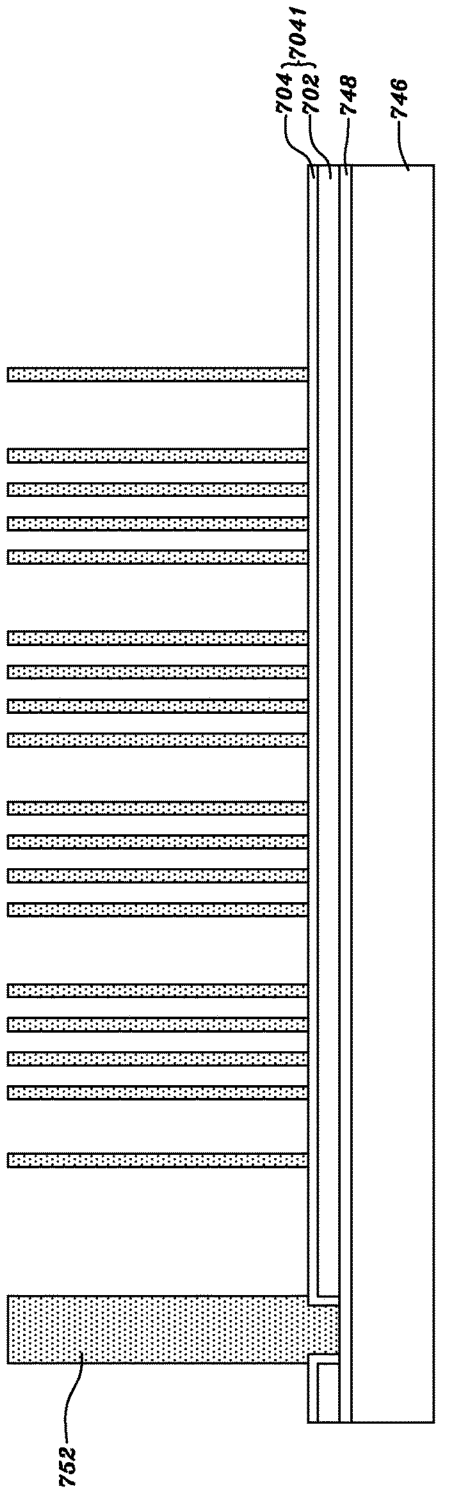
Figure 10C:
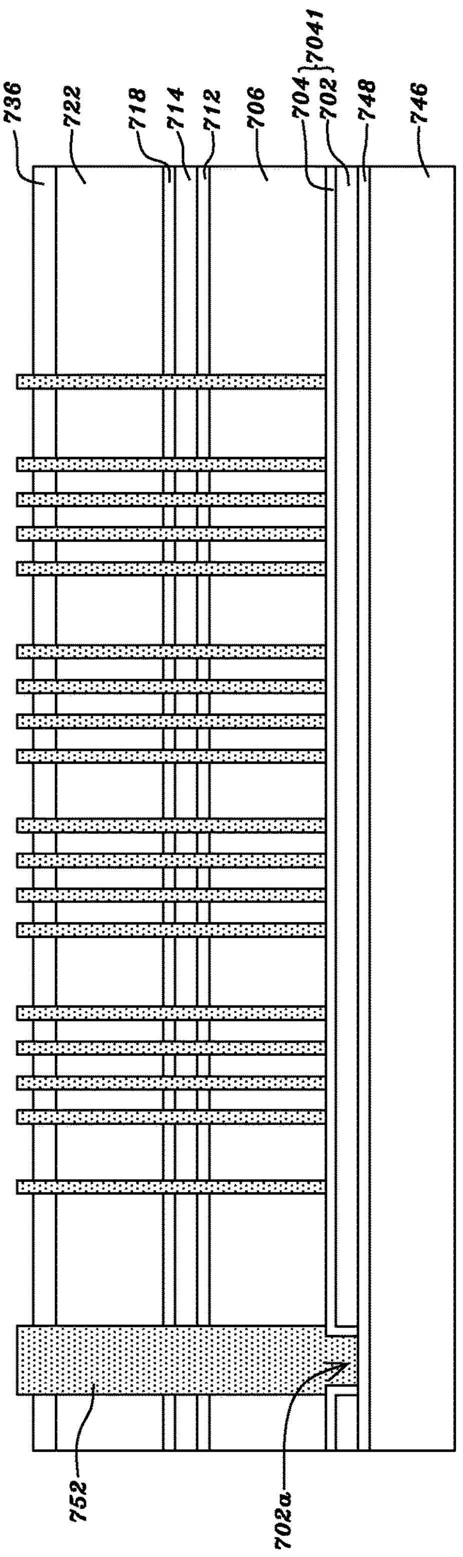
Figure 10D:
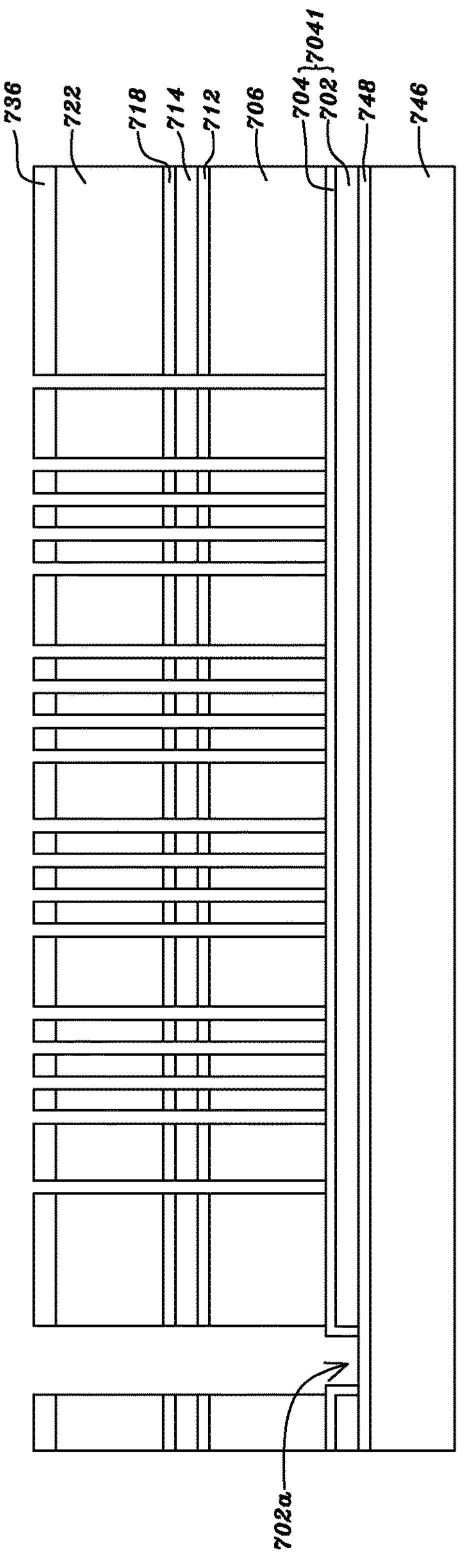
Figures 1, 10E:
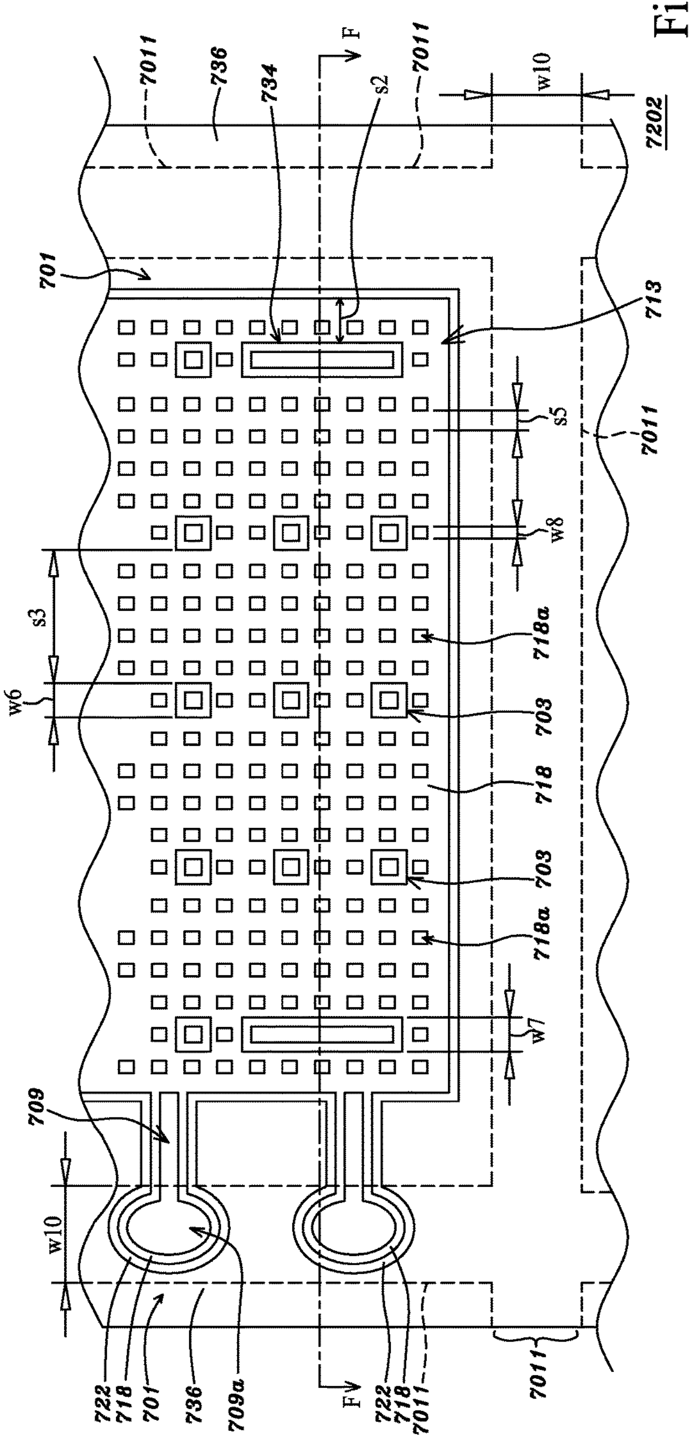
Figure 10E:
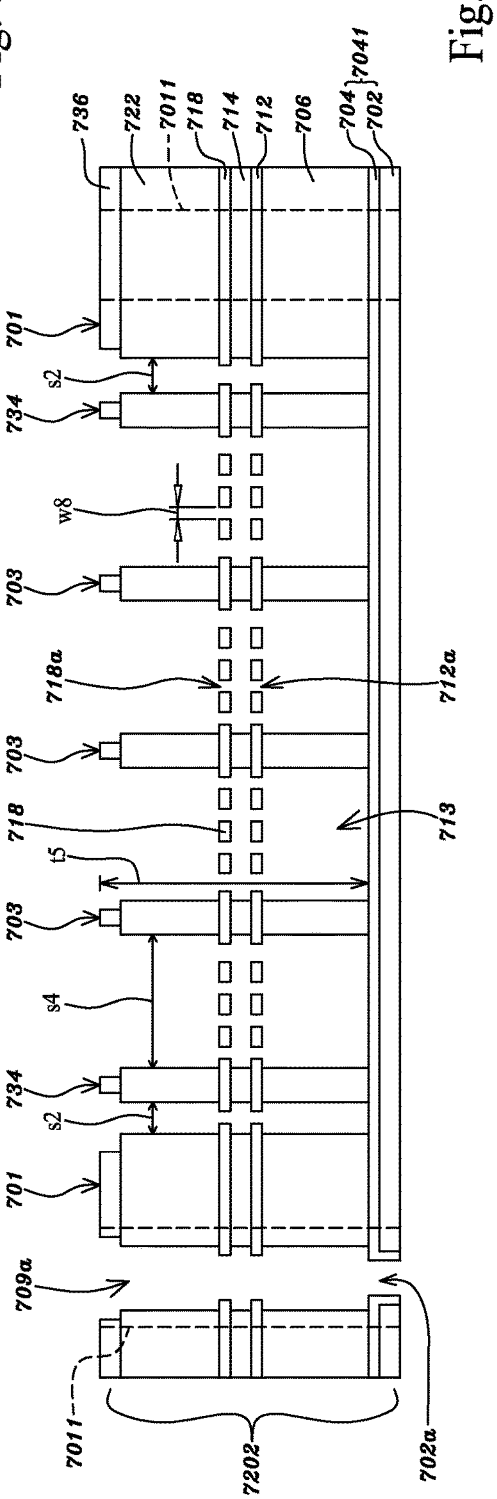

FIGS. 10A-10E are schematically cross-sectional views showing a process for fabricating a second type of skeleton for a first type of micro heat pipe in accordance with an embodiment of the present application. FIGS. 10A-1, 10B-1 and 10E-1 are schematically top views showing steps illustrated in FIGS. 10A, 10B and 10E for a process for fabricating a second type of skeleton for a first type of micro heat pipe in accordance with an embodiment of the present application, wherein FIG. 10A is a schematically cross-sectional view cut along a cross-sectional line D-D in FIG. 10A-1, FIG. 10B is a schematically cross-sectional view cut along a cross-sectional line E-E in FIG. 10B-1 and FIG. 10E is a schematically cross-sectional view cut along a cross-sectional line F-F in FIG. 10E-1. For an element indicated by the same reference number shown in FIGS. 9A-9D, 9A-1, 9D-1, 10A-10E, 10A-1, 10B-1 and 10E-1, the specification of the element as seen in FIGS. 10A-10E, 10A-1, 10B-1 and 10E-1 may be referred to that of the element as illustrated in FIGS. 9A-9D, 9A-1 and 9D-1. Referring to FIGS. 10A and 10A-1, a metal plate 702, such as copper foil or layer having a thickness between and including 5 and 100 micrometers, may be laminated on a temporary substrate 746 using a glue layer 748, wherein the temporary substrate may be a silicon wafer or glass panel. Next, multiple openings 702*a* may be formed in the metal plate 702 and at the same side of the metal plate 702 by photolithography and wet etching processes. Each of the openings 702*a* may have a width or diameter between 100 and 1000 micrometers.

Next, referring to FIGS. 10B and 10B-1, a metal layer 704 of nickel, silver, cobalt, iron, or chromium with a thickness between and including 0.1 and 5 micrometers may be electroplated on the metal plate 702 and on a sidewall of each of the openings 702*a* in the metal plate 702. The metal plate 702 and metal layer 704 are formed for a bottom metal plate 7041 of a second type of skeleton. Next, a photoresist layer 752 having a high aspect ratio may be laminated or spin coated with a thickness between and including 20 and 800 micrometers on the metal layer 704 and over and in the openings 702*a* and then patterned with (1) the rectangular posts 752*a* as illustrated in FIGS. 9A and 9A-1, (2) multiple circular posts 752*b* each over one of the openings 702*a* in the metal plate 702 respectively and (3) two horizontally extending posts 752*c* coupling to the two circular posts 752*b* of the photoresist layer 752 respectively, using a photolithography process, i.e., exposure and developing processes, to expose a first area of the metal layer 704.

Next, referring to FIG. 10C, the metal layer 706 as illustrated in FIG. 9B may be electroplated on the first area of the metal layer 704 not covered by the photoresist layer 752. Next, the metal layer 712 as illustrated in FIG. 9B may be electroplated on the metal layer 706 not covered by the photoresist layer 752. Next, the metal layer 714 as illustrated in FIG. 9B may be electroplated on the metal layer 712 not covered by the photoresist layer 752. Next, the metal layer 718 as illustrated in FIG. 9B may be electroplated on the metal layer 714 not covered by the photoresist layer 752. Next, the metal layer 722 as illustrated in FIG. 9B may be electroplated on the metal layer 718 not covered by the photoresist layer 752. Next, the solder layer 736 as illustrated in FIG. 9B may be electroplated on the metal layer 722 not covered by the photoresist layer 752.

Next, referring to FIG. 10D, the photoresist layer 752 may be stripped to expose multiple second areas of the metal layer 704 not under the metal layer 706 and expose the openings 702*a* in the metal plate 702 to form multiple openings each in the metal layers 706, 712, 714, 718 and 722 and over one of the second areas of the metal layer 704 and/or one of the openings 702*a*.

Next, referring to FIGS. 10E and 10E-1, the metal layers 706, 714 and 722 of copper may be partially removed from the sidewalls of the openings in the metal layers 706, 714 and 722 by between 5 and 30 micrometers using a wet etching process with a solution containing water, $NH_3$ and CuO to form a cut recessed from the metal layers 712 and 718 such that the metal posts 703, metal guides 734 and partitioning walls 701 as illustrated in FIGS. 9D and 9D-1 may be formed for the second type of skeleton 7202. Next, the solder layer 736 may be partially removed using a wet etching process with concentrated nitric acid to be formed with multiple first, second and third pieces for the solder layer 736 as illustrated in FIGS. 9D and 9D-1. Next, an oxidation treatment may be performed for an exposed surface of the metal layers 704, 718 and 712. Next, the temporary substrate 746 and glue layer 748 may be removed or peeled from the metal plate 702.

Thereby, referring to FIGS. 10E and 10E-1, the partitioning walls 701 and bottom metal plate 7041 of the second type of skeleton 7202 may form multiple cavities 713 in the second type of skeleton 7202. For the second type of skeleton 7202, each of the cavities 713 therein may connect to two vacancies 709*a*, i.e., through holes, formed in one of its partitioning walls 701, e.g., at a left side of said each of the cavities 713, and each of the two vacancies 709*a* may be formed over and connect to one of the openings 702*a* in its metal plate 702. Further, two first type of channels 709 may be formed in said one of its partitioning walls 701 and over its metal layer 704, and each of the two first type of channels 709 may connect one of the two vacancies 709*a* to said each of the cavities 713. In this case, each of the two first type of channels 709 may have a longitudinal shape.

Referring to FIGS. 10E and 10E-1, for the second type of skeleton 7202, each of the two first type of channels 709 may have a width w9 between 10 and 50 micrometers. Each of its partitioning walls 701 may have a scribe line 7011 extending along said each of its partitioning walls 701 and, in some cases, through the two vacancies 709*a* in said each of its partitioning walls 701, wherein the scribe line 7011 may have a width w10 between 100 and 1000 micrometers reserved to be cut in the following process to fabricate a plurality of first type of micro heat pipes.

Figure 11B:
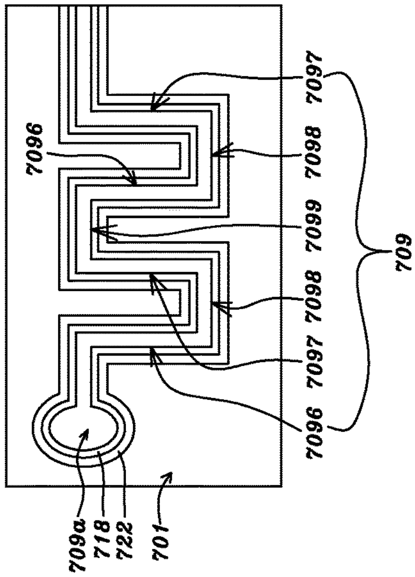
FIG. 11B is a schematically top view showing a third type of channel in accordance with another embodiment of the present application.
Figure 11D:
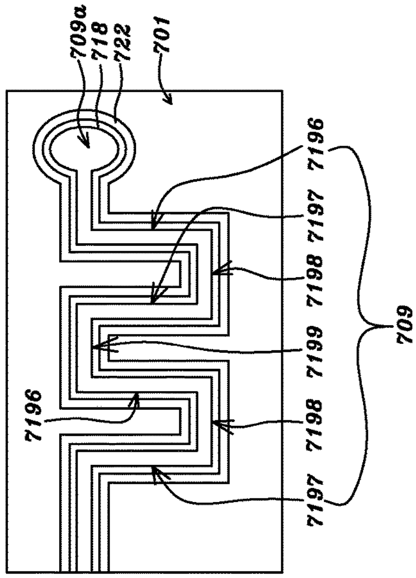
FIG. 11D is a schematically top view showing another third type of channel in accordance with another embodiment of the present application.
Figure 11A:
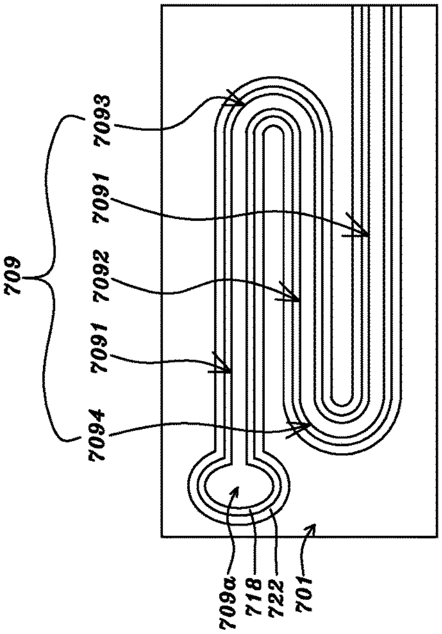
FIG. 11A is a schematically top view showing a second type of channel in accordance with an embodiment of the present application.

Alternatively, FIG. 11A is a schematically top view showing a second type of channel in accordance with an embodiment of the present application. For the second type of skeleton 7202, each of the two first type of channels 709 in said one of its partitioning walls 701 as seen in FIGS. 10E and 10E-1 may be redesigned as a second type of channel 709 as seen in FIG. 11A. Referring to FIG. 11A, for the second type of skeleton 7202, each of the two second type of channels 709 in said one of its partitioning walls 701 may include multiple first transverse sections 7091 extending in said one of its partitioning walls 701 in a transverse direction of said one of its partitioning walls 701, one or more second transverse sections 7092 each extending in said one of its partitioning walls 701, in parallel with each of the first transverse sections 7091 and between neighboring two of the first transverse sections 7091, one or more first connecting sections 7093, e.g., curved sections as seen in FIG. 11A or straight sections as seen in FIG. 11B, each connecting a right end of one of the second transverse sections 7092 to a right end of one of the first transverse sections 7091 at a front side of said one of the second transverse sections 7092 and one or more second connecting sections 7094, e.g., curved sections as seen in FIG. 11A or straight sections as seen in FIG. 11B, each connecting a left end of one of the second transverse sections 7092 to a left end of one of the first transverse sections 7091 at a rear side of said one of the second transverse sections 7092, wherein a frontmost one of the first transverse sections 7091 may have a left end connecting to one of the two vacancies 709*a*, and a rearmost one of the first transverse sections 7091 may have a right end connecting to said each of the cavities 713.

Alternatively, FIG. 11B is a schematically top view showing a third type of channel in accordance with another embodiment of the present application. For the second type of skeleton 7202, each of the two first type of channels 709 in said one of its partitioning walls 701 as seen in FIGS. 10E and 10E-1 may be redesigned as a third type of channel 709 as seen in FIG. 11B. Referring to FIG. 11B, for the second type of skeleton 7202, each of the two third type of channels 709 in said one of its partitioning walls 701 may include (1) multiple first longitudinal sections 7096 extending in said one of its partitioning walls 701 in a longitudinal direction of said one of its partitioning walls 701, (2) one or more second longitudinal sections 7097 each extending in said one of its partitioning walls 701, in parallel with each of the first longitudinal sections 7096 and between neighboring two of the first longitudinal sections 7096, (3) one or more first connecting sections 7098, e.g., curved sections as seen in FIG. 11A or straight sections as seen in FIG. 11B, each connecting a rear end of one of the second longitudinal sections 7097 to a rear end of one of the first longitudinal sections 7096 at a left side of said one of the second longitudinal sections 7097, and (4) one or more second connecting sections 7099, e.g., curved sections as seen in FIG. 11A or straight sections as seen in FIG. 11B, each connecting a front end of one of the second longitudinal sections 7097 to a front end of one of the first longitudinal sections 7096 at a right side of said one of the second longitudinal sections 7097, wherein a leftmost one of the first or second longitudinal sections 7096 or 7097 may have a respective front or rear end connecting to one of the two vacancies 709*a*, and a rightmost one of the first or second longitudinal sections 7096 or 7097 may have a respective rear or front end connecting to said each of the cavities 713.

Specification for Third Type of Skeleton for First Type of Micro Heat Pipe

Figure 10F:
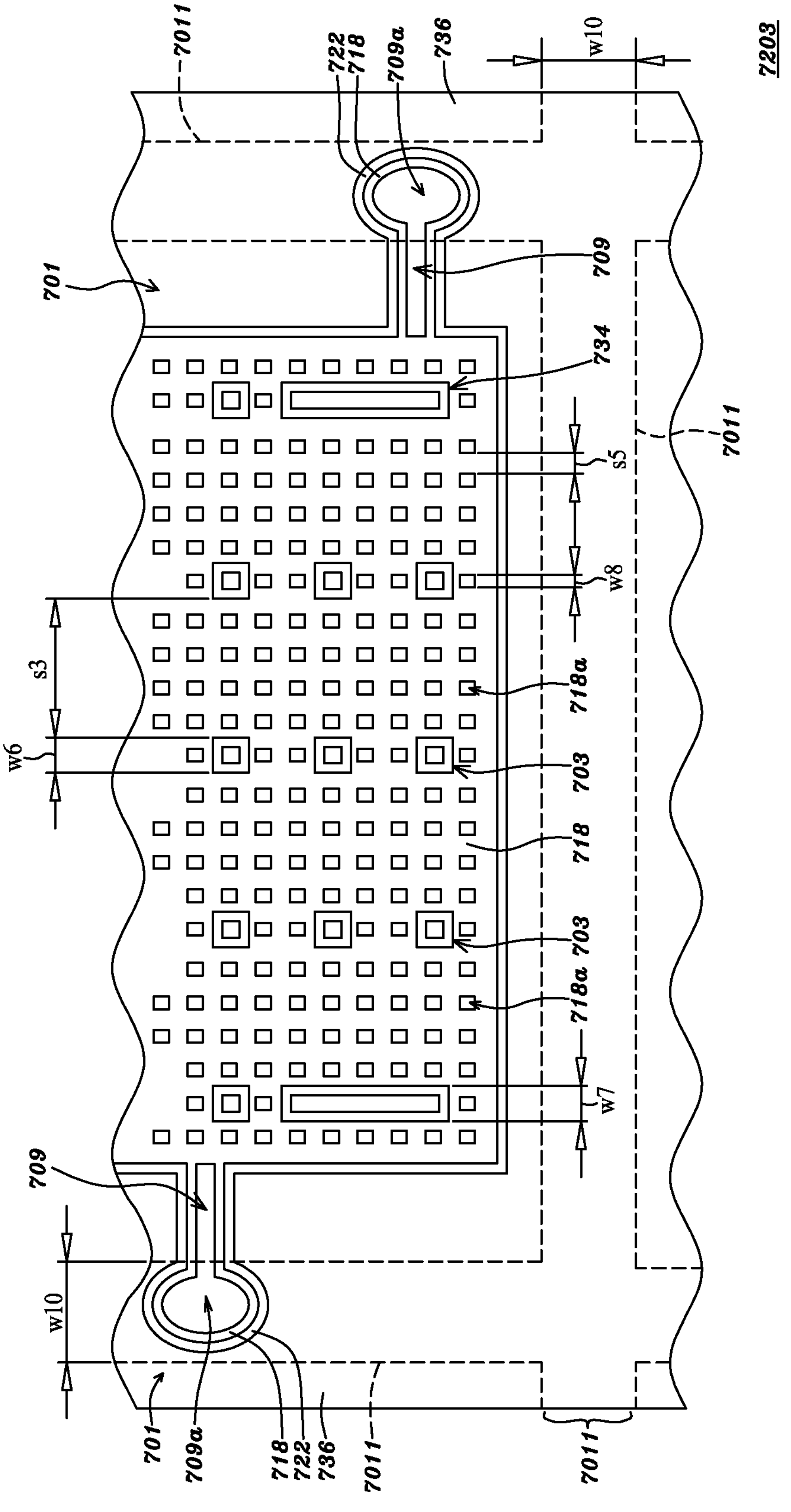
FIG. 10F is a schematically top view showing a third type of skeleton for a first type of micro heat pipe in accordance with an embodiment of the present application.

FIG. 10F is a schematically top view showing a third type of skeleton for a first type of micro heat pipe in accordance with an embodiment of the present application. Referring to FIG. 10F, a third type of skeleton 7203 for the first type of micro heat pipe 700 may have a structure similar to the second type of skeleton 7202 for the first type of micro heat pipe 700 as illustrated in FIGS. 10A-10E, 10A-1, 10B-1 and 10E-1. For an element indicated by the same reference number shown in FIGS. 10A-10F, 10A-1, 10B-1 and 10E-1, the specification of the element as seen in FIG. 10F may be referred to that of the element as illustrated in FIGS. 10A-10E, 10A-1, 10B-1 and 10E-1. The difference between the second and third types of skeletons 7202 and 7203 for the first type of micro heat pipe 700 is that for the third type of skeleton 7203 for the first type of micro heat pipe 700, the two vacancies 709*a* connecting to said each of the cavities 713 may be formed respectively in two of its partitioning walls 701 at two opposite sides of said each of the cavities 713, e.g., at the opposite left and right sides of said each of the cavities 713, and two of the openings 702*a* in its metal plate 702 may be formed under and connect to the two vacancies 709*a* respectively. The two first type of channels 709 may be formed in said two of its partitioning walls 701 respectively, and each of the two first type of channels 709 may connect one of the two vacancies 709*a* to said each of the cavities 713. In this case, for the third type of skeleton 7203 for the first type of micro heat pipe 700, each of the two first type of channels 709 may be shaped as a straight channel.

Figure 11C:
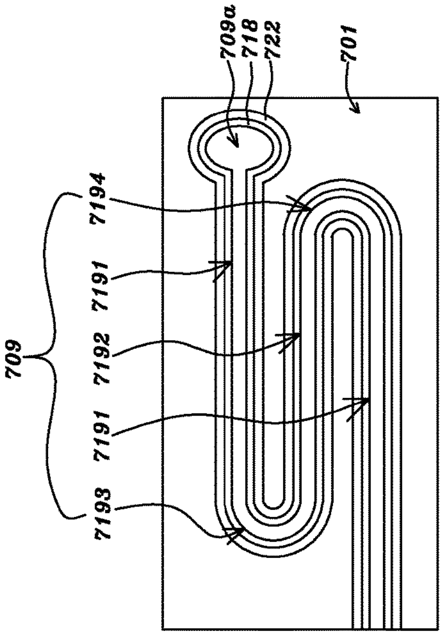
FIG. 11C is a schematically top view showing another second type of channel in accordance with another embodiment of the present application.

Alternatively, FIG. 11C is a schematically top view showing another second type of channel in accordance with another embodiment of the present application. Referring to FIG. 10F, for the third type of skeleton 7203 for the first type of micro heat pipe 700, the first type of channel 709 in a first one of its partitioning walls 701 at the left side of said each of the cavities 713 may be redesigned as the second type of channel 709 as illustrated in FIG. 11A. Further, the first type of channel 709 in a second one of its partitioning walls 701 at the right side of said each of the cavities 713 may be redesigned as another second type of channel 709 as illustrated in FIG. 11C, including multiple third transverse sections 7191 extending in the second one of its partitioning walls 701 in a transverse direction of the second one of its partitioning walls 701, one or more fourth transverse sections 7192 each extending in the second one of its partitioning walls 701, in parallel with each of the third transverse sections 7191 and between neighboring two of the third transverse sections 7191, one or more third connecting sections 7193, e.g., curved sections as seen in FIG. 11C or straight sections as seen in FIG. 11D, each connecting a left end of one of the fourth transverse sections 7192 to a left end of one of the third transverse sections 7191 at a front side of said one of the fourth transverse sections 7192 and one or more fourth connecting sections 7194, e.g., curved sections as seen in FIG. 11C or straight sections as seen in FIG. 11D, each connecting a right end of one of the fourth transverse sections 7192 to a right end of one of the third transverse sections 7191 at a rear side of said one of the fourth transverse sections 7192, wherein a frontmost one of the third transverse sections 7191 may have a right end connecting to one of the two vacancies 709*a* in the second one of its partitioning walls 701, and a rearmost one of the third transverse sections 7191 may have a left end connecting to said each of the cavities 713.

Alternatively, FIG. 11D is a schematically top view showing another third type of channel in accordance with another embodiment of the present application. Referring to FIG. 10F, for the third type of skeleton 7203 for the first type of micro heat pipe 700, the first type of channel 709 in the first one of its partitioning walls 701 may be redesigned as the third type of channel 709 as illustrated in FIG. 11B. Further, the first type of channel 709 in the second one of its partitioning walls 701 may be redesigned as another third type of channel 709 as illustrated in FIG. 11D, including (1) multiple third longitudinal sections 7196 extending in the second one of its partitioning walls 701 in a longitudinal direction of the second one of its partitioning walls 701, (2) one or more fourth longitudinal sections 7197 each extending in the second one of its partitioning walls 701, in parallel with each of the third longitudinal sections 7196 and between neighboring two of the third longitudinal sections 7196, (3) one or more third connecting sections 7198, e.g., curved sections as seen in FIG. 11C or straight sections as seen in FIG. 11D, each connecting a rear end of one of the fourth longitudinal sections 7197 to a rear end of one of the third longitudinal sections 7196 at a right side of said one of the fourth longitudinal sections 7197, and (4) one or more fourth connecting sections 7199, e.g., curved sections as seen in FIG. 11C or straight sections as seen in FIG. 11D, each connecting a front end of one of the fourth longitudinal sections 7197 to a front end of one of the third longitudinal sections 7196 at a left side of said one of the fourth longitudinal sections 7197, wherein a rightmost one of the third or fourth longitudinal sections 7196 or 7197 may have a respective front or rear end connecting to one of the two vacancies 709*a* in the second one of its partitioning walls 701, and a leftmost one of the third or fourth longitudinal sections 7196 or 7197 may have a respective rear or front end connecting to said each of the cavities 713.

Referring to FIG. 10F, for the third type of skeleton 7203, each of its partitioning walls 701 may have a scribe line 7011 extending along said each of its partitioning walls 701 and, in some cases, through one of the two vacancies 709*a* in said each of its partitioning walls 701, wherein the scribe line 7011 may have a width w10 between 100 and 1000 micrometers reserved to be cut in the following process to fabricate a plurality of first type of micro heat pipes.

Specification for Fourth Type of Skeleton for First Type of Micro Heat Pipe

Figures 1, 12A:
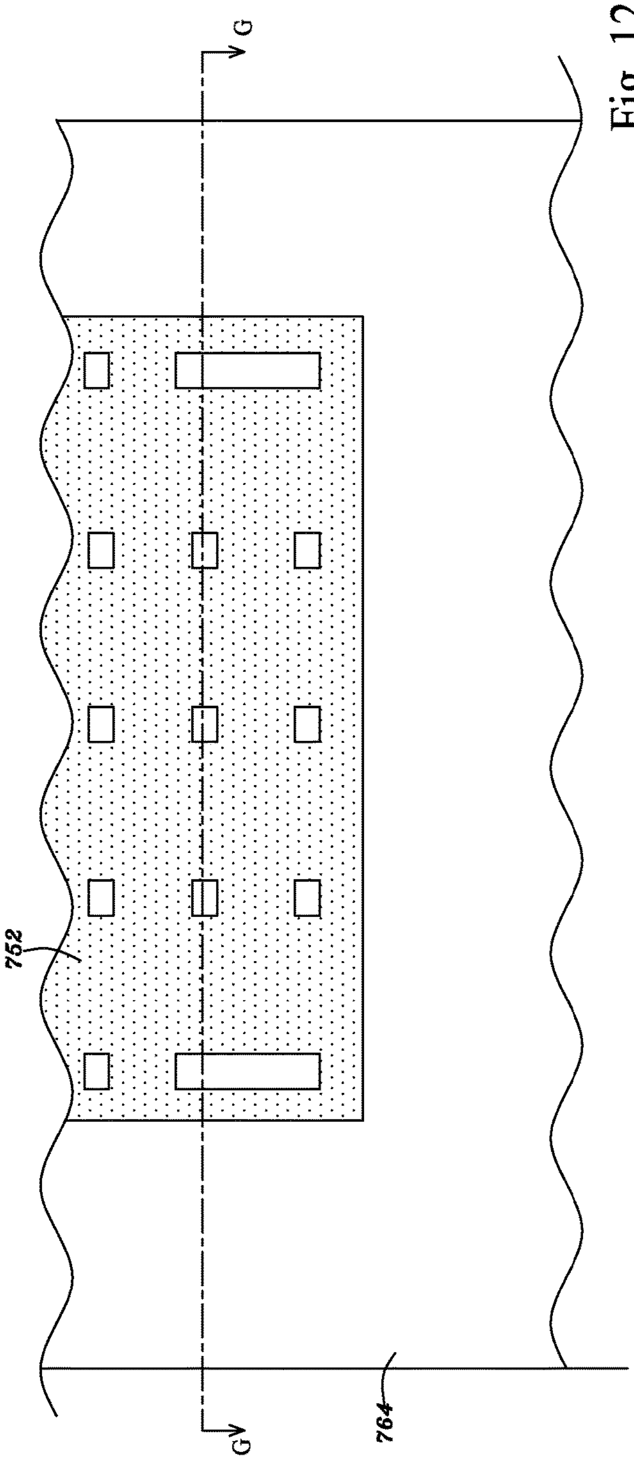
FIGS. 12A-12C are schematically cross-sectional views showing a process for fabricating a fourth type of skeleton for a first type of micro heat pipe in accordance with an embodiment of the present application.
Figure 12A:
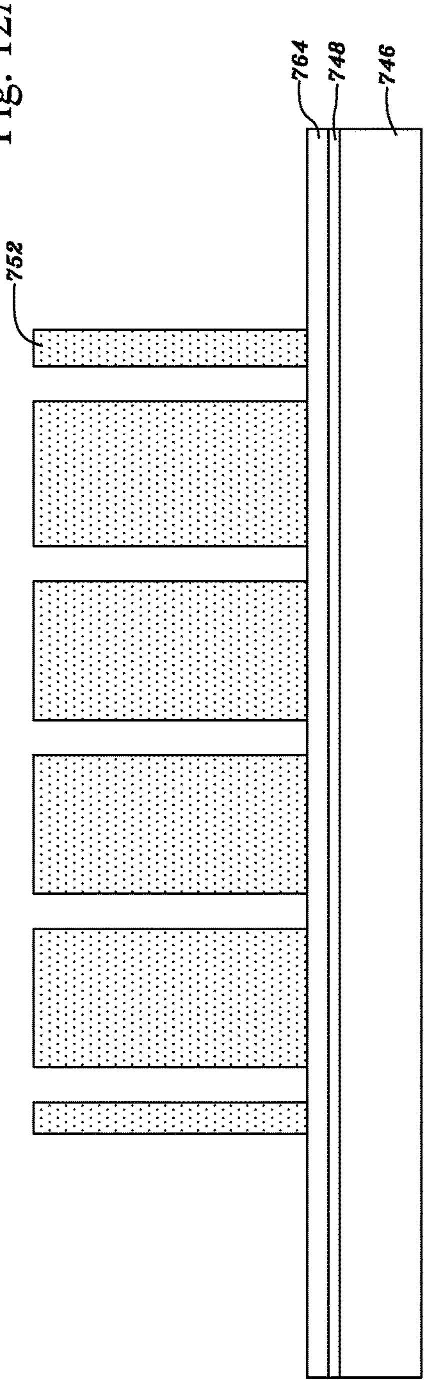
Figure 12B:
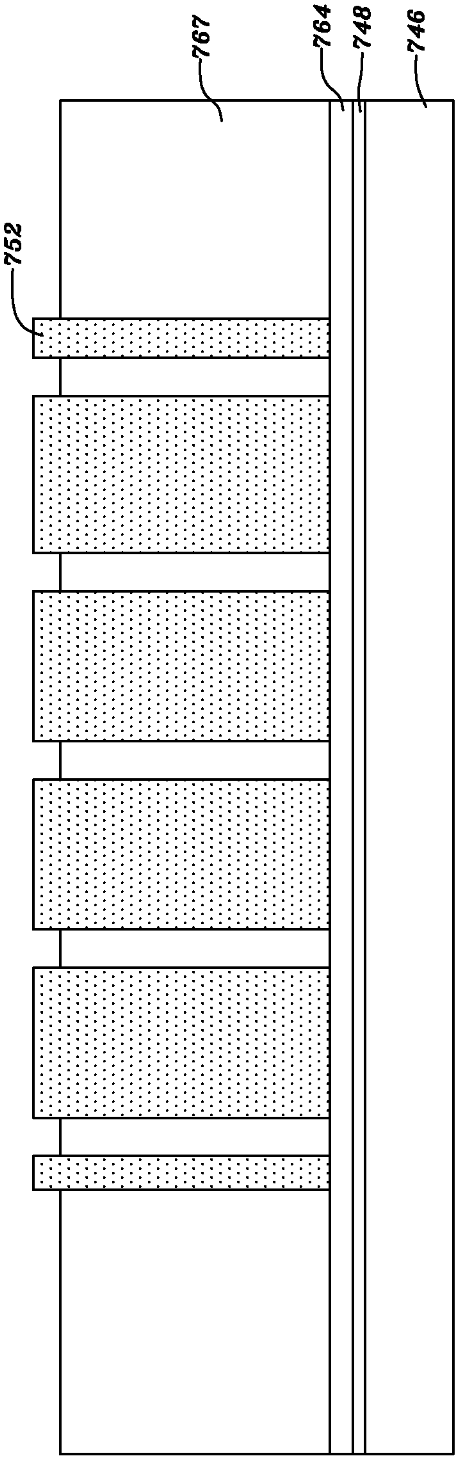
Figures 1, 12C:
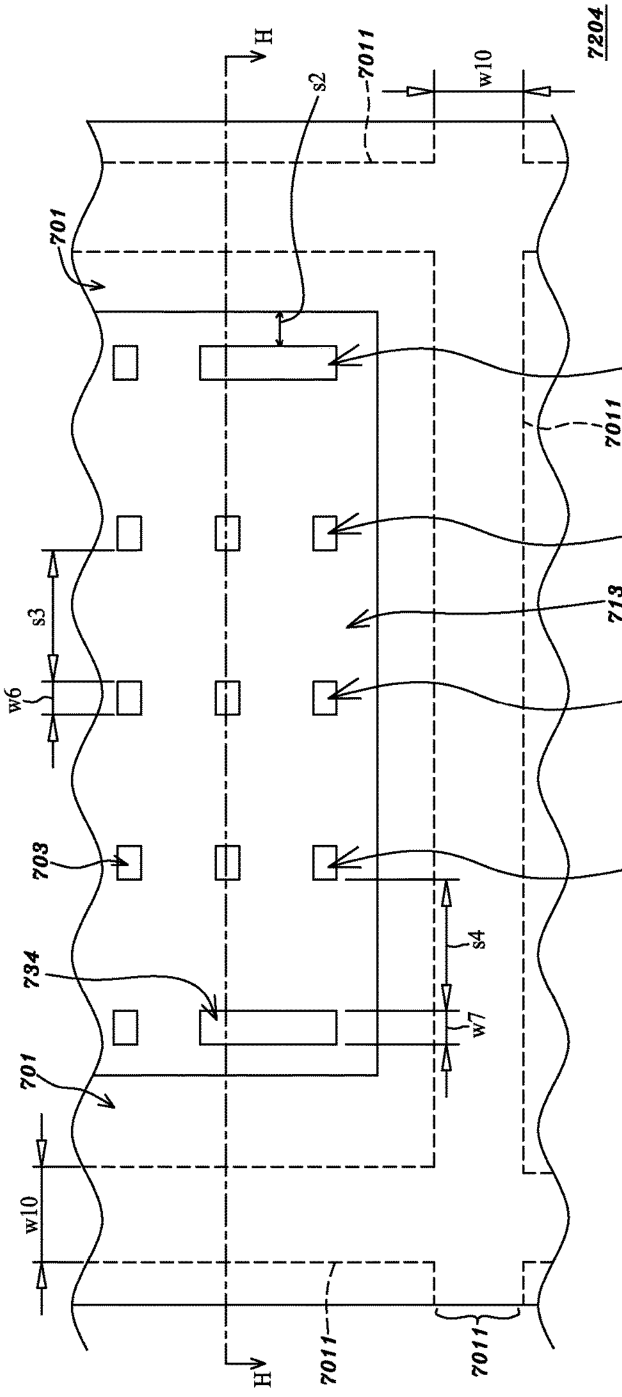
Figure 12C:
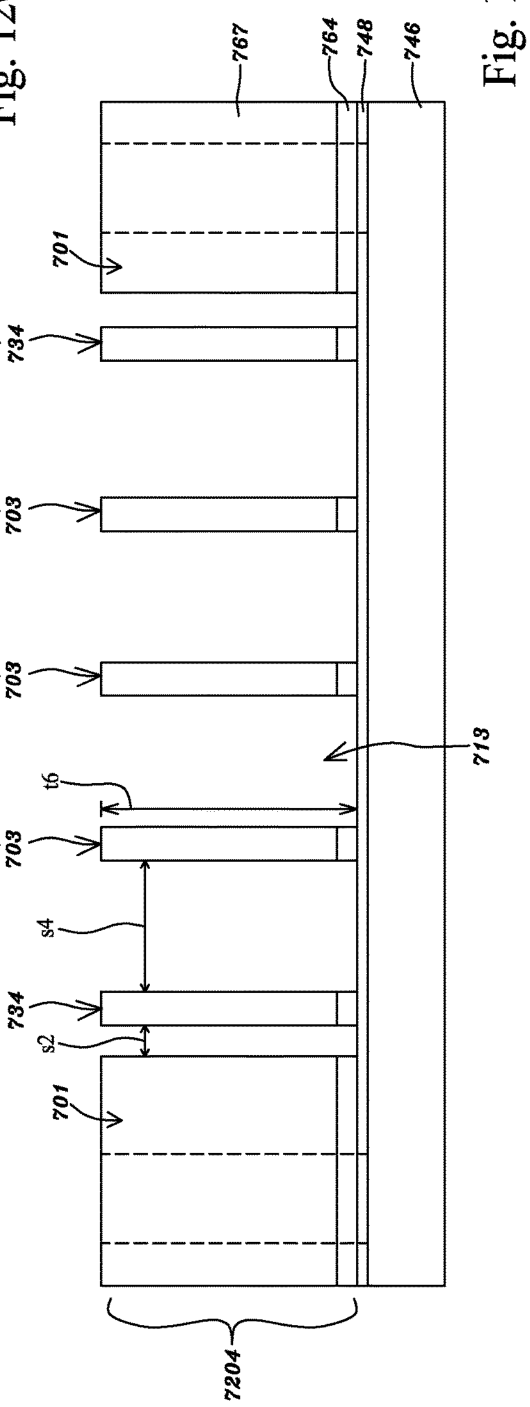

FIGS. 12A-12C are schematically cross-sectional views showing a process for fabricating a fourth type of skeleton for a first type of micro heat pipe in accordance with an embodiment of the present application. FIGS. 12A-1 and 12C-1 are schematically top views showing steps illustrated in FIGS. 12A and 12C for a process for fabricating a fourth type of skeleton for a first type of micro heat pipe in accordance with an embodiment of the present application, wherein FIG. 12A is a schematically cross-sectional view cut along a cross-sectional line G-G in FIG. 12A-1 and FIG. 12C is a schematically cross-sectional view cut along a cross-sectional line H-H in FIG. 12C-1. Referring to FIGS. 12A and 12A-1, a metal layer 764, such as copper foil or layer having a thickness between and including 5 and 15 micrometers, may be laminated on a temporary substrate 746 using a glue layer 748, wherein the temporary substrate 746 may be a silicon wafer or substrate, glass panel or substrate, ceramic substrate, plastic substrate or metal substrate. Next, a photoresist layer 752 having a high aspect ratio may be laminated or spin coated with a thickness between and including 20 and 800 micrometers on the metal layer 764 and then patterned with multiple openings using a photolithography process, i.e., exposure and developing processes, to expose the metal layer 764.

Next, referring to FIG. 12B, a metal layer 767 of copper having a thickness between and including 100 and 1,000 micrometers may be electroplated in the openings in the photoresist layer 752 and on the metal layer 764 not covered by the photoresist layer 752.

Next, referring to FIGS. 12C and 12C-1, the photoresist layer 752 may be stripped to expose the metal layer 764 not under the metal layer 767 and then the metal layer 764 not under the metal layer 767 may be removed using a wet etching process such that multiple metal posts 703 of the fourth type of skeleton 7204 may be formed each with a first piece of each of the metal layers 764 and 767, multiple metal guides 734 of the fourth type of skeleton 7204 may be formed each with a second piece of each of the metal layers 764 and 767, and multiple partitioning walls 701 of the fourth type of skeleton 7204 may be formed each with a third piece of each of the metal layers 764 and 767.

Thereby, referring to FIGS. 12C and 12C-1, the partitioning walls 701 of the fourth type of skeleton 7204 may form multiple cavities 713 in the fourth type of skeleton 7204. For the fourth type of skeleton 7204, the first piece of each of the metal layers 767 and 764 for each of its metal posts 703 may have a width w6 between 20 and 200 micrometers. The second piece of each of the metal layers 767 and 764 for each of its metal guides 734 may have a width w7 between 20 and 200 micrometers. The third piece of each of the metal layers 767 and 764 for each of its partitioning walls 701 may have a scribe line 7011 extending along said each of its partitioning walls 701, wherein the scribe line 7011 may have a width w10 between 50 and 150 micrometers reserved to be cut in the following process to fabricate a plurality of first type of micro heat pipes. A space s3 from the first piece of each of the metal layers 767 and 764 for each of its metal posts 703 to the first piece of said each of the metal layers 767 and 764 for another of its metal posts 703 neighboring said each of its metal posts 703 may be between 100 and 500 micrometers. A space s4 from the second piece of each of the metal layers 767 and 764 for one of its metal guides 734 to the first piece of said each of the metal layers 767 and 764 for one of its metal posts 703 neighboring said one of its metal guides 734 may be between 100 and 500 micrometers. A space s2 from the second piece of each of the metal layers 767 and 764 for one of its metal guides 734 to the third piece of said each of the metal layers 767 and 764 for one of its partitioning walls 701 neighboring said one of its metal guides 734 may be less than 20 or 30 micrometers or between 3 and 30 micrometers, and the space s2 may be used as a vertical liquid capillary or channel for liquid flow vertically by capillary effect or surface tension. The metal layer 767 for each of its metal posts 703, each of its metal guides 734 and each of its partitioning walls 701 may have a thickness between and including 100 and 1,000 micrometers. The metal layer 764 for each of its metal posts 703, each of its metal guides 734 and each of its partitioning walls 701 may have a thickness between and including 5 and 15 micrometers. Each of its metal posts 703, metal guides 734 and partitioning walls 701 may have a total vertical thickness t6 between and including 100 and 1,000 micrometers.

Specification for Fifth Type of Skeleton for First Type of Micro Heat Pipe

Figure 13A:
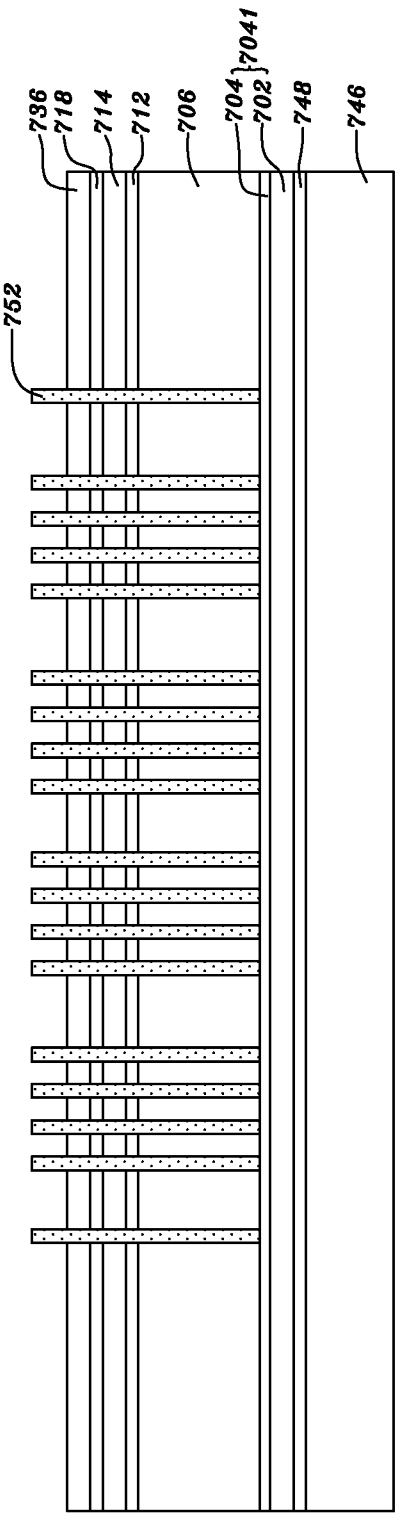
FIGS. 13A-13C are schematically cross-sectional views showing a process for fabricating a fifth type of skeleton for a first type of micro heat pipe in accordance with an embodiment of the present application.
Figure 13B:
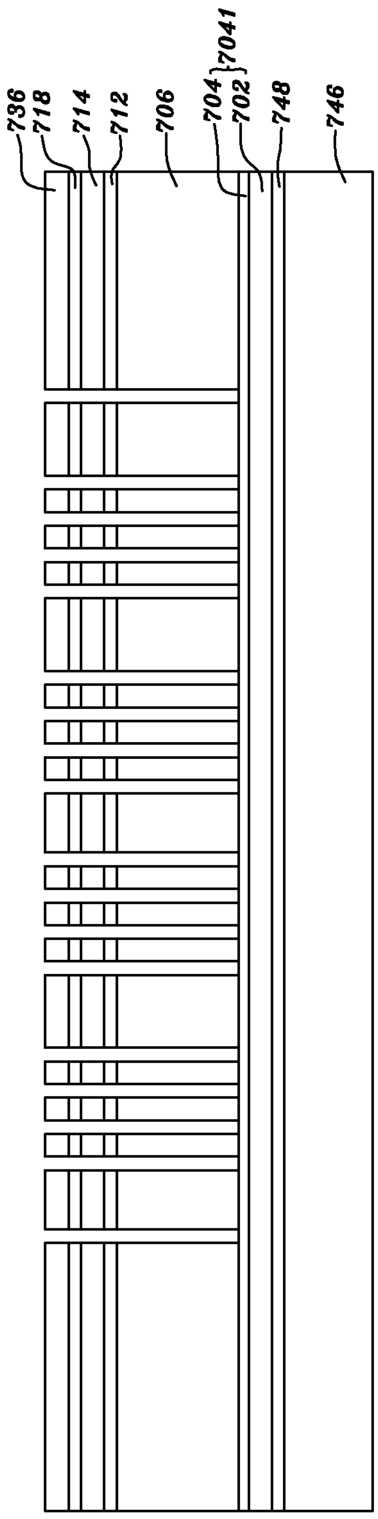
Figures 1, 13C:
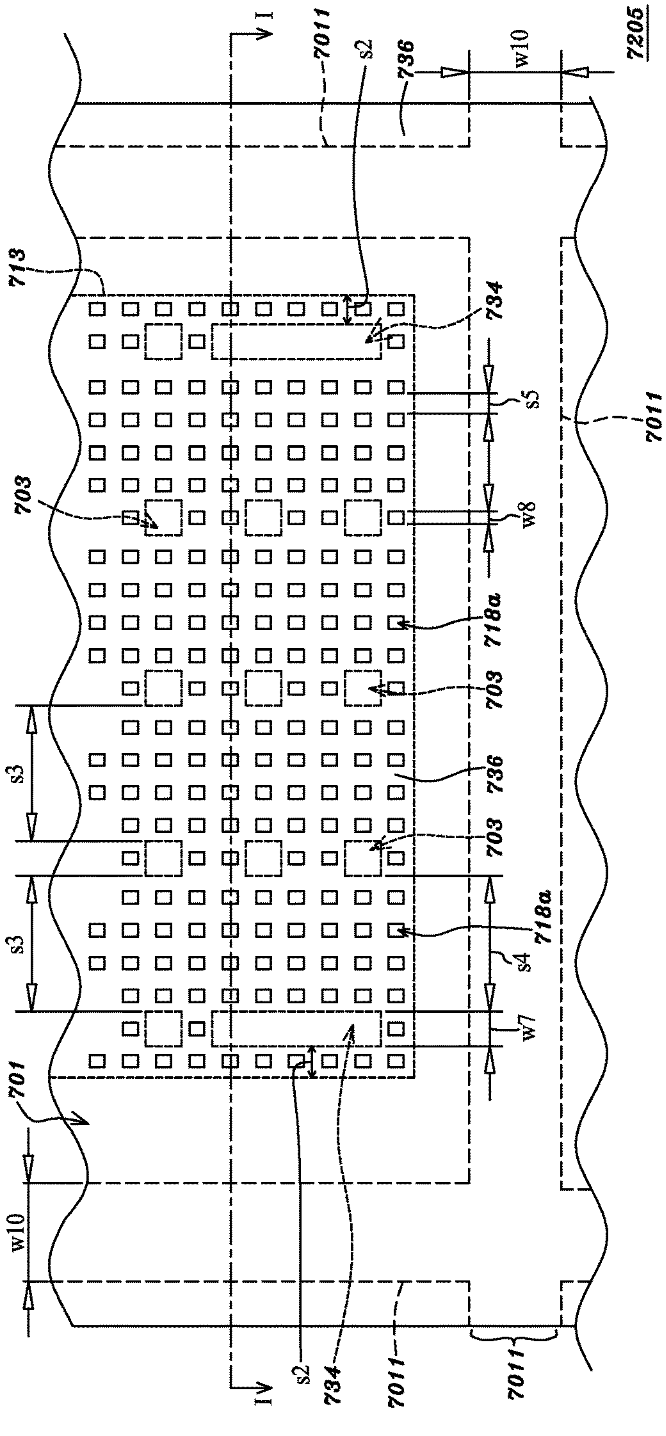
Figure 13C:
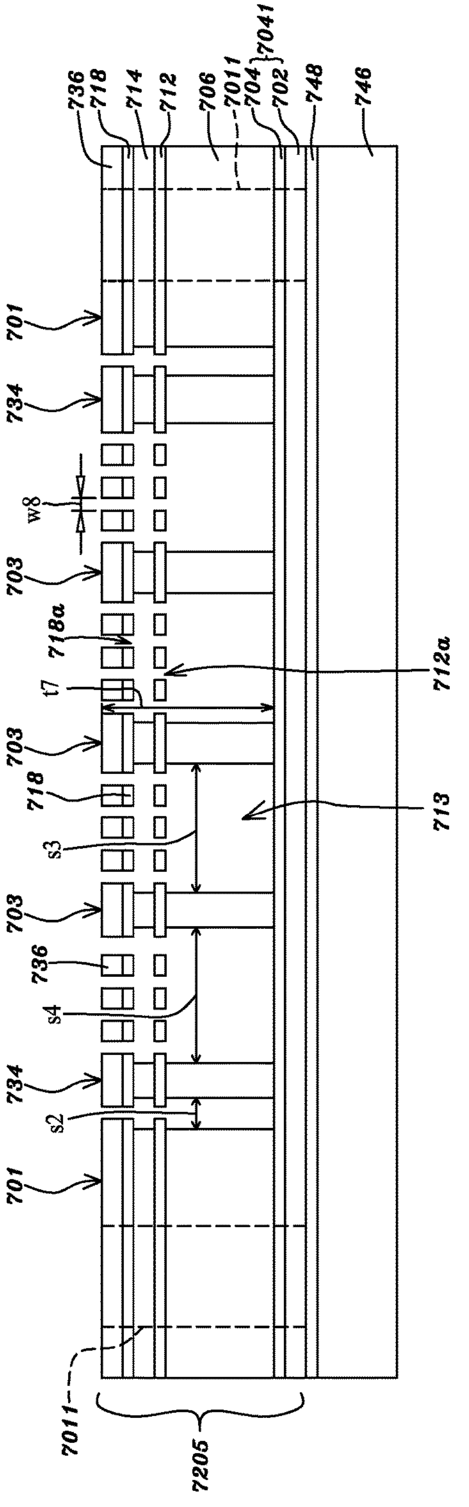

FIGS. 13A-13C are schematically cross-sectional views showing a process for fabricating a fifth type of skeleton for a first type of micro heat pipe in accordance with an embodiment of the present application. FIG. 13C-1 is a schematically top view showing the step illustrated in FIG. 13C for a process for fabricating a fifth type of skeleton for a first type of micro heat pipe in accordance with an embodiment of the present application, wherein FIG. 13C is a schematically cross-sectional view cut along a cross-sectional line I-I in FIG. 13C-1. The process for fabricating the fifth type of skeleton for a first type of micro heat pipe is similar to that for fabricating the first type of skeleton for a first type of micro heat pipe. For an element indicated by the same reference number shown in FIGS. 9A-9D, 9A-1, 9D-1, 13A-13C and 13C-1, the specification of the element as seen in FIGS. 13A-13C and 13C-1 may be referred to that of the element as illustrated in FIGS. 9A-9D, 9A-1 and 9D-1. The difference between the processes for fabricating the first and fifth types of skeletons for a first type of micro heat pipe is that for fabricating the fifth type of skeleton for a first type of micro heat pipe as illustrated in FIGS. 13A-13C and 13C-1, after the step for electroplating the metal layer 718 on the metal layer 714 as illustrated in FIG. 9B, the metal layer 722 for the first type of skeleton for a first type of micro heat pipe as illustrated in FIGS. 9B-9D and 9D-1 may not by formed on the metal layer 718, but the solder layer 736 of a tin-containing alloy having a thickness between and including 5 and 50 micrometers may be electroplated on the metal layer 718 as seen in FIG. 13A. In this case, the photoresist layer 752 may have a thickness between and including 5 and 100 micrometers.

Next, referring to FIG. 13B, the photoresist layer 752 may be stripped to expose multiple second areas of the metal layer 704 not under the metal layer 706 to form multiple openings each in the metal layers 706, 712, 714 and 718 and solder layer 736 and over one of the second areas of the metal layer 704.

Next, referring to FIGS. 13C and 13C-1, the metal layers 706 and 714 of copper may be partially removed from the sidewalls of the openings in the metal layers 706 and 714 by between 5 and 30 micrometers using a wet etching process with a solution containing water, $NH_3$ and CuO to form a cut recessed from the metal layers 712 and 718 such that multiple metal posts 703 of the fifth type of skeleton 7205 may be formed each with a first piece of each of the metal layers 706 and 714 and a first piece of each of the metal layers 712 and 718 aligned with the first piece of each of the metal layers 706 and 714, multiple metal guides 734 of the fifth type of skeleton 7205 may be formed each with a second piece of each of the metal layers 706 and 714 and a second piece of each of the metal layers 712 and 718 aligned with the second piece of each of the metal layers 706 and 714, and multiple partitioning walls 701 of the fifth type of skeleton 7205 may be formed each with a third piece of each of the metal layers 706 and 714 and a third piece of each of the metal layers 712 and 718 aligned with the third piece of each of the metal layers 706 and 714. Next, an oxidation treatment may be performed for an exposed surface of the metal layers 704, 718 and 712.

Thereby, referring to FIGS. 13C and 13C-1, the partitioning walls 701 and bottom metal plate 7041 of the fifth type of skeleton 7205 may form multiple cavities 713 in the fifth type of skeleton 7205. For the fifth type of skeleton 7205, the first piece of each of the metal layers 706 and 714 for each of its metal posts 703 may have a width w6 between 20 and 200 micrometers. The second piece of each of the metal layers 706 and 714 for each of its metal guides 734 may have a width w7 between 20 and 200 micrometers. The third piece of each of the metal layers 706 and 714 for each of its partitioning walls 701 may have a scribe line 7011 extending along said each of its partitioning walls 701, wherein the scribe line 7011 may have a width w10 between 50 and 150 micrometers reserved to be cut in the following process to fabricate a plurality of first type of micro heat pipes. A space s3 from the first piece of each of the metal layers 706 and 714 for each of its metal posts 703 to the first piece of said each of the metal layers 706 and 714 for another of its metal posts 703 neighboring said each of its metal posts 703 may be between 100 and 500 micrometers. A space s4 from the second piece of each of the metal layers 706 and 714 for one of its metal guides 734 to the first piece of said each of the metal layers 706 and 714 for one of its metal posts 703 neighboring said one of its metal guides 734 may be between 100 and 500 micrometers. Each of the openings 712*a* or 718*a* in each of the metal layers 712 and 718 for each of its metal meshes or nets may have a width w8 between and including 1 and 10 micrometers, 2 and 50 micrometers or 10 and 100 micrometers. A space s5 between neighboring two of the openings 712*a* or 718*a* in each of the metal layers 712 and 718 for each of its metal meshes or nets may be between and including 1 and 30 micrometers. A space s2 from the second piece of each of the metal layers 706 and 714 for one of its metal guides 734 to the third piece of said each of the metal layers 706 and 714 for one of its partitioning walls 701 neighboring said one of its metal guides 734 may be less than 20 or 30 micrometers or between 3 and 30 micrometers, and the space s2 may be used as a vertical liquid capillary or channel for liquid that flows vertically by capillary effect or surface tension. The metal plate 704 for its bottom metal plate 7041 may have a thickness between and including 5 and 100 micrometers. The metal layer 706 for each of its metal posts 703, each of its metal guides 734 and each of its partitioning walls 701 may have a thickness between and including 5 and 50 micrometers to hold a space between the metal layer 712 for a lower one of its two metal meshes or nets and its bottom metal plate 7041 with a vertical distance therebetween that may be between and including 5 and 50 micrometers. The metal layer 712 for each of its metal posts 703, each of its metal guides 734 and each of its partitioning walls 701 may have a thickness between and including 0.1 and 2 micrometers or 0.1 and 3 micrometers, wherein the metal layer 712 intersects each of its metal posts 703, metal guides 734 and partitioning walls 701 to divide each of its metal posts 703, metal guides 734 and partitioning walls 701 into top and bottom portions. The metal layer 714 for each of its metal posts 703, each of its metal guides 734 and each of its partitioning walls 701 may have a thickness between and including 0.5 and 5 micrometers to hold a space between the metal layers 712 and 718 for its two metal meshes or nets with a vertical distance therebetween that may be between and including 0.5 and 5 micrometers. The metal layer 718 for each of its metal posts 703, each of its metal guides 734 and each of its partitioning walls 701 may have a thickness between and including 0.1 and 5 micrometers or 0.1 and 3 micrometers. The solder layer 736 on each of its metal posts 703, each of its metal guides 734 and each of its partitioning walls 701 may have a thickness between and including 5 and 50 micrometers. Each of its metal posts 703, metal guides 734 and partitioning walls 701 may have a total vertical thickness t7 between and including 5 and 60 micrometers.

Specification for Sixth Type of Skeleton for First Type of Micro Heat Pipe

Figure 14A:
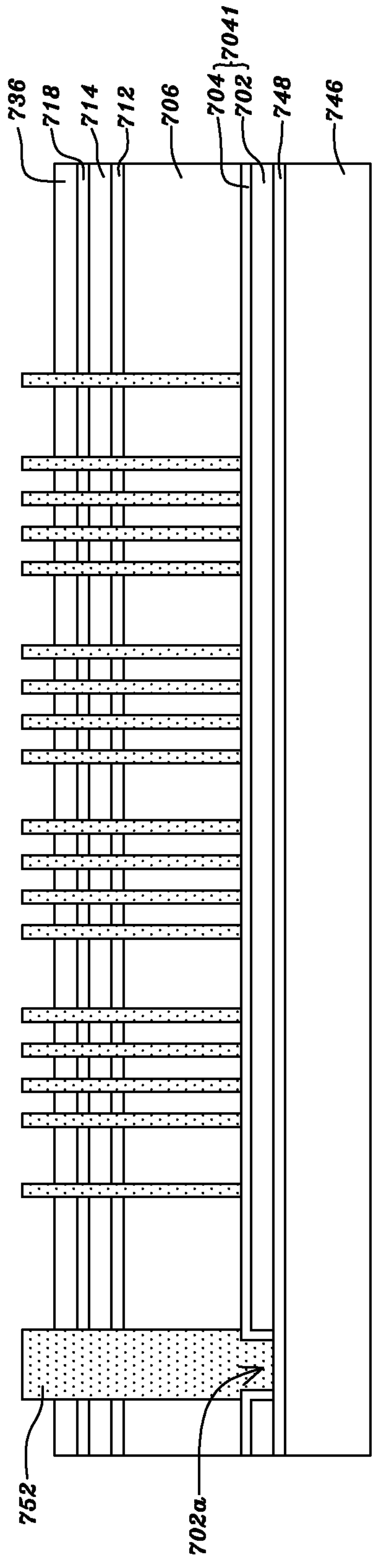
FIGS. 14A-14C are schematically cross-sectional views showing a process for fabricating a sixth type of skeleton for a first type of micro heat pipe in accordance with an embodiment of the present application.
Figure 14B:
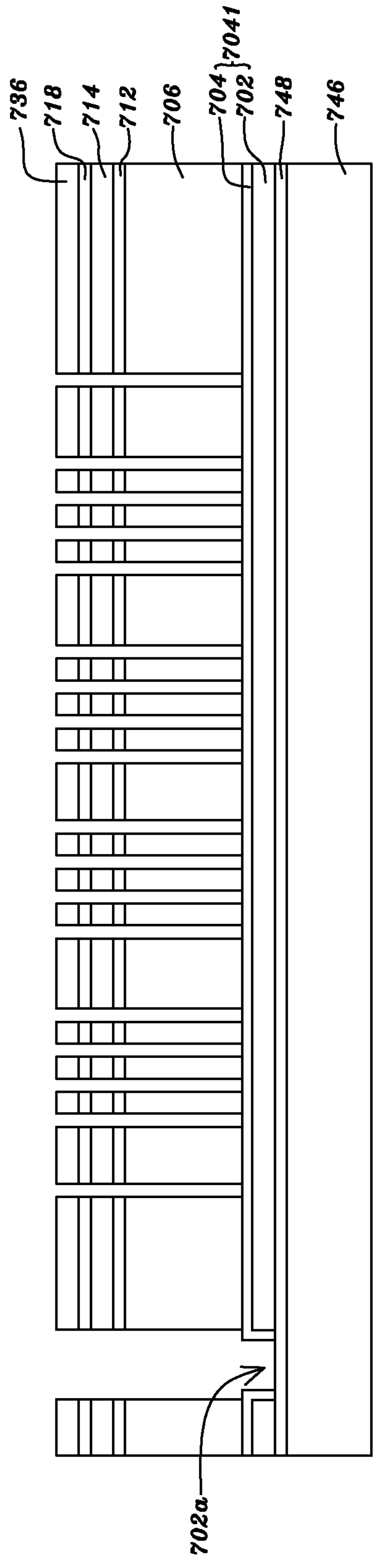
Figures 1, 14C:
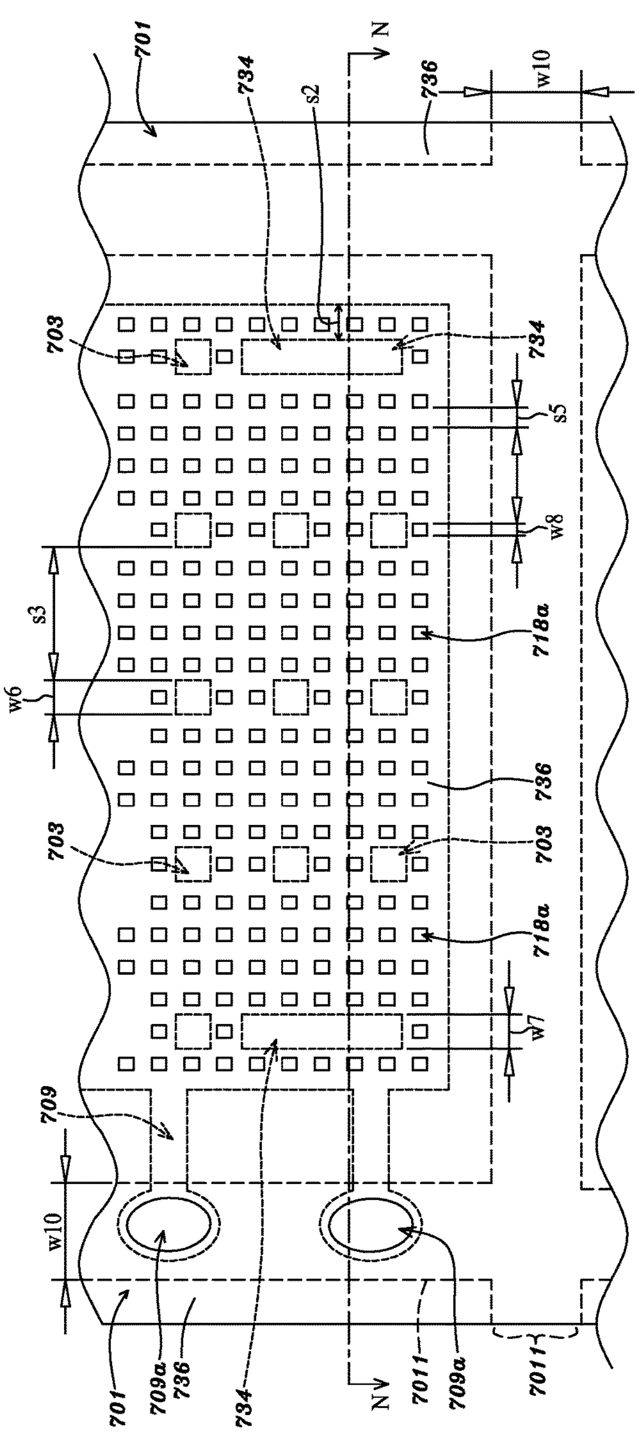
Figure 14C:
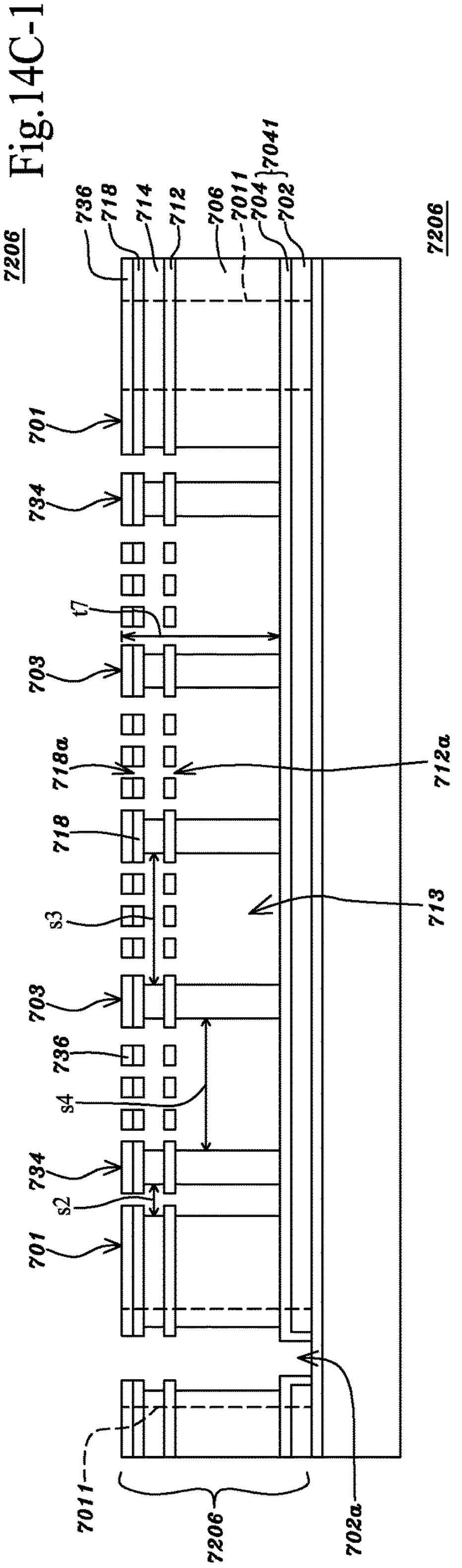

FIGS. 14A-14C are schematically cross-sectional views showing a process for fabricating a sixth type of skeleton for a first type of micro heat pipe in accordance with an embodiment of the present application. FIG. 14C-1 is a schematically top view showing the step illustrated in FIG. 14C for a process for fabricating a sixth type of skeleton for a first type of micro heat pipe in accordance with an embodiment of the present application, wherein FIG. 14C is a schematically cross-sectional view cut along a cross-sectional line N-N in FIG. 14C-1. The process for fabricating the sixth type of skeleton for a first type of micro heat pipe is similar to that for fabricating the second type of skeleton for a first type of micro heat pipe. For an element indicated by the same reference number shown in FIGS. 10A-10E, 10A-1, 10B-1, 10E-1, 11A, 11B, 14A-14C and 14C-1, the specification of the element as seen in FIGS. 14A-14C and 14C-1 may be referred to that of the element as illustrated in FIGS. 10A-10E, 10A-1, 10B-1, 10E-1, 11A and 11B. The difference between the processes for fabricating the second and sixth types of skeletons for a first type of micro heat pipe is that for fabricating the sixth type of skeleton for a first type of micro heat pipe as illustrated in FIGS. 14A-14C and 14C-1, after the step for electroplating the metal layer 718 on the metal layer 714 as illustrated in FIG. 10C, the metal layer 722 for the second type of skeleton for a first type of micro heat pipe as illustrated in FIGS. 10C-10E and 10E-1 is not formed on the metal layer 718, but the solder layer 736 of a tin-containing alloy having a thickness between and including 5 and 50 micrometers may be electroplated on the metal layer 718 as seen in FIG. 14A. In this case, the photoresist layer 752 may have a thickness between and including 5 and 100 micrometers.

Next, referring to FIG. 14B, the photoresist layer 752 may be stripped to expose multiple second areas of the metal layer 704 not under the metal layer 706 and expose the two openings 702*a* in the metal plate 702 to form multiple openings each in the metal layers 706, 712, 714 and 718 and solder layer 736 and over one of the second areas of the metal layer 704 and/or one of the two openings 702*a*.

Next, referring to FIGS. 14C and 14C-1, the metal layers 706 and 714 of copper may be partially removed from the sidewalls of the openings in the metal layers 706 and 714 by between 5 and 30 micrometers using a wet etching process with a solution containing water, $NH_3$ and CuO to form a cut recessed from the metal layers 712 and 718 such that multiple metal posts 703 of the sixth type of skeleton 7206 may be formed each with a first piece of each of the metal layers 706 and 714 and a first piece of each of the metal layers 712 and 718 aligned with the first piece of each of the metal layers 706 and 714, multiple metal guides 734 of the sixth type of skeleton 7206 may be formed each with a second piece of each of the metal layers 706 and 714 and a second piece of each of the metal layers 712 and 718 aligned with the second piece of each of the metal layers 706 and 714, and multiple partitioning walls 701 of the sixth type of skeleton 7206 may be formed each with a third piece of each of the metal layers 706 and 714 and a third piece of each of the metal layers 712 and 718 aligned with the third piece of each of the metal layers 706 and 714. Next, an oxidation treatment may be performed for an exposed surface of the metal layers 704, 718 and 712.

Thereby, referring to FIGS. 14C and 14C-1, the partitioning walls 701 and bottom metal plate 7041 of the sixth type of skeleton 7206 may form multiple cavities 713 in the sixth type of skeleton 7206. For the sixth type of skeleton 7206, each of the cavities 713 therein may connect to the two vacancies 709*a*, i.e., through holes, formed in one of its partitioning walls 701, e.g., at a left side of said each of the cavities 713, and each of the two vacancies 709*a* may be formed over and connect to one of the openings 702*a* in its metal plate 702. Further, two first type of channels 709 may be formed in said one of its partitioning walls 701 and over its metal layer 704, and each of the two first type of channels 709 may connect one of the two vacancies 709*a* to said each of the cavities 713. In this case, each of the two first type of channels 709 may have a longitudinal shape. Alternatively, for the sixth type of skeleton 7206, each of the two first type of channels 709 in said one of its partitioning walls 701 as seen in FIGS. 14C and 14C-1 may be redesigned as a second or third type of channel 709 as illustrated in FIG. 11A or 11B.

Referring to FIGS. 14C and 14C-1, for the sixth type of skeleton 7206, the first piece of each of the metal layers 706 and 714 for each of its metal posts 703 may have a width w6 between 20 and 200 micrometers. The second piece of each of the metal layers 706 and 714 for each of its metal guides 734 may have a width w7 between 20 and 200 micrometers. A space s3 from the first piece of each of the metal layers 706 and 714 for each of its metal posts 703 to the first piece of said each of the metal layers 706 and 714 for another of its metal posts 703 neighboring said each of its metal posts 703 may be between 100 and 500 micrometers. A space s4 from the second piece of each of the metal layers 706 and 714 for one of its metal guides 734 to the first piece of said each of the metal layers 706 and 714 for one of its metal posts 703 neighboring said one of its metal guides 734 may be between 100 and 500 micrometers. Each of the openings 712*a* or 718*a* in each of the metal layers 712 and 718 for each of its metal meshes or nets may have a width w8 between and including 1 and 10 micrometers, 2 and 50 micrometers or 10 and 100 micrometers. A space s5 between neighboring two of the openings 712*a* or 718*a* in each of the metal layers 712 and 718 for each of its metal meshes or nets may be between and including 1 and 30 micrometers. A space s2 from the second piece of each of the metal layers 706 and 714 for one of its metal guides 734 to the third piece of said each of the metal layers 706 and 714 for one of its partitioning walls 701 neighboring said one of its metal guides 734 may be less than 20 or 30 micrometers or between 3 and 30 micrometers, and the space s2 may be used as a vertical liquid capillary or channel for liquid that flows vertically by capillary effect or surface tension. The metal plate 704 for its bottom metal plate 7041 may have a thickness between and including 5 and 100 micrometers. The metal layer 706 for each of its metal posts 703, each of its metal guides 734 and each of its partitioning walls 701 may have a thickness between and including 5 and 50 micrometers to hold a space between the metal layer 712 for a lower one of its two metal meshes or nets and its bottom metal plate 7041 with a vertical distance therebetween that may be between and including 5 and 50 micrometers. The metal layer 712 for each of its metal posts 703, each of its metal guides 734 and each of its partitioning walls 701 may have a thickness between and including 0.1 and 2 micrometers or 0.1 and 3 micrometers, wherein the metal layer 712 intersects each of its metal posts 703, metal guides 734 and partitioning walls 701 to divide each of its metal posts 703, metal guides 734 and partitioning walls 701 into top and bottom portions. The metal layer 714 for each of its metal posts 703, each of its metal guides 734 and each of its partitioning walls 701 may have a thickness between and including 0.5 and 5 micrometers to hold a space between the metal layers 712 and 718 for its two metal meshes or nets with a vertical distance therebetween that may be between and including 0.5 and 5 micrometers. The metal layer 718 for each of its metal posts 703, each of its metal guides 734 and each of its partitioning walls 701 may have a thickness between and including 0.1 and 5 micrometers or 0.1 and 3 micrometers. The solder layer 736 on each of its metal posts 703, each of its metal guides 734 and each of its partitioning walls 701 may have a thickness between and including 5 and 50 micrometers. Each of its metal posts 703, metal guides 734 and partitioning walls 701 may have a total vertical thickness t7 between and including 5 and 60 micrometers. Each of the two first type of channels 709 may have a width w9 between 10 and 50 micrometers. Each of its partitioning walls 701 may have a scribe line 7011 extending along said each of its partitioning walls 701 and, in some cases, through the two vacancies 709*a* in said each of its partitioning walls 701, wherein the scribe line 7011 may have a width w10 between 100 and 1000 micrometers reserved to be cut in the following process to fabricate a plurality of first type of micro heat pipes.

Specification for Seventh Type of Skeleton for First Type of Micro Heat Pipe

Figure 14D:
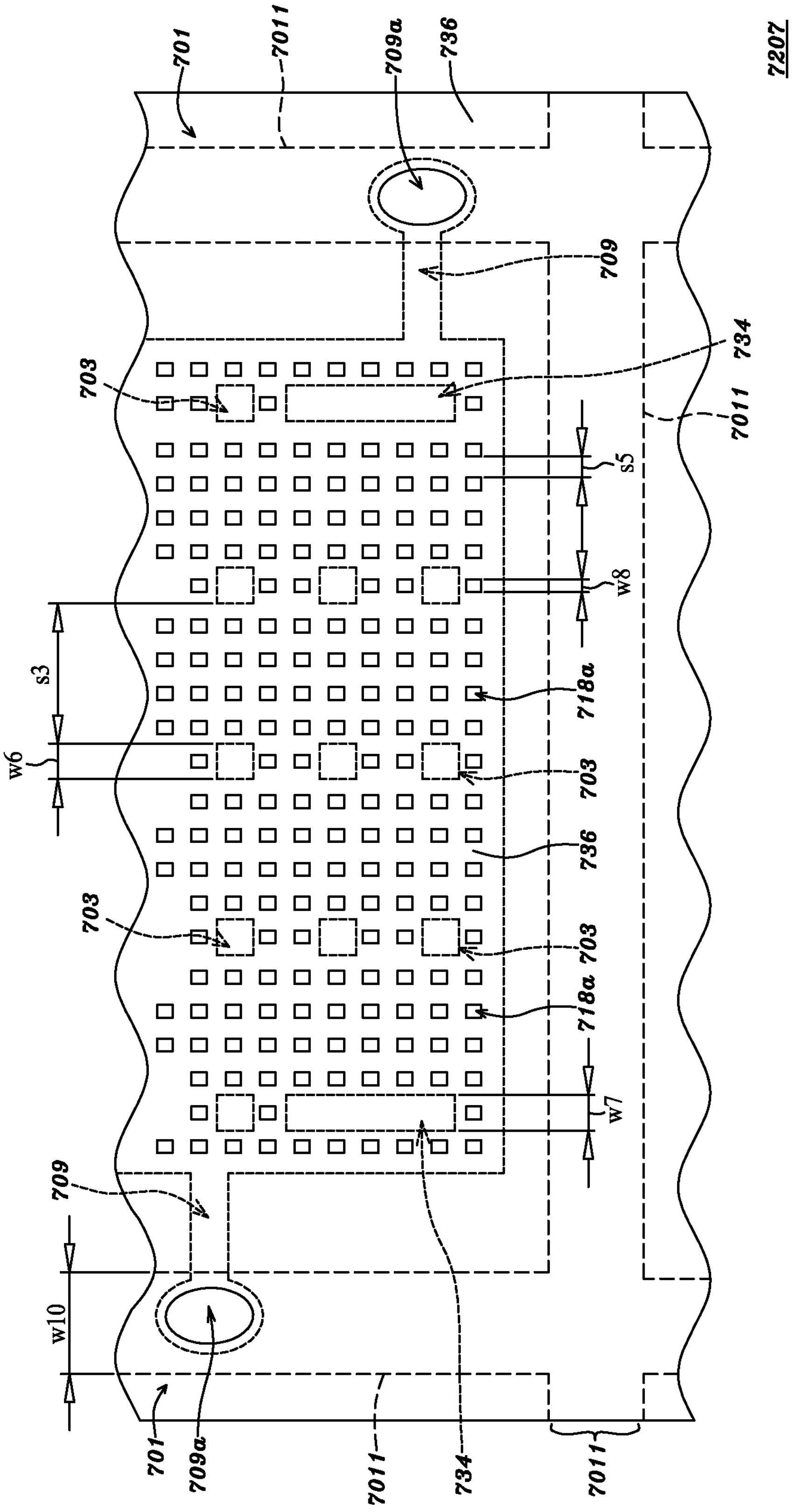
FIG. 14D is a schematically top view showing a seventh type of skeleton for a first type of micro heat pipe in accordance with an embodiment of the present application.

FIG. 14D is a schematically top view showing a seventh type of skeleton for a first type of micro heat pipe in accordance with an embodiment of the present application. Referring to FIG. 14D, a seventh type of skeleton 7207 for the first type of micro heat pipe 700 may have a structure similar to the sixth type of skeleton 7206 for the first type of micro heat pipe 700 as illustrated in FIGS. 14A-14C and 14C-1. For an element indicated by the same reference number shown in FIGS. 14A-14D and 14C-1, the specification of the element as seen in FIG. 14D may be referred to that of the element as illustrated in FIGS. 14A-14C and 14C-1. The difference between the sixth and seventh types of skeletons 7206 and 7207 for the first type of micro heat pipe 700 is that for the seventh type of skeleton 7207 for the first type of micro heat pipe 700, as seen in FIG. 14D, the two vacancies 709*a* connecting to said each of the cavities 713 may be formed respectively in two of its partitioning walls 701 at two opposite sides of said each of the cavities 713, e.g., at the opposite left and right sides of said each of the cavities 713, and two of the openings 702*a* in its metal plate 702 may be formed under and connect to the two vacancies 709*a* respectively. The two first type of channels 709 may be formed in said two of its partitioning walls 701 respectively, and each of the two first type of channels 709 may connect one of the two vacancies 709*a* to said each of the cavities 713. In this case, for the seventh type of skeleton 7207 for the first type of micro heat pipe 700, each of the two first type of channels 709 may be shaped as a straight channel. Alternatively, for the seventh type of skeleton 7207, the two first type of channels 709 in respective said two of its partitioning walls 701 may be redesigned respectively as two second type of channels 709 as illustrated in FIG. 11A at the left side of said each of the cavities 713 and as illustrated in FIG. 11C at the right side of said each of the cavities 713. Alternatively, for the seventh type of skeleton 7207, the two first type of channels 709 in respective said two of its partitioning walls 701 may be redesigned respectively as two third type of channels 709 as illustrated in FIG. 11B at the left side of said each of the cavities 713 and as illustrated in FIG. 11D at the right side of said each of the cavities 713.

Specification for Eighth Type of Skeleton for First Type of Micro Heat Pipe

Figure 15A:
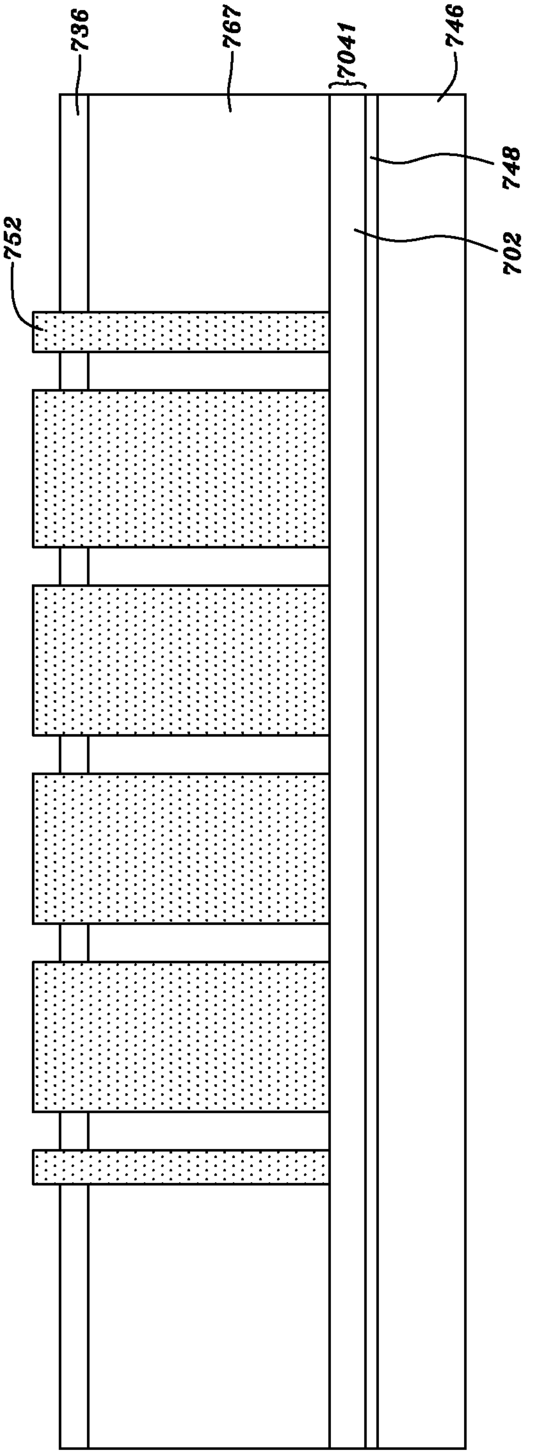
FIGS. 15A and 15B are schematically cross-sectional views showing a process for fabricating an eighth type of skeleton for a first type of micro heat pipe in accordance with an embodiment of the present application.
Figures 1, 15B:
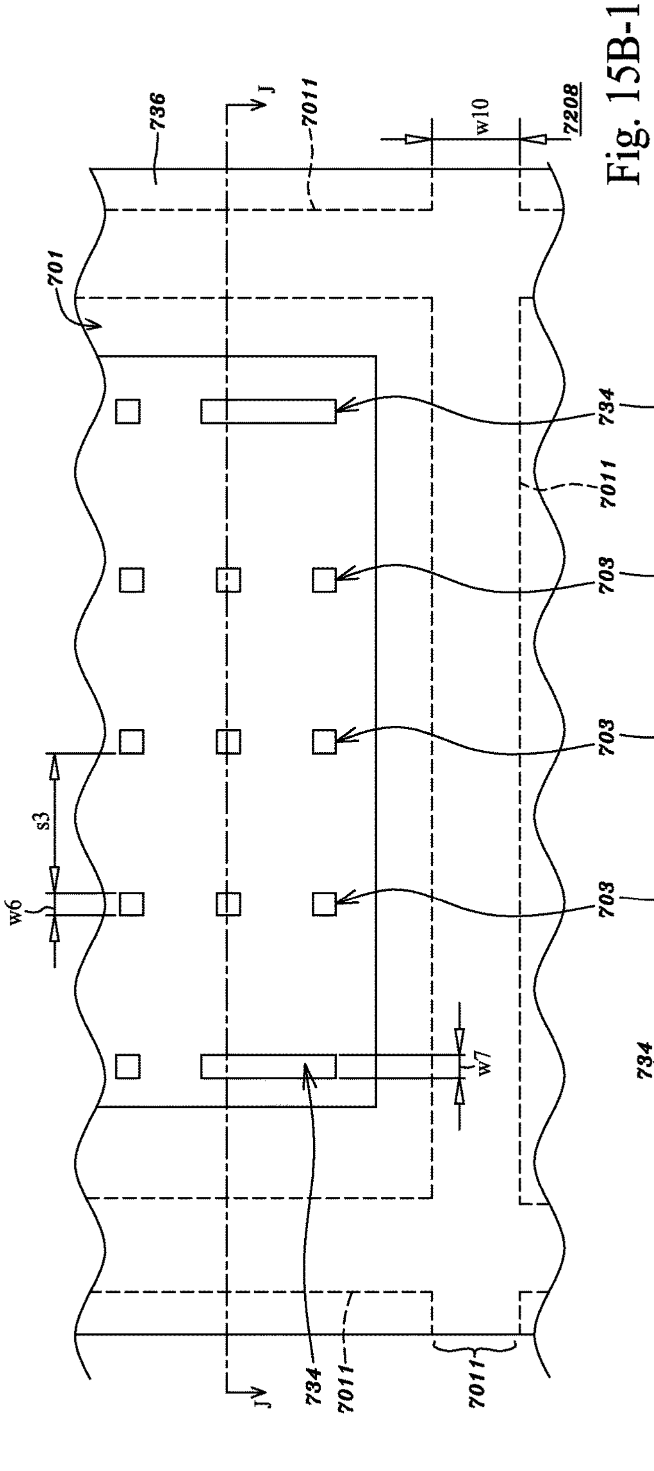
Figure 15B:
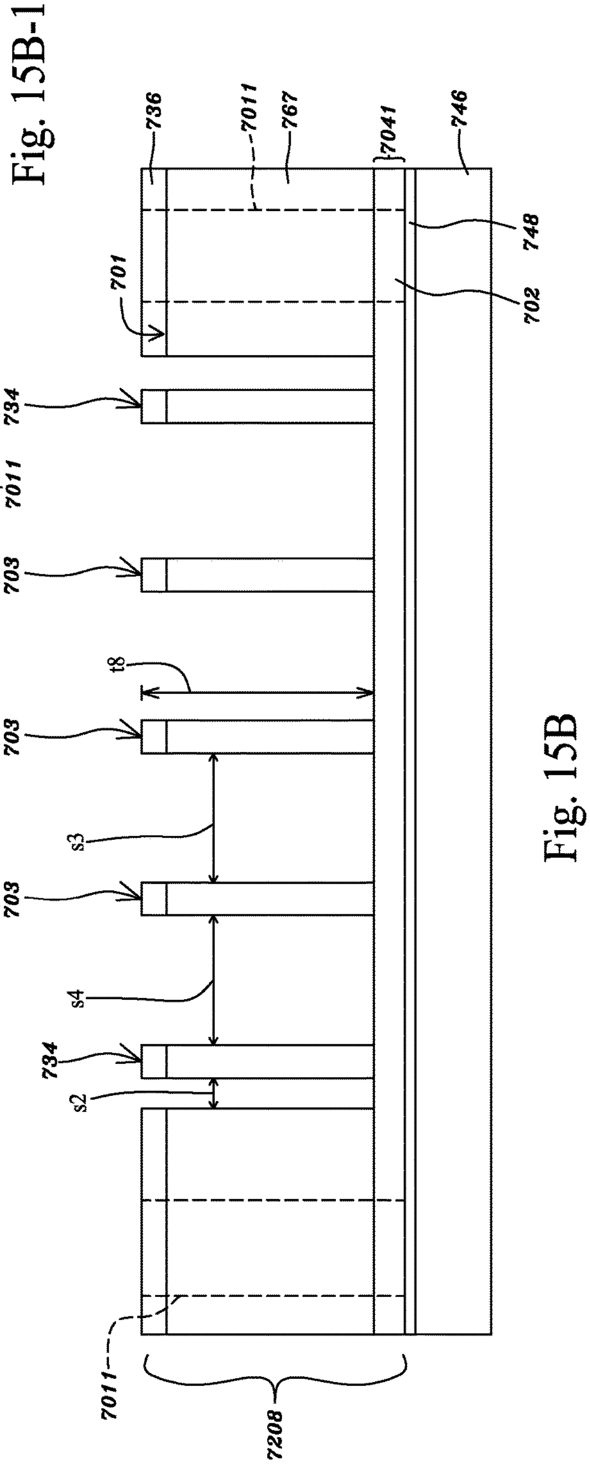

FIGS. 15A and 15B are schematically cross-sectional views showing a process for fabricating an eighth type of skeleton for a first type of micro heat pipe in accordance with an embodiment of the present application. FIG. 15B-1 is a schematically top view showing the step illustrated in FIG. 15B for a process for fabricating an eighth type of skeleton for a first type of micro heat pipe in accordance with an embodiment of the present application, wherein FIG. 15B is a schematically cross-sectional view cut along a cross-sectional line J-J in FIG. 15B-1. The process for fabricating the eighth type of skeleton for a first type of micro heat pipe is similar to that for fabricating the fourth type of skeleton for a first type of micro heat pipe. For an element indicated by the same reference number shown in FIGS. 12A-12C, 12A-1, 12C-1, 15A, 15B and 15B-1, the specification of the element as seen in FIGS. 15A, 15B and 15B-1 may be referred to that of the element as illustrated in FIGS. 12A-12C, 12A-1 and 12C-1. The difference between the processes for fabricating the fourth and eighth types of skeletons for a first type of micro heat pipe is that for fabricating the eighth type of skeleton for a first type of micro heat pipe as illustrated in FIGS. 15A, 15B and 15B-1, the metal layer 764 as illustrated in FIGS. 12A and 12A-1 may be replaced with the metal plate 702 as seen in FIG. 15A, such as copper foil or layer having a thickness between and including 5 and 100 micrometers, which may be laminated on the temporary substrate 746 using the glue layer 748. The metal plate 702 is formed for a bottom metal plate 7041 of an eighth type of skeleton. Next, referring to FIG. 15A, the photoresist layer 752 having a high aspect ratio may be laminated or spin coated with a thickness between and including 20 and 800 micrometers on the metal plate 702 and then patterned with multiple openings using a photolithography process, i.e., exposure and developing processes, to expose the metal plate 702. Next, a metal layer 767 of copper having a thickness between and including 100 and 1,000 micrometers may be electroplated in the openings in the photoresist layer 752 and on the metal plate 702 not covered by the photoresist layer 752. Next, a solder layer 736 of a tin-containing alloy having a thickness between and including 5 and 50 micrometers may be electroplated on the metal layer 767 not covered by the photoresist layer 752.

Next, referring to FIGS. 15B and 15B-1, the photoresist layer 752 may be stripped to expose the metal plate 702 not under the metal layer 767 such that multiple metal posts 703 of the eighth type of skeleton 7208 may be formed each with a first piece of the metal layer 767, multiple metal guides 734 of the eighth type of skeleton 7208 may be formed each with a second piece of the metal layer 767, and multiple partitioning walls 701 of the eighth type of skeleton 7208 may be formed each with a third piece of the metal layer 767.

Referring to FIGS. 15B and 15B-1, for the eighth type of skeleton 7208, the first piece of the metal layer 767 for each of its metal posts 703 may have a width w6 between 20 and 200 micrometers. The second piece of the metal layer 767 for each of its metal guides 734 may have a width w7 between 20 and 200 micrometers. The third piece of the metal layer 767 for each of its partitioning walls 701 may have a scribe line 7011 extending along said each of its partitioning walls 701, wherein the scribe line 7011 may have a width w10 between 50 and 150 micrometers reserved to be cut in the following process to fabricate a plurality of first type of micro heat pipes. A space s3 from the first piece of the metal layer 767 for each of its metal posts 703 to the first piece of the metal layer 767 for another of its metal posts 703 neighboring said each of its metal posts 703 may be between 100 and 500 micrometers. A space s4 from the second piece of the metal layer 767 for one of its metal guides 734 to the first piece of the metal layer 767 for one of its metal posts 703 neighboring said one of its metal guides 734 may be between 100 and 500 micrometers. A space s2 from the second piece of the metal layer 767 for one of its metal guides 734 to the third piece of the metal layer 767 for one of its partitioning walls 701 neighboring said one of its metal guides 734 may be less than 20 or 30 micrometers or between 3 and 30 micrometers, and the space s2 may be used as a vertical liquid capillary or channel for liquid that flows vertically by capillary effect or surface tension. The metal layer 767 for each of its metal posts 703, each of its metal guides 734 and each of its partitioning walls 701 may have a thickness between and including 100 and 1,000 micrometers. The solder layer 736 on each of its metal posts 703, each of its metal guides 734 and each of its partitioning walls 701 may have a thickness between and including 5 and 50 micrometers. Each of its metal posts 703, metal guides 734 and partitioning walls 701 may have a total vertical thickness t8 between and including 100 and 1,000 micrometers. Its bottom metal plate 7041, i.e., metal plate 702, may have a thickness between and including 5 and 100 micrometers.

Various Structure for First Type of Micro Heat Pipe

Specification for First Type of Micro Heat Pipe for First Alternative

Figure 16A:
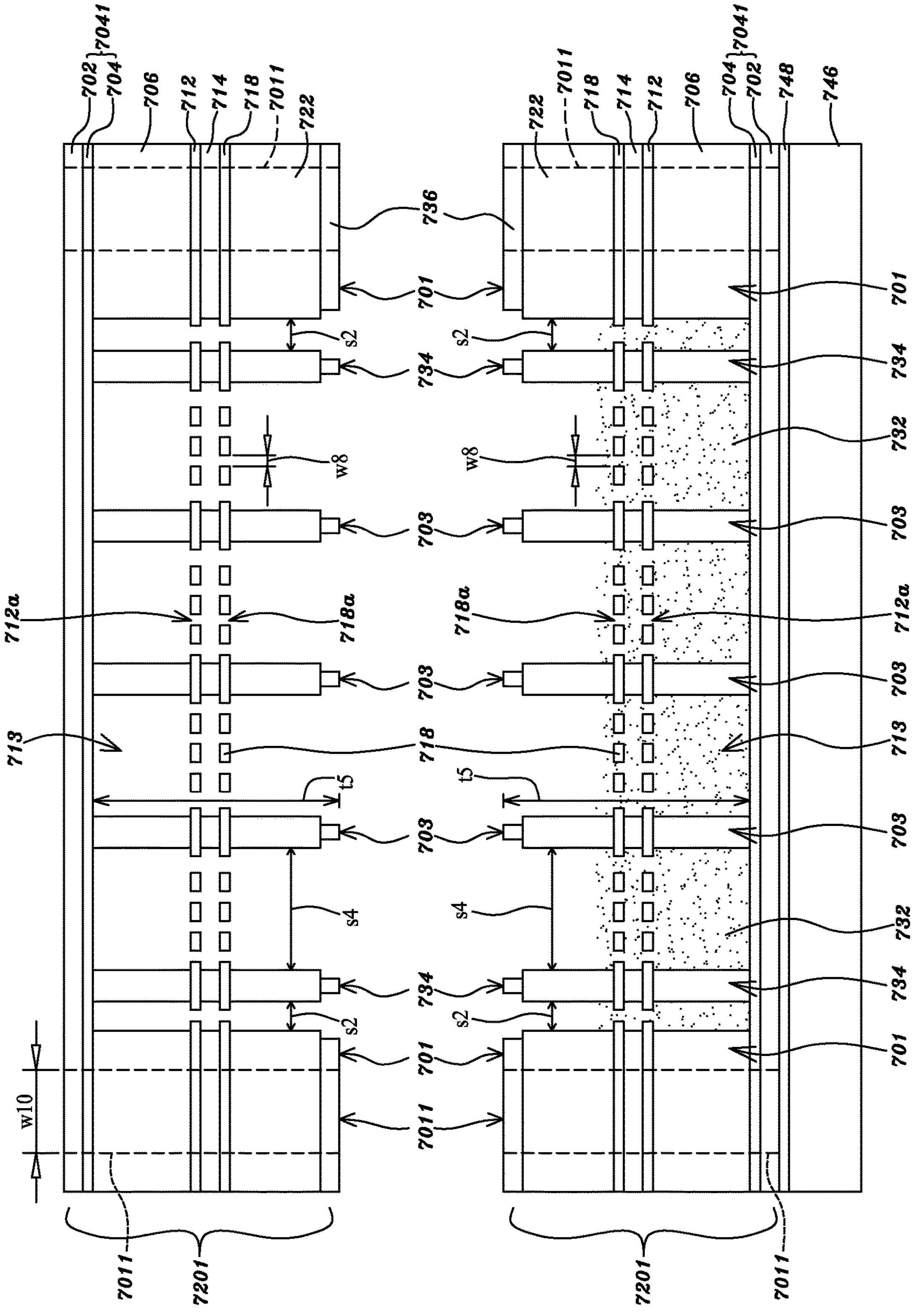
FIGS. 16A-16C are schematically cross-sectional views showing a process for fabricating a first type of micro heat pipe for a first alternative in accordance with an embodiment of the present application.
Figure 16B:
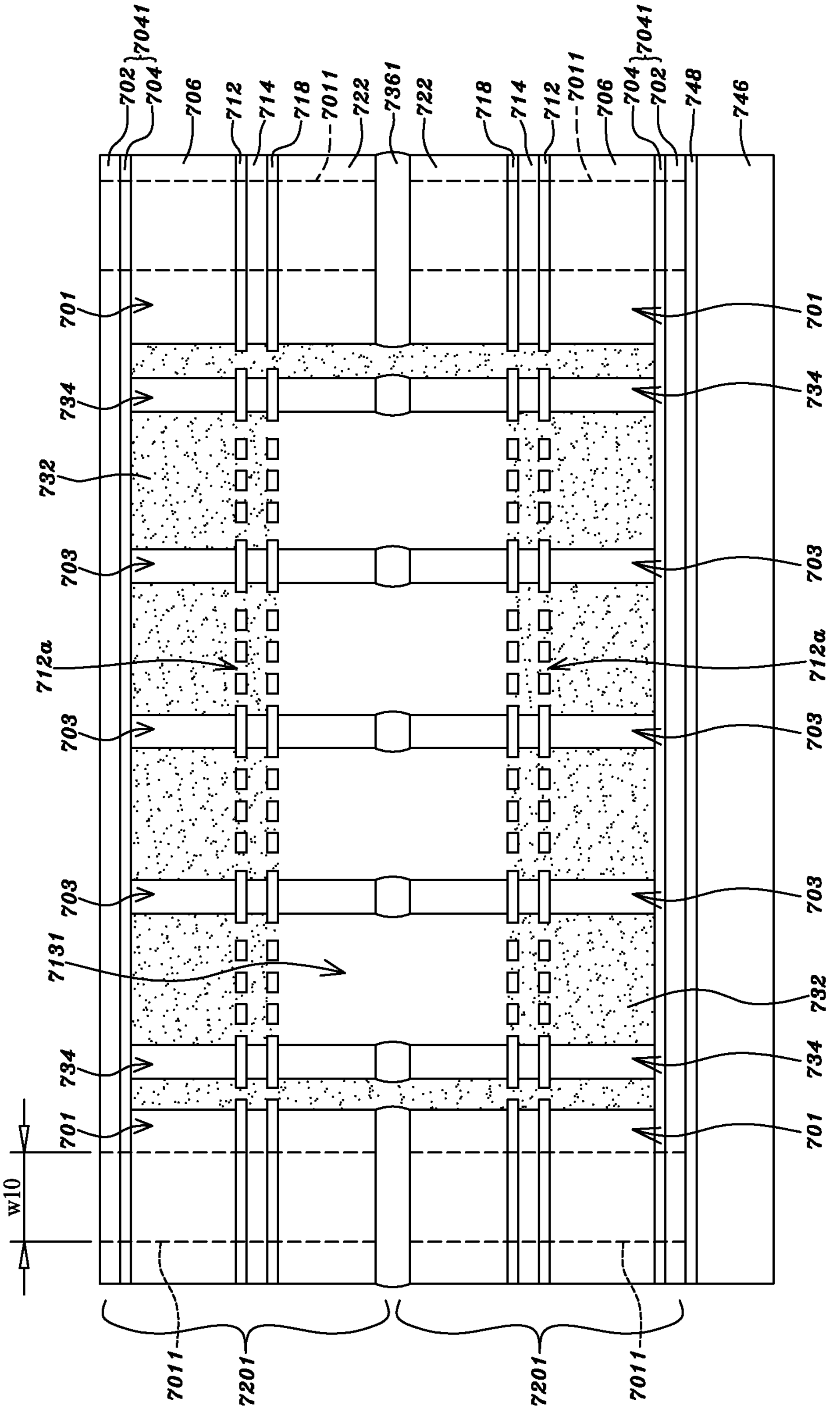
Figure 16C:
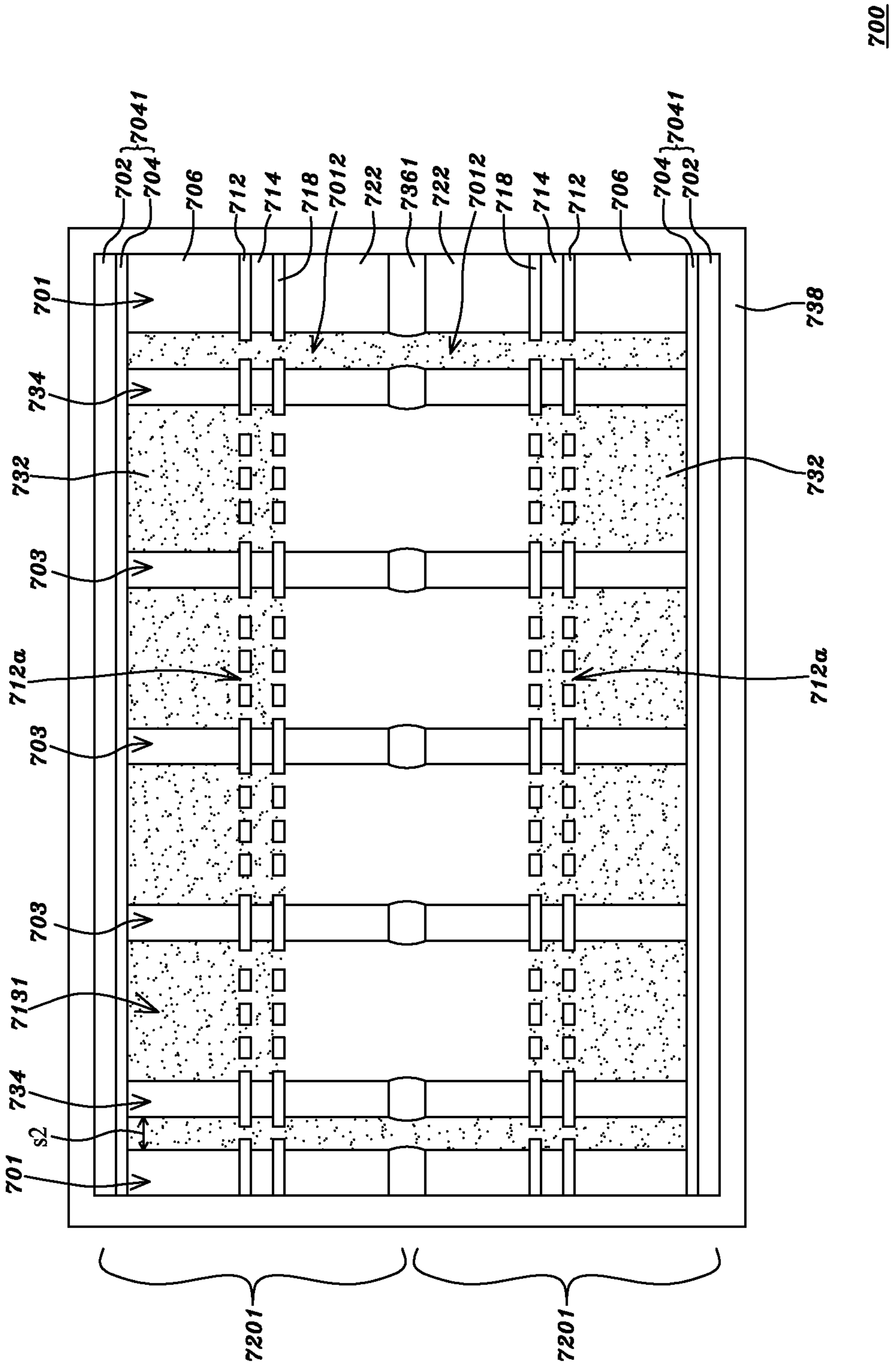

FIGS. 16A-16C are schematically cross-sectional views showing a process for fabricating a first type of micro heat pipe for a first alternative in accordance with an embodiment of the present application. Referring to FIG. 16A, two of the first type of skeletons 7201 as seen in FIGS. 9D and 9D-1 are provided as top and bottom skeletons, wherein the temporary substrate 746 and glue layer 748 may be removed from an outer surface of the metal plate 702 of the top skeleton 7201. Next, for an optional process, a liquid 732, such as water, ethanol, methanol or a solution containing the above-mentioned materials, may be fed into the cavities 713 (only one is shown) in the bottom skeleton 7201. Next, the top and bottom skeletons 7201 may be placed in a closed chamber (not shown), into which vaper of the liquid 732 may be purged to repel air from the closed chamber. Next, the optional process may be performed to feed the liquid 732 into the cavities 713 in the bottom skeleton 7201. Next, the top skeleton 7201 may be turned upside down and flipped to have the solder layer 736 of the top skeleton 7201 contact and aligned with the solder layer 736 of the bottom skeleton 7201, wherein the scribe line 7011 of each of the partitioning walls 701 of the top skeleton 7201 may be vertically aligned with the scribe line 7011 of one of the partitioning walls 701 of the bottom skeleton 7201. In this case, the scribe line 7011 of each of the partitioning walls 701 of each of the top and bottom skeletons 7201 may have a width w10 between 50 and 150 micrometers.

Next, referring to FIG. 16B, an ultrasonic compression bonding process may be performed at a temperature below the boiling temperature of the liquid 732 and in the closed chamber to bond the solder layer 736 of the top skeleton 7201 and the solder layer 736 of the bottom skeleton 7201 into multiple solder contacts 7361 such as a tin-containing alloy having a thickness between and including 5 and 100 micrometers. Each of the solder contacts 7361 may bond one of the metal posts 703 of the top skeleton 7201 to one of the metal posts 703 of the bottom skeleton 7201, one of the metal guides 734 of the top skeleton 7201 to one of the metal guides 734 of the bottom skeleton 7201, or one of the partitioning walls 701 of the top skeleton 7201 to one of the partitioning walls 701 of the bottom skeleton 7201. For example, in the case that the liquid 732 is water, the ultrasonic compression bonding process may be performed at a temperature between 80 and 95 degrees Celsius and in the closed chamber to bond the solder layer 736 of the top skeleton 7201 to the solder layer 736 of the bottom skeleton 7201. In the case that the liquid 732 is methanol, the ultrasonic compression bonding process may be performed at a temperature between 5 and 20 degrees Celsius and in the closed chamber to bond the solder layer 736 of the top skeleton 7201 to the solder layer 736 of the bottom skeleton 7201. In the case that the liquid 732 is ethanol, the ultrasonic compression bonding process may be performed at a temperature between 65 and 75 degrees Celsius and in the closed chamber to bond the solder layer 736 of the top skeleton 7201 to the solder layer 736 of the bottom skeleton 7201. Thereby, each of the cavities 713 in the top skeleton 7201 may be connected to one of the cavities 713 in the bottom skeleton 7201 vertically under said each of the cavities 713 in the top skeleton 7201 to form a chamber 7131 sealed by the top and bottom skeletons 7201. Next, the top and bottom skeletons 7201 may be moved out of the closed chamber. Next, the temporary substrate 746 and glue layer 748 may be removed from an outer surface of the metal plate 702 of the bottom skeleton 7201.

Next, referring to FIG. 16C, a mechanical sawing process for singulation may be performed to saw the top metal plate 7041 and partitioning wall 701 of the top skeleton 7201 and the bottom metal plate 7041 and partitioning wall 701 of the bottom skeleton 7201 along the vertically-aligned scribe lines 7011 of the partitioning walls 701 of the top and bottom skeletons 7201 into multiple units, wherein in this case the width w10 of the scribe line 7011 of each of the partitioning walls 701 of each of the top and bottom skeletons 7201 may be between 50 and 150 micrometers. Each of the partitioning walls 701 of each of the top and bottom skeletons 7201 may be cut into two of the outer sidewalls 7012 of respective neighboring two of the units. Next, for each of the units, a metal layer 738, such as copper or nickel, may be electroplated with a thickness between and including 1 and 15 micrometers on an outer surface of each of its peripheral walls, provided by the top metal plate 7041 and outer sidewalls 7012 of the top skeleton 7201 and the bottom metal plate 7041 and outer sidewalls 7012 of the bottom skeleton 7201, to form the first type of micro heat pipe 700 for the first alternative. Thereby, the liquid 732 may be sealed in the chamber 7131 to be used as a vapor chamber in the first type of micro heat pipe 700 for the first alternative. For the first type of micro heat pipe 700 for the first alternative, since in its chamber 7131 are the metal meshes or nets 712 and 718 and metal guides 734 all provided by each of the top and bottom skeletons 7201 and the space s2 may be used as a vertical liquid capillary or channel for its liquid 732 that flows vertically by capillary effect or surface tension, its liquid 732 may flow in a space under and/or at its metal meshes or nets 712 and 718 in its chamber 7131 provided by the bottom skeleton 7201 with a high efficiency of liquid transfer. Further, a vapor of its liquid 732 may flow in a space over and/or at its metal meshes or nets 712 and 718 in its chamber 7131 based on convection mechanism. A total pressure, i.e., vapor pressure, in its chamber 7131 may be smaller than 20 kilopascals (kPa) or 5 kilopascals (kPa) at a temperature of 25 degrees Celsius. A partial pressure of a vapor of its liquid 732 may be greater than 99% or 95% of a total gas pressure in its chamber 7131.

Referring to FIG. 16C, the first type of micro heat pipe 700 for the first alternative may have a total height between and including 50 and 2000 micrometers, 50 and 200 micrometers, 100 and 500 micrometers or 100 and 3000 micrometers. For the first type of micro heat pipe 700 for the first alternative, each of its outer sidewalls 7012 may have a width between and including 50 and 1000 micrometers, and a transverse dimension of the width of said each of its outer sidewalls 7012 plus the thickness of its metal layer 738 on said each of its outer sidewalls 7012 may be between and including 50 and 1000 micrometers. A vertical dimension of the thickness of its bottom metal plate 7041 plus the thickness of its metal layer 738 on its bottom metal plate 7041 may be between and including 5 and 100 micrometers. A vertical dimension of the thickness of its top metal plate 7041 plus the thickness of its metal layer 738 on its top metal plate 7041 may be between and including 5 and 100 micrometers. Each of its metal posts 703 provided by the bottom skeleton 7201 and one of its metal posts 703 provided by the top skeleton 7201 over said each of its metal posts 703 may form a metal pillar having a top end joining its top metal plate 7041 provided by the top skeleton 7201 and a bottom end joining its bottom metal plate 7041 provided by the bottom skeleton 7201, wherein in a case its metal pillar may have a height less than 500 micrometers to hold a space between its top and bottom metal plates 7041 with a vertical distance therebetween that may be less than 500 micrometers.

Specification for First Type of Micro Heat Pipe for Second Alternative

Figure 17A:
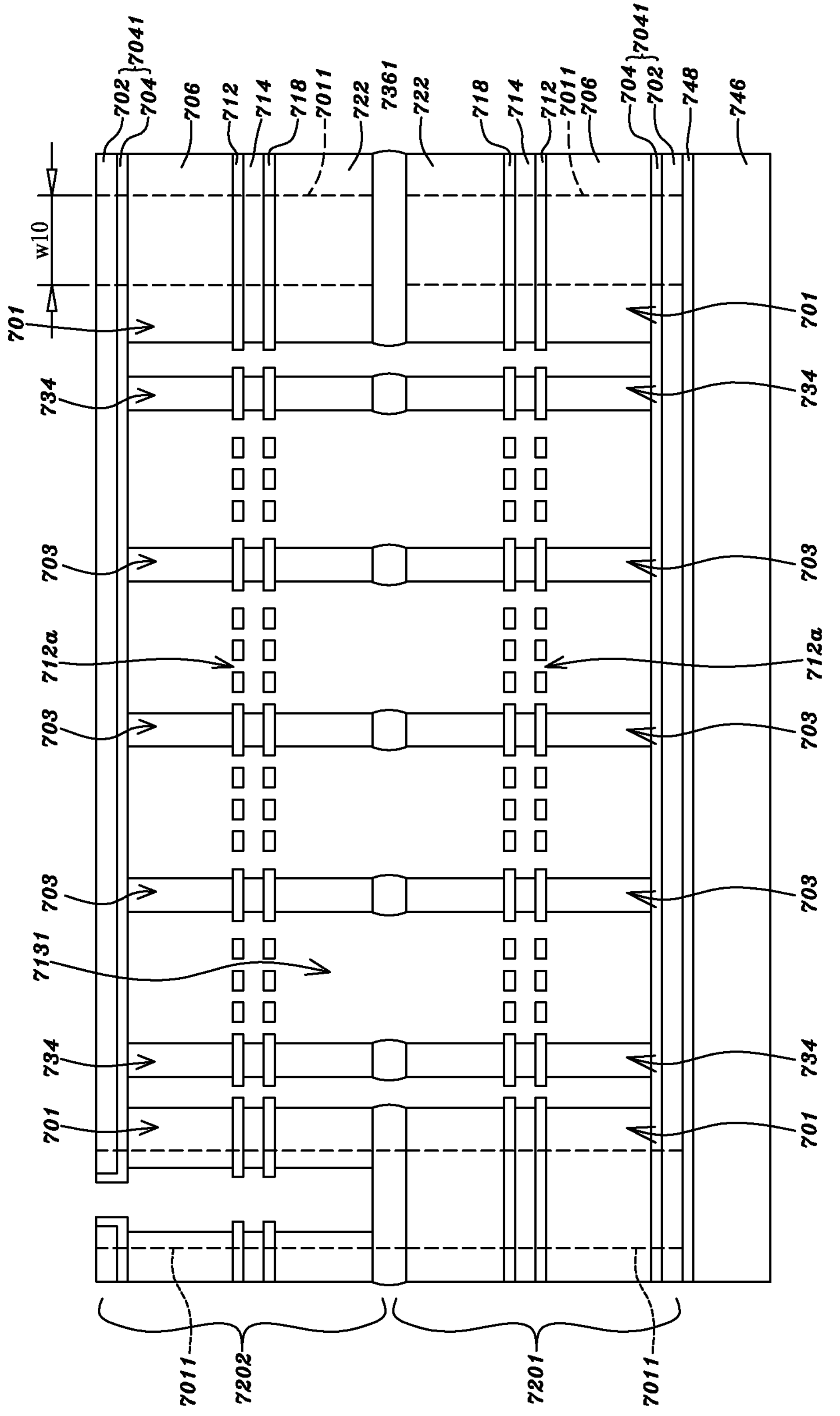
FIGS. 17A-17C are schematically cross-sectional views showing a process for fabricating a first type of micro heat pipe for a second alternative in accordance with an embodiment of the present application.
Figures 1, 17B:
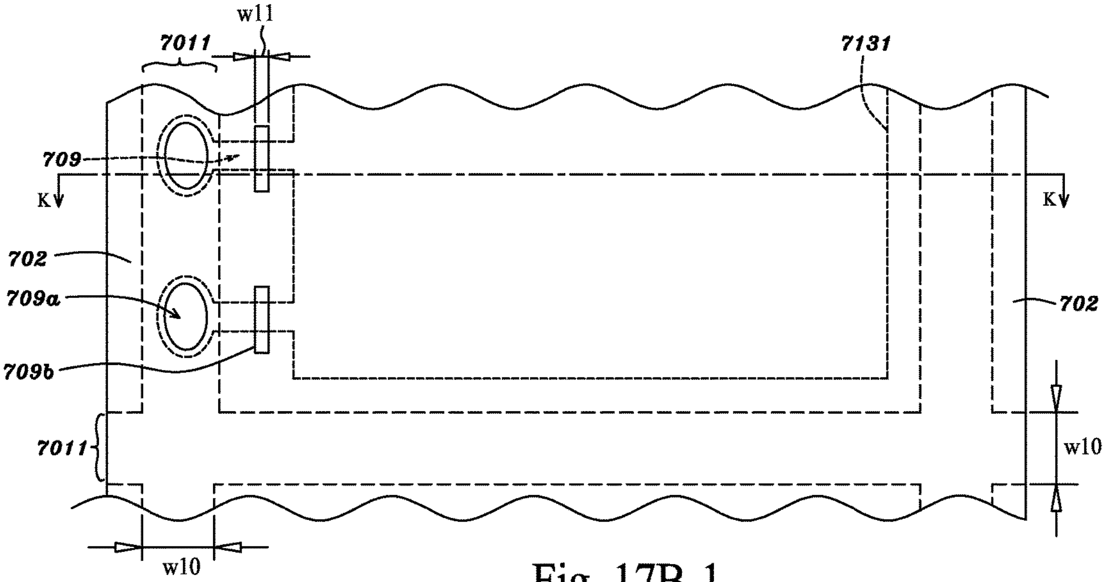
Figure 17B:
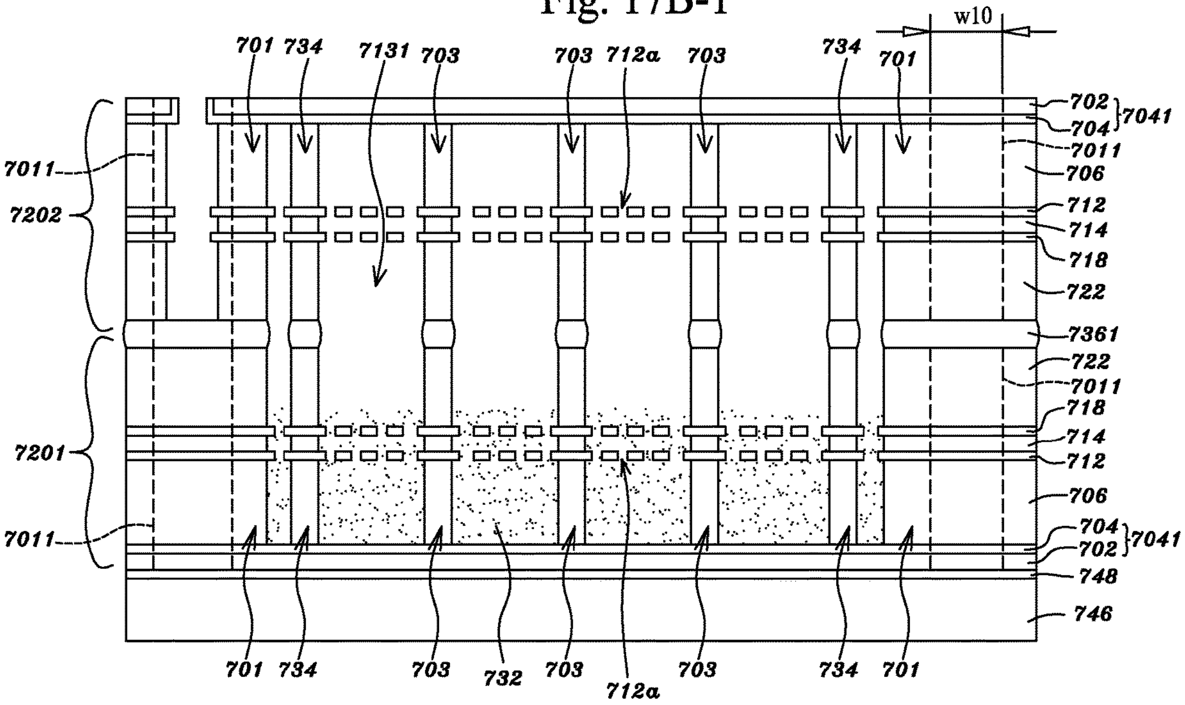
Figure 17C:
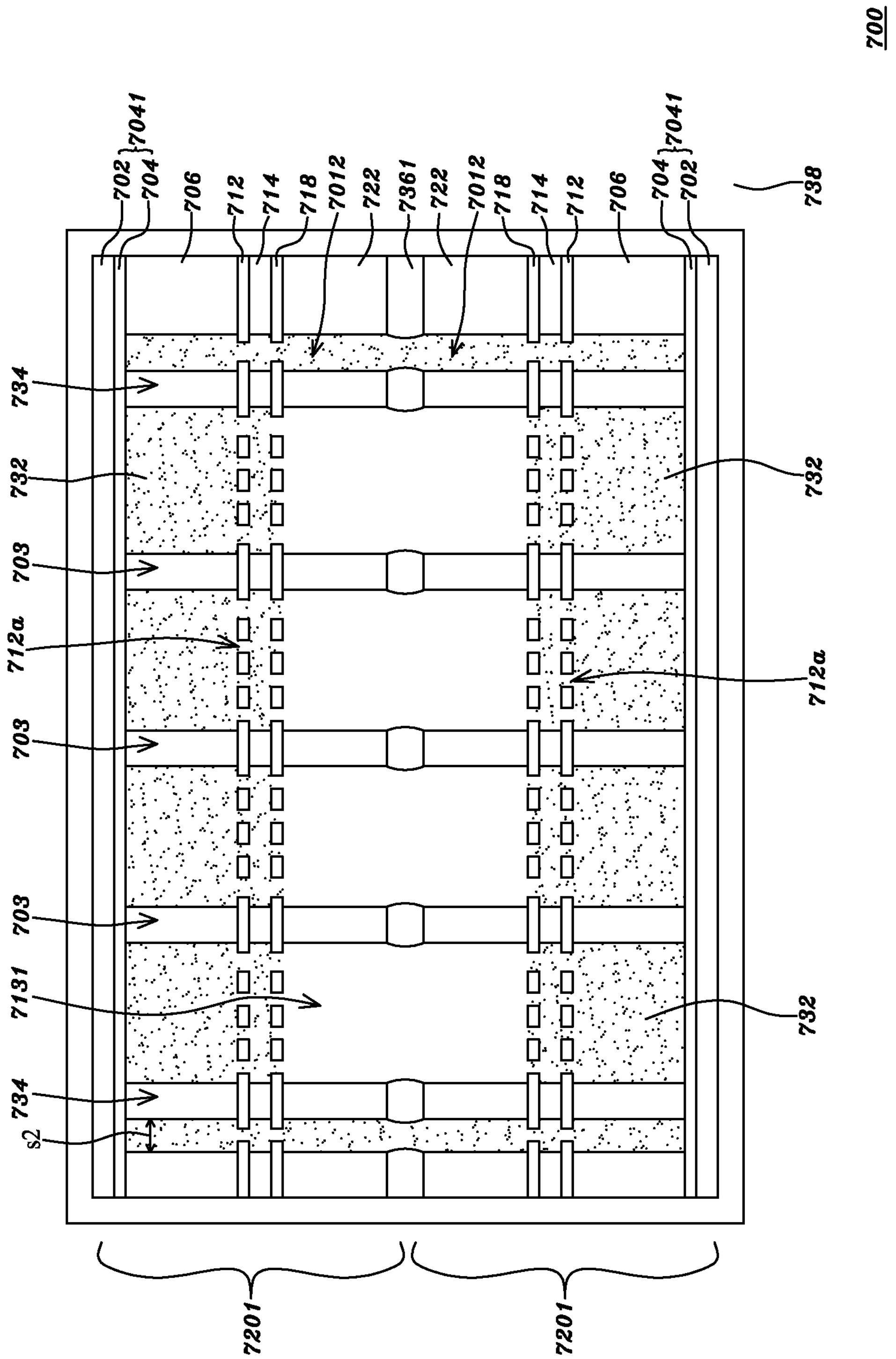

FIGS. 17A-17C are schematically cross-sectional views showing a process for fabricating a first type of micro heat pipe for a second alternative in accordance with an embodiment of the present application. FIG. 17B-1 is a schematically top view showing steps illustrated in FIG. 17B for a process for fabricating a first type of micro heat pipe for a second alternative in accordance with an embodiment of the present application, wherein FIG. 17B is a schematically cross-sectional view cut along a cross-sectional line K-K in FIG. 17B-1. Referring to FIG. 17A, the first type of skeleton 7201 as seen in FIGS. 9D and 9D-1 may be provided as a bottom skeleton, and the second type of skeleton 7202 as seen in FIGS. 10E and 10E-1, 11A and 11B or the third type of skeleton 7203 as seen in FIGS. 10F, 11A-11D may be provided as a top skeleton. In this case shown in FIGS. 17A-17C, the second type of skeleton 7202 as seen in FIGS. 10E and 10E-1, 11A and 11B is provided as a top skeleton. First, the top skeleton 7202 or 7203 may be turned upside down and flipped to have the solder layer 736 of the top skeleton 7202 or 7203 contact and aligned with the solder layer 736 of the bottom skeleton 7201, wherein the scribe line 7011 of each of the partitioning walls 701 of the top skeleton 7202 or 7203 may be vertically aligned with the scribe line 7011 of one of the partitioning walls 701 of the bottom skeleton 7201. In this case, the scribe line 7011 of each of the partitioning walls 701 of each of the top skeleton 7202 or 7203 and bottom skeleton 7201 may have a width w10 between 100 and 1000 micrometers.

Next, referring to FIG. 17B, a thermal compression bonding may be performed to bond the solder layer 736 of the top skeleton 7202 or 7203 and the solder layer 736 of the bottom skeleton 7201 into multiple solder contacts 7361 such as a tin-containing alloy having a thickness between and including 5 and 100 micrometers. Each of the solder contacts 7361 may bond one of the metal posts 703 of the top skeleton 7202 or 7203 to one of the metal posts 703 of the bottom skeleton 7201, one of the metal guides 734 of the top skeleton 7202 or 7203 to one of the metal guides 734 of the bottom skeleton 7201, or one of the partitioning walls 701 of the top skeleton 7202 or 7203 to one of the partitioning walls 701 of the bottom skeleton 7201.

Alternatively, the solder layer 736 of the top skeleton 7202 or 7203 and the solder layer 736 of the bottom skeleton 7201 may not be formed, and a direct bonding process or copper-to-copper process may be performed at a temperature between 300 and 350 degrees Celsius for a time period between 10 and 60 minutes to bond the metal layer 722 of copper of the top skeleton 7202 or 7203 to the metal layer 722 of copper of the bottom skeleton 7201 due to copper inter-diffusion between the metal layer 722 of copper of the top skeleton 7202 or 7203 and the metal layer 722 of copper of the bottom skeleton 7201. Each of the first pieces of the metal layer 722 of copper of the top skeleton 7202 or 7203 for one of the metal posts 703 of the top skeleton 7202 or 7203 may be directly bonded via copper-to-copper inter-diffusion to one of the first pieces of the metal layer 722 of copper of the bottom skeleton 7201 for one of the metal posts 703 of the bottom skeleton 7201. Each of the second pieces of the metal layer 722 of copper of the top skeleton 7202 or 7203 for one of the metal guides 734 of the top skeleton 7202 or 7203 may be directly bonded via copper-to-copper inter-diffusion to one of the second pieces of the metal layer 722 of copper of the bottom skeleton 7201 for one of the metal guides 734 of the bottom skeleton 7201. Each of the third pieces of the metal layer 722 of copper of the top skeleton 7202 or 7203 for one of the partitioning walls 701 of the top skeleton 7202 or 7203 may be directly bonded via copper-to-copper inter-diffusion to one of the third pieces of the metal layer 722 of copper of the bottom skeleton 7201 for one of the partitioning walls 701 of the bottom skeleton 7201. Thereby, each of the cavities 713 in the top skeleton 7202 or 7203 may be connected to one of the cavities 713 in the bottom skeleton 7201 vertically under said each of the cavities 713 in the top skeleton 7202 or 7203 to form a chamber 7131 enclosed by the top skeleton 7202 or 7203 and bottom skeleton 7201.

Next, referring to FIG. 17B, the top skeleton 7202 or 7203 and bottom skeleton 7201 may be placed in a closed chamber (not shown), into which vaper of a liquid 732, such as water, ethanol, methanol or a solution containing the above-mentioned materials, may be purged to repel air from the closed chamber. Next, the liquid 732 may be fed or injected into each of the chambers 7131 via, in sequence, (1) a specific one of the openings 702*a* in the metal plate 702 of the top skeleton 7202 or 7203, (2) a specific one of the two vacancies 709*a* in one of the partitioning walls 701 of the top skeleton 7202 or 7203 under the specific one of the openings 702*a* and (3) a specific one of the first, second or third type of channels 709 in said one of the partitioning walls 701 of the top skeleton 7202 or 7203 and connecting the specific one of the two vacancies 709*a* to said each of the chambers 7131. Next, the top skeleton 7202 or 7203 and bottom skeleton 7201 may be heated at a temperature between 100 and 120 degrees Celsius to vaporize the liquid 732 in said each of the chambers 7131 and air in said each of the chambers 7131 may be purged away from said each of the chambers 7131 via, in sequence, (1) two of the first, second or third type of channels 709 in one or respective opposite two of the partitioning walls 701 of the top skeleton 7202 or 7203 and connecting to said each of the chambers 7131, (2) the two vacancies 709*a* in said one or said respective opposite two of the partitioning walls 701 of the top skeleton 7202 or 7203 and connecting to said each of the chambers 7131 through respective said two of the first, second or third type of channels 709 and (3) two of the openings 702*a* in the metal plate 702 of the top skeleton 7202 or 7203 vertically over the respective two vacancies 709*a*. Next, the liquid 732 may be fed or injected again into said each of the chambers 7131 via, in sequence, (1) the specific one of the openings 702*a*, (2) the specific one of the two vacancies 709*a* and (3) the specific one of the first, second or third type of channels 709 at a temperature of the closed chamber below the boiling temperature of the liquid 732. For example, in the case that the liquid 732 is water, the liquid 732 may be fed or injected again into said each of the chambers 7131 via, in sequence, (1) the specific one of the openings 702*a*, (2) the specific one of the two vacancies 709*a* and (3) the specific one of the first, second or third type of channels 709 at a temperature of the closed chamber between 80 and 95 degrees Celsius. In the case that the liquid 732 is methanol, the liquid 732 may be fed or injected again into said each of the chambers 7131 via, in sequence, (1) the specific one of the openings 702*a*, (2) the specific one of the two vacancies 709*a* and (3) the specific one of the first, second or third type of channels 709 at a temperature of the closed chamber between 5 and 20 degrees Celsius. In the case that the liquid 732 is ethanol, the liquid 732 may be fed or injected again into said each of the chambers 7131 via, in sequence, (1) the specific one of the openings 702*a*, (2) the specific one of the two vacancies 709*a* and (3) the specific one of the first, second or third type of channels 709 at a temperature of the closed chamber between 65 and 75 degrees Celsius. Next, a polymer (not shown) may be filled into the two vacancies 709*a* and first, second or third type of channels 709 in the partitioning walls 701 of the top skeleton 7202 or 7203 to seal each of the chambers 7131. Next, the top skeleton 7202 or 7203 and bottom skeleton 7201 may be moved out of the closed chamber. Next, for an optional process, the temporary substrate 746 and glue layer 748 may be removed from an outer surface of the metal plate 702 of the bottom skeleton 7201.

Next, referring to FIGS. 17B and 17B-1, the top skeleton 7202 or 7203 may have multiple compressive seal regions 709*b* each extending across over one of the first, second or third type of channels 709 in one of its partitioning walls 701, wherein each of the compressive seal regions 709*b* has a width w11 between 100 and 500 micrometers. The top skeleton 7202 or 7203 may be pressed at each of the compressive seal regions 709*b* to seal each of the first, second or third type of channels 709. Next, the optional process may be performed to remove the temporary substrate 746 and glue layer 748 from an outer surface of the metal plate 702 of the bottom skeleton 7201. Next, a mechanical sawing process for singulation may be performed to saw the top metal plate 7041 and partitioning wall 701 of the top skeleton 7202 or 7203 and the bottom metal plate 7041 and partitioning wall 701 of the bottom skeleton 7201 along the vertically-aligned scribe lines 7011 of the partitioning walls 701 of the top skeleton 7202 or 7023 and bottom skeleton 7201 into multiple units. Each of the partitioning walls 701 of each of the top skeleton 7202 or 7203 and bottom skeleton 7201 may be cut into two of the outer sidewalls 7012 of respective neighboring two of the units.

Next, referring to FIG. 17C, for each of the units, a metal layer 738, such as copper or nickel, may be electroplated with a thickness between and including 1 and 15 micrometers on an outer surface of each of its peripheral walls, provided by the top metal plate 7041 and outer sidewalls 7012 of the top skeleton 7202 or 7203 and the bottom metal plate 7041 and outer sidewalls 7012 of the bottom skeleton 7201, to form the first type of micro heat pipe 700 for the second alternative. Thereby, the liquid 732 may be sealed in the chamber 7131 to be used as a vapor chamber in the first type of micro heat pipe 700 for the second alternative. For the first type of micro heat pipe 700 for the second alternative, since in its chamber 7131 are the metal meshes or nets 712 and 718 and metal guides 734 all provided by each of the top and bottom skeletons 7201 and the space s2 may be used as a vertical liquid capillary or channel for its liquid 732 that flows vertically by capillary effect or surface tension, its liquid 732 may flow in a space under and/or at its metal meshes or nets 712 and 718 in its chamber 7131 provided by the bottom skeleton 7201 with a high efficiency of liquid transfer. Further, a vapor of its liquid 732 may flow in a space over and/or at its metal meshes or nets 712 and 718 in its chamber 7131 based on convection mechanism. A total pressure, i.e., vapor pressure, in its chamber 7131 may be smaller than 20 kilopascals (kPa) or 5 kilopascals (kPa) at a temperature of 25 degrees Celsius. A partial pressure of a vapor of its liquid 732 may be greater than 99% or 95% of a total gas pressure in its chamber 7131.

Referring to FIG. 17C, the first type of micro heat pipe 700 for the second alternative may have a total height between and including 50 and 2000 micrometers, 50 and 200 micrometers, 100 and 500 micrometers or 100 and 3000 micrometers. For the first type of micro heat pipe 700 for the second alternative, each of its outer sidewalls 7012 may have a width between and including 50 and 1000 micrometers, and a transverse dimension of the width of said each of its outer sidewalls 7012 plus the thickness of its metal layer 738 on said each of its outer sidewalls 7012 may be between and including 50 and 1000 micrometers. A vertical dimension of the thickness of its bottom metal plate 7041 plus the thickness of its metal layer 738 on its bottom metal plate 7041 may be between and including 5 and 100 micrometers. A vertical dimension of the thickness of its top metal plate 7041 plus the thickness of its metal layer 738 on its top metal plate 7041 may be between and including 5 and 100 micrometers. Each of its metal posts 703 provided by the bottom skeleton 7201 and one of its metal posts 703 provided by the top skeleton 7202 or 7203 over said each of its metal posts 703 may form a metal pillar having a top end joining its top metal plate 7041 provided by the top skeleton 7202 or 7203 and a bottom end joining its bottom metal plate 7041 provided by the bottom skeleton 7201, wherein in a case its metal pillar may have a height less than 500 micrometers to hold a space between its top and bottom metal plates 7041 with a vertical distance therebetween that may be less than 500 micrometers.

Specification for First Type of Micro Heat Pipe for Third Alternative

Figure 18A:
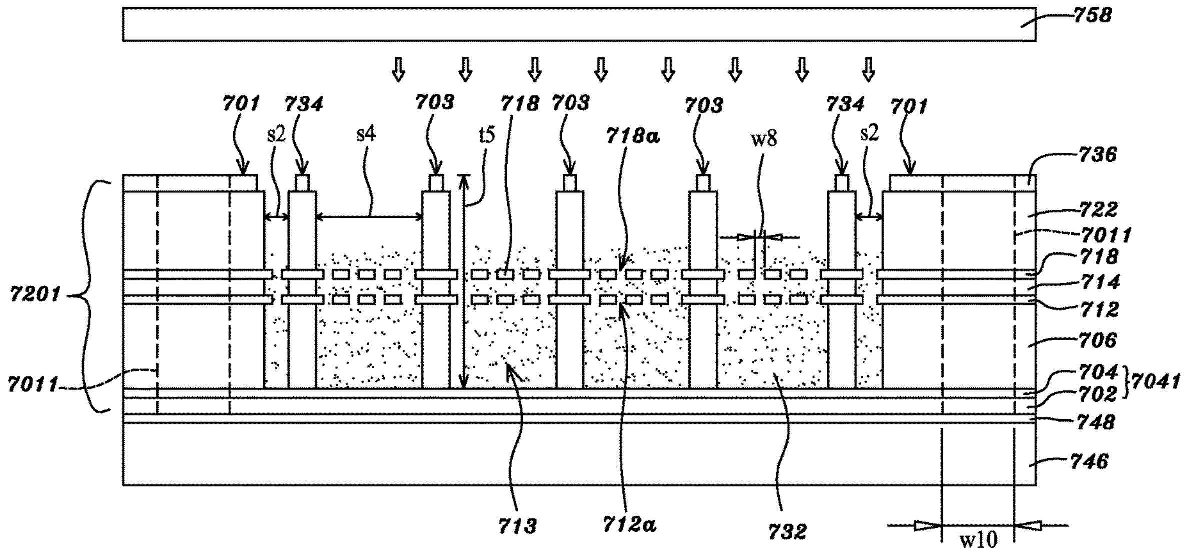
FIGS. 18A-18C are schematically cross-sectional views showing a process for fabricating a first type of micro heat pipe for a third alternative in accordance with an embodiment of the present application.
Figure 18B:
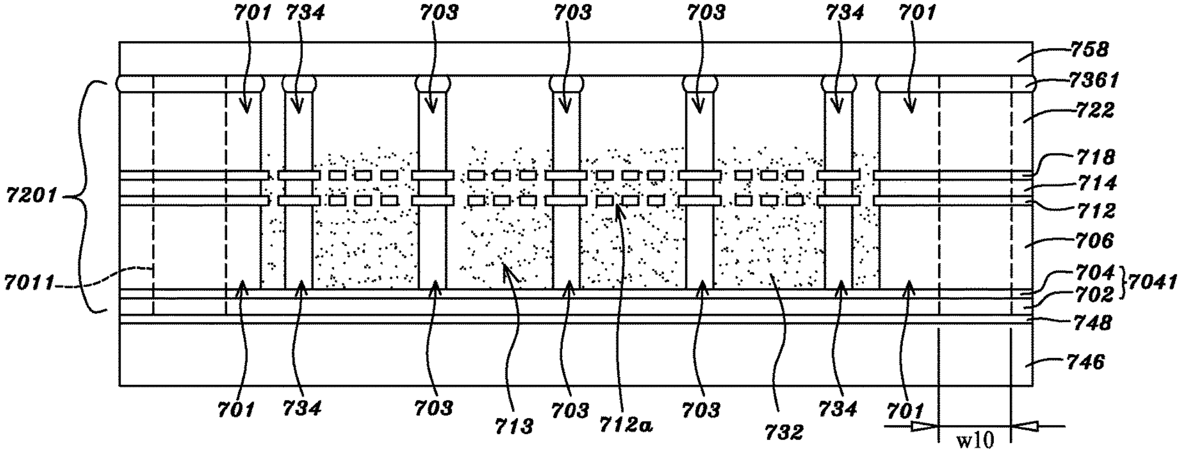
Figure 18C:
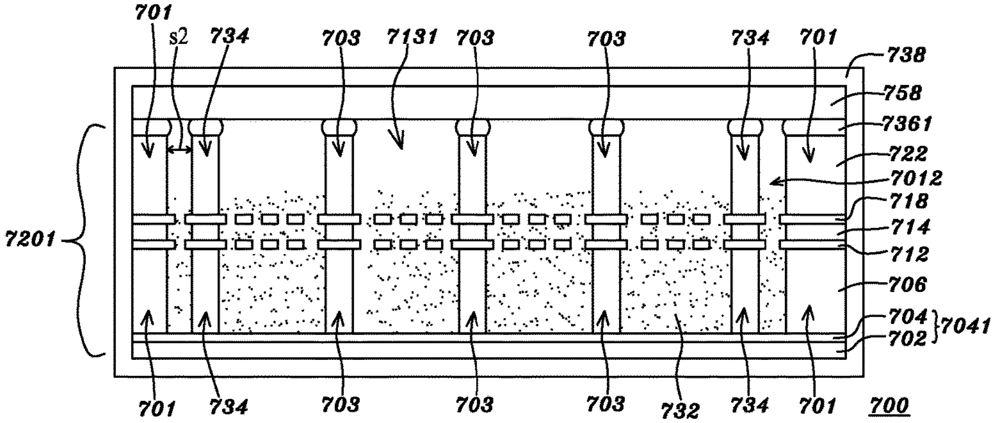

FIGS. 18A-18C are schematically cross-sectional views showing a process for fabricating a first type of micro heat pipe for a third alternative in accordance with an embodiment of the present application. Referring to FIG. 18A, the first type of skeleton 7201 as seen in FIGS. 9D and 9D-1 is provided as a bottom skeleton. First, for an optional process, a liquid 732, such as water, ethanol, methanol or a solution containing the above-mentioned materials, may be fed into the cavities 713 (only one is shown) in the bottom skeleton 7201. Next, the bottom skeleton 7201 and a top metal plate 758 may be placed in a closed chamber (not shown), into which vaper of the liquid 732 may be purged to repel air from the closed chamber, wherein the top metal plate 758 may be a metal layer of copper having a thickness between and including 5 and 100 micrometers. Next, the optional process may be performed to feed the liquid 732 into the cavities 713 in the bottom skeleton 7201. Next, the top metal plate 758 may be placed on and in contact with the solder layer 736 of the bottom skeleton 7201. In this case, the scribe line 7011 of each of the partitioning walls 701 of the bottom skeleton 7201 may have a width w10 between 50 and 150 micrometers.

Next, referring to FIG. 18B, an ultrasonic compression bonding process may be performed at a temperature below the boiling temperature of the liquid 732 and in the closed chamber to bond the top metal plate 758 to the solder layer 736 of the bottom skeleton 7201 to form multiple solder contacts 7361, such as a tin-containing alloy having a thickness between and including 5 and 100 micrometers, each joining the top metal plate 758 to one of the metal posts 703 of the bottom skeleton 7201, one of the metal guides 734 of the bottom skeleton 7201 or one of the partitioning walls 701 of the bottom skeleton 7201. For example, in the case that the liquid 732 is water, the ultrasonic compression bonding process may be performed at a temperature between 80 and 95 degrees Celsius and in the closed chamber to bond the top metal plate 758 to the solder layer 736 of the bottom skeleton 7201. In the case that the liquid 732 is methanol, the ultrasonic compression bonding process may be performed at a temperature between 5 and 20 degrees Celsius and in the closed chamber to bond the top metal plate 758 to the solder layer 736 of the bottom skeleton 7201. In the case that the liquid 732 is ethanol, the ultrasonic compression bonding process may be performed at a temperature between 65 and 75 degrees Celsius and in the closed chamber to bond the top metal plate 758 to the solder layer 736 of the bottom skeleton 7201. Thereby, each of the cavities 713 in the bottom skeleton 7201 may be covered by the top metal plate 758 to form a chamber 7131 sealed by the top metal plate 758 and bottom skeleton 7201. Next, the top metal plate 758 and bottom skeleton 7201 may be moved out of the closed chamber. Next, the temporary substrate 746 and glue layer 748 may be removed from an outer surface of the metal plate 702 of the bottom skeleton 7201.

Next, referring to FIG. 18C, a mechanical sawing process for singulation may be performed to saw the top metal plate 758 and the bottom metal plate 7041 and partitioning walls 701 of the bottom skeleton 7201 along the scribe lines 7011 of the partitioning walls 701 of the bottom skeleton 7201 into multiple units, wherein in this case the width w10 of the scribe line 7011 of each of the partitioning walls 701 of the bottom skeleton 7201 may be between 50 and 150 micrometers. Each of the partitioning walls 701 of the bottom skeleton 7201 may be cut into two of the outer sidewalls 7012 of respective neighboring two of the units. Next, for each of the units, a metal layer 738, such as copper or nickel, may be electroplated with a thickness between and including 1 and 15 micrometers on an outer surface of each of its peripheral walls, provided by the top metal plate 758 and the bottom metal plate 7041 and outer sidewalls 7012 of the bottom skeleton 7201, to form the first type of micro heat pipe 700 for the third alternative. Thereby, the liquid 732 may be sealed in the chamber 7131 to be used as a vapor chamber in the first type of micro heat pipe 700 for the third alternative. For the first type of micro heat pipe 700 for the third alternative, since in its chamber 7131 are the metal meshes or nets 712 and 718 and metal guides 734 provided by the bottom skeleton 7201 and the space s2 may be used as a vertical liquid capillary or channel for its liquid 732 that flows vertically by capillary effect or surface tension, its liquid 732 may flow in a space under and/or at its metal meshes or nets 712 and 718 in its chamber 7131 provided by the bottom skeleton 7201 with a high efficiency of liquid transfer. Further, a vapor of its liquid 732 may flow in a space over and/or at its metal meshes or nets 712 and 718 in its chamber 7131 based on convection mechanism. A total pressure, i.e., vapor pressure, in its chamber 7131 may be smaller than 20 kilopascals (kPa) or 5 kilopascals (kPa) at a temperature of 25 degrees Celsius. A partial pressure of a vapor of its liquid 732 may be greater than 99% or 95% of a total gas pressure in its chamber 7131.

Referring to FIG. 18C, the first type of micro heat pipe 700 for the third alternative may have a total height between and including 50 and 1000 micrometers or 50 and 200 micrometers. For the first type of micro heat pipe 700 for the third alternative, each of its outer sidewalls 7012 may have a width between and including 50 and 1000 micrometers, and a transverse dimension of the width of said each of its outer sidewalls 7012 plus the thickness of its metal layer 738 on said each of its outer sidewalls 7012 may be between and including 50 and 1000 micrometers. A vertical dimension of the thickness of its bottom metal plate 7041 plus the thickness of its metal layer 738 on its bottom metal plate 7041 may be between and including 5 and 100 micrometers. A vertical dimension of the thickness of its top metal plate 7041 plus the thickness of its metal layer 738 on its top metal plate 7041 may be between and including 5 and 100 micrometers. Each of its metal posts 703 provided by the bottom skeleton 7201 may have a top end joining its top metal plate 758 and a bottom end joining its bottom metal plate 7041 provided by the bottom skeleton 7201, wherein in a case each of its metal posts 703 may have a height less than 500 micrometers to hold a space between its top and bottom metal plates 758 and 7041 with a vertical distance therebetween that may be less than 500 micrometers.

Specification for First Type of Micro Heat Pipe for Fourth Alternative

Figure 19A:
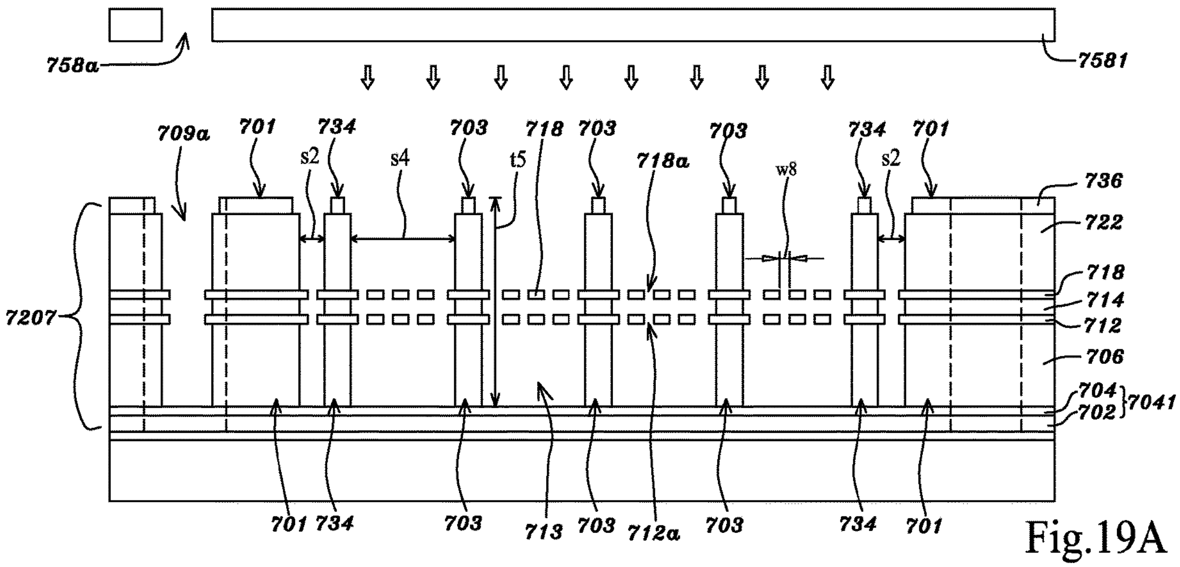
FIGS. 19A-19C are schematically cross-sectional views showing a process for fabricating a first type of micro heat pipe for a fourth alternative in accordance with an embodiment of the present application.
Figures 1, 19B:
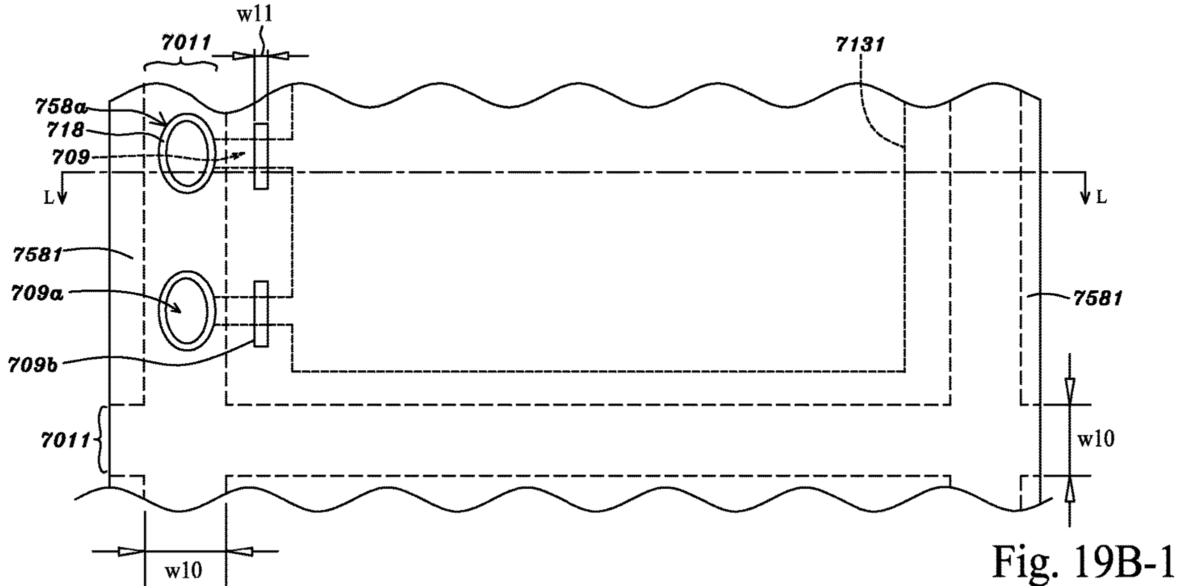
Figure 19B:
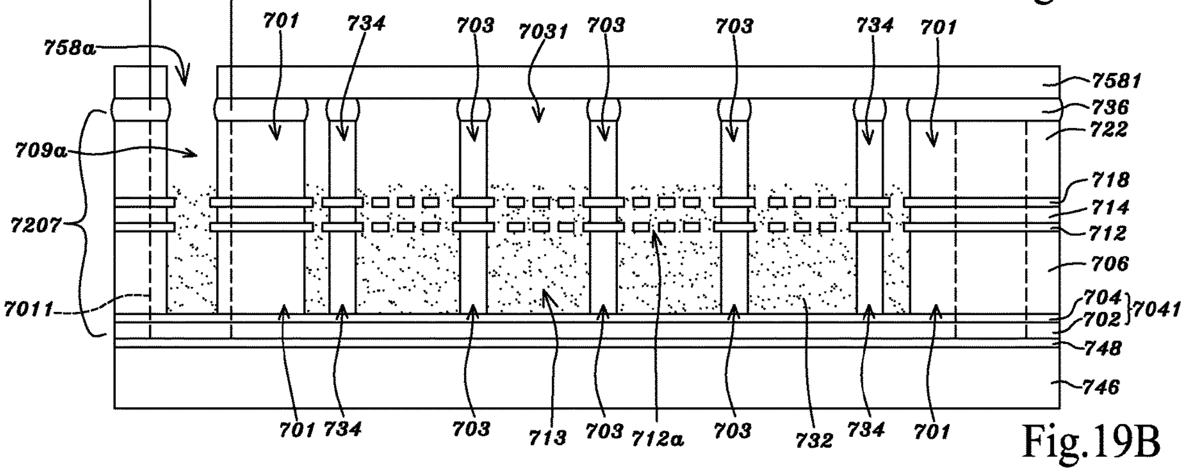
Figure 19C:
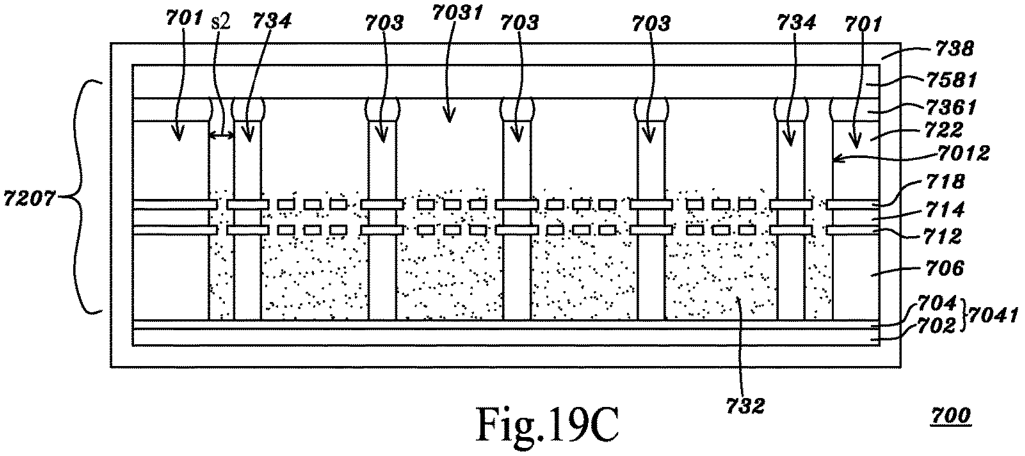

FIGS. 19A-19C are schematically cross-sectional views showing a process for fabricating a first type of micro heat pipe for a fourth alternative in accordance with an embodiment of the present application. FIG. 19B-1 is a schematically top view showing steps illustrated in FIG. 19B for a process for fabricating a first type of micro heat pipe for a fourth alternative in accordance with an embodiment of the present application, wherein FIG. 19B is a schematically cross-sectional view cut along a cross-sectional line L-L in FIG. 19B-1. Referring to FIG. 19A, the second type of skeleton 7202 as seen in FIGS. 10E and 10E-1, 11A and 11B may be formed without any openings 702*a* in its metal plate 702 to provide a bottom skeleton 7209 for a first type of micro heat pipe for a fourth alternative. Alternatively, the third type of skeleton 7203 as seen in FIGS. 10F, 11A-11D may be formed without any openings 702*a* in its metal plate 702 to provide the bottom skeleton 7209 for the first type of micro heat pipe for the fourth alternative. In this case shown in FIGS. 19A-19C, the second type of skeleton 7202 as seen in FIGS. 10E and 10E-1, 11A and 11B formed without any openings 702*a* in its metal plate 702 is provided as the bottom skeleton 7209 for the first type of micro heat pipe for the fourth alternative. First, a top metal plate 7581, such as a metal layer of copper having a thickness between and including 5 and 100 micrometers, may be provided to be placed on and in contact with the solder layer 736 of the bottom skeleton 7209, wherein each of multiple openings 758*a* in the top metal plate 7581 may be aligned with one of the two vacancies 709*a* in one of the partitioning walls 701 of the bottom skeleton 7209. In this case, the scribe line 7011 of each of the partitioning walls 701 of the bottom skeleton 7209 may have a width w10 between 100 and 1000 micrometers. Next, a thermal compression bonding may be performed to bond the top metal plate 7581 to the solder layer 736 of the bottom skeleton 7209 into multiple solder contacts 7361, such as a tin-containing alloy having a thickness between and including 5 and 100 micrometers, each joining the top metal plate 7581 to one of the metal posts 703 of the bottom skeleton 7209, one of the metal guides 734 of the bottom skeleton 7209 or one of the partitioning walls 701 of the bottom skeleton 7209.

Alternatively, the solder layer 736 of the bottom skeleton 7209 may not be formed, and a direct bonding process or copper-to-copper process may be performed at a temperature between 300 and 350 degrees Celsius for a time period between 10 and 60 minutes to bond the top metal plate 7581 of copper to the metal layer 722 of copper of the bottom skeleton 7209 due to copper inter-diffusion between the top metal plate 7581 of copper and the metal layer 722 of copper of the bottom skeleton 7209. The top metal plate 7581 of copper may be directly bonded via copper-to-copper inter-diffusion to each of the first pieces of the metal layer 722 of copper of the bottom skeleton 7209 for one of the metal posts 703 of the bottom skeleton 7209. The top metal plate 7581 of copper may be directly bonded via copper-to-copper inter-diffusion to each of the second pieces of the metal layer 722 of copper of the bottom skeleton 7209 for one of the metal guides 734 of the bottom skeleton 7209. The top metal plate 7581 of copper may be directly bonded via copper-to-copper inter-diffusion to each of the third pieces of the metal layer 722 of copper of the bottom skeleton 7209 for one of the partitioning walls 701 of the bottom skeleton 7209. Thereby, each of the cavities 713 in the bottom skeleton 7209 may be covered by the top metal plate 7581 to form a chamber 7131 enclosed by the top metal plate 7581 and bottom skeleton 7209.

Next, referring to FIG. 19B, the top metal plate 7581 and bottom skeleton 7209 may be placed in a closed chamber (not shown), into which vaper of a liquid 732, such as water, ethanol, methanol or a solution containing the above-mentioned materials, may be purged to repel air from the closed chamber. Next, the liquid 732 may be fed or injected into each of the chambers 7131 via, in sequence, (1) a specific one of the openings 758*a* in the top metal plate 7581, (2) a specific one of the two vacancies 709*a* in one of the partitioning walls 701 of the bottom skeleton 7209 under the specific one of the openings 758*a* and (3) a specific one of the first, second or third type of channels 709 in said one of the partitioning walls 701 of the bottom skeleton 7209 and connecting the specific one of the two vacancies 709*a* to said each of the chambers 7131. Next, the top metal plate 7581 and bottom skeleton 7209 may be heated at a temperature between 100 and 120 degrees Celsius to vaporize the liquid 732 in said each of the chambers 7131 and air in said each of the chambers 7131 may be purged away from said each of the chambers 7131 via, in sequence, (1) two of the first, second or third type of channels 709 in one or respective opposite two of the partitioning walls 701 of the bottom skeleton 7209 and connecting to said each of the chambers 7131, (2) the two vacancies 709*a* in said one or said respective opposite two of the partitioning walls 701 of the bottom skeleton 7209 and connecting to said each of the chambers 7131 through respective said two of the first, second or third type of channels 709 and (3) two of the openings 758*a* in the top metal plate 7581 vertically over the respective two vacancies 709*a*. Next, the liquid 732 may be fed or injected again into said each of the chambers 7131 via, in sequence, (1) the specific one of the openings 758*a*, (2) the specific one of the two vacancies 709*a* and (3) the specific one of the first, second or third type of channels 709 at a temperature of the closed chamber below the boiling temperature of the liquid 732. For example, in the case that the liquid 732 is water, the liquid 732 may be fed or injected again into said each of the chambers 7131 via, in sequence, (1) the specific one of the openings 758*a*, (2) the specific one of the two vacancies 709*a* and (3) the specific one of the first, second or third type of channels 709 at a temperature of the closed chamber between 80 and 95 degrees Celsius. In the case that the liquid 732 is methanol, the liquid 732 may be fed or injected again into said each of the chambers 7131 via, in sequence, (1) the specific one of the openings 758*a*, (2) the specific one of the two vacancies 709*a* and (3) the specific one of the first, second or third type of channels 709 at a temperature of the closed chamber between 5 and 20 degrees Celsius. In the case that the liquid 732 is ethanol, the liquid 732 may be fed or injected again into said each of the chambers 7131 via, in sequence, (1) the specific one of the openings 758*a*, (2) the specific one of the two vacancies 709*a* and (3) the specific one of the first, second or third type of channels 709 at a temperature of the closed chamber between 65 and 75 degrees Celsius. Next, a polymer (not shown) may be filled into the two vacancies 709*a* and first, second or third type of channels 709 in the partitioning walls 701 of the bottom skeleton 7209 to seal each of the chambers 7131. Next, the top metal plate 7581 and bottom skeleton 7209 may be moved out of the closed chamber. Next, for an optional process, the temporary substrate 746 and glue layer 748 may be removed from an outer surface of the metal plate 702 of the bottom skeleton 7209.

Next, referring to FIGS. 19B and 19B-1, the top metal plate 7581 may have multiple compressive seal regions 709*b* each extending across over one of the first, second or third type of channels 709 in one of the partitioning walls 701 of the bottom skeleton 7209, wherein each of the compressive seal regions 709*b* has a width w11 between 100 and 500 micrometers. The top metal plate 7581 may be pressed at each of the compressive seal regions 709*b* to seal each of the first, second or third type of channels 709. Next, the optional process may be performed to remove the temporary substrate 746 and glue layer 748 from an outer surface of the metal plate 702 of the bottom skeleton 7209. Next, a mechanical sawing process for singulation may be performed to saw the top metal plate 7581 and the partitioning walls 701 and bottom metal plate 7041 of the bottom skeleton 7209 along the scribe lines 7011 of the partitioning walls 701 of the bottom skeleton 7209 into multiple units. Each of the partitioning walls 701 of the bottom skeleton 7209 may be cut into two of the outer sidewalls 7012 of respective neighboring two of the units.

Next, referring to FIG. 19C, for each of the units, a metal layer 738, such as copper or nickel, may be electroplated with a thickness between and including 1 and 15 micrometers on an outer surface of each of its peripheral walls, provided by the outer sidewalls 7012 and bottom metal plate 7041 of the bottom skeleton 7209 and the top metal plate 7581, to form the first type of micro heat pipe 700 for the fourth alternative. Thereby, the liquid 732 may be sealed in the chamber 7131 to be used as a vapor chamber in the first type of micro heat pipe 700 for the fourth alternative. For the first type of micro heat pipe 700 for the fourth alternative, since in its chamber 7131 are the metal meshes or nets 712 and 718 and metal guides 734 provided by the bottom skeleton 7209 and the space s2 may be used as a vertical liquid capillary or channel for its liquid 732 that flows vertically by capillary effect or surface tension, its liquid 732 may flow in a space under and/or at its metal meshes or nets 712 and 718 in its chamber 7131 provided by the bottom skeleton 7209 with a high efficiency of liquid transfer. Further, a vapor of its liquid 732 may flow in a space over and/or at its metal meshes or nets 712 and 718 in its chamber 7131 based on convection mechanism. A total pressure, i.e., vapor pressure, in its chamber 7131 may be smaller than 20 kilopascals (kPa) or 5 kilopascals (kPa) at a temperature of 25 degrees Celsius. A partial pressure of a vapor of its liquid 732 may be greater than 99% or 95% of a total gas pressure in its chamber 7131.

Referring to FIG. 19C, the first type of micro heat pipe 700 for the fourth alternative may have a total height between and including 50 and 1000 micrometers or 50 and 200 micrometers. For the first type of micro heat pipe 700 for the fourth alternative, each of its outer sidewalls 7012 may have a width between and including 50 and 1000 micrometers, and a transverse dimension of the width of said each of its outer sidewalls 7012 plus the thickness of its metal layer 738 on said each of its outer sidewalls 7012 may be between and including 50 and 1000 micrometers. A vertical dimension of the thickness of its bottom metal plate 7041 plus the thickness of its metal layer 738 on its bottom metal plate 7041 may be between and including 5 and 100 micrometers. A vertical dimension of the thickness of its top metal plate 7041 plus the thickness of its metal layer 738 on its top metal plate 7041 may be between and including 5 and 100 micrometers. Each of its metal posts 703 provided by the bottom skeleton 7209 may have a top end joining its top metal plate 7581 and a bottom end joining its bottom metal plate 7041 provided by the bottom skeleton 7209, wherein in a case each of its metal posts 703 may have a height less than 500 micrometers to hold a space between its top and bottom metal plates 7581 and 7041 with a vertical distance therebetween that may be less than 500 micrometers.

Specification for First Type of Micro Heat Pipe for Fifth Alternative

Figure 20A:
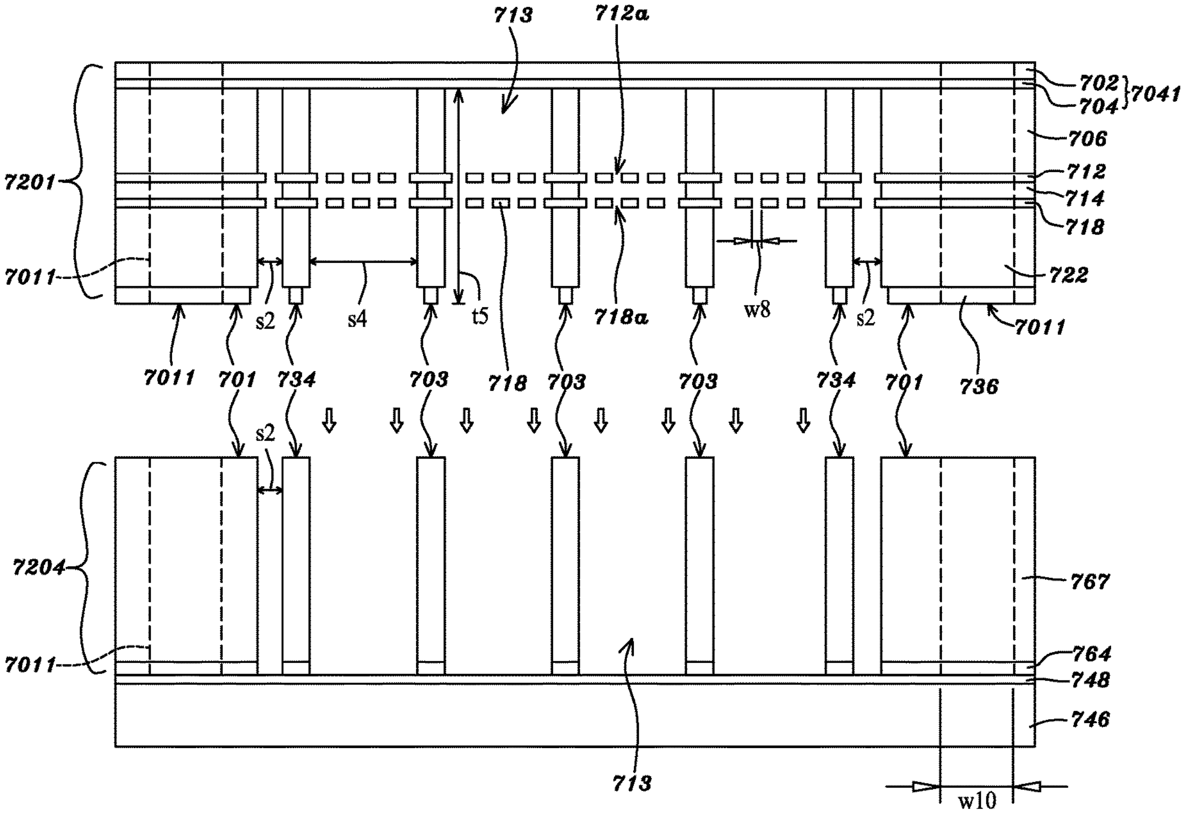
FIGS. 20A-20E are schematically cross-sectional views showing a process for fabricating a first type of micro heat pipe for a fifth alternative in accordance with an embodiment of the present application.
Figure 20B:
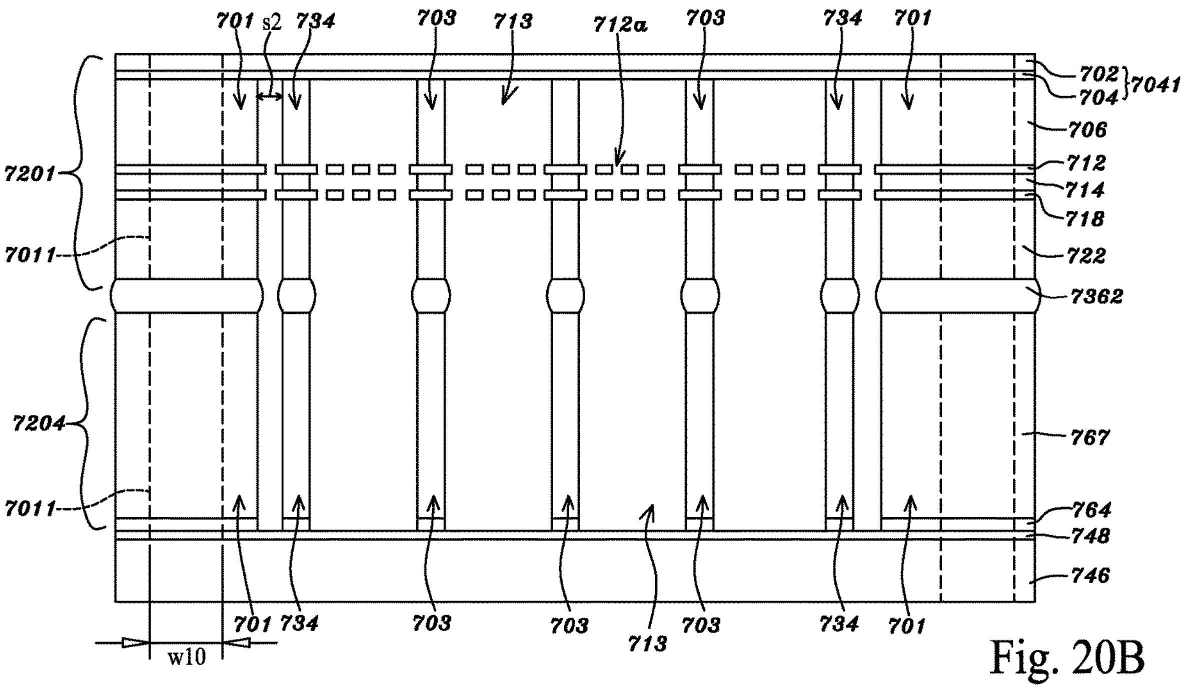
Figure 20C:
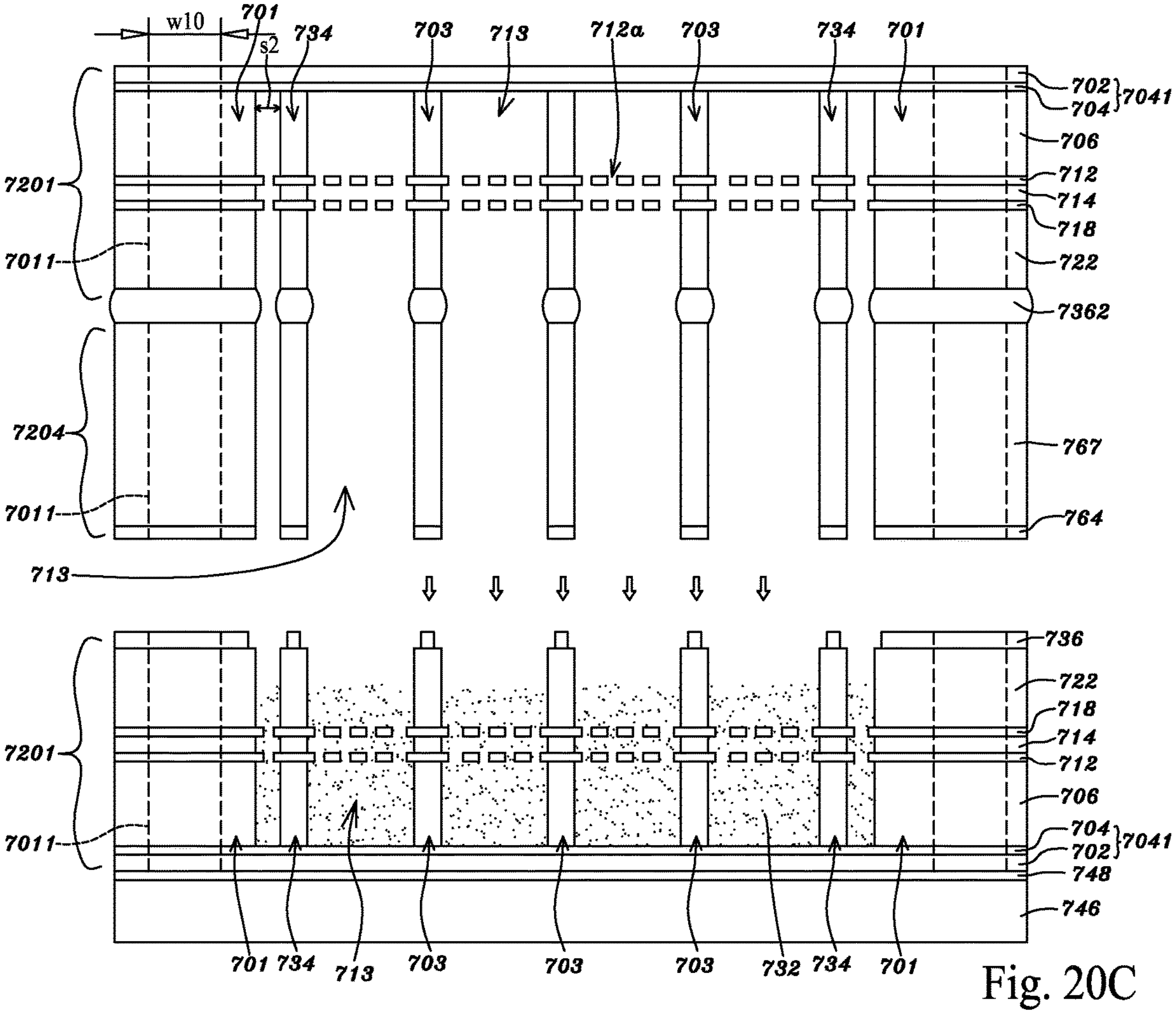

FIGS. 20A-20E are schematically cross-sectional views showing a process for fabricating a first type of micro heat pipe for a fifth alternative in accordance with an embodiment of the present application. Referring to FIG. 20A-20E, the fourth type of skeleton 7204 as seen in FIGS. 12C and 12C-1 may be provided as a middle skeleton, and two of the first type of skeletons 7201 as seen in FIGS. 9D and 9D-1 may be provided as top and bottom skeletons respectively. First, referring to FIG. 20A, the top skeleton 7201 may be turned upside down and flipped to have the solder layer 736 of the top skeleton 7201 contact and aligned with the metal layer 767 of copper of the middle skeleton 7204, wherein the scribe line 7011 of each of the partitioning walls 701 of the top skeleton 7201 may be vertically aligned with the scribe line 7011 of one of the partitioning walls 701 of the middle skeleton 7204. In this case, the scribe line 7011 of each of the partitioning walls 701 of each of the top and middle skeletons 7201 and 7204 may have a width w10 between 50 and 150 micrometers. Next, referring to FIG. 20B, a thermal compression bonding may be performed to bond the solder layer 736 of the top skeleton 7201 and the metal layer 767 of copper of the middle skeleton 7204 into multiple solder contacts 7362 such as a tin-containing alloy having a thickness between and including 5 and 100 micrometers. Each of the solder contacts 7362 may bond one of the metal posts 703 of the top skeleton 7201 to one of the metal posts 703 of the middle skeleton 7204, one of the metal guides 734 of the top skeleton 7201 to one of the metal guides 734 of the middle skeleton 7204, or one of the partitioning walls 701 of the top skeleton 7201 to one of the partitioning walls 701 of the middle skeleton 7204. Next, the temporary substrate 746 and glue layer 748 may be removed from a bottom surface of the metal layer 764 of the middle skeleton 7204 as seen in FIG. 20C.

Next, referring to FIG. 20C, for an optional process, a liquid 732, such as water, ethanol, methanol or a solution containing the above-mentioned materials, may be fed into the cavities 713 (only one is shown) in the bottom skeleton 7201. Next, the top and middle skeletons 7201 and 7204 and the bottom skeleton 7201 may be placed in a closed chamber (not shown), into which vaper of the liquid 732 may be purged to repel air from the closed chamber. Next, the optional process may be performed to feed the liquid 732 into the cavities 713 in the bottom skeleton 7201. Next, the top and middle skeletons 7201 and 7204 may be moved to have the metal layer 764 of the middle skeleton 7204 aligned with and in contact with the solder layer 736 of the bottom skeleton 7201, wherein the scribe line 7011 of each of the partitioning walls 701 of the top skeleton 7201 may be vertically aligned with the scribe line 7011 of one of the partitioning walls 701 of the middle skeleton 7204 and the scribe line 7011 of one of the partitioning walls 701 of the bottom skeleton 7201. In this case, the scribe line 7011 of each of the partitioning walls 701 of the bottom skeleton 7201 may have a width w10 between 50 and 150 micrometers.

Next, referring to FIGS. 20C and 20D, an ultrasonic compression bonding process may be performed at a temperature below the boiling temperature of the liquid 732 and in the closed chamber to bond the metal layer 764 of the middle skeleton 7204 and the solder layer 736 of the bottom skeleton 7201 into multiple solder contacts 7361 such as a tin-containing alloy having a thickness between and including 5 and 100 micrometers. Each of the solder contacts 7361 may bond one of the metal posts 703 of the middle skeleton 7204 to one of the metal posts 703 of the bottom skeleton 7201, one of the metal guides 734 of the middle skeleton 7204 to one of the metal guides 734 of the bottom skeleton 7201, or one of the partitioning walls 701 of the middle skeleton 7204 to one of the partitioning walls 701 of the bottom skeleton 7201. For example, in the case that the liquid 732 is water, the ultrasonic compression bonding process may be performed at a temperature between 80 and 95 degrees Celsius and in the closed chamber to bond the metal layer 764 of the middle skeleton 7204 to the solder layer 736 of the bottom skeleton 7201. In the case that the liquid 732 is methanol, the ultrasonic compression bonding process may be performed at a temperature between 5 and 20 degrees Celsius and in the closed chamber to bond the metal layer 764 of the middle skeleton 7204 to the solder layer 736 of the bottom skeleton 7201. In the case that the liquid 732 is ethanol, the ultrasonic compression bonding process may be performed at a temperature between 65 and 75 degrees Celsius and in the closed chamber to bond the metal layer 764 of the middle skeleton 7204 to the solder layer 736 of the bottom skeleton 7201. Thereby, each of the cavities 713 in the top skeleton 7201 may be connected to one of the cavities 713 in the bottom skeleton 7201 vertically under said each of the cavities 713 in the top skeleton 720 via one of the cavities 713 in the middle skeleton 7204 vertically under said each of the cavities 713 in the top skeleton 720 to form a chamber 7131 sealed by the top skeleton 7201, middle skeleton 7204 and bottom skeleton 7201. Next, the top skeleton 7201, middle skeleton 7204 and bottom skeleton 7201 may be moved out of the closed chamber. Next, the temporary substrate 746 and glue layer 748 may be removed from an outer surface of the metal plate 702 of the bottom skeleton 7201, as seen in FIG. 20D.

Figure 20D:
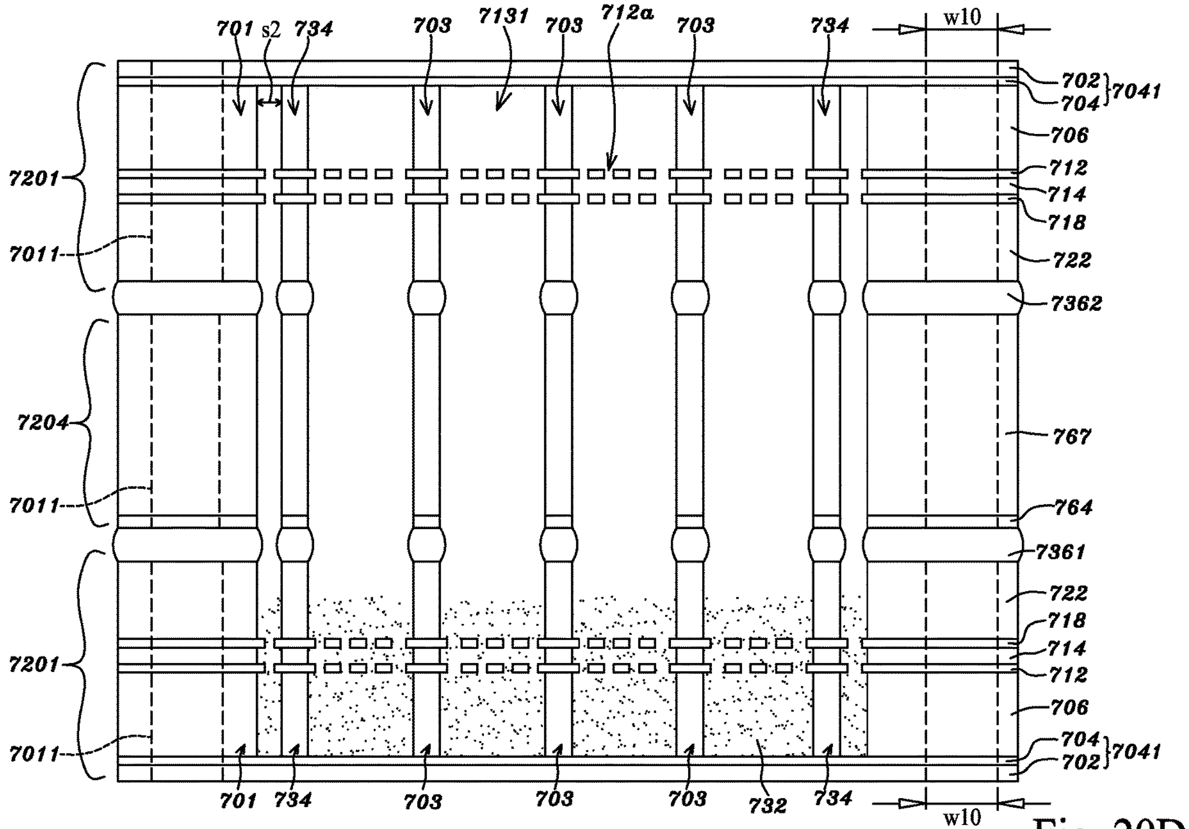
Figure 20E:
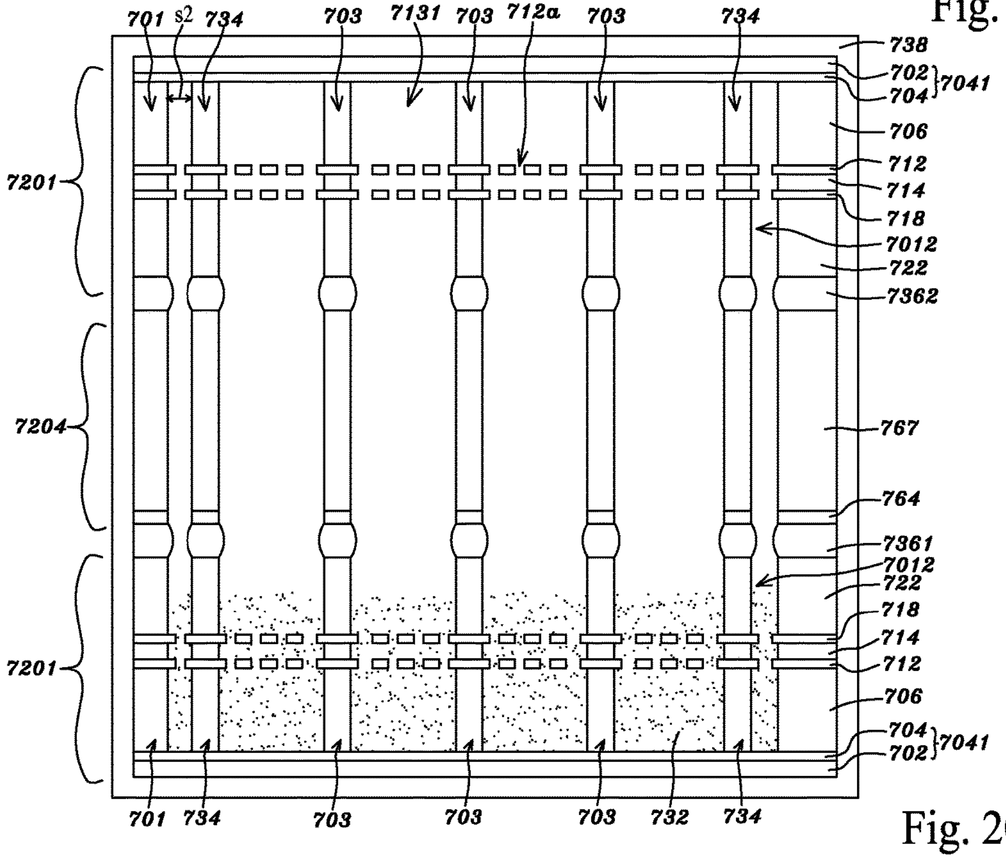

Next, referring to FIGS. 20D and 20E, a mechanical sawing process for singulation may be performed to saw the top metal plate 7041 and partitioning walls 701 of the top skeleton 7201, the partitioning walls 701 of the middle skeleton 7204 and the bottom metal plate 7041 and partitioning walls 701 of the bottom skeleton 7201 along the vertically-aligned scribe lines 7011 of the partitioning walls 701 of the top and bottom skeletons 7201 and middle skeleton 7204 into multiple units. Each of the partitioning walls 701 of each of the top skeleton 7201, middle skeleton 7204 and bottom skeleton 7201 may be cut into two of the outer sidewalls 7012 of respective neighboring two of the units. Next, for each of the units, a metal layer 738, such as copper or nickel, may be electroplated with a thickness between and including 1 and 15 micrometers on an outer surface of each of its peripheral walls, provided by the top metal plate 7041 and outer sidewalls 7012 of the top skeleton 7201, the outer sidewalls 7012 of the middle skeleton 7204 and the bottom metal plate 7041 and outer sidewalls 7012 of the bottom skeleton 7201, to form the first type of micro heat pipe 700 for the fifth alternative. Thereby, the liquid 732 may be sealed in the chamber 7131 to be used as a vapor chamber in the first type of micro heat pipe 700 for the fifth alternative. For the first type of micro heat pipe 700 for the fifth alternative, since in its chamber 7131 are the metal meshes or nets 712 and 718 provided by each of the top and bottom skeletons 7201 and the metal guides 734 provided by each of the top and bottom skeletons 7201 and middle skeleton 7204 and the space s2 may be used as a vertical liquid capillary or channel for its liquid 732 that flows vertically by capillary effect or surface tension, its liquid 732 may flow in a space under and/or at its metal meshes or nets 712 and 718 in its chamber 7131 provided by the bottom skeleton 7201 with a high efficiency of liquid transfer. Further, a vapor of its liquid 732 may flow in a space over and/or at its metal meshes or nets 712 and 718 in its chamber 7131 based on convection mechanism. A total pressure, i.e., vapor pressure, in its chamber 7131 may be smaller than 20 kilopascals (kPa) or 5 kilopascals (kPa) at a temperature of 25 degrees Celsius. A partial pressure of a vapor of its liquid 732 may be greater than 99% or 95% of a total gas pressure in its chamber 7131.

Referring to FIG. 20E, the first type of micro heat pipe 700 for the fifth alternative may have a total height between and including 1 and 3 millimeters. For the first type of micro heat pipe 700 for the fifth alternative, each of its outer sidewalls 7012 may have a width between and including 50 and 1000 micrometers, and a transverse dimension of the width of said each of its outer sidewalls 7012 plus the thickness of its metal layer 738 on said each of its outer sidewalls 7012 may be between and including 50 and 1000 micrometers. A vertical dimension of the thickness of its bottom metal plate 7041 plus the thickness of its metal layer 738 on its bottom metal plate 7041 may be between and including 5 and 100 micrometers. A vertical dimension of the thickness of its top metal plate 7041 plus the thickness of its metal layer 738 on its top metal plate 7041 may be between and including 5 and 100 micrometers. Each of its metal posts 703 provided by the bottom skeleton 7201, one of its metal posts 703 provided by the middle skeleton 7204 over said each of its metal posts 703 and one of its metal posts 703 provided by the top skeleton 7201 over said each of its metal posts 703 may form a metal pillar having a top end joining its top metal plate 7041 provided by the top skeleton 7201 and a bottom end joining its bottom metal plate 7041 provided by the bottom skeleton 7201, wherein in a case its metal pillar may have a height less than 500 micrometers to hold a space between its top and bottom metal plates 7041 with a vertical distance therebetween that may be less than 500 micrometers.

Specification for First Type of Micro Heat Pipe for Sixth Alternative

Figure 21A:
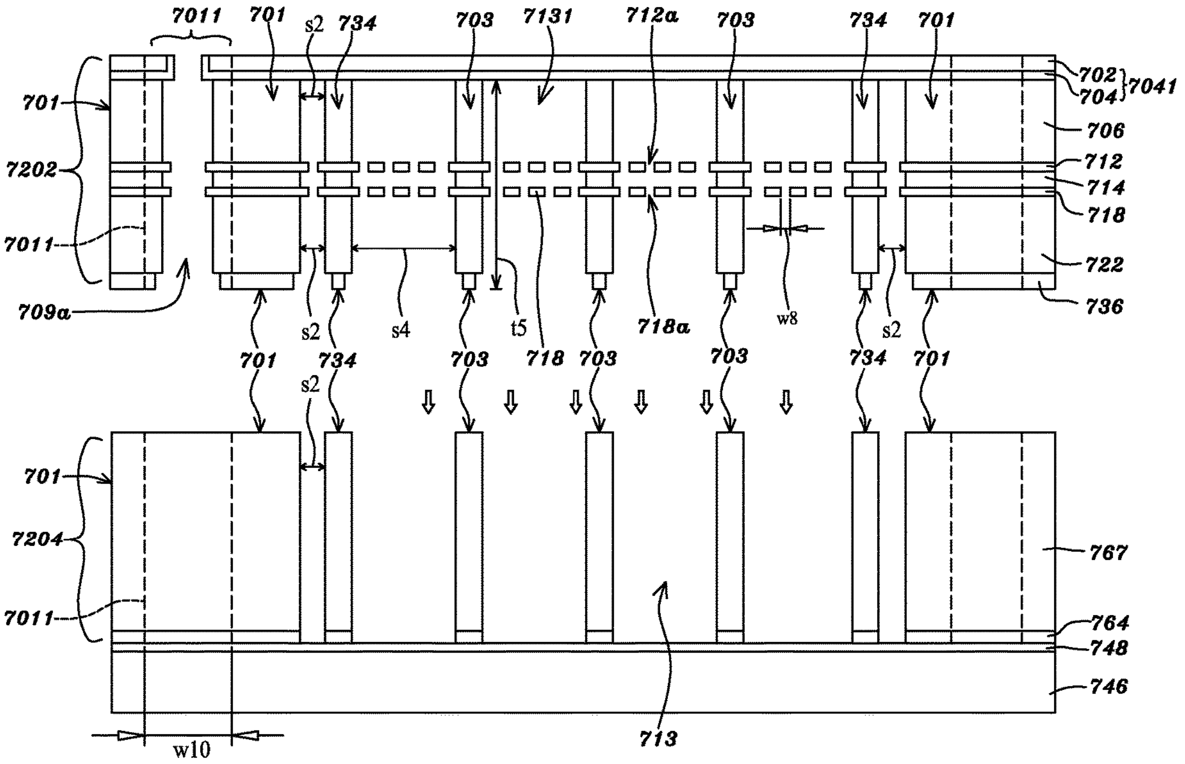
FIGS. 21A-21E are schematically cross-sectional views showing a process for fabricating a first type of micro heat pipe for a sixth alternative in accordance with an embodiment of the present application.
Figure 21B:
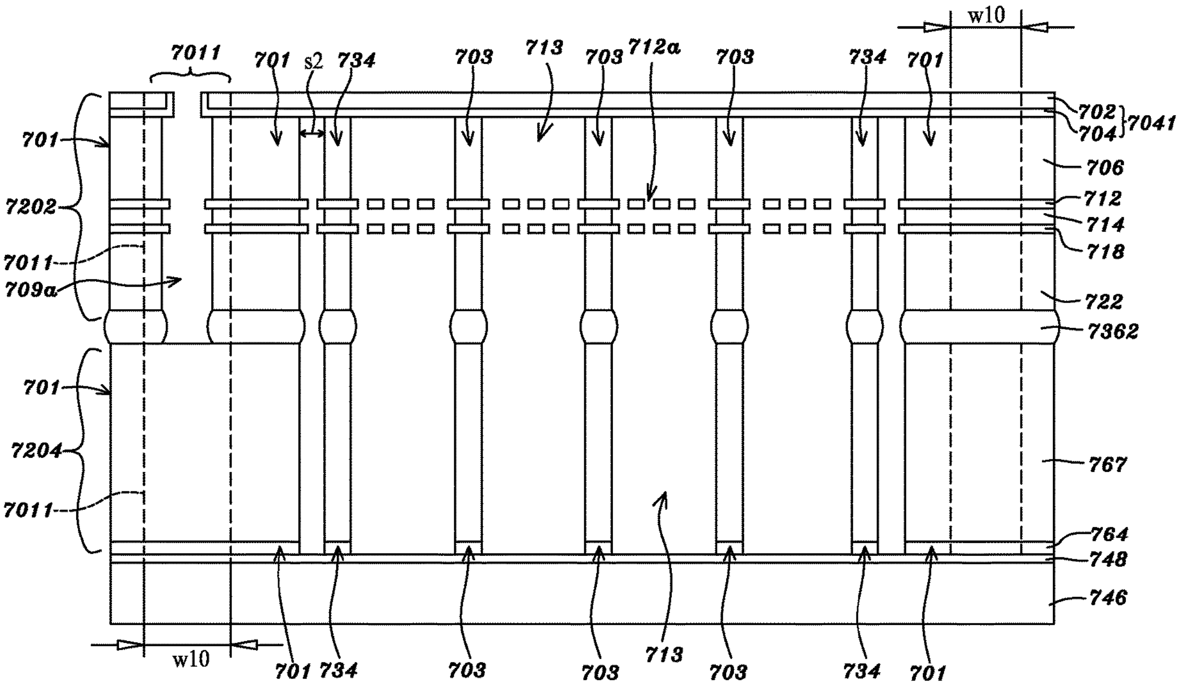
Figure 21C:
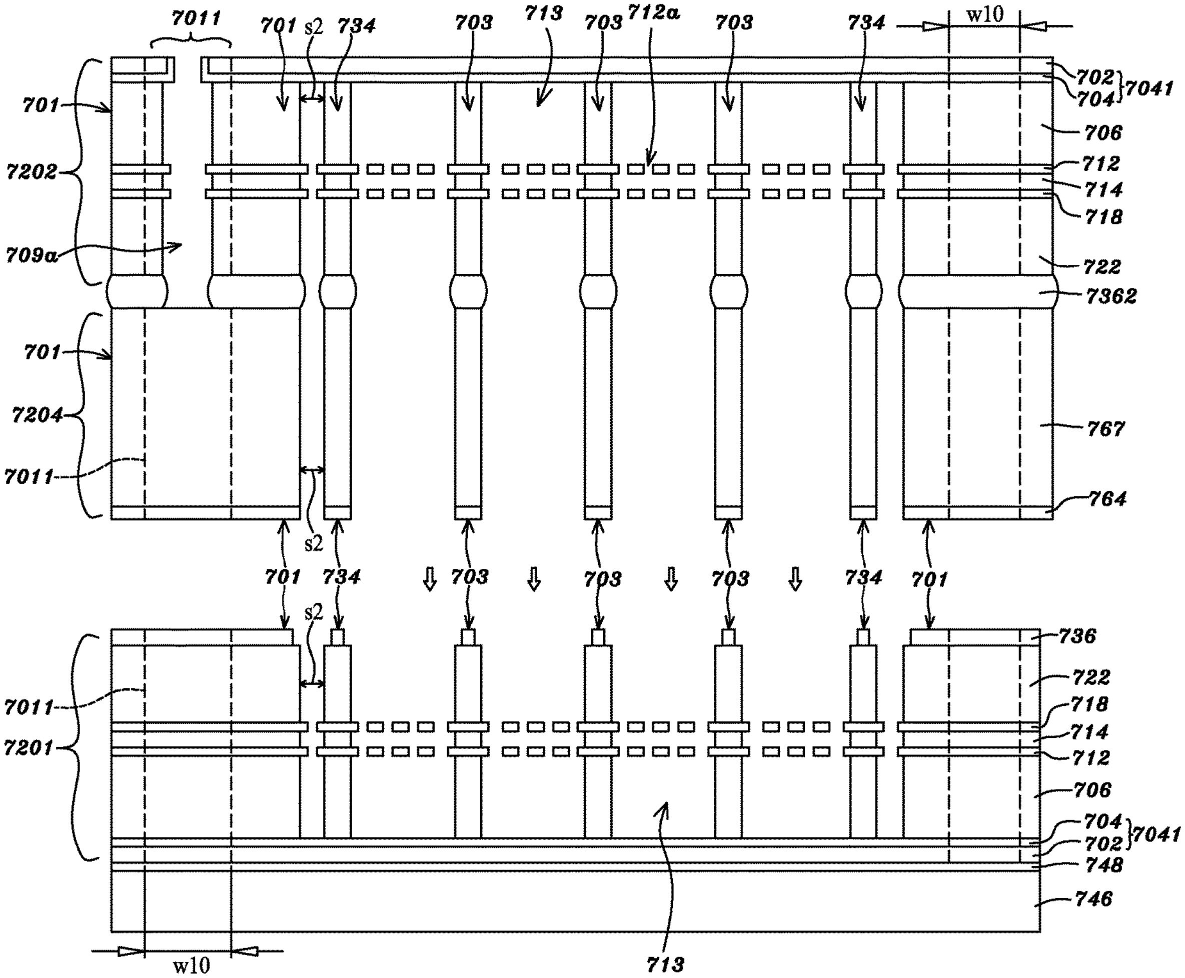
Figures 1, 21D:
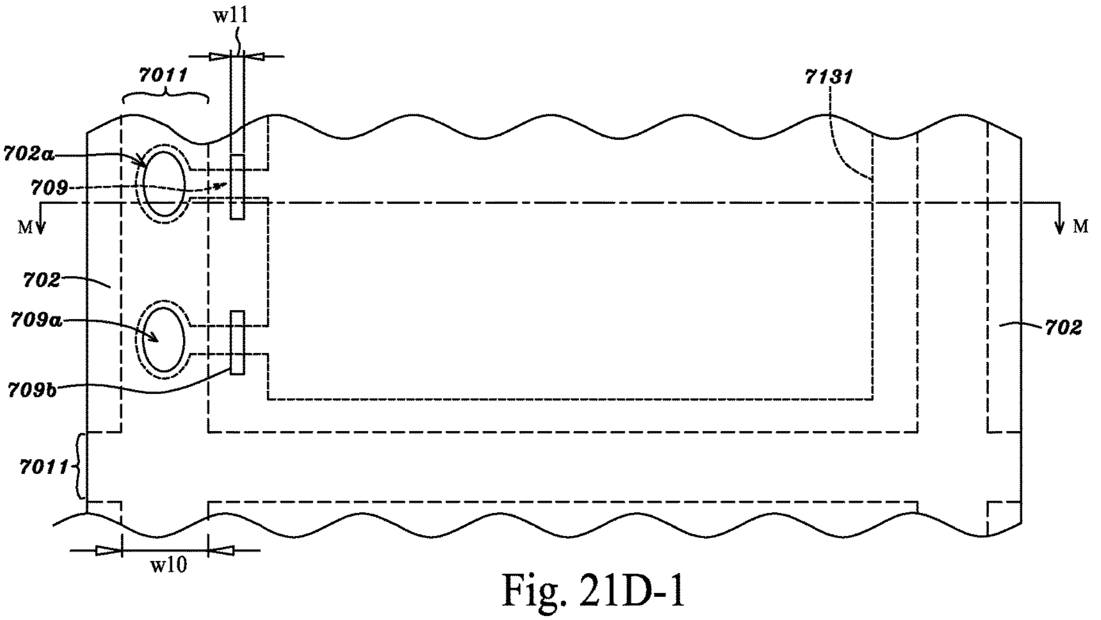
Figure 21D:
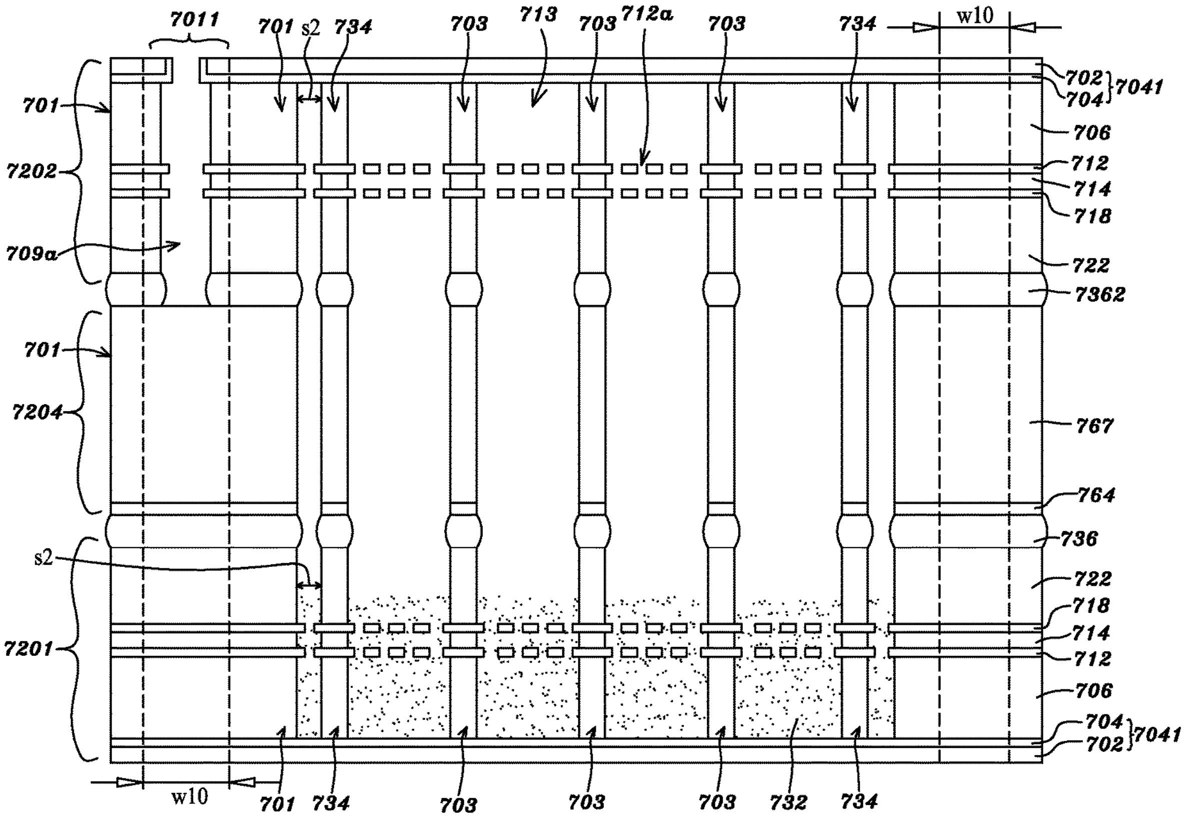

FIGS. 21A-21E are schematically cross-sectional views showing a process for fabricating a first type of micro heat pipe for a sixth alternative in accordance with an embodiment of the present application. FIG. 21D-1 is a schematically top view showing steps illustrated in FIG. 21D for a process for fabricating a first type of micro heat pipe for a sixth alternative in accordance with an embodiment of the present application, wherein FIG. 21D is a schematically cross-sectional view cut along a cross-sectional line M-M in FIG. 21D-1. Referring to FIG. 21A-21E, the fourth type of skeleton 7204 as seen in FIGS. 12C and 12C-1 may be provided as a middle skeleton, the second type of skeleton 7202 as seen in FIGS. 10E and 10E-1, 11A and 11B or the third type of skeleton 7203 as seen in FIGS. 10F, 11A-11D may be provided as a top skeleton, and the first type of skeletons 7201 as seen in FIGS. 9D and 9D-1 may be provided as a bottom skeleton. In this case shown in FIGS. 21A-21E, the second type of skeleton 7202 as seen in FIGS. 10E and 10E-1, 11A and 11B is provided as a top skeleton. First, referring to FIG. 21A, the top skeleton 7202 or 7203 may be turned upside down and flipped to have the solder layer 736 of the top skeleton 7202 or 7203 contact and aligned with the metal layer 767 of copper of the middle skeleton 7204, wherein the scribe line 7011 of each of the partitioning walls 701 of the top skeleton 7202 or 7203 may be vertically aligned with the scribe line 7011 of one of the partitioning walls 701 of the middle skeleton 7204. In this case, the scribe line 7011 of each of the partitioning walls 701 of each of the top skeleton 7202 or 7203 and middle skeleton 7204 may have a width w10 between 100 and 1000 micrometers. Next, referring to FIG. 21B, a thermal compression bonding may be performed to bond the solder layer 736 of the top skeleton 7202 or 7203 and the metal layer 767 of copper of the middle skeleton 7204 into multiple solder contacts 7362 such as a tin-containing alloy having a thickness between and including 5 and 100 micrometers. Each of the solder contacts 7362 may bond one of the metal posts 703 of the top skeleton 7202 or 7203 to one of the metal posts 703 of the middle skeleton 7204, one of the metal guides 734 of the top skeleton 7202 or 7203 to one of the metal guides 734 of the middle skeleton 7204, or one of the partitioning walls 701 of the top skeleton 7202 or 7203 to one of the partitioning walls 701 of the middle skeleton 7204. Next, the temporary substrate 746 and glue layer 748 may be removed from a bottom surface of the metal layer 764 of the middle skeleton 7204 as seen in FIG. 21C.

Next, referring to FIG. 21C, the top skeleton 7202 or 7203 and middle skeleton 7204 may be moved to have the metal layer 764 of the middle skeleton 7204 aligned with and in contact with the solder layer 736 of the bottom skeleton 7201, wherein the scribe line 7011 of each of the partitioning walls 701 of the top skeleton 7202 or 7203 may be vertically aligned with the scribe line 7011 of one of the partitioning walls 701 of the middle skeleton 7204 and the scribe line 7011 of one of the partitioning walls 701 of the bottom skeleton 7201. In this case, the scribe line 7011 of each of the partitioning walls 701 of the bottom skeleton 7201 may have a width w10 between 100 and 1000 micrometers.

Next, referring to FIG. 21D, a thermal compression bonding may be performed to bond the metal layer 764 of the middle skeleton 7204 and the solder layer 736 of the bottom skeleton 7201 into multiple solder contacts 7361 such as a tin-containing alloy having a thickness between and including 5 and 100 micrometers. Each of the solder contacts 7361 may bond one of the metal posts 703 of the middle skeleton 7204 to one of the metal posts 703 of the bottom skeleton 7201, one of the metal guides 734 of the middle skeleton 7204 to one of the metal guides 734 of the bottom skeleton 7201, or one of the partitioning walls 701 of the middle skeleton 7204 to one of the partitioning walls 701 of the bottom skeleton 7201.

Alternatively, the solder layer 736 of the bottom skeleton 7201 may not be formed, and a direct bonding process or copper-to-copper process may be performed at a temperature between 300 and 350 degrees Celsius for a time period between 10 and 60 minutes to bond the metal layer 764 of the middle skeleton 7204 to the metal layer 722 of copper of the bottom skeleton 7201 due to copper inter-diffusion between the metal layer 764 of the middle skeleton 7204 and the metal layer 722 of copper of the bottom skeleton 7201. Each of the first pieces of the metal layer 764 of the middle skeleton 7204 for one of the metal posts 703 of the middle skeleton 7204 may be directly bonded via copper-to-copper inter-diffusion to one of the first pieces of the metal layer 722 of copper of the bottom skeleton 7201 for one of the metal posts 703 of the bottom skeleton 7201. Each of the second pieces of the metal layer 764 of the middle skeleton 7204 for one of the metal guides 734 of the middle skeleton 7204 may be directly bonded via copper-to-copper inter-diffusion to one of the second pieces of the metal layer 722 of copper of the bottom skeleton 7201 for one of the metal guides 734 of the bottom skeleton 7201. Each of the third pieces of the metal layer 764 of the middle skeleton 7204 for one of the partitioning walls 701 of the middle skeleton 7204 may be directly bonded via copper-to-copper inter-diffusion to one of the third pieces of the metal layer 722 of copper of the bottom skeleton 7201 for one of the partitioning walls 701 of the bottom skeleton 7201. Thereby, each of the cavities 713 in the top skeleton 7202 or 7203 may be connected to one of the cavities 713 in the bottom skeleton 7201 vertically under said each of the cavities 713 in the top skeleton 7202 or 7203 via one of the cavities 713 in the middle skeleton 7204 vertically under said each of the cavities 713 in the top skeleton 7202 or 7203 to form a chamber 7131 sealed by the top skeleton 7202 or 7203, middle skeleton 7204 and bottom skeleton 7201.

Next, referring to FIG. 21D, the top skeleton 7202 or 7203, middle skeletons 7204 and bottom skeleton 7201 may be placed in a closed chamber (not shown), into which vaper of a liquid 732, such as water, ethanol, methanol or a solution containing the above-mentioned materials, may be purged to repel air from the closed chamber. Next, the liquid 732 may be fed or injected into each of the chambers 7131 via, in sequence, (1) a specific one of the openings 702*a* in the metal plate 702 of the top skeleton 7202 or 7203, (2) a specific one of the two vacancies 709*a* in one of the partitioning walls 701 of the top skeleton 7202 or 7203 under the specific one of the openings 702*a* and (3) a specific one of the first, second or third type of channels 709 in said one of the partitioning walls 701 of the top skeleton 7202 or 7203 and connecting the specific one of the two vacancies 709*a* to said each of the chambers 7131. Next, the top skeleton 7202 or 7203, middle skeleton 7204 and bottom skeleton 7201 may be heated at a temperature between 100 and 120 degrees Celsius to vaporize the liquid 732 in said each of the chambers 7131 and air in said each of the chambers 7131 may be purged away from said each of the chambers 7131 via, in sequence, (1) two of the first, second or third type of channels 709 in one or respective opposite two of the partitioning walls 701 of the top skeleton 7202 or 7203 and connecting to said each of the chambers 7131, (2) the two vacancies 709*a* in said one or said respective opposite two of the partitioning walls 701 of the top skeleton 7202 or 7203 and connecting to said each of the chambers 7131 through respective said two of the first, second or third type of channels 709 and (3) two of the openings 702*a* in the metal plate 702 of the top skeleton 7202 or 7203 vertically over the respective two vacancies 709*a*. Next, the liquid 732 may be fed or injected again into said each of the chambers 7131 via, in sequence, (1) the specific one of the openings 702*a*, (2) the specific one of the two vacancies 709*a* and (3) the specific one of the first, second or third type of channels 709 at a temperature of the closed chamber below the boiling temperature of the liquid 732. For example, in the case that the liquid 732 is water, the liquid 732 may be fed or injected again into said each of the chambers 7131 via, in sequence, (1) the specific one of the openings 702*a*, (2) the specific one of the two vacancies 709*a* and (3) the specific one of the first, second or third type of channels 709 at a temperature of the closed chamber between 80 and 95 degrees Celsius. In the case that the liquid 732 is methanol, the liquid 732 may be fed or injected again into said each of the chambers 7131 via, in sequence, (1) the specific one of the openings 702*a*, (2) the specific one of the two vacancies 709*a* and (3) the specific one of the first, second or third type of channels 709 at a temperature of the closed chamber between 5 and 20 degrees Celsius. In the case that the liquid 732 is ethanol, the liquid 732 may be fed or injected again into said each of the chambers 7131 via, in sequence, (1) the specific one of the openings 702*a*, (2) the specific one of the two vacancies 709*a* and (3) the specific one of the first, second or third type of channels 709 at a temperature of the closed chamber between 65 and 75 degrees Celsius. Next, a polymer (not shown) may be filled into the two vacancies 709*a* and first, second or third type of channels 709 in the partitioning walls 701 of the top skeleton 7202 or 7203 to seal each of the chambers 7131. Next, the top skeleton 7202 or 7203, middle skeleton 7204 and bottom skeleton 7201 may be moved out of the closed chamber. Next, for an optional process, the temporary substrate 746 and glue layer 748 may be removed from an outer surface of the metal plate 702 of the bottom skeleton 7201.

Next, referring to FIGS. 21D and 21D-1, the top skeleton 7202 or 7203 may have multiple compressive seal regions 709*b* each extending across over one of the first, second or third type of channels 709 in one of its partitioning walls 701, wherein each of the compressive seal regions 709*b* has a width w11 between 100 and 500 micrometers. The top skeleton 7202 or 7203 may be pressed at each of the compressive seal regions 709*b* to seal each of the first, second or third type of channels 709. Next, the optional process may be performed to remove the temporary substrate 746 and glue layer 748 from an outer surface of the metal plate 702 of the bottom skeleton 7201. Next, a mechanical sawing process for singulation may be performed to saw the top metal plate 7041 and partitioning walls 701 of the top skeleton 7202 or 7203, the partitioning walls 701 of the middle skeleton 7204 and the bottom metal plate 7041 and partitioning walls 701 of the bottom skeleton 7201 along the vertically-aligned scribe lines 7011 of the partitioning walls 701 of the top skeleton 7202 or 7023, middle skeleton 7204 and bottom skeleton 7201 into multiple units. Each of the partitioning walls 701 of each of the top skeleton 7202 or 7203, middle skeleton 7204 and bottom skeleton 7201 may be cut into two of the outer sidewalls 7012 of respective neighboring two of the units.

Figure 21E:
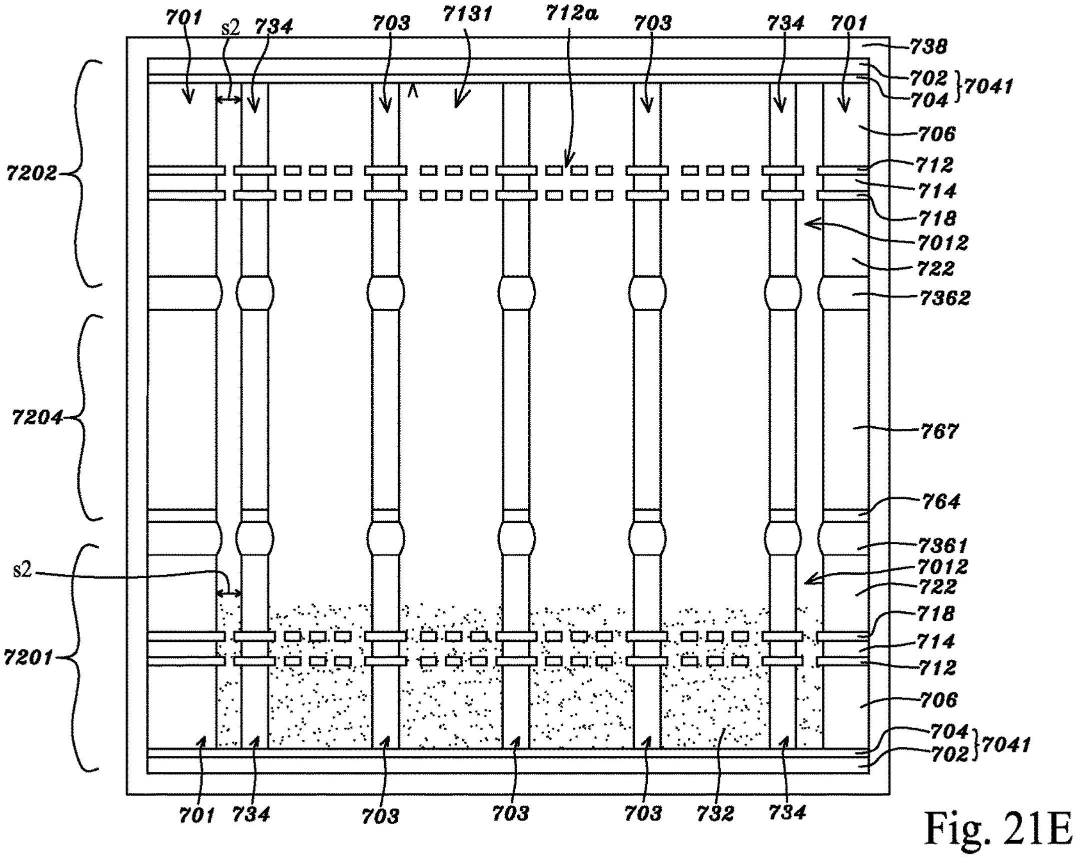

Next, referring to FIG. 21E, for each of the units, a metal layer 738, such as copper or nickel, may be electroplated with a thickness between and including 1 and 15 micrometers on an outer surface of each of its peripheral walls, provided by the top metal plate 7041 and outer sidewalls 7012 of the top skeleton 7202 or 7203, the outer sidewalls 7012 of the middle skeleton 7204 and the bottom metal plate 7041 and outer sidewalls 7012 of the bottom skeleton 7201, to form the first type of micro heat pipe 700 for the sixth alternative. Thereby, the liquid 732 may be sealed in the chamber 7131 to be used as a vapor chamber in the first type of micro heat pipe 700 for the sixth alternative. For the first type of micro heat pipe 700 for the sixth alternative, since in its chamber 7131 are the metal meshes or nets 712 and 718 provided by each of the top skeleton 7202 or 7203 and bottom skeleton 7201 and the metal guides 734 provided by each of the top skeleton 7202 or 7203, middle skeleton 7204 and bottom skeleton 7201 and the space s2 may be used as a vertical liquid capillary or channel for its liquid 732 that flows vertically by capillary effect or surface tension, its liquid 732 may flow in a space under and/or at its metal meshes or nets 712 and 718 in its chamber 7131 provided by the bottom skeleton 7201 with a high efficiency of liquid transfer. Further, a vapor of its liquid 732 may flow in a space over and/or at its metal meshes or nets 712 and 718 in its chamber 7131 based on convection mechanism. A total pressure, i.e., vapor pressure, in its chamber 7131 may be smaller than 20 kilopascals (kPa) or 5 kilopascals (kPa) at a temperature of 25 degrees Celsius. A partial pressure of a vapor of its liquid 732 may be greater than 99% or 95% of a total gas pressure in its chamber 7131.

Referring to FIG. 21E, the first type of micro heat pipe 700 for the sixth alternative may have a total height between and including 1 and 3 millimeters. For the first type of micro heat pipe 700 for the sixth alternative, each of its outer sidewalls 7012 may have a width between and including 50 and 1000 micrometers, and a transverse dimension of the width of said each of its outer sidewalls 7012 plus the thickness of its metal layer 738 on said each of its outer sidewalls 7012 may be between and including 50 and 1000 micrometers. A vertical dimension of the thickness of its bottom metal plate 7041 plus the thickness of its metal layer 738 on its bottom metal plate 7041 may be between and including 5 and 100 micrometers. A vertical dimension of the thickness of its top metal plate 7041 plus the thickness of its metal layer 738 on its top metal plate 7041 may be between and including 5 and 100 micrometers. Each of its metal posts 703 provided by the bottom skeleton 7201, one of its metal posts 703 provided by the middle skeleton 7204 over said each of its metal posts 703 and one of its metal posts 703 provided by the top skeleton 7202 or 7203 over said each of its metal posts 703 may form a metal pillar having a top end joining its top metal plate 7041 provided by the top skeleton 7202 or 7203 and a bottom end joining its bottom metal plate 7041 provided by the bottom skeleton 7201, wherein in a case its metal pillar may have a height less than 500 micrometers to hold a space between its top and bottom metal plates 7041 with a vertical distance therebetween that may be less than 500 micrometers.

Specification for First Type of Micro Heat Pipe for Seventh Alternative

Figure 22A:
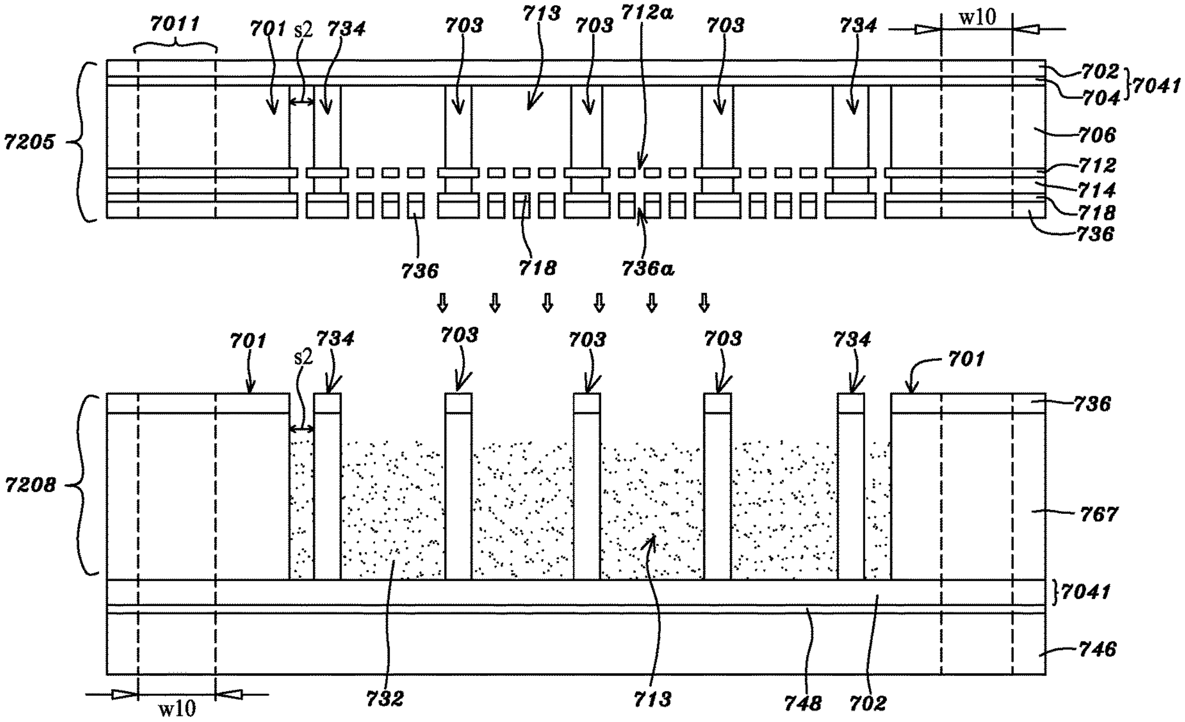
FIGS. 22A and 22B are schematically cross-sectional views showing a process for fabricating a first type of micro heat pipe for a seventh alternative in accordance with an embodiment of the present application.
Figure 22B:
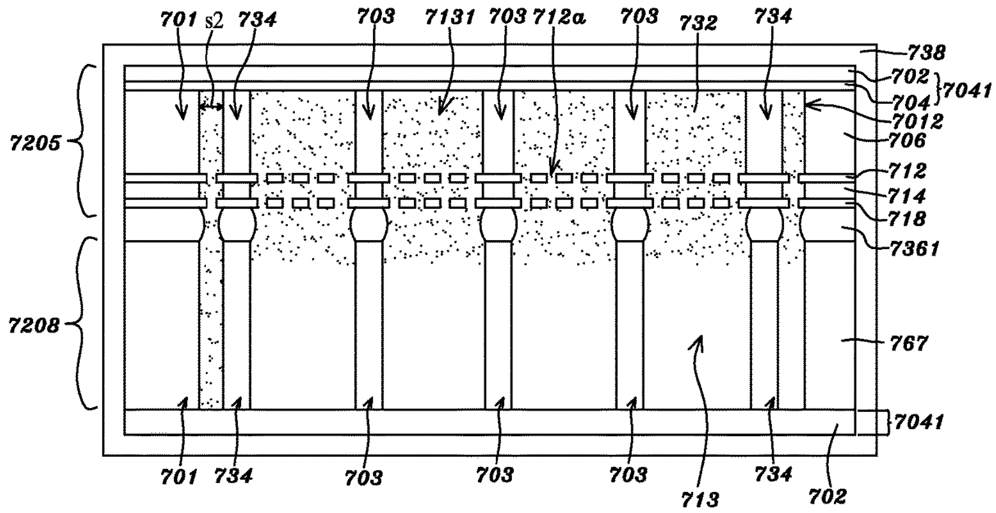

FIGS. 22A and 22B are schematically cross-sectional views showing a process for fabricating a first type of micro heat pipe for a seventh alternative in accordance with an embodiment of the present application. Referring to FIG. 22A, the eighth type of skeleton 7208 as seen in FIG. 15B may be provided as a bottom skeleton, and the fifth type of skeleton 7205 as seen in FIGS. 13C and 13C-1 may be provided as a top skeleton, wherein the temporary substrate 746 and glue layer 748 may be removed from an outer surface of the metal plate 702 of the top skeleton 7205. Next, for an optional process, a liquid 732, such as water, ethanol, methanol or a solution containing the above-mentioned materials, may be fed into the cavities 713 (only one is shown) in the bottom skeleton 7208. Next, the top and bottom skeletons 7205 and 7208 may be placed in a closed chamber (not shown), into which vaper of the liquid 732 may be purged to repel air from the closed chamber. Next, the optional process may be performed to feed the liquid 732 into the cavities 713 in the bottom skeleton 7208. Next, the top skeleton 7205 may be turned upside down and flipped to have the solder layer 736 of the top skeleton 7205 contact and aligned with the solder layer 736 of the bottom skeleton 7208, wherein the scribe line 7011 of each of the partitioning walls 701 of the top skeleton 7205 may be vertically aligned with the scribe line 7011 of one of the partitioning walls 701 of the bottom skeleton 7208. In this case, the scribe line 7011 of each of the partitioning walls 701 of each of the top and bottom skeletons 7205 and 7208 may have a width w10 between 50 and 150 micrometers.

Next, referring to FIGS. 22A and 22B, an ultrasonic compression bonding process may be performed at a temperature below the boiling temperature of the liquid 732 and in the closed chamber to bond the solder layer 736 of the top skeleton 7205 and the solder layer 736 of the bottom skeleton 7208 into multiple solder contacts 7361 such as a tin-containing alloy having a thickness between and including 5 and 100 micrometers. Each of the solder contacts 7361 may bond one of the metal posts 703 of the top skeleton 7205 to one of the metal posts 703 of the bottom skeleton 7208, one of the metal guides 734 of the top skeleton 7205 to one of the metal guides 734 of the bottom skeleton 7208, or one of the partitioning walls 701 of the top skeleton 7205 to one of the partitioning walls 701 of the bottom skeleton 7208. For example, in the case that the liquid 732 is water, the ultrasonic compression bonding process may be performed at a temperature between 80 and 95 degrees Celsius and in the closed chamber to bond the solder layer 736 of the top skeleton 7205 to the solder layer 736 of the bottom skeleton 7208. In the case that the liquid 732 is methanol, the ultrasonic compression bonding process may be performed at a temperature between 5 and 20 degrees Celsius and in the closed chamber to bond the solder layer 736 of the top skeleton 7205 to the solder layer 736 of the bottom skeleton 7208. In the case that the liquid 732 is ethanol, the ultrasonic compression bonding process may be performed at a temperature between 65 and 75 degrees Celsius and in the closed chamber to bond the solder layer 736 of the top skeleton 7205 to the solder layer 736 of the bottom skeleton 7208. Thereby, each of the cavities 713 in the top skeleton 7205 may be connected to one of the cavities 713 in the bottom skeleton 7208 vertically under said each of the cavities 713 in the top skeleton 7205 to form a chamber 7131 sealed by the top and bottom skeletons 7205 and 7208. Next, the top and bottom skeletons 7205 and 7208 may be moved out of the closed chamber. Next, the temporary substrate 746 and glue layer 748 may be removed from an outer surface of the metal plate 702 of the bottom skeleton 7208.

Next, referring to FIGS. 22A and 22B, a mechanical sawing process for singulation may be performed to saw the top metal plate 7041 and partitioning walls 701 of the top skeleton 7205 and the bottom metal plate 7041 and partitioning walls 701 of the bottom skeleton 7208 along the vertically-aligned scribe lines 7011 of the partitioning walls 701 of the top and bottom skeletons 7205 and 7208 into multiple units, wherein in this case the width w10 of the scribe line 7011 of each of the partitioning walls 701 of each of the top and bottom skeletons 7205 and 7208 may be between 50 and 150 micrometers. Each of the partitioning walls 701 of each of the top and bottom skeletons 7205 and 7208 may be cut into two of the outer sidewalls 7012 of respective neighboring two of the units. Next, for each of the units, a metal layer 738, such as copper or nickel, may be electroplated with a thickness between and including 1 and 15 micrometers on an outer surface of each of its peripheral walls, provided by the top metal plate 7041 and outer sidewalls 7012 of the top skeleton 7205 and the bottom metal plate 7041 and outer sidewalls 7012 of the bottom skeleton 7208, to form the first type of micro heat pipe 700 for the seventh alternative. Thereby, the liquid 732 may be sealed in the chamber 7131 to be used as a vapor chamber in the first type of micro heat pipe 700 for the seventh alternative. For the first type of micro heat pipe 700 for the seventh alternative, since in its chamber 7131 are the metal meshes or nets 712 and 718 provided by the top skeleton 7205 and the metal guides 734 provided by each of the top and bottom skeletons 7205 and 7208 and the space s2 may be used as a vertical liquid capillary or channel for its liquid 732 that flows vertically by capillary effect or surface tension, its liquid 732 may flow in a space over and/or at its metal meshes or nets 712 and 718 in its chamber 7131 provided by the top skeleton 7205 with a high efficiency of liquid transfer. Further, a vapor of its liquid 732 may flow in a space under and/or at its metal meshes or nets 712 and 718 in its chamber 7131 based on convection mechanism. A total pressure, i.e., vapor pressure, in its chamber 7131 may be smaller than 20 kilopascals (kPa) or 5 kilopascals (kPa) at a temperature of 25 degrees Celsius. A partial pressure of a vapor of its liquid 732 may be greater than 99% or 95% of a total gas pressure in its chamber 7131.

Referring to FIG. 22B, the first type of micro heat pipe 700 for the seventh alternative may have a total height between and including 50 and 2000 micrometers, 50 and 200 micrometers, 100 and 500 micrometers or 100 and 3000 micrometers. For the first type of micro heat pipe 700 for the seventh alternative, each of its outer sidewalls 7012 may have a width between and including 50 and 1000 micrometers, and a transverse dimension of the width of said each of its outer sidewalls 7012 plus the thickness of its metal layer 738 on said each of its outer sidewalls 7012 may be between and including 50 and 1000 micrometers. A vertical dimension of the thickness of its bottom metal plate 7041 plus the thickness of its metal layer 738 on its bottom metal plate 7041 may be between and including 5 and 100 micrometers. A vertical dimension of the thickness of its top metal plate 7041 plus the thickness of its metal layer 738 on its top metal plate 7041 may be between and including 5 and 100 micrometers. Each of its metal posts 703 provided by the bottom skeleton 7208 and one of its metal posts 703 provided by the top skeleton 7205 over said each of its metal posts 703 may form a metal pillar having a top end joining its top metal plate 7041 provided by the top skeleton 7205 and a bottom end joining its bottom metal plate 7041 provided by the bottom skeleton 7208, wherein in a case its metal pillar may have a height less than 500 micrometers to hold a space between its top and bottom metal plates 7041 with a vertical distance therebetween that may be less than 500 micrometers.

Specification for First Type of Micro Heat Pipe for Eighth Alternative

Figure 23A:
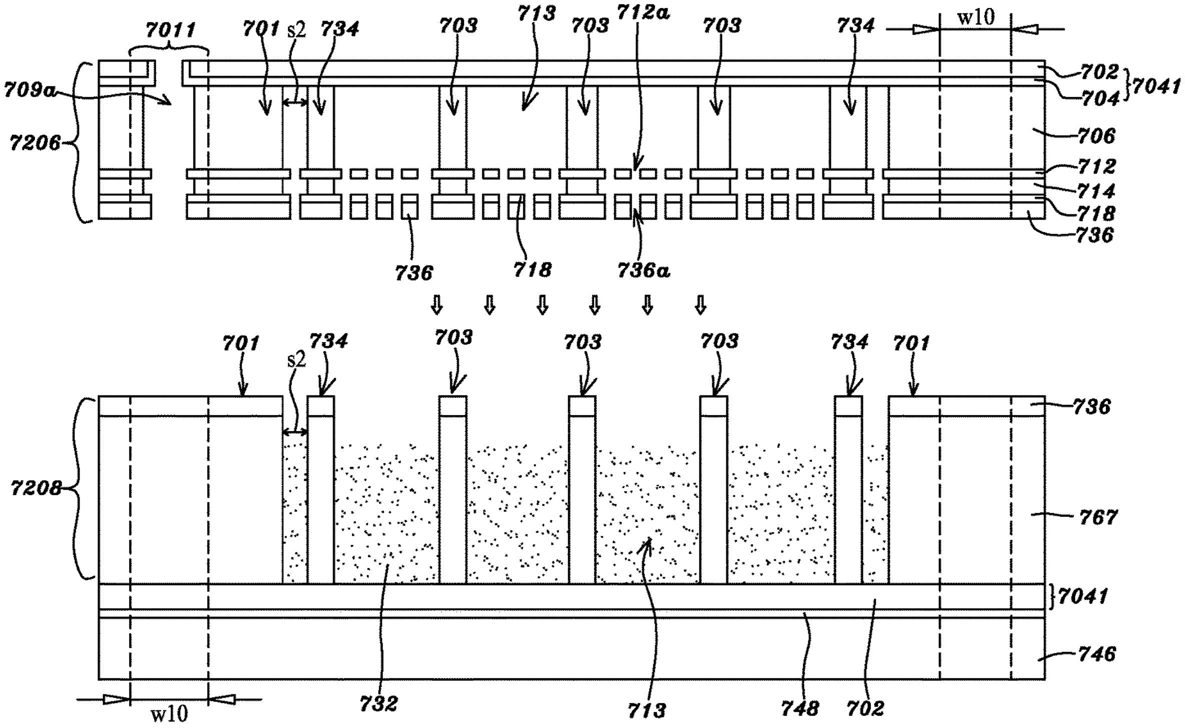
FIGS. 23A-23C are schematically cross-sectional views showing a process for fabricating a first type of micro heat pipe for an eighth alternative in accordance with an embodiment of the present application.
Figures 1, 23B:
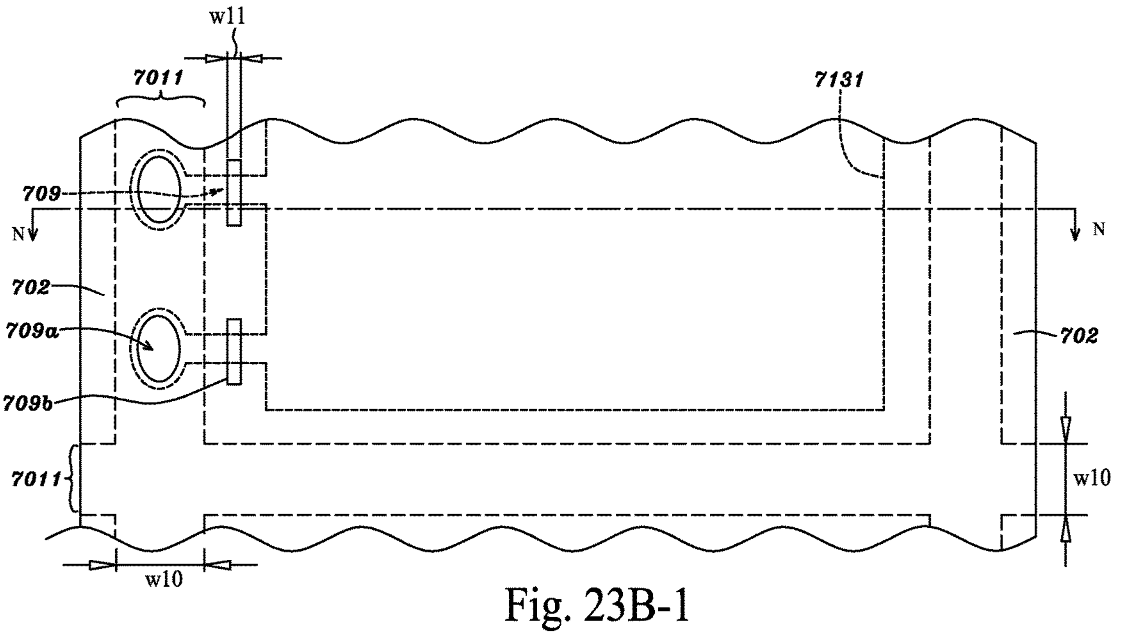
Figure 23B:
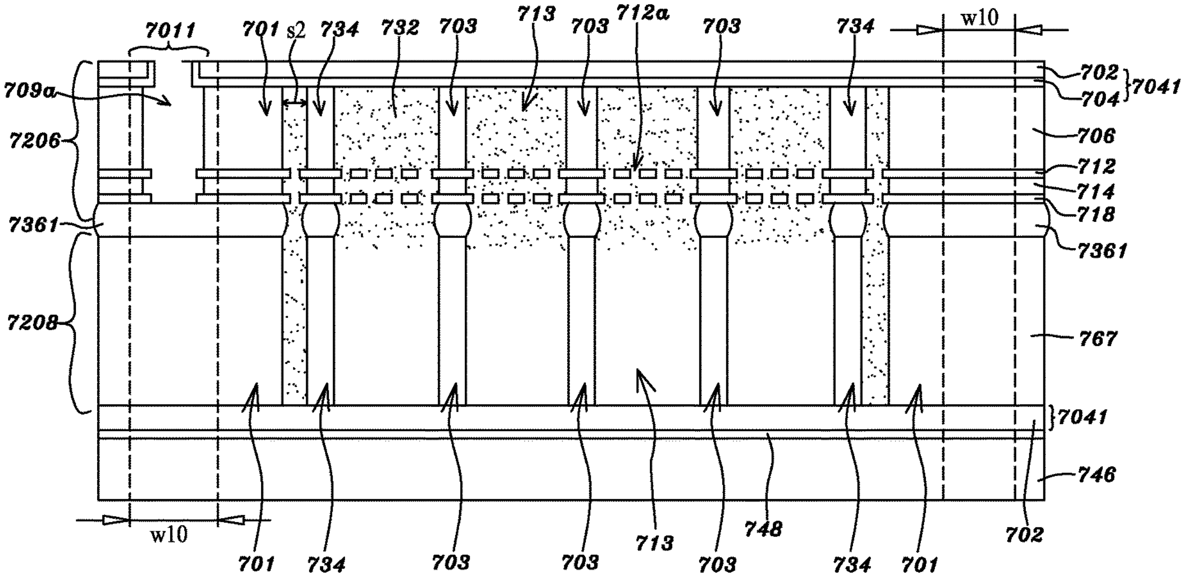
Figure 23C:
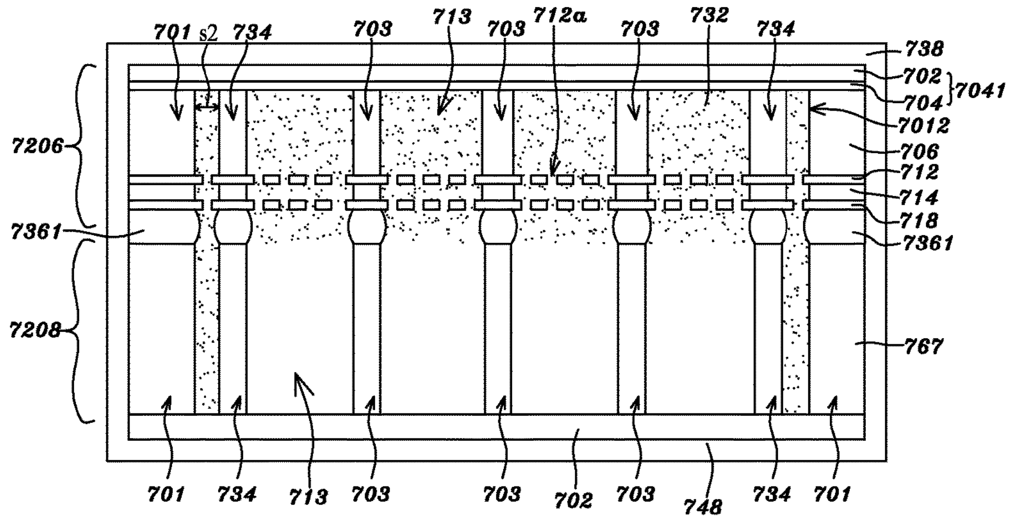

FIGS. 23A-23C are schematically cross-sectional views showing a process for fabricating a first type of micro heat pipe for an eighth alternative in accordance with an embodiment of the present application. FIG. 23B-1 is a schematically top view showing steps illustrated in FIG. 23B for a process for fabricating a first type of micro heat pipe for an eighth alternative in accordance with an embodiment of the present application, wherein FIG. 23B is a schematically cross-sectional view cut along a cross-sectional line O-O in FIG. 23B-1. Referring to FIG. 23A, the eighth type of skeleton 7208 as seen in FIG. 15B may be provided as a bottom skeleton, and the sixth type of skeleton 7206 as seen in FIGS. 14C and 14C-1 or the seventh type of skeleton 7207 as seen in FIG. 14D may be provided as a top skeleton. In this case shown in FIGS. 23A-23C, the sixth type of skeleton 7206 as seen in FIGS. 14C and 14C-1 is provided as a top skeleton. First, the top skeleton 7206 or 7207 may be turned upside down and flipped to have the solder layer 736 of the top skeleton 7206 or 7207 contact and aligned with the solder layer 736 of the bottom skeleton 7208, wherein the scribe line 7011 of each of the partitioning walls 701 of the top skeleton 7206 or 7207 may be vertically aligned with the scribe line 7011 of one of the partitioning walls 701 of the bottom skeleton 7208. In this case, the scribe line 7011 of each of the partitioning walls 701 of each of the top skeleton 7206 or 7207 and bottom skeleton 7201 may have a width w10 between 100 and 1000 micrometers.

Next, referring to FIGS. 23A and 23B, a thermal compression bonding may be performed to bond the solder layer 736 of the top skeleton 7206 or 7207 and the solder layer 736 of the bottom skeleton 7208 into multiple solder contacts 7361 such as a tin-containing alloy having a thickness between and including 5 and 100 micrometers. Each of the solder contacts 7361 may bond one of the metal posts 703 of the top skeleton 7206 or 7207 to one of the metal posts 703 of the bottom skeleton 7208, one of the metal guides 734 of the top skeleton 7206 or 7207 to one of the metal guides 734 of the bottom skeleton 7208, or one of the partitioning walls 701 of the top skeleton 7206 or 7207 to one of the partitioning walls 701 of the bottom skeleton 7208. Thereby, each of the cavities 713 in the top skeleton 7206 or 7207 may be connected to one of the cavities 713 in the bottom skeleton 7208 vertically under said each of the cavities 713 in the top skeleton 7206 or 7207 to form a chamber 7131 enclosed by the top skeleton 7206 or 7207 and bottom skeleton 7208.

Next, referring to FIGS. 23B and 23B-1, the top skeleton 7206 or 7207 and bottom skeleton 7208 may be placed in a closed chamber (not shown), into which vaper of a liquid 732, such as water, ethanol, methanol or a solution containing the above-mentioned materials, may be purged to repel air from the closed chamber. Next, the liquid 732 may be fed or injected into each of the chambers 7131 via, in sequence, (1) a specific one of the openings 702*a* in the metal plate 702 of the top skeleton 7206 or 7207, (2) a specific one of the two vacancies 709*a* in one of the partitioning walls 701 of the top skeleton 7206 or 7207 under the specific one of the openings 702*a* and (3) a specific one of the first, second or third type of channels 709 in said one of the partitioning walls 701 of the top skeleton 7206 or 7207 and connecting the specific one of the two vacancies 709*a* to said each of the chambers 7131. Next, the top skeleton 7206 or 7207 and bottom skeleton 7208 may be heated at a temperature between 100 and 120 degrees Celsius to vaporize the liquid 732 in said each of the chambers 7131 and air in said each of the chambers 7131 may be purged away from said each of the chambers 7131 via, in sequence, (1) two of the first, second or third type of channels 709 in one or respective opposite two of the partitioning walls 701 of the top skeleton 7206 or 7207 and connecting to said each of the chambers 7131, (2) the two vacancies 709*a* in said one or said respective opposite two of the partitioning walls 701 of the top skeleton 7206 or 7207 and connecting to said each of the chambers 7131 through respective said two of the first, second or third type of channels 709 and (3) two of the openings 702*a* in the metal plate 702 of the top skeleton 7206 or 7207 vertically over the respective two vacancies 709*a*. Next, the liquid 732 may be fed or injected again into said each of the chambers 7131 via, in sequence, (1) the specific one of the openings 702*a*, (2) the specific one of the two vacancies 709*a* and (3) the specific one of the first, second or third type of channels 709 at a temperature of the closed chamber below the boiling temperature of the liquid 732. For example, in the case that the liquid 732 is water, the liquid 732 may be fed or injected again into said each of the chambers 7131 via, in sequence, (1) the specific one of the openings 702*a*, (2) the specific one of the two vacancies 709*a* and (3) the specific one of the first, second or third type of channels 709 at a temperature of the closed chamber between 80 and 95 degrees Celsius. In the case that the liquid 732 is methanol, the liquid 732 may be fed or injected again into said each of the chambers 7131 via, in sequence, (1) the specific one of the openings 702*a*, (2) the specific one of the two vacancies 709*a* and (3) the specific one of the first, second or third type of channels 709 at a temperature of the closed chamber between 5 and 20 degrees Celsius. In the case that the liquid 732 is ethanol, the liquid 732 may be fed or injected again into said each of the chambers 7131 via, in sequence, (1) the specific one of the openings 702*a*, (2) the specific one of the two vacancies 709*a* and (3) the specific one of the first, second or third type of channels 709 at a temperature of the closed chamber between 65 and 75 degrees Celsius. Next, a polymer (not shown) may be filled into the two vacancies 709*a* and first, second or third type of channels 709 in the partitioning walls 701 of the top skeleton 7206 or 7207 to seal each of the chambers 7131. Next, the top skeleton 7206 or 7207 and bottom skeleton 7208 may be moved out of the closed chamber. Next, for an optional process, the temporary substrate 746 and glue layer 748 may be removed from an outer surface of the metal plate 702 of the bottom skeleton 7208.

Next, referring to FIGS. 23B and 23B-1, the top skeleton 7206 or 7207 may have multiple compressive seal regions 709*b* each extending across over one of the first, second or third type of channels 709 in one of its partitioning walls 701, wherein each of the compressive seal regions 709*b* has a width w11 between 100 and 500 micrometers. The top skeleton 7206 or 7207 may be pressed at each of the compressive seal regions 709*b* to seal each of the first, second or third type of channels 709. Next, the optional process may be performed to remove the temporary substrate 746 and glue layer 748 from an outer surface of the metal plate 702 of the bottom skeleton 7208. Next, a mechanical sawing process for singulation may be performed to saw the top metal plate 7041 and partitioning walls 701 of the top skeleton 7206 or 7207 and the bottom metal plate 7041 and partitioning walls 701 of the bottom skeleton 7208 along the vertically-aligned scribe lines 7011 of the partitioning walls 701 of the top skeleton 7206 or 7027 and bottom skeleton 7208 into multiple units. Each of the partitioning walls 701 of each of the top skeleton 7206 or 7207 and bottom skeleton 7208 may be cut into two of the outer sidewalls 7012 of respective neighboring two of the units.

Next, referring to FIG. 23C, for each of the units, a metal layer 738, such as copper or nickel, may be electroplated with a thickness between and including 1 and 15 micrometers on an outer surface of each of its peripheral walls, provided by the top metal plate 7041 and outer sidewalls 7012 of the top skeleton 7206 or 7207 and the bottom metal plate 7041 and outer sidewalls 7012 of the bottom skeleton 7208, to form the first type of micro heat pipe 700 for the eighth alternative. Thereby, the liquid 732 may be sealed in the chamber 7131 to be used as a vapor chamber in the first type of micro heat pipe 700 for the eighth alternative. For the first type of micro heat pipe 700 for the eighth alternative, since in its chamber 7131 are the metal meshes or nets 712 and 718 provided by the top skeleton 7206 or 7207 and the metal guides 734 provided by each of the top skeleton 7206 or 7207 and bottom skeleton 7208 and the space s2 may be used as a vertical liquid capillary or channel for its liquid 732 that flows vertically by capillary effect or surface tension, its liquid 732 may flow in a space over and/or at its metal meshes or nets 712 and 718 in its chamber 7131 provided by the top skeleton 7206 or 7207 with a high efficiency of liquid transfer. Further, a vapor of its liquid 732 may flow in a space under and/or at its metal meshes or nets 712 and 718 in its chamber 7131 based on convection mechanism. A total pressure, i.e., vapor pressure, in its chamber 7131 may be smaller than 20 kilopascals (kPa) or 5 kilopascals (kPa) at a temperature of 25 degrees Celsius. A partial pressure of a vapor of its liquid 732 may be greater than 99% or 95% of a total gas pressure in its chamber 7131.

Referring to FIG. 23C, the first type of micro heat pipe 700 for the eighth alternative may have a total height between and including 50 and 2000 micrometers, 50 and 200 micrometers, 100 and 500 micrometers or 100 and 3000 micrometers. For the first type of micro heat pipe 700 for the eighth alternative, each of its outer sidewalls 7012 may have a width between and including 50 and 1000 micrometers, and a transverse dimension of the width of said each of its outer sidewalls 7012 plus the thickness of its metal layer 738 on said each of its outer sidewalls 7012 may be between and including 50 and 1000 micrometers. A vertical dimension of the thickness of its bottom metal plate 7041 plus the thickness of its metal layer 738 on its bottom metal plate 7041 may be between and including 5 and 100 micrometers. A vertical dimension of the thickness of its top metal plate 7041 plus the thickness of its metal layer 738 on its top metal plate 7041 may be between and including 5 and 100 micrometers. Each of its metal posts 703 provided by the bottom skeleton 7208 and one of its metal posts 703 provided by the top skeleton 7206 or 7207 over said each of its metal posts 703 may form a metal pillar having a top end joining its top metal plate 7041 provided by the top skeleton 7206 or 7207 and a bottom end joining its bottom metal plate 7041 provided by the bottom skeleton 7208, wherein in a case its metal pillar may have a height less than 500 micrometers to hold a space between its top and bottom metal plates 7041 with a vertical distance therebetween that may be less than 500 micrometers.

Second Type of Micro Heat Pipe or Micro Heat Transfer Component (Non-Uniform Oscillating (Pulsating) Micro Heat Pipe)

Specification for Heat-Transfer Mechanism for Second Type of Micro Heat Pipe

Figures 24A, 24B, 24C:
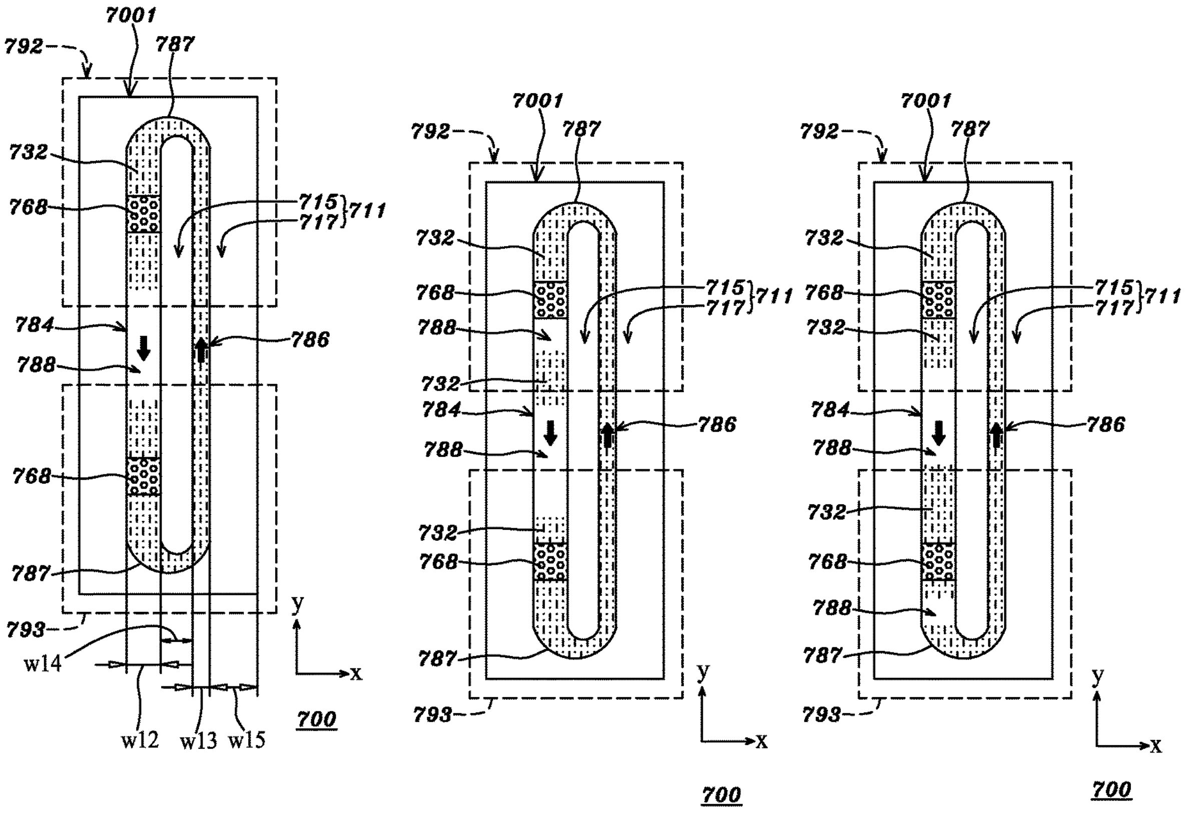
FIGS. 24A-24C are schematically cross-sectional views showing a heat-transfer mechanism for a second type of micro heat pipe in an x-y plane in accordance with an embodiment of the present application.

FIGS. 24A-24C are schematically cross-sectional views showing a heat-transfer mechanism for a second type of micro heat pipe in an x-y plane in accordance with an embodiment of the present application. Referring to FIG. 24A, a second type of micro heat pipe 700 may include a main body 711 formed of copper or aluminum and with (1) an inner longitudinal wall 715 having a width w14 between 5 and 30 micrometers and (2) multiple outer sidewalls 717 having a width w15 between 50 and 1,000 micrometers and surrounding the inner longitudinal wall 715 of its main body 711.

Furthermore, referring to FIG. 24A, its wide and narrow pipes 784 and 786 may be formed at two opposite sides of the inner longitudinal wall 715 of its main body 711 and each between one of the two opposite sides of the inner longitudinal wall 715 of its main body 711 and one of the outer sidewalls 717 of its main body 711. Its wide pipe 784 may extend in the y-direction with a width or diameter w12 between and including 20 and 200 micrometers. Its narrow pipe 786 may extend in the y-direction, i.e., in parallel with its wide pipe 784, with a width or diameter w13 between and including 10 and 100 micrometers. A ratio of the width or diameter of its wide pipe 784 to that of its narrow pipe 786 may be between 2 and 40. Its two connecting pipes 787 may be formed at two opposite ends of the inner longitudinal wall 715 of its main body 711 and each between one of the two opposite ends of the inner longitudinal wall 715 of its main body 711 and one of the outer sidewalls 717 of its main body 711. Each of its two connecting pipes 787 may extend in an arc as shown in FIG. 24A or in a straight line to connect one of two ends of its wide pipe 784 to one of two ends of its narrow pipe 786 opposite to said one of the two ends of its wide pipe 784 across the inner longitudinal wall 715 of its main body 711. Its wide and narrow pipes 784 and 786 and connecting pipes 787 may form a close loop.

Referring to FIG. 24A, the second type of micro heat pipe 700 may further include a liquid 732, such as water, ethanol, methanol or a solution containing the above-mentioned materials, sealed in its wide and narrow pipes 784 and 786 and connecting pipes 787, and one or more bubble-formation enhancement regions 768, i.e., relatively rough regions, on an inner surface of its wide pipe 784 to enhance formation of vapor bubbles in the liquid 732, wherein each of its bubble-formation enhancement regions 768 may have a greater surface roughness than that of the other regions of the inner surface of each of its wide and narrow pipes 784 and 786 and connecting pipes 787 than its bubble-formation enhancement regions 768.

Referring to FIG. 24A, the second type of micro heat pipe 700 may have a first end 7001 mounted to a hot region 792, where heat may be generated by a heat source such as semiconductor integrated-circuit chip, to absorb heat from the hot region 792 and a second end 7002 mounted to a cold region 793 to release heat to the cold region 793. Thereby, its liquid 732 may circularly flow in its wide and narrow pipes 784 and 786 and connecting pipes 787 in a counter-clockwise direction for heat circulation. Its liquid 732 flowing from its narrow pipe 786 at its second end 7002 may be heated in its wide and narrow pipes 784 and 786 and one of its connecting pipes 787 at its first end 7001 to absorb the heat from the hot region 792, and vapor bubbles may abundantly expand or explode at one of its bubble-formation enhancement regions 768 at its first end 7001 to form a vapor space 788 in its wide pipe 784 as seen in FIG. 24B, flowing along its wide pipe 784 with the vapor space 788 having a gradually expanding volume as seen in FIG. 24C. The vapor in the vapor bubbles in the vapor space 788 flowing along its wide pipe 784 and from its first end 7001 may be condensed into a liquid, as a part of its liquid 732, in its wide and narrow pipes 784 and 786 and one of its connecting pipes 787 at its second end 7002 at the time when the vapor space 788 may have a gradually shrunk volume as seen in FIGS. 24B and 24C. The volume of the vapor space 788 at its second end 7002 may be smaller than that of the vapor space 788 before moving to its second end 7002. Thereby, the heat contained in its liquid 732 and/or the vapor of its liquid 732 in its wide and narrow pipes 784 and 786 and one of its connecting pipes 787 at its second end 7002 may be released to the cold region 793. Its liquid 732 in its wide and narrow pipes 784 and 786 and one of its connecting pipes 787 at its second end 7002 may flow to its wide and narrow pipes 784 and 786 and one of its connecting pipes 787 at its first end 7001 through its narrow pipe 786 due to a capillary effect of its narrow pipe 786 and a pulling force induced by the shrinkage of the vapor space 788. Hereby, heat may be transferred from the hot region 792 to the cold region 793.

Alternatively, for the second type of micro heat pipe 700, since the other of its bubble-formation enhancement regions 768 is formed at its second end 7002, its first end 7001 may be mounted to a cold region and its second end 7002 may be mounted to a hot region to have its liquid 732 flow in its wide and narrow pipes 784 and 786 and connecting pipes 787 in a clockwise direction and transfer heat from the hot region to the cold region.

Alternatively, for the second type of micro heat pipe 700, its bubble-formation enhancement regions 768 may be formed on an inner surface of its wide pipe 784 at its first and second ends 7001 and 7002 and on an inner surface of its narrow pipe 786 at its first and second ends 7001 and 7002, wherein each of its bubble-formation enhancement regions 768 may have a greater surface roughness than those of the other regions of the inner surface of each of its wide and narrow pipes 784 and 786 and connecting pipes 787 than its bubble-formation enhancement regions 768.

Various Structure for Second Type of Micro Heat Pipe

Specification for Second Type of Micro Heat Pipe for First Alternative

Figure 25:
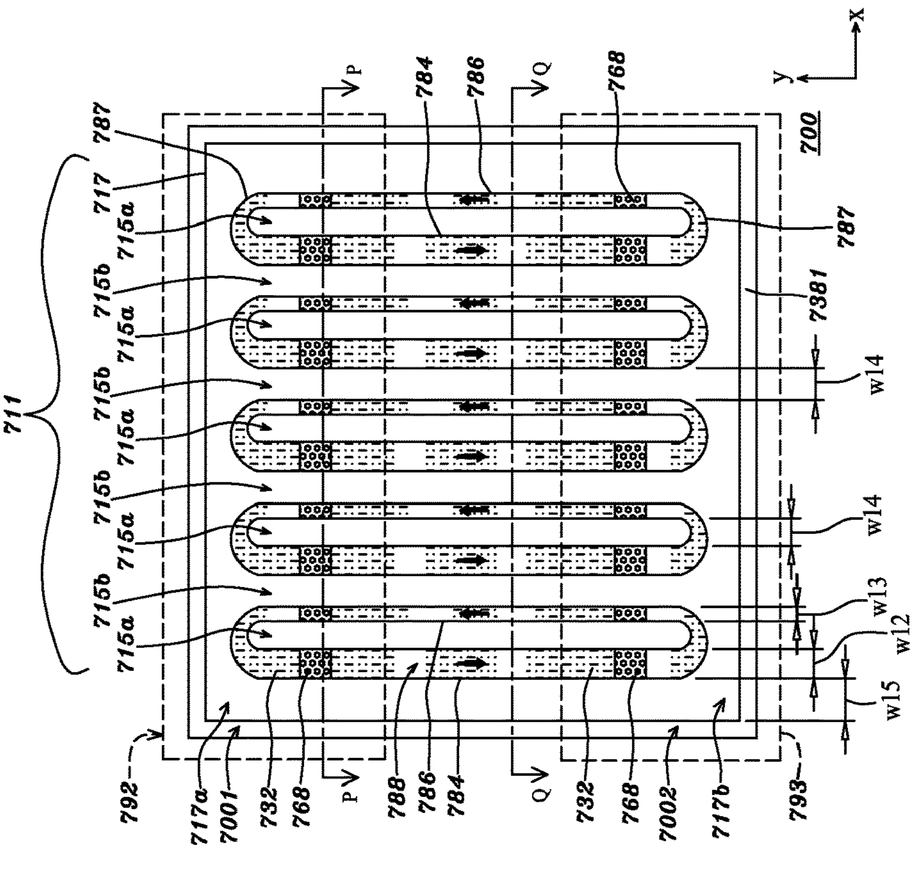

FIG. 25 is a schematically top view showing a second type of micro heat pipe for a first alternative in an x-y plane in accordance with an embodiment of the present application. Referring to FIG. 25, a second type of micro heat pipe 700 for a first alternative may include a main body 711 formed of copper or aluminum and with (1) multiple first inner longitudinal walls 715*a* each extending in the y-direction and having a width w14 between 5 and 30 micrometers, (2) multiple second inner longitudinal walls 715*b* each extending in the y-direction and having a width w14 between 5 and 30 micrometers and (3) multiple outer sidewalls 717 having a width w15 between 50 and 1,000 micrometers and surrounding the first and second inner longitudinal walls 715*a* and 715*b* of its main body 711, wherein each of the second inner longitudinal walls 715*b* of its main body 711 may be between neighboring two of the first inner longitudinal walls 715*a* of its main body 711 and join front and rear sidewalls 717*a* and 717*b* of the outer sidewalls 717 of its main body 711.

Furthermore, referring to FIG. 25, for the second type of micro heat pipe 700 for the first alternative, one of its wide pipes 784 and one of its narrow pipes 786 may be formed at two opposite sides of each of the first inner longitudinal walls 715*a* of its main body 711, wherein said one of its wide pipes 784 may extend in the y-direction with a width or diameter w12 between and including 20 and 200 micrometers and said one of its narrow pipes 786 may extend in the y-direction, i.e., in parallel with said one of its wide pipes 784, with a width or diameter w13 between and including 10 and 100 micrometers, wherein a ratio of the width or diameter of said one of its wide pipes 784 to that of said one of its narrow pipes 786 may be between 2 and 40. Two of its connecting pipes 787 may be formed at two opposite ends of said each of the first inner longitudinal walls 715*a* of its main body 711 and each between one of the two opposite ends of said each of the first inner longitudinal walls 715*a* of its main body 711 and one of the front and rear sidewalls 717*a* and 717*b* of the outer sidewalls 717 of its main body 711, wherein each of said two of its connecting pipes 787 may extend in an arc as shown in FIG. 25 or in a straight line to connect one of two ends of said one of its wide pipes 784 to one of two ends of said one of its narrow pipes 786 opposite to said one of the two ends of said one of its wide pipes 784 across said each of the first inner longitudinal walls 715*a* of its main body 711. Said one of its wide pipes 784, said one of its narrow pipes 786 and said two of its connecting pipes 787 around said each of the first inner longitudinal walls 715*a* of its main body 711 may form a close loop. Each of the second inner longitudinal walls 715*b* of its main body 711 may separate one of its wide pipes 784 and one of its narrow pipes 786 at opposite sides of said each of the second inner longitudinal walls 715*b* of its main body 711 from each other.

Referring to FIG. 25, the second type of micro heat pipe 700 for the first alternative may further include a liquid 732, such as water, ethanol, methanol or a solution containing the above-mentioned materials, sealed in its wide and narrow pipes 784 and 786 and connecting pipes 787, and one or more bubble-formation enhancement regions 768, i.e., relatively rough regions, on an inner surface of its wide and narrow pipes 784 and 786 at both of its first and second ends 7001 and 7002 to enhance formation of vapor bubbles in the liquid 732, wherein each of its bubble-formation enhancement regions 768 may have a greater surface roughness than those of the other regions of the inner surface of each of its wide and narrow pipes 784 and 786 and connecting pipes 787 than its bubble-formation enhancement regions 768.

Referring to FIG. 25, the first end 7001 of the second type of micro heat pipe 700 for the first alternative may be mounted to a hot region 792, where heat may be generated by a heat source such as semiconductor integrated-circuit chip, to absorb heat from the hot region 792 and the second end 7002 of the second type of micro heat pipe 700 for the first alternative may be mounted to a cold region 793 to release heat to the cold region 793. Thereby, due to the same reason as illustrated in FIGS. 24A-24C, its liquid 732 may circularly flow in its wide and narrow pipes 784 and 786 and connecting pipes 787 around each of the first inner longitudinal walls 715*a* of its main body 711 in a counterclockwise direction for heat circulation.

Specification for Second Type of Micro Heat Pipe for Second Alternative

Figure 26:
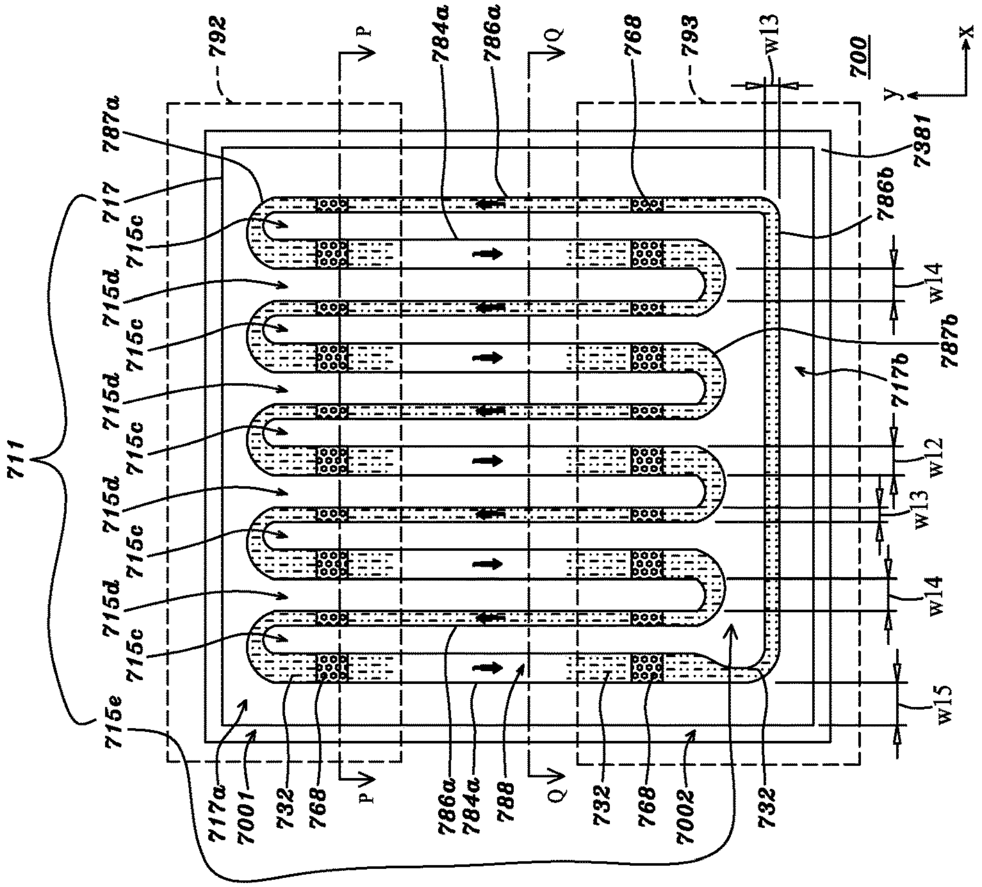
FIGS. 25-31 are schematically top views showing various second type of micro heat pipes for first through seventh alternatives in an x-y plane in accordance with an embodiment of the present application.

FIG. 26 is a schematically top view showing a second type of micro heat pipe for a second alternative in an x-y plane in accordance with an embodiment of the present application. Referring to FIG. 26, a second type of micro heat pipe 700 for a second alternative may include a main body 711 formed of copper or aluminum and with (1) multiple first inner longitudinal walls 715*c* each extending in the y-direction and having a width w14 between 5 and 30 micrometers, (2) multiple second inner longitudinal walls 715*d* each extending in the y-direction and having a width w14 between 5 and 30 micrometers, (3) a third inner longitudinal wall 715*e* extending in the x-direction and joining a rear end of each of the first inner longitudinal walls 715*c* of its main body 711 and (4) multiple outer sidewalls 717 having a width w15 between 50 and 1,000 micrometers and surrounding the first, second and third inner longitudinal walls 715*c*, 715*d* and 715*e* of its main body 711, wherein each of the second inner longitudinal walls 715*d* of its main body 711 may be between neighboring two of the first inner longitudinal walls 715*c* of its main body 711 and join a front sidewall 717*a* of the outer sidewalls 717 of its main body 711.

For more elaboration, referring to FIG. 26, for the second type of micro heat pipe 700 for the second alternative, one of its wide pipes 784*a* and one of its first narrow pipes 786*a* may be formed at two opposite sides of each of the first inner longitudinal walls 715*c* of its main body 711. One of its wide pipes 784*a* and one of its first narrow pipes 786*a* may be formed at two opposite sides of each of the second inner longitudinal walls 715*d* of its main body 711. Its second narrow pipe 786*b* may be formed between the third inner longitudinal wall 715*e* of its main body 711 and a rear sidewall 717*b* of the outer sidewalls 717 of its main body 711. Each of its wide pipes 784*a* may extend in the y-direction with a width or diameter w12 between and including 20 and 200 micrometers. Each of its first narrow pipes 786*a* may extend in the y-direction, i.e., in parallel with each of its wide pipes 784*a*, with a width or diameter w13 between and including 10 and 100 micrometers. Its second narrow pipe 786*b* may extend in the x-direction, i.e., vertical to each of its wide pipes 784*a* and first narrow pipes 786*a*, with a width or diameter w13 between and including 10 and 100 micrometers to connect a rear end of a leftmost one of its wide pipes 784*a* to a rear end of a rightmost one of its first narrow pipes 786*a*. A ratio of the width or diameter of each of its wide pipes 784*a* to that of each of its first and second narrow pipes 786*a* and 786*b* may be between 2 and 40. One of its first connecting pipes 787*a* may be formed at a front end of said each of the first inner longitudinal walls 715*a* of its main body 711 and between the front end of said each of the first inner longitudinal walls 715*a* of its main body 711 and the front sidewall 717*a* of the outer sidewalls 717 of its main body 711 to connect a front end of one of its wide pipes 784*a* at a left side of said each of the first inner longitudinal walls 715*a* of its main body 711 to a front end of one of its first narrow pipes 786*a* at a right side of said each of the first inner longitudinal walls 715*a* of its main body 711. One of its second connecting pipes 787*b* may be formed at a rear end of said each of the second inner longitudinal walls 715*b* of its main body 711 and between the rear end of said each of the second inner longitudinal walls 715*b* of its main body 711 and the third inner longitudinal wall 715*e* of its main body 711 to connect a rear end of one of its wide pipes 784*a* at a right side of said each of the second inner longitudinal walls 715*b* of its main body 711 to a rear end of one of its first narrow pipes 786*a* at a left side of said each of the second inner longitudinal walls 715*b* of its main body 711. Its wide pipes 784*a*, first and second narrow pipes 786*a* and 786*b* and first and second connecting pipes 787*a* and 787*b* may form a close loop.

Referring to FIG. 26, the second type of micro heat pipe 700 for the second alternative may further include a liquid 732, such as water, ethanol, methanol or a solution containing the above-mentioned materials, sealed in its wide pipes 784*a*, first and second narrow pipes 786*a* and 786*b* and first and second connecting pipes 787*a* and 787*b*, and one or more bubble-formation enhancement regions 768, i.e., relatively rough regions, on an inner surface of its wide pipes 784*a* and first narrow pipes 786*a* at both of its first and second ends 7001 and 7002 to enhance formation of vapor bubbles in the liquid 732, wherein each of its bubble-formation enhancement regions 768 may have a greater surface roughness than those of the other regions of the inner surface of each of its wide pipes 784*a*, first and second narrow pipes 786*a* and 786*b* and first and second connecting pipes 787*a* and 787*b* than its bubble-formation enhancement regions 768.

Referring to FIG. 26, the first end 7001 of the second type of micro heat pipe 700 for the second alternative may be mounted to a hot region 792, where heat may be generated by a heat source such as semiconductor integrated-circuit chip, to absorb heat from the hot region 792 and the second end 7002 of the second type of micro heat pipe 700 for the second alternative may be mounted to a cold region 793 to release heat to the cold region 793. Thereby, due to the same reason as illustrated in FIGS. 24A-24C, its liquid 732 may circularly flow in its wide pipes 784*a*, first and second narrow pipes 786*a* and 786*b* and first and second connecting pipes 787*a* and 787*b* for heat circulation.

Specification for Second Type of Micro Heat Pipe for Third Alternative

Figure 27:
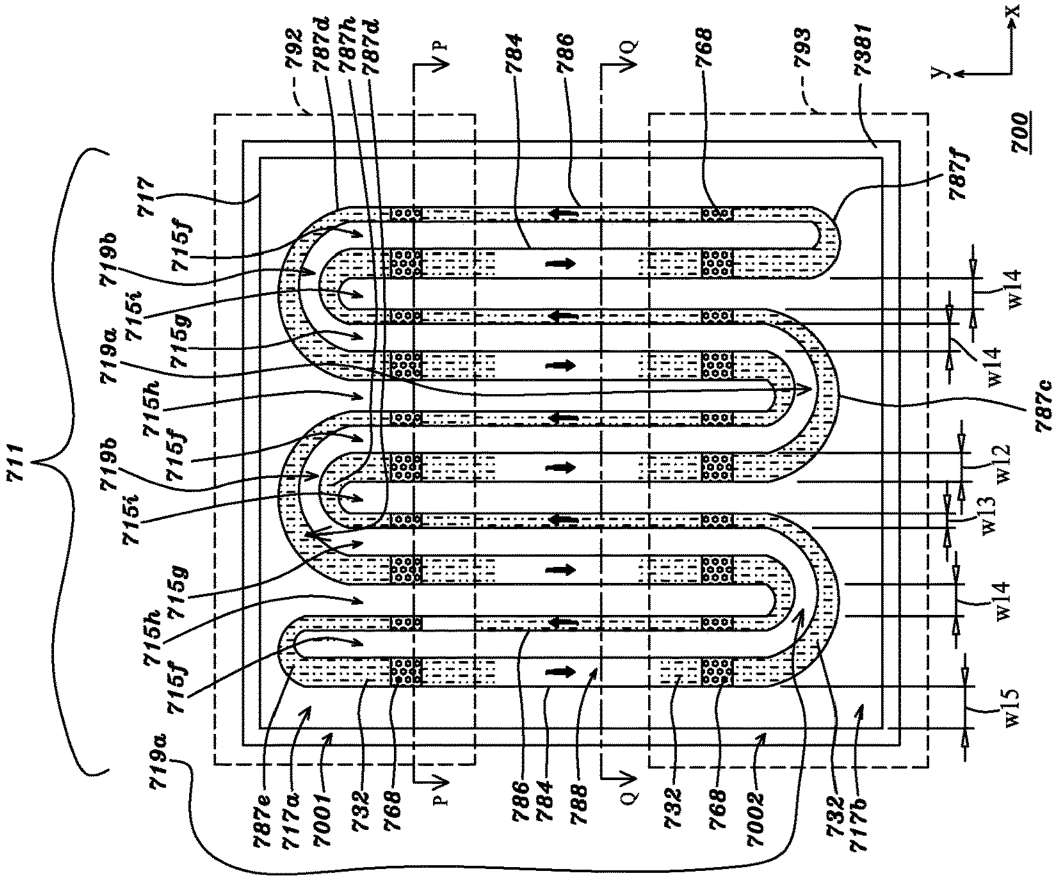

FIG. 27 is a schematically top view showing a second type of micro heat pipe for a third alternative in an x-y plane in accordance with an embodiment of the present application. Referring to FIG. 27, a second type of micro heat pipe 700 for a third alternative may include a main body 711 formed of copper or aluminum and with (1) multiple first inner longitudinal walls 715*f* each extending in the y-direction and having a width w14 between 5 and 30 micrometers, (2) multiple second inner longitudinal walls 715*g* each extending between neighboring two of the first inner longitudinal walls 715*f* of its main body 711 in the y-direction and having a width w14 between 5 and 30 micrometers, (3) multiple third inner longitudinal walls 715*h* each extending in the y-direction and having a width w14 between 5 and 30 micrometers, (4) multiple fourth inner longitudinal walls 715*i* each extending in the y-direction and having a width w14 between 5 and 30 micrometers, (5) multiple first inner connecting walls 719*a* each extending in an arc as shown in FIG. 27 or in a straight line with a first end joining a rear end of one of the first inner longitudinal walls 715*f* of its main body 711 and a second end joining a rear end of one of the second inner longitudinal walls 715*g* of its main body 711, (6) multiple second inner connecting walls 719*b* each extending in an arc as shown in FIG. 27 or in a straight line with a first end joining a front end of one of the first inner longitudinal walls 715*f* of its main body 711 and a second end joining a front end of one of the second inner longitudinal walls 715*g* of its main body 711 and (7) multiple outer sidewalls 717 having a width w15 between 50 and 1,000 micrometers and surrounding the first, second, third fourth inner longitudinal walls 715*f*, 715*g*, 715*h* and 715*i* of its main body 711 and the first and second inner connecting walls 719*a* and 719*b* of its main body 711, wherein each of the third inner longitudinal walls 715*h* of its main body 711 may be between neighboring two of the first and second inner longitudinal walls 715*f* and 715*g* of its main body 711 and join a front sidewall 717*a* of the outer sidewalls 717 of its main body 711, and each of the fourth inner longitudinal walls 715*i* of its main body 711 may be between neighboring two of the first and second inner longitudinal walls 715*f* and 715*g* of its main body 711 and join a rear sidewall 717*b* of the outer sidewalls 717 of its main body 711.

For more elaboration, referring to FIG. 27, for the second type of micro heat pipe 700 for the third alternative, one of its wide pipes 784 and one of its narrow pipes 786 may be formed at two opposite sides of each of the first inner longitudinal walls 715*f* of its main body 711. One of its wide pipes 784 and one of its narrow pipes 786 may be formed at two opposite sides of each of the second inner longitudinal walls 715*g* of its main body 711. Each of its wide pipes 784 may extend in the y-direction with a width or diameter w12 between and including 20 and 200 micrometers. Each of its narrow pipes 786 may extend in the y-direction, i.e., in parallel with each of its wide pipes 784, with a width or diameter w13 between and including 10 and 100 micrometers. A ratio of the width or diameter of each of its wide pipes 784 to that of each of its narrow pipes 786 may be between 2 and 40. One of its first connecting pipes 787*c* may be formed between each of the first inner connecting walls 719*a* of its main body 711 and the rear sidewall 717*b* of the outer sidewalls 717 of its main body 711 to connect a rear end of one of its wide pipes 784 at a left side of one of the first inner longitudinal walls 715*f* of its main body 711 joining the first end of said each of the first inner connecting walls 719*a* of its main body 711 to a rear end of one of its narrow pipes 786 at a right side of one of the second inner longitudinal walls 715*g* of its main body 711 joining the second end of said each of the first inner connecting walls 719*a* of its main body 711. One of its second connecting pipes 787*d* may be formed between each of the second inner connecting walls 719*b* of its main body 711 and the front sidewall 717*a* of the outer sidewalls 717 of its main body 711 to connect a front end of one of its wide pipes 784 at a left side of one of the second inner longitudinal walls 715*g* of its main body 711 joining the second end of said each of the second inner connecting walls 719*b* of its main body 711 to a front end of one of its narrow pipes 786 at a right side of one of the first inner longitudinal walls 715*f* of its main body 711 joining the first end of said each of the second inner connecting walls 719*b* of its main body 711. Its third connecting pipe 787*e* may be formed at a front end of the leftmost one of the first inner longitudinal walls 715*f* of its main body 711 and between the front end of the leftmost one of the first inner longitudinal walls 715*f* of its main body 711 and the front sidewall 717*a* of the outer sidewalls 717 of its main body 711 to connect a front end of one of its wide pipes 784 at a left side of the leftmost one of the first inner longitudinal walls 715*f* of its main body 711 to a front end of one of its narrow pipes 786 at a right side of the leftmost one of the first inner longitudinal walls 715*f* of its main body 711. Its fourth connecting pipe 787*f* may be formed at a rear end of the rightmost one of the first inner longitudinal walls 715*f* of its main body 711 and between the rear end of the rightmost one of the first inner longitudinal walls 715*f* of its main body 711 and the rear sidewall 717*b* of the outer sidewalls 717 of its main body 711 to connect a rear end of one of its wide pipes 784 at a left side of the rightmost one of the first inner longitudinal walls 715*f* of its main body 711 to a rear end of the one of its narrow pipes 786 at a right side of the rightmost one of the first inner longitudinal walls 715*f* of its main body 711. One of its fifth connecting pipes 787*g* may be formed at a rear end of each of the third inner longitudinal walls 715*h* of its main body 711 and between the rear end of said each of the third inner longitudinal walls 715*h* of its main body 711 and one of the first inner connecting walls 719*a* of its main body 711 to connect a rear end of one of its narrow pipes 786 at a right side of one of the first inner longitudinal walls 715*f* of its main body 711 joining the first end of said one of the first inner connecting walls 719*a* of its main body 711 to a rear end of one of its wide pipes 784 at a left side of one of the second inner longitudinal walls 715*g* of its main body 711 joining the second end of said one of the first inner connecting walls 719*a* of its main body 711. One of its sixth connecting pipes 787*h* may be formed at a front end of each of the fourth inner longitudinal walls 715*i* of its main body 711 and between the front end of said each of the fourth inner longitudinal walls 715*i* of its main body 711 and one of the second first inner connecting walls 719*b* of its main body 711 to connect a front end of one of its narrow pipes 786 at a right side of one of the second inner longitudinal walls 715*g* of its main body 711 joining the second end of said one of the second inner connecting walls 719*b* of its main body 711 to a front end of one of its wide pipes 784 at a left side of one of the first inner longitudinal walls 715*f* of its main body 711 joining the first end of said one of the second inner connecting walls 719*b* of its main body 711. Its wide and narrow pipes 784 and 786 and first, second, third, fourth, fifth and sixth connecting pipes 787*c*, 787*d*, 787*e*, 787*f*, 787*g* and 787*h* may form a close loop.

Referring to FIG. 27, the second type of micro heat pipe 700 for the third alternative may further include a liquid 732, such as water, ethanol, methanol or a solution containing the above-mentioned materials, sealed in its wide and narrow pipes 784 and 786 and first, second, third, fourth, fifth and sixth connecting pipes 787*c*, 787*d*, 787*e*, 787*f*, 787*g* and 787*h*, and one or more bubble-formation enhancement regions 768, i.e., relatively rough regions, on an inner surface of its wide and narrow pipes 784 and 786 at both of its first and second ends 7001 and 7002 to enhance formation of vapor bubbles in the liquid 732, wherein each of its bubble-formation enhancement regions 768 may have a greater surface roughness than those of the other regions of the inner surface of each of its wide and narrow pipes 784 and 786 and first, second, third, fourth, fifth and sixth connecting pipes 787*c*, 787*d*, 787*e*, 787*f*, 787*g* and 787*h* than its bubble-formation enhancement regions 768.

Referring to FIG. 27, the first end 7001 of the second type of micro heat pipe 700 for the second alternative may be mounted to a hot region 792, where heat may be generated by a heat source such as semiconductor integrated-circuit chip, to absorb heat from the hot region 792 and the second end 7002 of the second type of micro heat pipe 700 for the second alternative may be mounted to a cold region 793 to release heat to the cold region 793. Thereby, due to the same reason as illustrated in FIGS. 24A-24C, its liquid 732 may circularly flow in its wide and narrow pipes 784 and 786 and first, second, third, fourth, fifth and sixth connecting pipes 787*c*, 787*d*, 787*e*, 787*f*, 787*g* and 787*h* for heat circulation.

Specification for Second Type of Micro Heat Pipe for Fourth Alternative

Figure 28:
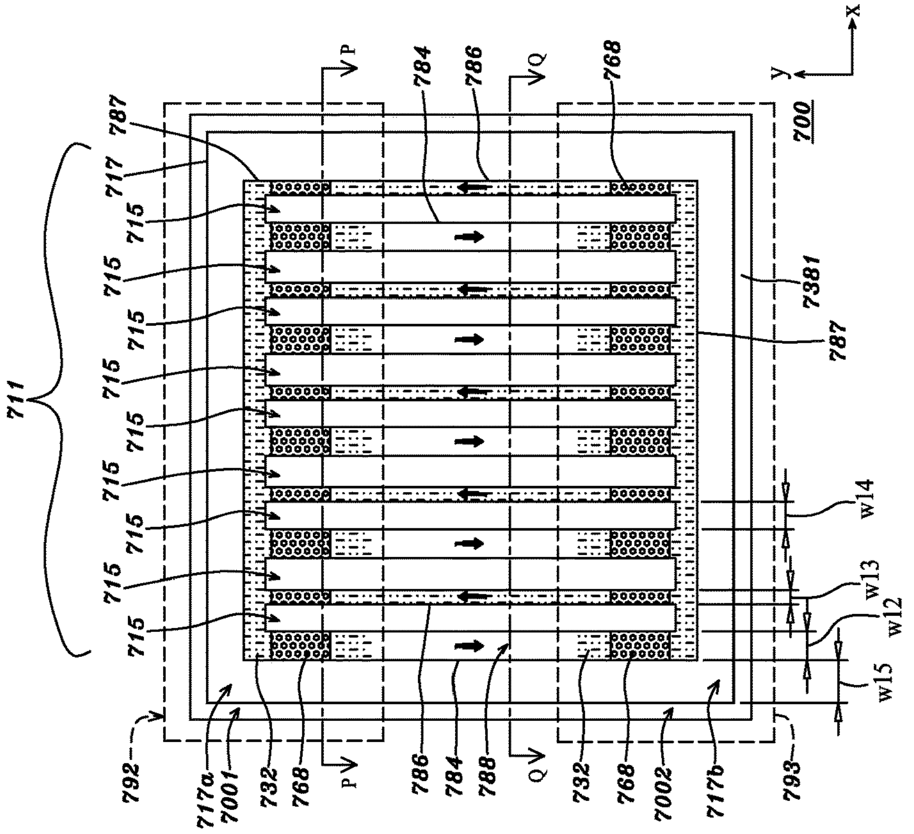

FIG. 28 is a schematically top view showing a second type of micro heat pipe for a fourth alternative in an x-y plane in accordance with an embodiment of the present application. Referring to FIG. 28, a second type of micro heat pipe 700 for a fourth alternative may include a main body 711 formed of copper or aluminum and with (1) multiple inner longitudinal walls 715 each extending in the y-direction and having a width w14 between 5 and 30 micrometers and (2) multiple outer sidewalls 717 having a width w15 between 50 and 1,000 micrometers and surrounding the inner longitudinal walls 715 of its main body 711.

Furthermore, referring to FIG. 28, for the second type of micro heat pipe 700 for the fourth alternative, one of its wide pipes 784 and one of its narrow pipes 786 may be formed at two opposite sides of each of the inner longitudinal walls 715 of its main body 711, wherein said one of its wide pipes 784 may extend in the y-direction with a width or diameter w12 between and including 20 and 200 micrometers and said one of its narrow pipes 786 may extend in the y-direction, i.e., in parallel with said one of its wide pipes 784, with a width or diameter w13 between and including 10 and 100 micrometers, wherein a ratio of the width or diameter of said one of its wide pipes 784 to that of said one of its narrow pipes 786 may be between 2 and 40. Its two connecting pipes 787 may be formed extending in the x-direction and along the front and rear sidewalls 717*a* and 717*b* of the outer sidewalls 717 of its main body 711 respectively, wherein a front one of its two connecting pipes 787 may connect to a front end of each of its wide and narrow pipes 784 and 786 and a rear one of its two connecting pipes 787 may connect to a rear end of each of its wide and narrow pipes 784 and 786. Its wide and narrow pipes 784 and 786 and connecting pipes 787 may form a close loop.

Referring to FIG. 28, the second type of micro heat pipe 700 for the fourth alternative may further include a liquid 732, such as water, ethanol, methanol or a solution containing the above-mentioned materials, sealed in its wide and narrow pipes 784 and 786 and connecting pipes 787, and one or more bubble-formation enhancement regions 768, i.e., relatively rough regions, on an inner surface of its wide and narrow pipes 784 and 786 at both of its first and second ends 7001 and 7002 to enhance formation of vapor bubbles in the liquid 732, wherein each of its bubble-formation enhancement regions 768 may have a greater surface roughness than those of the other regions of the inner surface of each of its wide and narrow pipes 784 and 786 and connecting pipes 787 than its bubble-formation enhancement regions 768.

Referring to FIG. 28, the first end 7001 of the second type of micro heat pipe 700 for the fourth alternative may be mounted to a hot region 792, where heat may be generated by a heat source such as semiconductor integrated-circuit chip, to absorb heat from the hot region 792 and the second end 7002 of the second type of micro heat pipe 700 for the fourth alternative may be mounted to a cold region 793 to release heat to the cold region 793. Thereby, due to the same reason as illustrated in FIGS. 24A-24C, its liquid 732 may circularly flow in its wide and narrow pipes 784 and 786 and connecting pipes 787 for heat circulation.

Specification for Second Type of Micro Heat Pipe for Fifth Alternative

Figure 29:
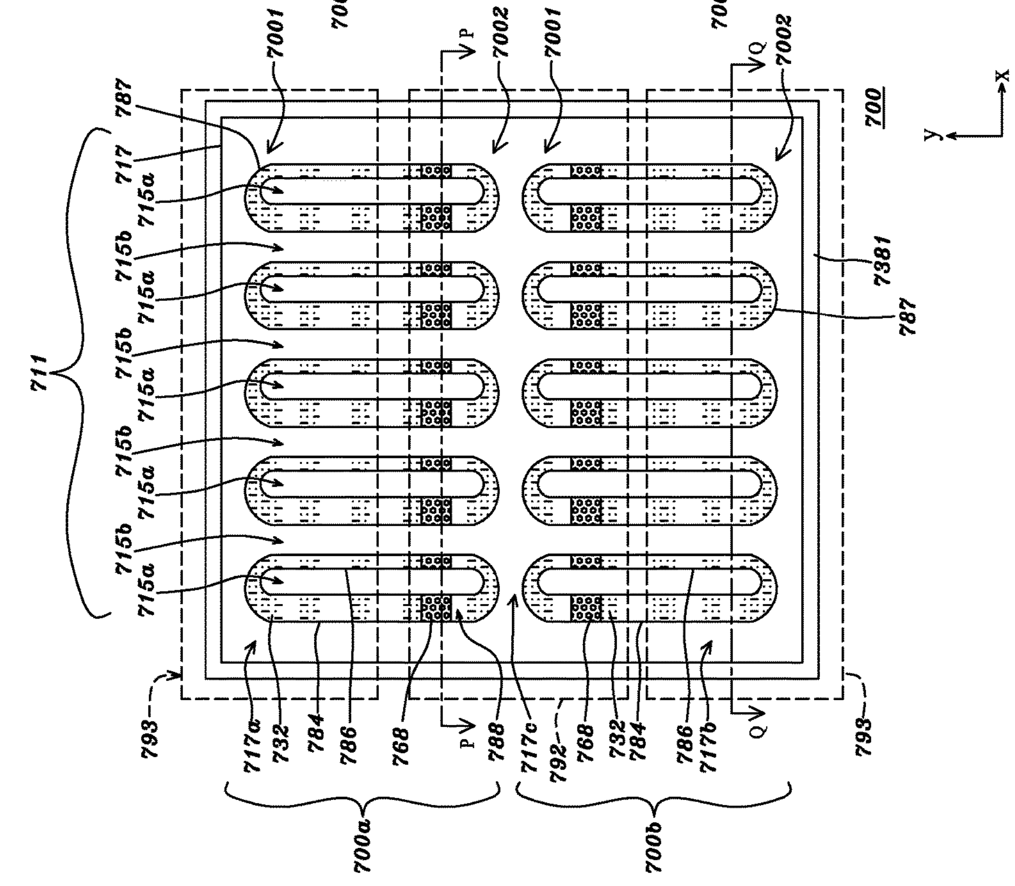

FIG. 29 is a schematically top view showing a second type of micro heat pipe for a fifth alternative in an x-y plane in accordance with an embodiment of the present application. Referring to FIG. 29, a second type of micro heat pipe 700 for a fifth alternative may include front and rear micro heat pipes 700*a* and 700*b* each having a similar structure to that as illustrated for the second type of micro heat pipe 700 for the first alternative as seen in FIG. 25, wherein the second type of micro heat pipe 700 for the fifth alternative may include a middle sidewall 717*c* acting as the rear sidewall 717*b* of the outer sidewalls 717 of its front micro heat pipe 700*a* as illustrated in FIG. 25 and the front sidewall 717*a* of the outer sidewalls 717 of its rear micro heat pipe 700*b* as illustrated in FIG. 25. For an element indicated by the same reference number shown in FIGS. 25 and 29, the specification of the element as seen in FIG. 29 may be referred to that of the element as illustrated in FIG. 25. The difference between the front micro heat pipe 700*a* and the second type of micro heat pipe 700 for the first alternative is that for the front micro heat pipe 700*a* as seen in FIG. 29, its bubble-formation enhancement regions 768 may not be formed on the inner surface of its wide and narrow pipes 784 and 786 at its first end 7001, and for the rear micro heat pipe 700*b* as seen in FIG. 29, its bubble-formation enhancement regions 768 may not be formed on the inner surface of its wide and narrow pipes 784 and 786 at its second end 7002.

Referring to FIG. 29, for the second type of micro heat pipe 700 for the fifth alternative, the first end 7001 of its rear micro heat pipe 700*b* and the second end 7002 of its front micro heat pipe 700*a* may be mounted to a hot region 792, where heat may be generated by a heat source such as semiconductor integrated-circuit chip, to absorb heat from the hot region 792, and the second end 7002 of its rear micro heat pipe 700*b* and the first end 7001 of its front micro heat pipe 700*a* may be mounted to cold regions 793 to release heat to the cold region 793. Thereby, due to the same reason as illustrated in FIGS. 24A-24C, its liquid 732 may circularly flow in its wide and narrow pipes 784 and 786 and connecting pipes 787 for heat circulation.

Specification for Second Type of Micro Heat Pipe for Sixth Alternative

Figure 30:
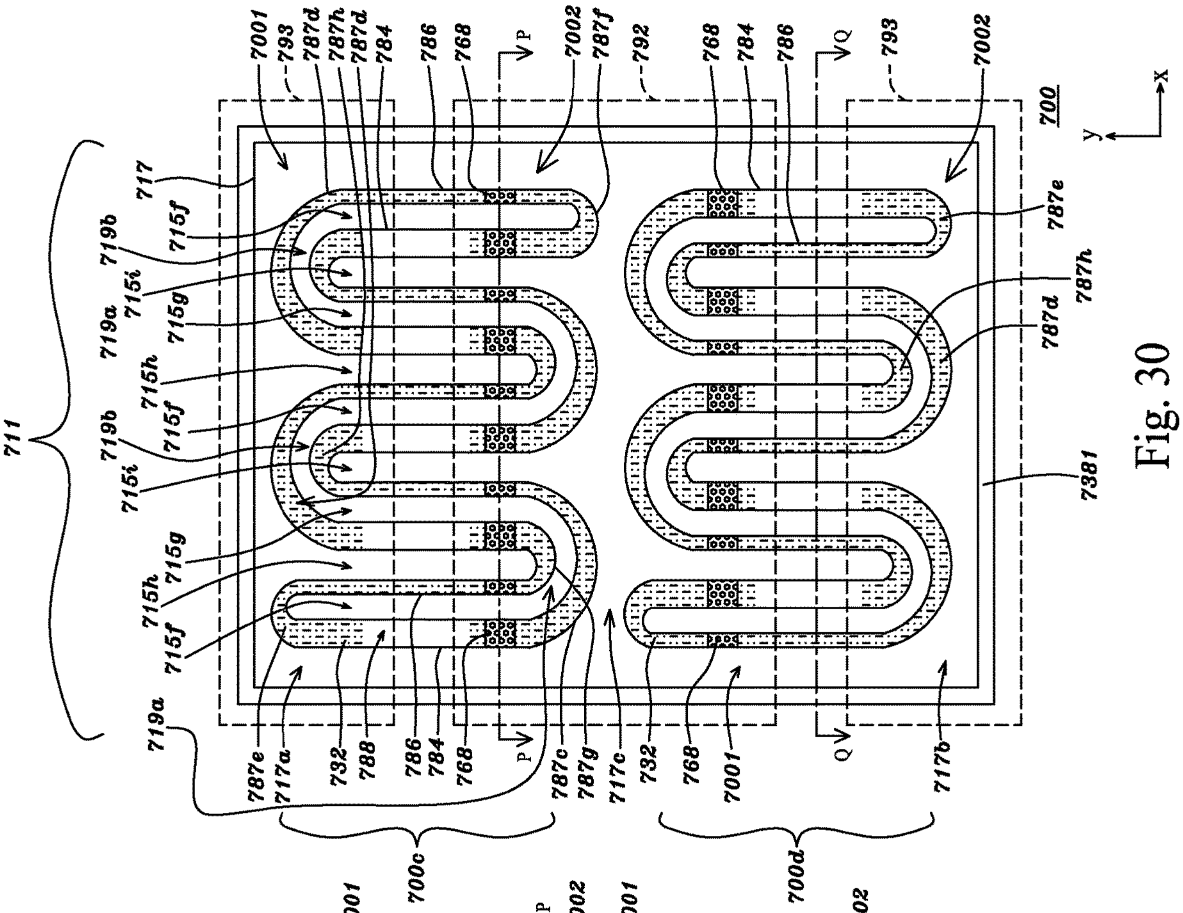

FIG. 30 is a schematically top view showing a second type of micro heat pipe for a sixth alternative in an x-y plane in accordance with an embodiment of the present application. Referring to FIG. 30, a second type of micro heat pipe 700 for a sixth alternative may include front and rear micro heat pipes 700*c* and 700*d* each having a similar structure to that as illustrated for the second type of micro heat pipe 700 for the third alternative as seen in FIG. 27, wherein the second type of micro heat pipe 700 for the sixth alternative may include a middle sidewall 717*c* acting as the rear sidewall 717*b* of the outer sidewalls 717 of its front micro heat pipe 700*c* as illustrated in FIG. 27 and the front sidewall 717*a* of the outer sidewalls 717 of its rear micro heat pipe 700*d* as illustrated in FIG. 27. For an element indicated by the same reference number shown in FIGS. 27 and 30, the specification of the element as seen in FIG. 30 may be referred to that of the element as illustrated in FIG. 27. The difference between the front micro heat pipe 700*c* and the second type of micro heat pipe 700 for the third alternative is that for the front micro heat pipe 700*c* as seen in FIG. 30, its bubble-formation enhancement regions 768 may not be formed on the inner surface of its wide and narrow pipes 784 and 786 at its first end 7001, and for the rear micro heat pipe 700*d* as seen in FIG. 30, its bubble-formation enhancement regions 768 may not be formed on the inner surface of its wide and narrow pipes 784 and 786 at its second end 7002.

Referring to FIG. 30, for the second type of micro heat pipe 700 for the sixth alternative, the first end 7001 of its rear micro heat pipe 700*d* and the second end 7002 of its front micro heat pipe 700*c* may be mounted to a hot region 792, where heat may be generated by a heat source such as semiconductor integrated-circuit chip, to absorb heat from the hot region 792, and the second end 7002 of its rear micro heat pipe 700*d* and the first end 7001 of its front micro heat pipe 700*c* may be mounted to cold regions 793 to release heat to the cold region 793. Thereby, due to the same reason as illustrated in FIGS. 24A-24C, its liquid 732 may circularly flow in its wide and narrow pipes 784 and 786 and first, second, third, fourth, fifth and sixth connecting pipes 787*c*, 787*d*, 787*e*, 787*f*, 787*g* and 787*h* for heat circulation.

Specification for Second Type of Micro Heat Pipe for Seventh Alternative

Figure 31:
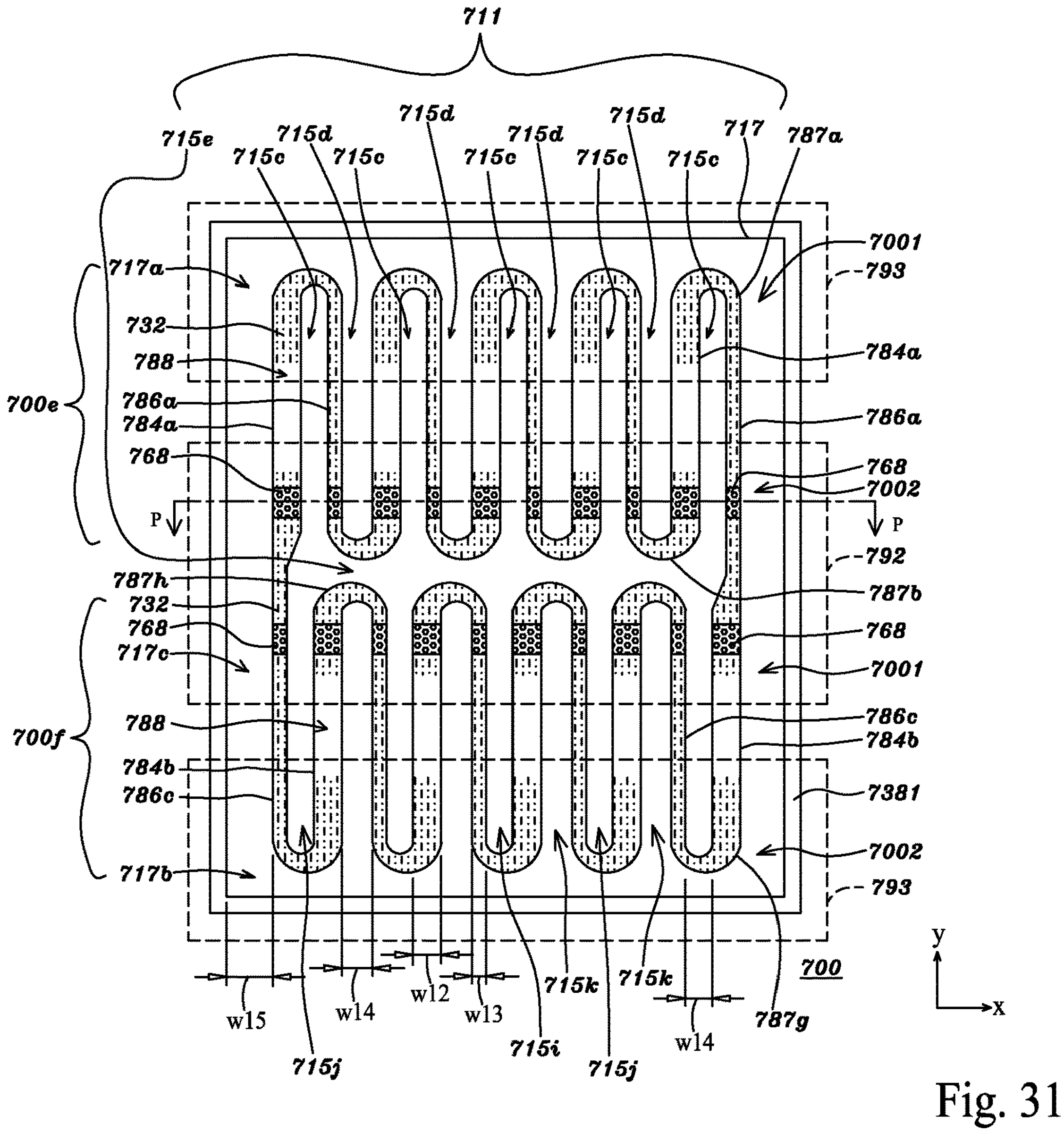

FIG. 31 is a schematically top view showing a second type of micro heat pipe for a seventh alternative in an x-y plane in accordance with an embodiment of the present application. Referring to FIG. 31, a second type of micro heat pipe 700 for a seventh alternative may include front and rear micro heat pipes 700*e* and 700*f* connecting to each other, wherein the front micro heat pipe 700*e* may have a similar structure to that as illustrated for the second type of micro heat pipe for the second alternative as seen in FIG. 26. For an element indicated by the same reference number shown in FIGS. 26 and 31, the specification of the element as seen in FIG. 31 may be referred to that of the element as illustrated in FIG. 26. The difference between the front micro heat pipe 700*e* and the second type of micro heat pipe 700 for the second alternative is that the second narrow pipe 786*b* of the second type of micro heat pipe 700 for the second alternative as seen in FIG. 26 may not be formed for the front micro heat pipe 700*e* as seen in FIG. 31, but for the second type of micro heat pipe 700 for the seventh alternative, its main body 711 may be formed further with a rear micro heat pipe 700*f*, wherein the rear end of the leftmost one of the wide pipes 784*a* of its front micro heat pipe 700*f* is connected to its rear micro heat pipe 700*f* and the rear end of the rightmost one of the first narrow pipes 786*a* of its front micro heat pipe 700*f* is connected to its rear micro heat pipe 700*f*. Further, the bubble-formation enhancement regions 768 of its front micro heat pipe 700*e* may not be formed on the inner surface of the wide and narrow pipes 784 and 786 of its front micro heat pipe 700*e* at the first end 7001 of its front micro heat pipe 700*e*.

Referring to FIG. 31, for the second type of micro heat pipe 700 for the seventh alternative, its main body 711 for its rear micro heat pipe 700*f* may be formed of copper or aluminum and further with (1) multiple fourth inner longitudinal walls 715*j* each extending in the y-direction and having a width w14 between 5 and 30 micrometers and having a front end joining the third inner longitudinal wall 715*e* of its main body 711, and (2) multiple fifth inner longitudinal walls 715*k* each extending in the y-direction and having a width w14 between 5 and 30 micrometers, wherein the outer sidewalls 717 of its main body may have a width w15 between 50 and 1,000 micrometers and surround the first, second and third, fourth and fifth inner longitudinal walls 715*c*, 715*d*, 715*e*, 715*j* and 715*k* of its main body 711, wherein each of the fifth inner longitudinal walls 715*k* of its main body 711 may be between neighboring two of the fourth inner longitudinal walls 715*j* of its main body 711 and join a rear sidewall 717*b* of the outer sidewalls 717 of its main body 711.

More elaboration of the rear micro heat pipe 700*f* of the second type of micro heat pipe 700 for the seventh alternative is described as below. Referring to FIG. 31, for the second type of micro heat pipe 700 for the seventh alternative, one of its wide pipes 784*b* and one of its third narrow pipes 786*c* may be formed at two opposite sides of each of the fourth inner longitudinal walls 715*j* of its main body 711. One of its wide pipes 784*b* and one of its third narrow pipes 786*c* may be formed at two opposite sides of each of the fifth inner longitudinal walls 715*k* of its main body 711. Each of its wide pipes 784*b* may extend in the y-direction with a width or diameter w12 between and including 20 and 200 micrometers, wherein the rightmost one of its wide pipes 784*b* may have a front end connecting to the rear end of the rightmost one of its first narrow pipes 786*a*. Each of its third narrow pipes 786*c* may extend in the y-direction, i.e., in parallel with each of its wide pipes 784*b*, with a width or diameter w13 between and including 10 and 100 micrometers, wherein the leftmost one of its third narrow pipes 786*c* may have a front end connecting to the rear end of the leftmost one of its wide pipes 784*a*. A ratio of the width or diameter of each of its wide pipes 784*a* and 784*b* to that of each of its first and third narrow pipes 786*a* and 786*c* may be between 2 and 40. One of its third connecting pipes 787*g* may be formed at a rear end of said each of the fourth inner longitudinal walls 715*j* of its main body 711 and between the rear end of said each of the fourth inner longitudinal walls 715*j* of its main body 711 and the rear sidewall 717*b* of the outer sidewalls 717 of its main body 711 to connect a rear end of one of its wide pipes 784*b* at a right side of said each of the fourth inner longitudinal walls 715*j* of its main body 711 to a rear end of one of its third narrow pipes 786*c* at a left side of said each of the fourth inner longitudinal walls 715*j* of its main body 711. One of its fourth connecting pipes 787*h* may be formed at a front end of said each of the fifth inner longitudinal walls 715*k* of its main body 711 and between the front end of said each of the fifth inner longitudinal walls 715*k* of its main body 711 and the third inner longitudinal wall 715*e* of its main body 711 to connect a front end of one of its wide pipes 784*b* at a left side of said each of the fifth inner longitudinal walls 715*k* of its main body 711 to a front end of one of its third narrow pipes 786*c* at a right side of said each of the fifth inner longitudinal walls 715*k* of its main body 711. Its wide pipes 784*a* and 784*b*, first and third narrow pipes 786*a* and 786*c* and first, second, third and fourth connecting pipes 787*a*, 787*b*, 787*g* and 787*h* may form a close loop.

Referring to FIG. 31, the second type of micro heat pipe 700 for the seventh alternative may further include a liquid 732, such as water, ethanol, methanol or a solution containing the above-mentioned materials, sealed in its wide pipes 784*a* and 784*b*, first and third narrow pipes 786*a* and 786*c* and first, second, third and fourth connecting pipes 787*a*, 787*b*, 787*g* and 787*h*, and one or more bubble-formation enhancement regions 768, i.e., relatively rough regions, on an inner surface of its wide pipes 784*a* and first narrow pipes 786*a* at the second end 7002 of its front micro heat pipes 700*e* and on an inner surface of its wide pipes 784*b* and third narrow pipes 786*c* at the first end 7001 of its rear micro heat pipe 700*f* to enhance formation of vapor bubbles in the liquid 732, wherein each of its bubble-formation enhancement regions 768 may have a greater surface roughness than those of the other regions of the inner surface of each of its wide pipes 784*a* and 784*b*, first and third narrow pipes 786*a* and 786*c* and first, second, third and fourth connecting pipes 787*a*, 787*b*, 787*g* and 787*h* than its bubble-formation enhancement regions 768.

Referring to FIG. 31, for the second type of micro heat pipe 700 for the seventh alternative, the second end 7002 of its front micro heat pipe 700*e* and a first end 7001 of its rear micro heat pipe 700*f* may be mounted to a hot region 792, where heat may be generated by a heat source such as semiconductor integrated-circuit chip, to absorb heat from the hot region 792 and the first end 7001 of its front micro heat pipe 700*e* and a rear end 7002 of its rear micro heat pipe 700*f* may be mounted to cold regions 793 to release heat to the cold region 793. Thereby, due to the same reason as illustrated in FIGS. 24A-24C, its liquid 732 may circularly flow in its wide pipes 784*a* and 784*b*, first and third narrow pipes 786a and 786c and first, second, third and fourth connecting pipes 787a, 787b, 787g and 787h for heat circulation.

Specification for Process for Fabricating Second Type of Micro Heat Pipe

First Example for Process for Fabricating Second Type of Micro Heat Pipe

Figure 32A:
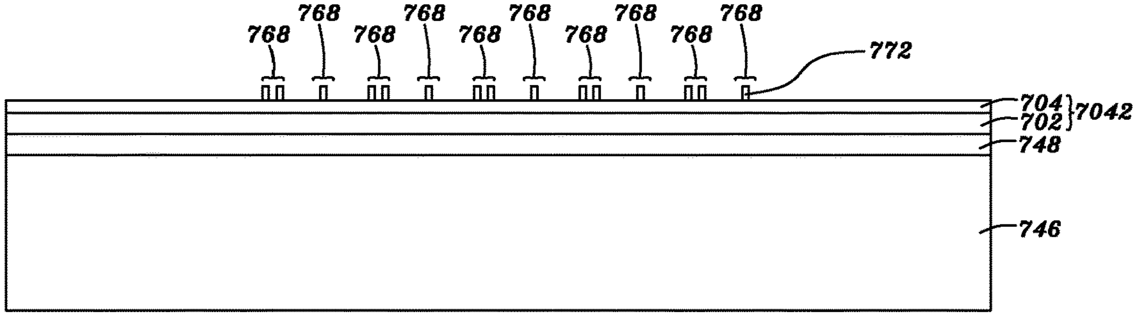
Figure 32B:
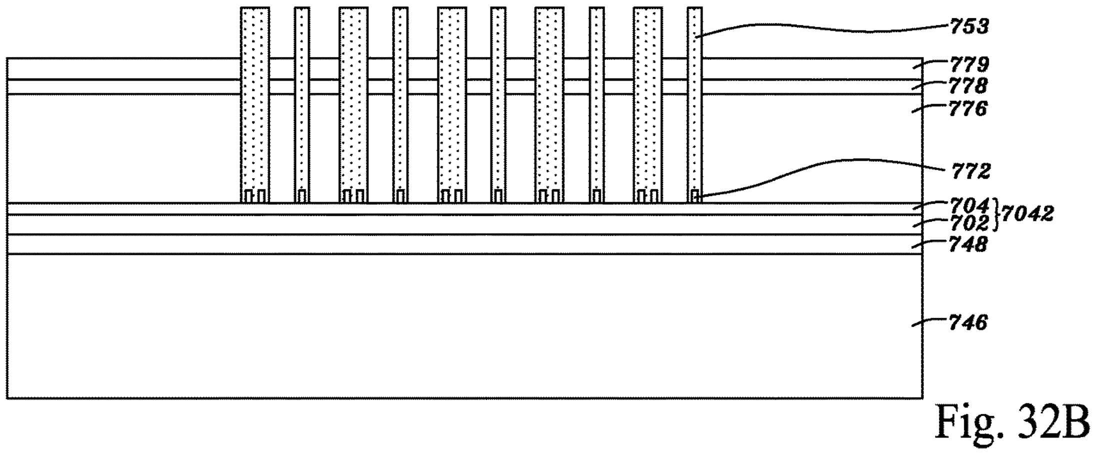
Figure 32C:
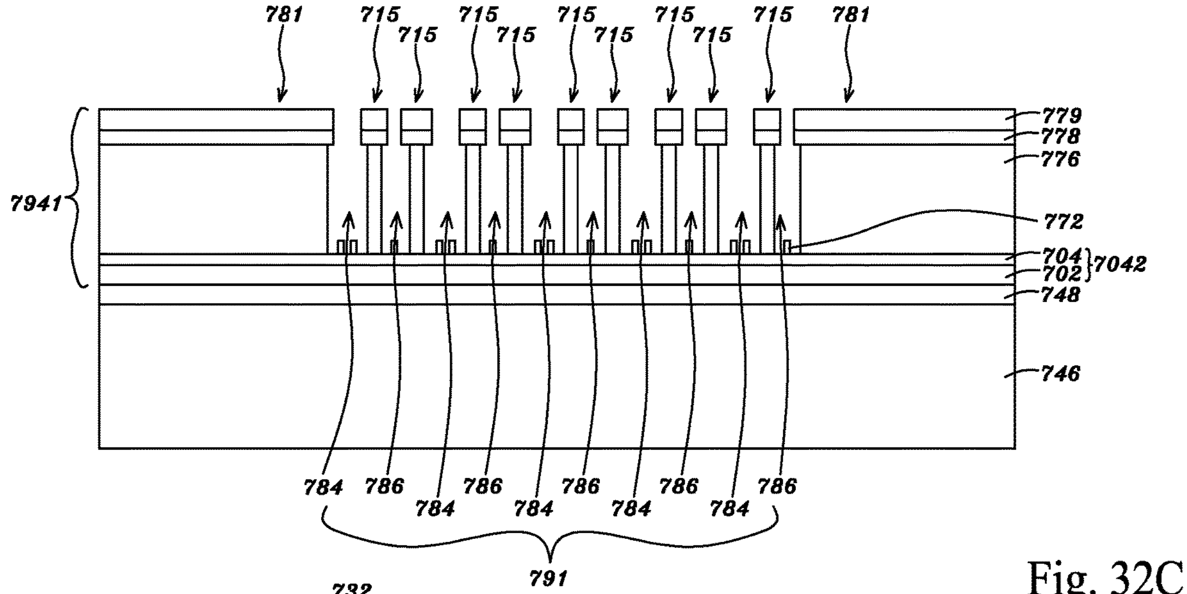
Figure 32D:
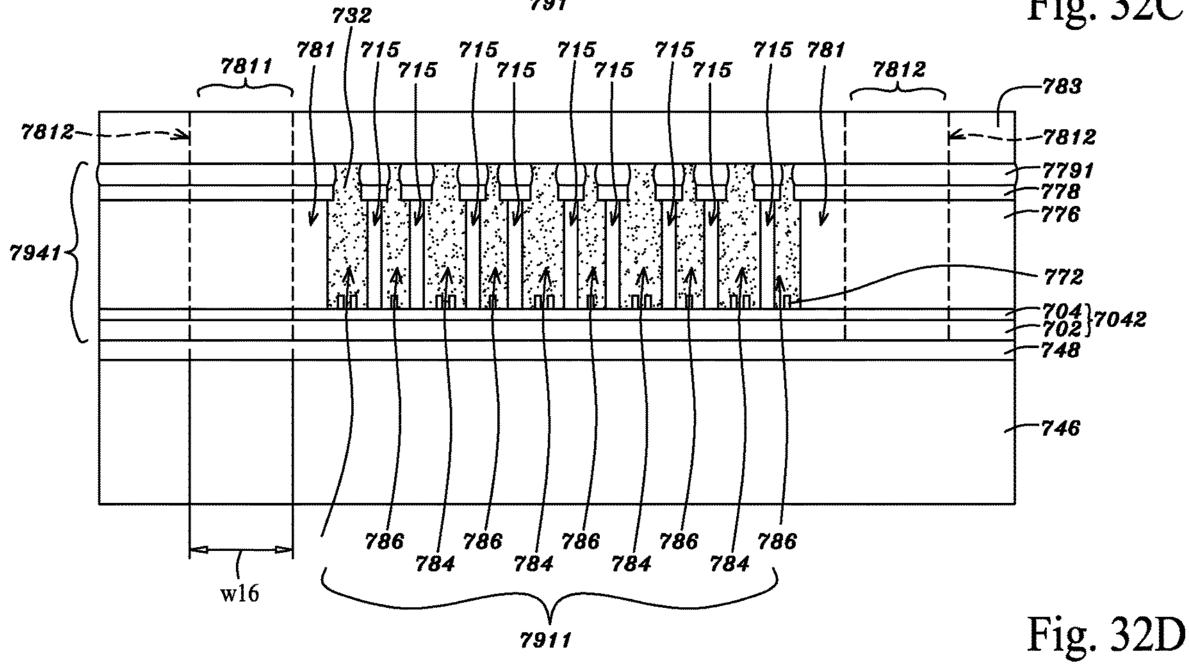
Figure 32E:
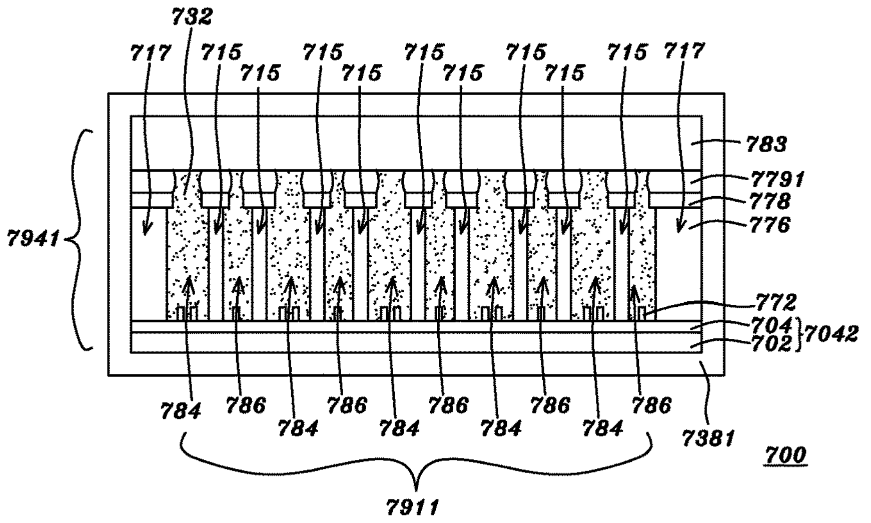
Figure 32F:
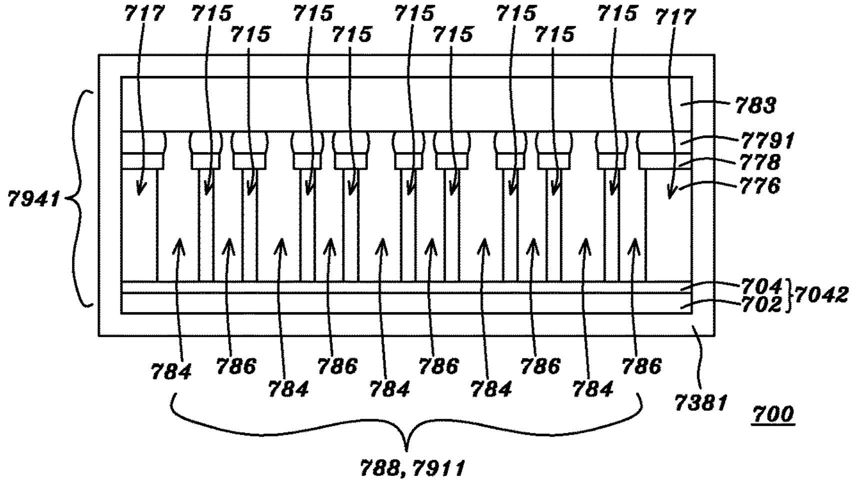

FIGS. 32A-32F are schematically cross-sectional views showing a process for fabricating a second type of micro heat pipe for first through seventh alternatives in accordance with an embodiment of the present application. FIGS. 25-31 are schematically top views showing steps illustrated in FIG. 32E for a first example, wherein FIG. 32E is a schematically cross-sectional view cut along a cross-sectional line P-P in each of FIGS. 25-31 for the first example and FIG. 32F is a schematically cross-sectional view cut along a cross-sectional line Q-Q in each of FIGS. 25-30 for the first example Referring to FIGS. 32A and 32F, a metal plate 702, such as copper foil or layer having a thickness between and including 5 and 100 micrometers, may be laminated on a temporary substrate 746 using a glue layer 748, wherein the temporary substrate 746 may be a silicon wafer or substrate, glass panel or substrate, ceramic substrate, plastic substrate or metal substrate. Next, a metal layer 704 of nickel, silver, cobalt, iron, or chromium with a thickness between and including 0.1 and 5 micrometers may be electroplated on the metal plate 702. The metal plate 702 and metal layer 704 may be formed for a bottom metal plate 7042 of a first type of skeleton 7941 for each of the second type of micro heat pipes 700 for the first through seventh alternatives as seen in FIGS. 25-31. Next, referring to FIG. 32A, the bubble-formation enhancement regions 768 of each of the second type of micro heat pipes 700 for the first through seventh alternatives as seen in FIGS. 25-31 may be formed on the metal layer 704 by spin coating a first photoresist layer (not shown) may be on the metal layer 704 and then patterning the first photoresist layer with multiple openings therein using a photolithography process, i.e., exposure and developing processes, to expose the metal layer 704, followed by electroplating multiple micro bumps 772 of nickel, silver, gold, platinum, cobalt, iron, or chromium on the metal layer 704 and in the openings in the first photoresist layer, followed by stripping the first photoresist layer to expose the metal layer 704 not under the micro bumps 772.

Next, referring to FIGS. 32B and 32F, a second photoresist layer 753 having a high aspect ratio may be laminated or spin coated with a thickness between and including 20 and 800 micrometers on the metal layer 704 and then patterned with multiple openings using a photolithography process, i.e., exposure and developing processes, to expose multiple first areas of the metal layer 704. Next, a metal layer 776 of copper having a thickness between and including 30 and 800 micrometers or between and including 50 and 800 micrometers may be electroplated on the first areas of the metal layer 704 and in the openings in the second photoresist layer 753. Next, a metal layer 778 of nickel, silver, gold, cobalt, iron, or chromium having a thickness between and including 0.1 and 5 micrometers may be electroplated on the metal layer 776 and in the openings in the second photoresist layer 753. Next, a solder layer 779 of a tin-containing alloy having a thickness between and including 5 and 50 micrometers may be electroplated on the metal layer 778 and in the openings in the second photoresist layer 753. Next, the second photoresist layer 753 may be stripped as seen in FIG. 32C to expose multiple second areas of the metal layer 704, which include the bubble-formation enhancement regions 768, not under the metal layer 776.

Next, referring to FIGS. 32C and 32F, the metal layer 776 may be optionally partially removed from the sidewalls of the metal layer 776 using a wet etching process with a solution containing water, $NH_3$ and CuO to form a cut recessed from the metal layer 778. So far, the first type of skeleton 7941 for each of the second type of micro heat pipes 700 for the first through seventh alternatives as seen in FIGS. 25-31 may be well formed. For each of the second type of micro heat pipes 700 for the first through seventh alternatives, each of the elements indicated by the reference number 715 shown in FIGS. 32C-32F may be one of the first, second, third, fourth or fifth inner longitudinal walls 715a, 715b, 715c, 715d, 715e, 715f, 715g, 715h, 715i, 715j or 715k or inner longitudinal walls 715 of its main body 711 as seen in FIGS. 25-31, and each of the first, second, third, fourth or fifth inner longitudinal walls 715a, 715b, 715c, 715d, 715e, 715f, 715g, 715h, 715i, 715j or 715k or inner longitudinal walls 715 of its main body 711 may be formed with a first piece of the metal layer 776 of the first type of skeleton 7941 and a first piece of the metal layer 778 of the first type of skeleton 7941 aligned with the first piece of the metal layer 776 of the first type of skeleton 7941. Multiple partitioning walls 781 may be formed each with a second piece of the metal layer 776 of the first type of skeleton 7941 and a second piece of the metal layer 778 of the first type of skeleton 7941 aligned with the second piece of the metal layer 776 of the first type of skeleton 7941. For the second type of micro heat pipe 700 for each of the third and sixth alternatives as seen in FIGS. 27 and 30, each of the first and second inner connecting walls 719a and 719b of its main body 711 may be formed each with a third piece of the metal layer 776 of the first type of skeleton 7941 and a third piece of the metal layer 778 of the first type of skeleton 7941 aligned with the third piece of the metal layer 776 of the first type of skeleton 7941. Thereby, the partitioning walls 781 and bottom metal plate 7042 of the second type of skeleton 7942 may form multiple pipe schemes 791 in the second type of skeleton 7942. For each of the second type of micro heat pipes 700 for the first through seventh alternatives, each of the pipe schemes 791 in the second type of skeleton 7942 may be divided by the first, second, third, fourth or fifth inner longitudinal walls 715a, 715b, 715c, 715d, 715e, 715f, 715g, 715h, 715i, 715j or 715k or inner longitudinal walls 715 of its main body 711 and, in the case for the third alternative, the first and second inner connecting walls 719a and 719b of its main body 711 into the wide pipes 784, wide pipes 784a or wide pipes 784a and 784b, the narrow pipes 786, narrow pipes 786a or narrow pipes 786a and 786b and the connecting pipes 787, first and second connecting pipes 787a and 787b, first through fourth connecting pipes 787c-787f or first through fourth connecting pipes 787a, 787b, 787g and 787h as seen in FIGS. 25-31. Each of the elements indicated by the reference number 784 shown in FIGS. 32C-32F may be one of the wide pipes 784 or 784a as seen in FIGS. 25-31, and each of the elements indicated by the reference number 786 shown in FIGS. 32C-32F may be one of the narrow pipes 786 or 786a as seen in FIGS. 25-31. Further, each of the partitioning walls 781 may have a scribe line 7811 extending along said each of the partitioning walls 781, wherein the scribe line 7811 may have a width w16 between 50 and 150 micrometers reserved to be cut in the following process to fabricate a plurality of second type of micro heat pipes for each of the first through seventh alternatives.

Next, referring to FIGS. 32D and 32F, the first type of skeleton 7941 may be used as a bottom skeleton. For an optional process, a liquid 732, such as water, ethanol, methanol or a solution containing the above-mentioned materials, may be fed into the pipe schemes 791 (only one is shown) in the bottom skeleton 7941. Next, the bottom skeleton 7941 and a top metal plate 783 may be placed in a closed chamber (not shown), into which vaper of the liquid 732 may be purged to repel air from the closed chamber, wherein the top metal plate 783 may be a metal layer of copper having a thickness between and including 5 and 100 micrometers. Next, the optional process may be performed to feed the liquid 732 into the pipe schemes 791 in the bottom skeleton 7941. Next, the top metal plate 783 may be placed on and in contact with the solder layer 779 of the bottom skeleton 7941. Next, an ultrasonic compression bonding process may be performed at a temperature below the boiling temperature of the liquid 732 and in the closed chamber to bond the top metal plate 783 to the solder layer 779 of the bottom skeleton 7941 to form multiple solder contacts 7791, such as a tin-containing alloy having a thickness between and including 5 and 100 micrometers, each joining the top metal plate 783 to one or more of the first, second, third, fourth or fifth inner longitudinal walls 715*a*, 715*b*, 715*c*, 715*d*, 715*e*, 715*f*, 715*g*, 715*h*, 715*i*, 715*j* or 715*k* or inner longitudinal walls 715 of the bottom skeleton 7941, one or more of the partitioning walls 781 of the bottom skeleton 7941 and/or one or more of the first and second inner connecting walls 719*a* and 719*b* of the bottom skeleton 7941. For example, in the case that the liquid 732 is water, the ultrasonic compression bonding process may be performed at a temperature between 80 and 95 degrees Celsius and in the closed chamber to bond the top metal plate 783 to the solder layer 779 of the bottom skeleton 7941. In the case that the liquid 732 is methanol, the ultrasonic compression bonding process may be performed at a temperature between 5 and 20 degrees Celsius and in the closed chamber to bond the top metal plate 783 to the solder layer 779 of the bottom skeleton 7941. In the case that the liquid 732 is ethanol, the ultrasonic compression bonding process may be performed at a temperature between 65 and 75 degrees Celsius and in the closed chamber to bond the top metal plate 783 to the solder layer 779 of the bottom skeleton 7941. Thereby, each of the pipe schemes 791 in the bottom skeleton 7941 may be covered by the top metal plate 783 to form a pipe scheme 7911 sealed by the top metal plate 783 and bottom skeleton 7941. Next, the top metal plate 783 and bottom skeleton 7941 may be moved out of the closed chamber. Next, the temporary substrate 746 and glue layer 748 may be removed from an outer surface of the metal plate 702 of the bottom skeleton 7941. Next, a mechanical sawing process for singulation may be performed to saw the top metal plate 783 and the bottom metal plate 7042 and partitioning walls 781 of the bottom skeleton 7941 along the scribe lines 7811 of the partitioning walls 781 of the bottom skeleton 7941 into multiple units as seen in FIGS. 25-31, 32E and 32F, wherein each of the partitioning walls 781 of the bottom skeleton 7941 may be cut into two of the outer sidewalls 717 of respective neighboring two of the units.

Next, referring to FIGS. 32E and 32F, for each of the units, a metal layer 7381, such as copper or nickel, may be electroplated with a thickness between and including 1 and 15 micrometers on an outer surface of each of its peripheral walls, provided by the top metal plate 783 and the bottom metal plate 7042 and outer sidewalls 717 of the bottom skeleton 7941, to form each of the second type of micro heat pipes 700 for the first through seventh alternatives. Thereby, the liquid 732 may be sealed in the pipe scheme 7911 to be used as one or more vapor chambers in each of the second type of micro heat pipes 700 for the first through seventh alternatives. For each of the second type of micro heat pipes 700 for the first through seventh alternatives, the total pressure, i.e., vapor pressure, of its pipe scheme 7911 may be smaller than 20 kilopascals (kPa) or 5 kilopascals (kPa) at a temperature of 25 degrees Celsius.

Referring to FIGS. 32E and 32F, for each of the second type of micro heat pipes 700 for the first through seventh alternatives as seen in FIGS. 25-31, each of its micro bumps 772 for each of its bubble-formation enhancement regions 768 may have a width between and including 0.5 and 10 micrometers and a thickness or height between and including 0.5 and 5 micrometers, and a space between neighboring two of its micro bumps 772 for each of its bubble-formation enhancement regions 768 may be between and including 0.5 and 10 micrometers. The first piece of the metal layer 776 for each of the first, second, third, fourth or fifth inner longitudinal walls 715*a*, 715*b*, 715*c*, 715*d*, 715*e*, 715*f*, 715*g*, 715*h*, 715*i*, 715*j* or 715*k* or inner longitudinal walls 715 of its main body 711 may have the width w14 between 5 and 30 micrometers. The second piece of the metal layer 776 for each of the outer sidewalls 717 of its main body 711 may have the width w15 between 50 and 1000 micrometers. Each of the first, second, third, fourth or fifth inner longitudinal walls 715*a*, 715*b*, 715*c*, 715*d*, 715*e*, 715*f*, 715*g*, 715*h*, 715*i*, 715*j* or 715*k* or inner longitudinal walls 715 of its main body 711 and the outer sidewalls 717 of its main body 711 may have a total vertical thickness between 30 and 800 micrometers or between 50 and 800 micrometers. Its bottom metal plate 7042 may have a thickness between and including 5 and 100 micrometers.

Second Example for Process for Fabricating Second Type of Micro Heat Pipe

Figure 33A:
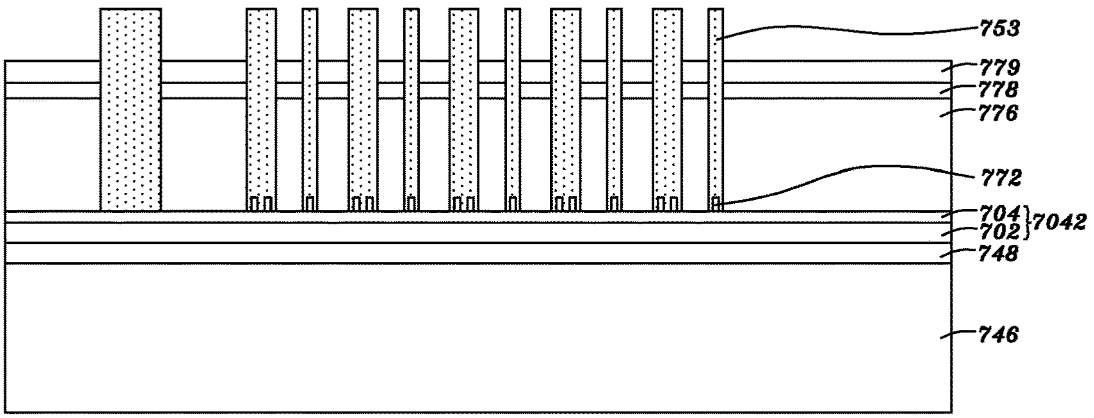
Figures 1, 33B:
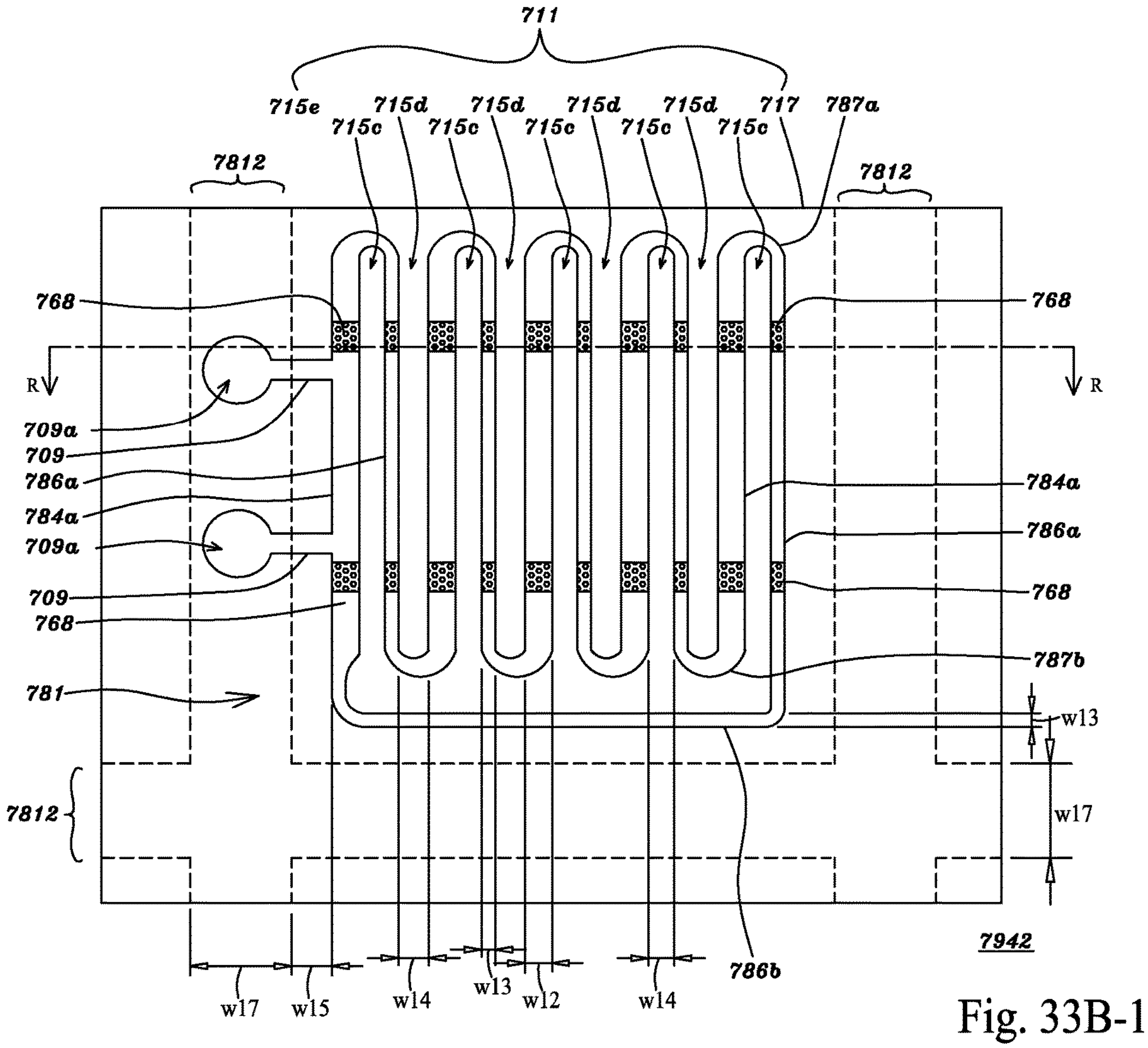
Figure 33B:
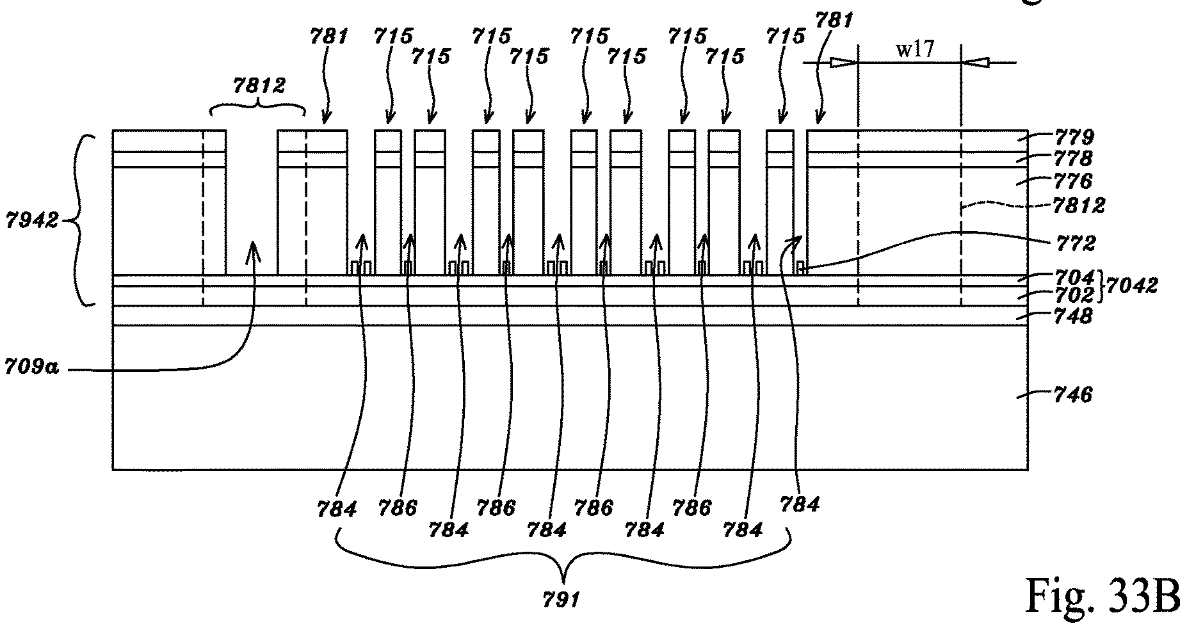
Figure 33C:
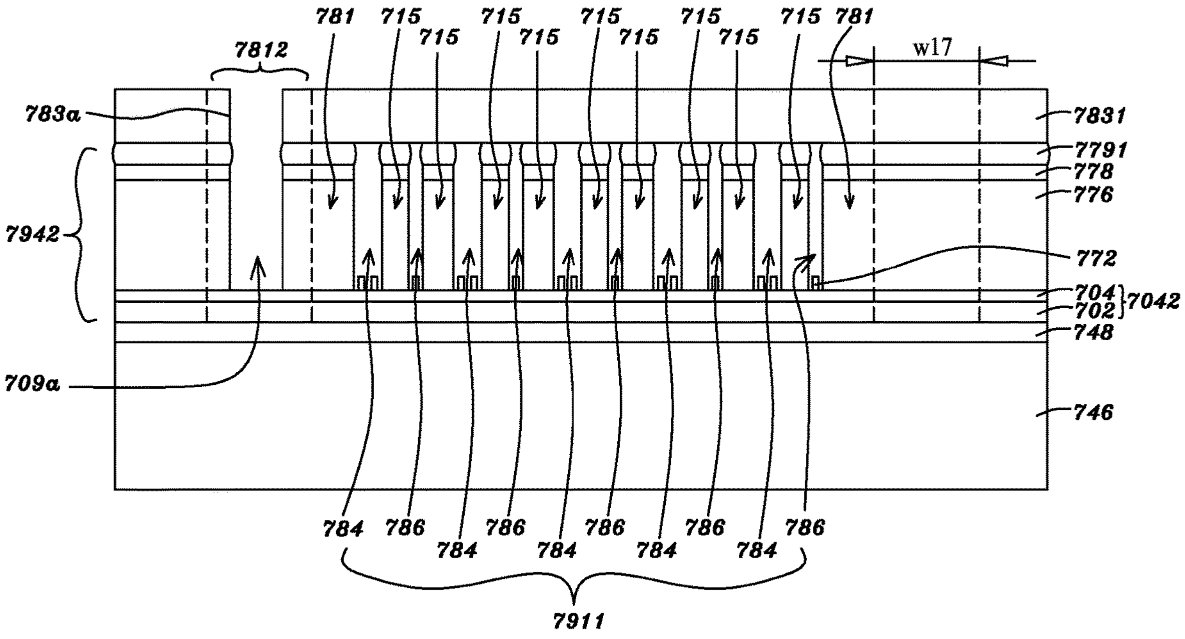
Figures 1, 33D:
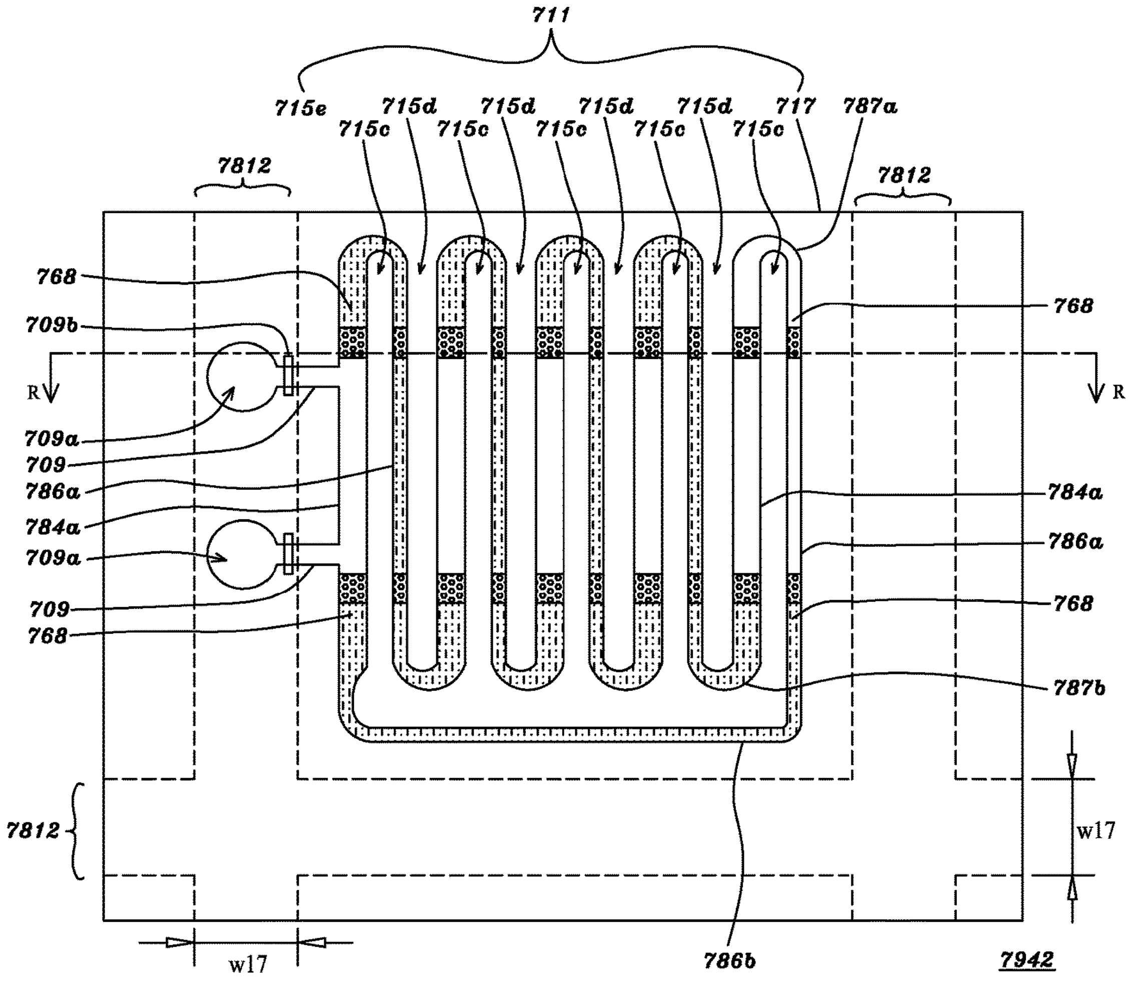
Figure 33D:
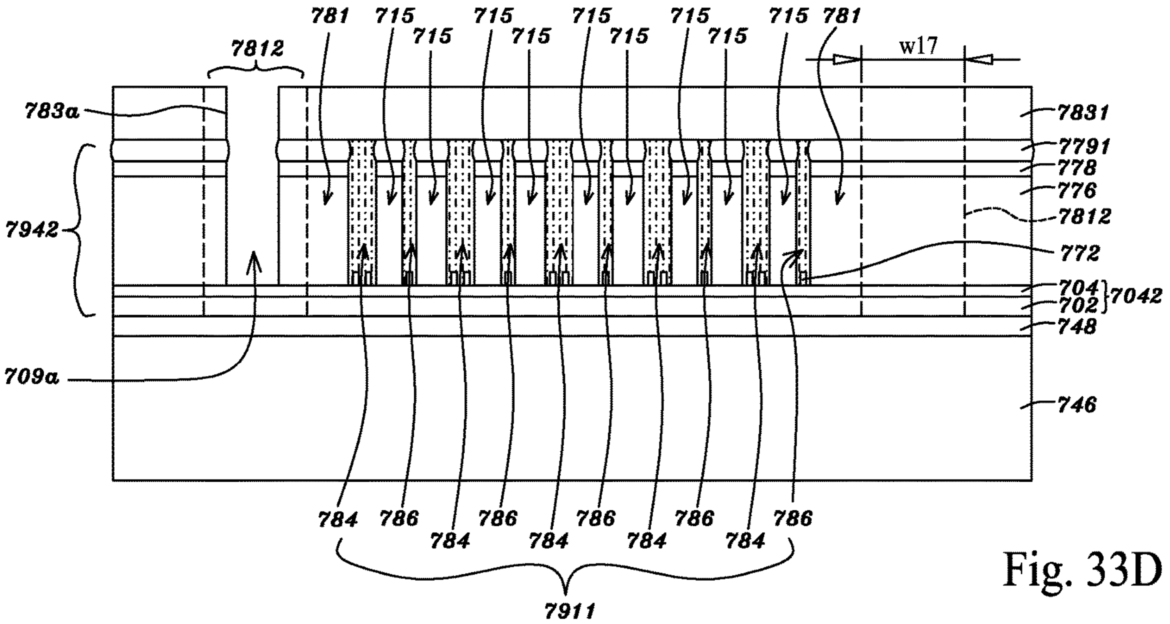

FIGS. 33A-33D, 32E and 32F are schematically cross-sectional views showing a process for fabricating a second type of micro heat pipe for first through seventh alternatives in accordance with an embodiment of the present application. FIGS. 25-31 are schematically top views showing steps illustrated in FIG. 32E for a second example, wherein FIG. 32E is a schematically cross-sectional view cut along a cross-sectional line P-P in each of FIGS. 25-31 for the second example and FIG. 32F is a schematically cross-sectional view cut along a cross-sectional line Q-Q in each of FIGS. 25-30 for the second example. FIG. 33B-1 is a schematically top view showing steps illustrated in FIG. 33B for a process for fabricating a second type of micro heat pipe for the second alternative as seen in FIG. 26 in accordance with an embodiment of the present application, wherein FIG. 33B is a schematically cross-sectional view cut along a cross-sectional line R-R in FIG. 33B-1. FIG. 33D-1 is a schematically top view showing steps illustrated in FIG. 33D for a process for fabricating a second type of micro heat pipe for the second alternative as seen in FIG. 26 in accordance with an embodiment of the present application, wherein FIG. 33D is a schematically cross-sectional view cut along a cross-sectional line S-S in FIG. 33D-1. For an element indicated by the same reference number shown in FIGS. 32A-32F, 33A-33C, 33B-1 and 33C-1, the specification of the element as seen in FIGS. 33A-33C, 33B-1 and 33C-1 may be referred to that of the element as illustrated in FIGS. 32A-32F. Referring to FIG. 33A, a metal plate 702, such as copper foil or layer having a thickness between and including 5 and 100 micrometers, may be laminated on a temporary substrate 746 using a glue layer 748, wherein the temporary substrate may be a silicon wafer or glass panel. Next, the metal layer 704 of nickel, silver, cobalt, iron, or chromium with a thickness between and including 0.1 and 5 micrometers may be electroplated on the metal plate 702. The metal plate 702 and metal layer 704 may be formed for a bottom metal plate 7042 of a second type of skeleton 7942 for each of the second type of micro heat pipes 700 for the first through seventh alternatives as seen in FIGS. 25-31. Next, the bubble-formation enhancement regions 768 of each of the second type of micro heat pipes 700 for the first through seventh alternatives as seen in FIGS. 25-31 may be formed on the metal layer 704 by the steps as illustrated in FIG. 32A. Next, the second photoresist layer 753 having a high aspect ratio may be laminated or spin coated with a thickness between and including 20 and 800 micrometers on the metal layer 704 and then patterned with multiple openings using a photolithography process, i.e., exposure and developing processes, to expose multiple first areas of the metal layer 704. Next, the metal layers 776 and 778 and solder layer 779 may be sequentially electroplated over the first areas of the metal layer 704 and in the openings in the second photoresist layer 753, as illustrated in FIG. 32B. Next, the second photoresist layer 753 may be stripped as seen in FIG. 33B to expose multiple second areas of the metal layer 704, which include the bubble-formation enhancement regions 768, not under the metal layer 776. Next, referring to FIGS. 33B, 33B-1, 32E and 32F, the metal layer 776 may be optionally partially removed from the sidewalls of the metal layer 776 using a wet etching process with a solution containing water, $NH_3$ and CuO to form a cut recessed from the metal layer 778. So far, referring to FIGS. 33B and 33B-1, the second type of skeleton 7942 for each of the second type of micro heat pipes 700 for the first through seventh alternatives as seen in FIGS. 25-31 may be well formed. For each of the second type of micro heat pipes 700 for the first through seventh alternatives, each of the elements indicated by the reference number 715 shown in FIGS. 33B and 33C may be one of the first, second, third, fourth or fifth inner longitudinal walls 715*a*, 715*b*, 715*c*, 715*d*, 715*e*, 715*f*, 715*g*, 715*h*, 715*i*, 715*j* or 715*k* or inner longitudinal walls 715 of its main body 711 as seen in FIGS. 25-31, and each of the first, second, third, fourth or fifth inner longitudinal walls 715*a*, 715*b*, 715*c*, 715*d*, 715*e*, 715*f*, 715*g*, 715*h*, 715*i*, 715*j* or 715*k* or inner longitudinal walls 715 of its main body 711 may be formed with a first piece of the metal layer 776 of the second type of skeleton 7942 and a first piece of the metal layer 778 of the second type of skeleton 7942 aligned with the first piece of the metal layer 776 of the second type of skeleton 7942. Multiple partitioning walls 781 may be formed each with a second piece of the metal layer 776 of the second type of skeleton 7942 and a second piece of the metal layer 778 of the second type of skeleton 7942 aligned with the second piece of the metal layer 776 of the second type of skeleton 7942. For the second type of micro heat pipe 700 for each of the third and sixth alternatives as seen in FIGS. 27 and 30, each of the first and second inner connecting walls 719*a* and 719*b* of its main body 711 may be formed each with a third piece of the metal layer 776 of the second type of skeleton 7942 and a third piece of the metal layer 778 of the second type of skeleton 7942 aligned with the third piece of the metal layer 776 of the second type of skeleton 7942. Thereby, the partitioning walls 781 and bottom metal plate 7042 of the second type of skeleton 7942 may form multiple pipe schemes 791 in the second type of skeleton 7942. For each of the second type of micro heat pipes 700 for the first through seventh alternatives, each of the pipe schemes 791 in the second type of skeleton 7942 may be divided by the first, second, third, fourth or fifth inner longitudinal walls 715*a*, 715*b*, 715*c*, 715*d*, 715*e*, 715*f*, 715*g*, 715*h*, 715*i*, 715*j* or 715*k* or inner longitudinal walls 715 of its main body 711 and, in the case for the third alternative, the first and second inner connecting walls 719*a* and 719*b* of its main body 711 into the wide pipes 784, wide pipes 784*a* or wide pipes 784*a* and 784*b*, the narrow pipes 786, narrow pipes 786*a* or narrow pipes 786*a* and 786*b* and the connecting pipes 787, first and second connecting pipes 787*a* and 787*b*, first through fourth connecting pipes 787*c*-787*f* or first through fourth connecting pipes 787*a*, 787*b*, 787*g* and 787*h* as seen in FIGS. 25-31. Each of the elements indicated by the reference number 784 shown in FIGS. 33B and 33C may be one of the wide pipes 784 or 784*a* as seen in FIGS. 25-31, and each of the elements indicated by the reference number 786 shown in FIGS. 33B and 33C may be one of the narrow pipes 786 or 786*a* as seen in FIGS. 25-31. For the second type of skeleton 7942, each of the pipe schemes 791 therein may connect to two vacancies 709*a*, i.e., through holes, formed in one of its partitioning walls 781, e.g., at a left side of said each of the pipe schemes 791. Further, two first type of channels 709 (not shown in FIGS. 25-31) may be formed in said one of its partitioning walls 781 and over its metal layer 704, and each of the two first type of channels 709 may connect one of the two vacancies 709*a* to said each of the pipe schemes 791. In this case, each of the two first type of channels 709 may have a longitudinal shape. Each of the two first type of channels 709 may have a width w9 between 10 and 50 micrometers.

Alternatively, the two first type of channels 709 in said one of its partitioning walls 781 as seen in FIG. 33B-1 may be redesigned respectively as two second type of channels 709 as illustrated in FIG. 11A at the left side of said each of the cavities 713, wherein the rearmost one of the first transverse sections 7091 of the second type of channel 709 may have the right end connecting to said each of the pipe schemes 791. Alternatively, the two first type of channels 709 in said one of its partitioning walls 781 as seen in FIG. 33B-1 may be redesigned respectively as two third type of channels 709 as illustrated in FIG. 11B at the left side of said each of the pipe schemes 791, wherein the rightmost one of the first or second longitudinal sections 7096 or 7097 may have the respective rear or front end connecting to said each of the pipe schemes 791.

Alternatively, for a case of the two vacancies 709*a* arranged at opposite sides, the two vacancies 709*a* connecting to said each of the pipe schemes 791 as seen in FIG. 33B-1 may be formed respectively in two of its partitioning walls 781 at two opposite sides of said each of the pipe schemes 791, e.g., at the opposite left and right sides of said each of the pipe schemes 791 and the two first type of channels 709 may be formed in said two of its partitioning walls 781 respectively, wherein each of the two first type of channels 709 may connect one of the two vacancies 709*a* to said each of the pipe schemes 791 and may be shaped as a straight channel. Alternatively, in the case of the two vacancies 709*a* arranged at opposite sides, the first type of channel 709 in a first one of its partitioning walls 781 at the left side of said each of the pipe schemes 791 may be redesigned as the second type of channel 709 as illustrated in FIG. 11A, wherein the rearmost one of the first transverse sections 7091 of the second type of channel 709 in the first one of its partitioning walls 781 may have the right end connecting to said each of the pipe schemes 791, and the first type of channel 709 in a second one of its partitioning walls 781 at the right side of said each of the pipe schemes 791 may be redesigned as another second type of channel 709 as illustrated in FIG. 11C, wherein the rearmost one of the third transverse sections 7191 of the another second type of channel 709 in the second one of its partitioning walls 781 may have the left end connecting to said each of the pipe schemes 791. Alternatively, in the case of the two vacancies 709*a* arranged at opposite sides, the first type of channel 709 in the first one of its partitioning walls 781 at the left side of said each of the pipe schemes 791 may be redesigned as the third type of channel 709 as illustrated in FIG. 11B, wherein the rightmost one of the first or second longitudinal sections 7096 or 7097 of the third type of channel 709 in the first one of its partitioning walls 781 may have the respective rear or front end connecting to said each of the pipe schemes 791, and the first type of channel 709 in the second one of its partitioning walls 781 at the right side of said each of the pipe schemes 791 may be redesigned as another third type of channel 709 as illustrated in FIG. 11D, wherein the leftmost one of the third or fourth longitudinal sections 7196 or 7197 of the another third type of channel 709 in the second one of its partitioning walls 781 may have a respective rear or front end connecting to said each of the pipe schemes 791.

Referring to FIGS. 33B and 33B-1, each of its partitioning walls 781 may have a scribe line 7812 extending along said each of its partitioning walls 781 and, in some cases, through one or two of the vacancies 709*a* in said each of its partitioning walls 781, wherein the scribe line 7812 may have a width w17 between 100 and 1000 micrometers reserved to be cut in the following process to fabricate a plurality of second type of micro heat pipes.

Next, referring to FIG. 33C, the second type of skeleton 7942 may be used as a bottom skeleton and a top metal plate 7831, such as a metal layer of copper having a thickness between and including 5 and 100 micrometers, may be provided to be placed on and in contact with the solder layer 779 of the bottom skeleton 7942, wherein each of multiple openings 783*a* in the top metal plate 7831 may be aligned with one of the two vacancies 709*a* in one of the partitioning walls 781 of the bottom skeleton 7942. Next, a thermal compression bonding may be performed to bond the top metal plate 7831 to the solder layer 779 of the bottom skeleton 7942 into multiple solder contacts 7791, such as a tin-containing alloy having a thickness between and including 5 and 100 micrometers, each joining the top metal plate 7831 to one or more of the first, second, third, fourth or fifth inner longitudinal walls 715*a*, 715*b*, 715*c*, 715*d*, 715*e*, 715*f*, 715*g*, 715*h*, 715*i*, 715*j* or 715*k* or inner longitudinal walls 715 of the bottom skeleton 7942, one or more of the partitioning walls 781 of the bottom skeleton 7942 and/or one or more of the first and second inner connecting walls 719*a* and 719*b* of the bottom skeleton 7942.

Alternatively, the solder layer 779 and metal layer 778 of the bottom skeleton 7942 may not be formed, and a direct bonding process or copper-to-copper process may be performed at a temperature between 300 and 350 degrees Celsius for a time period between 10 and 60 minutes to bond the top metal plate 7831 of copper to the metal layer 776 of copper of the bottom skeleton 7942 due to copper inter-diffusion between the top metal plate 7831 of copper and the metal layer 776 of copper of the bottom skeleton 7942. The top metal plate 7831 of copper may be directly bonded via copper-to-copper inter-diffusion to each of the first pieces of the metal layer 776 of copper of the bottom skeleton 7942 for one or more of the first, second, third, fourth or fifth inner longitudinal walls 715*a*, 715*b*, 715*c*, 715*d*, 715*e*, 715*f*, 715*g*, 715*h*, 715*i*, 715*j* or 715*k* or inner longitudinal walls 715 of the bottom skeleton 7942. The top metal plate 7831 of copper may be directly bonded via copper-to-copper inter-diffusion to each of the second pieces of the metal layer 776 of copper of the bottom skeleton 7209 for one or more of the partitioning walls 781 of the bottom skeleton 7942. The top metal plate 7831 of copper may be directly bonded via copper-to-copper inter-diffusion to each of the third pieces of the metal layer 776 of copper of the bottom skeleton 7942 for one or more of the first and second inner connecting walls 719*a* and 719*b* of the bottom skeleton 7942. Thereby, each of the pipe schemes 791 in the bottom skeleton 7942 may be covered by the top metal plate 7831 to form a pipe scheme 7911 enclosed by the top metal plate 7831 and bottom skeleton 7942.

Next, referring to FIGS. 33D and 33D-1, the top metal plate 7831 and bottom skeleton 7942 may be placed in a closed chamber (not shown), into which vaper of a liquid 732, such as water, ethanol, methanol or a solution containing the above-mentioned materials, may be purged to repel air from the closed chamber. Next, the liquid 732 may be fed or injected into each of the pipe schemes 7911 via, in sequence, (1) a specific one of the openings 783*a* in the top metal plate 7831, (2) a specific one of the two vacancies 709*a* in one of the partitioning walls 781 of the bottom skeleton 7942 under the specific one of the openings 783*a* and (3) a specific one of the first, second or third type of channels 709 in said one of the partitioning walls 781 of the bottom skeleton 7942 and connecting the specific one of the two vacancies 709*a* to said each of the pipe schemes 7911. Next, the top metal plate 7831 and bottom skeleton 7942 may be heated at a temperature between 100 and 120 degrees Celsius to vaporize the liquid 732 in said each of the pipe schemes 7911 and air in said each of the pipe schemes 7911 may be purged away from said each of the pipe schemes 7911 via, in sequence, (1) two of the first, second or third type of channels 709 in one or respective opposite two of the partitioning walls 781 of the bottom skeleton 7942 and connecting to said each of the pipe schemes 7911, (2) the two vacancies 709*a* in said one or said respective opposite two of the partitioning walls 781 of the bottom skeleton 7942 and connecting to said each of the pipe schemes 7911 through respective said two of the first, second or third type of channels 709 and (3) two of the openings 783*a* in the top metal plate 7831 vertically over the respective two vacancies 709*a*. Next, the liquid 732 may be fed or injected again into said each of the pipe schemes 7911 via, in sequence, (1) the specific one of the openings 783*a*, (2) the specific one of the two vacancies 709*a* and (3) the specific one of the first, second or third type of channels 709 at a temperature of the closed chamber below the boiling temperature of the liquid 732. For example, in the case that the liquid 732 is water, the liquid 732 may be fed or injected again into said each of the pipe schemes 7911 via, in sequence, (1) the specific one of the openings 783*a*, (2) the specific one of the two vacancies 709*a* and (3) the specific one of the first, second or third type of channels 709 at a temperature of the closed chamber between 80 and 95 degrees Celsius. In the case that the liquid 732 is methanol, the liquid 732 may be fed or injected again into said each of the pipe schemes 7911 via, in sequence, (1) the specific one of the openings 783*a*, (2) the specific one of the two vacancies 709*a* and (3) the specific one of the first, second or third type of channels 709 at a temperature of the closed chamber between 5 and 20 degrees Celsius. In the case that the liquid 732 is ethanol, the liquid 732 may be fed or injected again into said each of the pipe schemes 7911 via, in sequence, (1) the specific one of the openings 783*a*, (2)

the specific one of the two vacancies 709*a* and (3) the specific one of the first, second or third type of channels 709 at a temperature of the closed chamber between 65 and 75 degrees Celsius. Next, a polymer (not shown) may be filled into the two vacancies 709*a* and first, second or third type of channels 709 in the partitioning walls 781 of the bottom skeleton 7942 to seal each of the pipe schemes 7911. Next, the top metal plate 7831 and bottom skeleton 7942 may be moved out of the closed chamber. Next, for an optional process, the temporary substrate 746 and glue layer 748 may be removed from an outer surface of the metal plate 702 of the bottom skeleton 7942.

Next, referring to FIGS. 33D and 33D-1, the top metal plate 7831 may have multiple compressive seal regions 709*b* each extending across over one of the first, second or third type of channels 709 in one of the partitioning walls 781 of the bottom skeleton 7942, wherein each of the compressive seal regions 709*b* has a width w11 between 100 and 500 micrometers. The top metal plate 7831 may be pressed at each of the compressive seal regions 709*b* to seal each of the first, second or third type of channels 709. Next, the optional process may be performed to remove the temporary substrate 746 and glue layer 748 from an outer surface of the metal plate 702 of the bottom skeleton 7942. Next, a mechanical sawing process for singulation may be performed to saw the top metal plate 7831 and the partitioning walls 781 and bottom metal plate 7042 of the bottom skeleton 7942 along the scribe lines 7812 of the partitioning walls 781 of the bottom skeleton 7942 into multiple units. Each of the partitioning walls 781 of the bottom skeleton 7942 may be cut into two of the outer sidewalls 717 of respective neighboring two of the units.

Next, referring to FIGS. 32E and 32F, for each of the units, a metal layer 738, such as copper or nickel, may be electroplated with a thickness between and including 1 and 15 micrometers on an outer surface of each of its peripheral walls, provided by the top metal plate 7831 and the bottom metal plate 7042 and outer sidewalls 717 of the bottom skeleton 7942, to form each of the second type of micro heat pipes 700 for the first through seventh alternatives. Thereby, the liquid 732 may be sealed in the pipe scheme 7911 to be used as one or more vapor chambers in each of the second type of micro heat pipes 700 for the first through seventh alternatives. For each of the second type of micro heat pipes 700 for the first through seventh alternatives, the total pressure, i.e., vapor pressure, of its pipe scheme 7911 may be smaller than 20 kilopascals (kPa) or 5 kilopascals (kPa) at a temperature of 25 degrees Celsius.

Specification for Stacking Unit

1. Structure for First Type of Stacking Unit and Process for Forming the Same

Figure 34A:
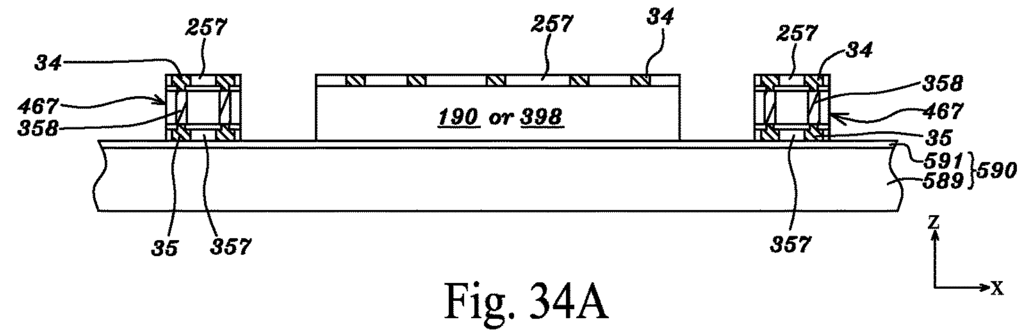
FIGS. 34A-34E are schematically cross-sectional views showing a process for forming a first type of stacking unit in an x-z plane in accordance with an embodiment of the present application.

FIGS. 34A-34E are schematically cross-sectional views showing a process for forming a first type of stacking unit in an x-z plane in accordance with an embodiment of the present application. FIG. 34F is a schematically cross-sectional view showing first and second types of stacking units in a y-z plane in accordance with an embodiment of the present application. Referring to FIG. 34A, a temporary substrate 590 may be provided with a glass or silicon substrate 589 and a sacrificial bonding layer 591 formed on the glass or silicon substrate 589. The sacrificial bonding layer 591 may have the glass or silicon substrate 589 to be easily debonded or released from a structure subsequently formed on the sacrificial bonding layer 591. For example, the sacrificial bonding layer 591 may be a material of light-to-heat conversion (LTHC) that may be deposited on the glass or silicon substrate 589 by printing or spin-on coating and then cured or dried with a thickness of about 1 micrometer or between 0.5 and 2 micrometers. The LTHC material may be a liquid ink containing carbon black and binder in a mixture of solvents.

Next, referring to FIG. 34A, multiple application specific integrated-circuit (ASIC) chips 398 (only one is shown), each having the same specification as the second type of semiconductor integrated-circuit (IC) chip 100 illustrated in FIG. 3B, each may include the semiconductor substrate 2 having a bottom surface at a backside thereof attached to the sacrificial bonding layer 591 of the temporary substrate 590. Each of the application specific integrated-circuit (ASIC) chips 398 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example. Alternatively, each of the application specific integrated-circuit (ASIC) chips 398 may be replaced with a sub-system module 190 having the same specification as the second type of sub-system module 190 as illustrated in FIG. 7B, which may include the application specific integrated-circuit (ASIC) chip 399 having a bottom surface at a backside thereof attached to the sacrificial bonding layer 591 of the temporary substrate 590. Further, multiple vertical-through-via (VTV) connectors 467, each having the same specification as the second type of vertical-through-via (VTV) connector 467 as illustrated in FIG. 4B, each may have the insulating dielectric layer 357 at the backside thereof attached to the sacrificial bonding layer 591 of the temporary substrate 590 and the micro-bumps or micro-pads 35 at the backside thereof attached to the sacrificial bonding layer 591 of the temporary substrate 590. Further, multiple dummy semiconductor chips 367, made of silicon for example, as seen in FIG. 34F may be provided each with a bottom surface attached to the sacrificial bonding layer 591 of the temporary substrate 590.

Figure 34B:
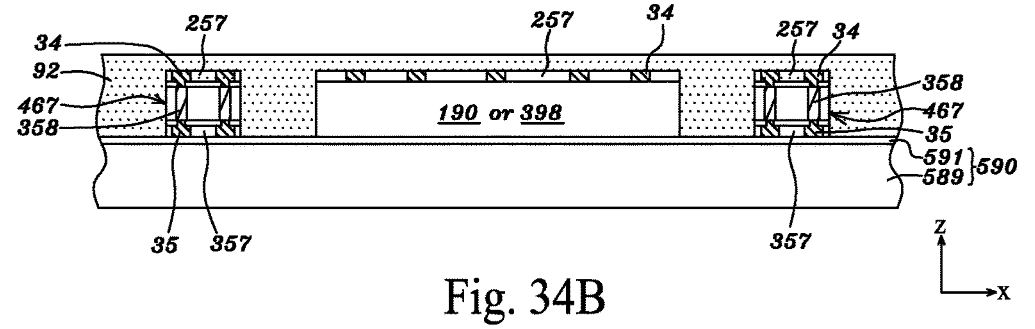
Figure 34C:
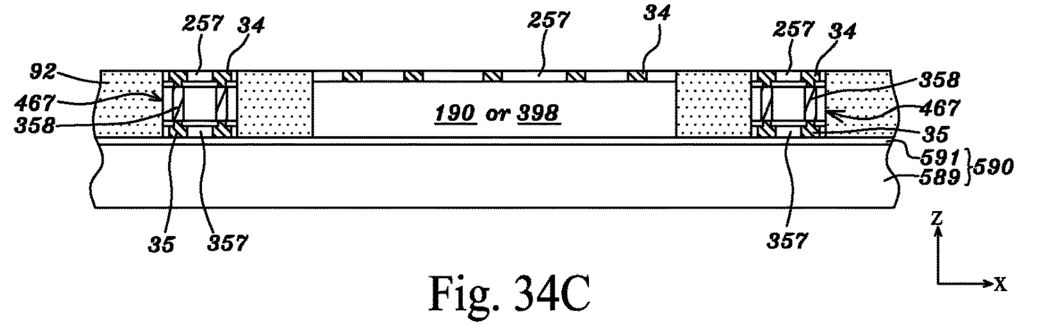
Figure 34D:
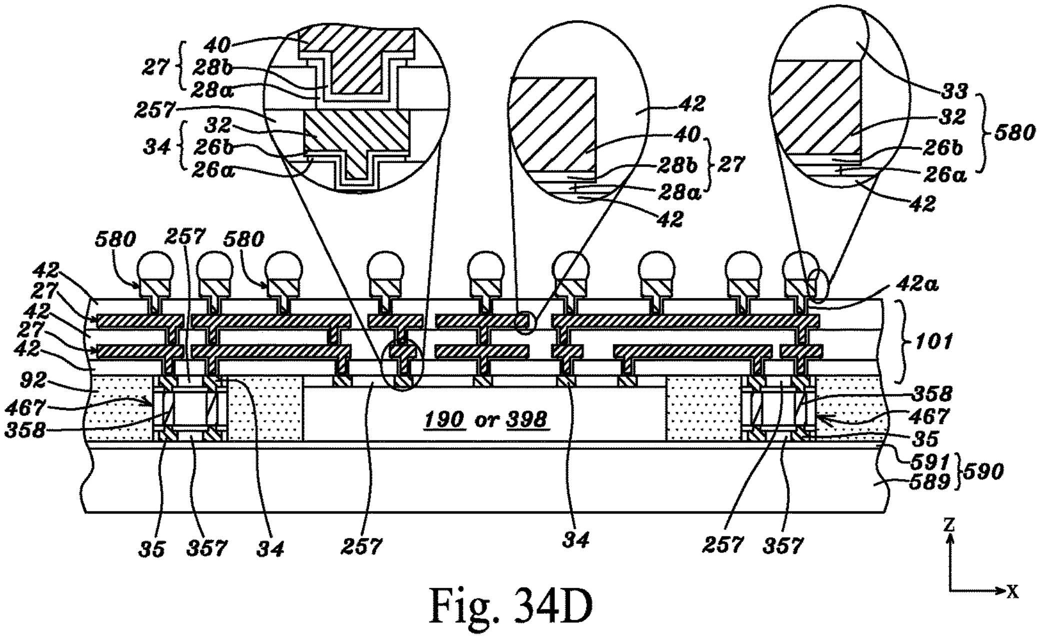
Figure 34E:
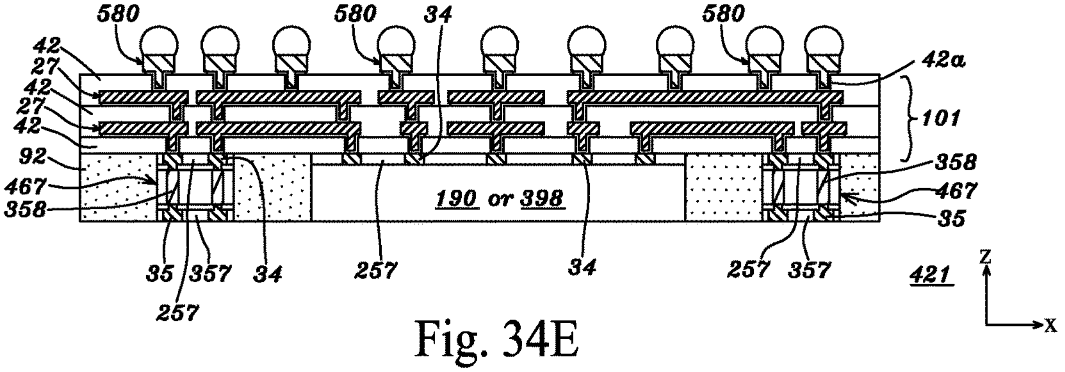
Figure 34F:
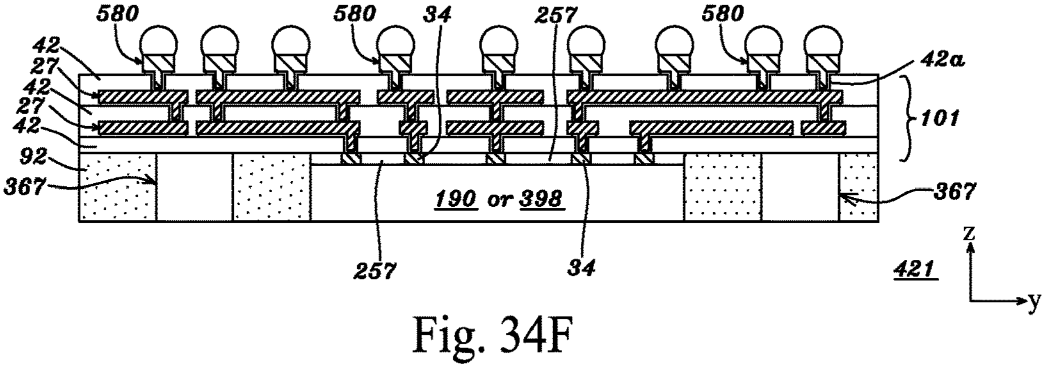
FIG. 34F is a schematically cross-sectional view showing first and second types of stacking units in a y-z plane in accordance with an embodiment of the present application.

Next, referring to FIGS. 34B and 34F, a polymer layer 92, or insulating dielectric layer, may be applied to fill a gap between each neighboring two of the application specific integrated-circuit (ASIC) chips 398, or the sub-system modules 190 in case of replacing the application specific integrated-circuit (ASIC) chips 398, the vertical-through-via (VTV) connectors 467 and the dummy semiconductor chips 367 and to cover the insulating dielectric layer 257 and micro-bumps or micro-pads 34 of each of the application specific integrated-circuit (ASIC) chips 398, or the sub-system modules 190 in case of replacing the application specific integrated-circuit (ASIC) chips 398, the insulating dielectric layer 257 and micro-bumps or micro-pads 34 of each of the vertical-through-via (VTV) connectors 467 and a top surface of each of the dummy semiconductor chips 367 by methods, for example, spin-on coating, screen-printing, dispensing or molding. The polymer layer 92 may be, for example, polyimide, BenzoCycloButene (BCB), parylene, polybenzoxazole (PBO), epoxy-based resin or compound, photo epoxy SU-8, elastomer, or silicone. The polymer layer 92 may be, for example, photosensitive polyimide/PBO PIMEL™ supplied by Asahi Kasei Corporation, Japan, or epoxy-based molding compounds, resins or sealants provided by Nagase ChemteX Corporation, Japan.

Next, referring to FIGS. 34C and 34F, a chemical mechanical polishing (CMP), polishing or grinding process may be applied to remove a top portion of the polymer layer 92 and to planarize a top surface of the polymer layer 92, a top surface of the copper layer 32 of each of the micro-bumps or micro-pads 34 of each of the application specific integrated-circuit (ASIC) chips 398, or the sub-system modules 190 in case of replacing the application specific integrated-circuit (ASIC) chips 398, a top surface of the insulating dielectric layer 257 of each of the application specific integrated-circuit (ASIC) chips 398, or the sub-system modules 190 in case of replacing the application specific integrated-circuit (ASIC) chips 398, a top surface of the copper layer 32 of each of the micro-bumps or micro-pads 34 of each of the vertical-through-via (VTV) connectors 467, a top surface of the insulating dielectric layer 257 of each of the vertical-through-via (VTV) connectors 467 and the top surface of each of the dummy semiconductor chips 367. Thereby, the top surface of the polymer layer 92, the top surface of the copper layer 32 of each of the micro-bumps or micro-pads 34 of each of the application specific integrated-circuit (ASIC) chips 398, or the sub-system modules 190 in case of replacing the application specific integrated-circuit (ASIC) chips 398, the top surface of the insulating dielectric layer 257 of each of the application specific integrated-circuit (ASIC) chips 398, or the sub-system modules 190 in case of replacing the application specific integrated-circuit (ASIC) chips 398, the top surface of the copper layer 32 of each of the micro-bumps or micro-pads 34 of each of the vertical-through-via (VTV) connectors 467, the top surface of the insulating dielectric layer 257 of each of the vertical-through-via (VTV) connectors 467 and the top surface of each of the dummy semiconductor chips 367 may be exposed.

Referring to FIGS. 34D and 34F, a frontside interconnection scheme for a device (FISD) 101 may be formed on top surface of the polymer layer 92 and the top surface of each of the dummy semiconductor chips 367 and over the application specific integrated-circuit (ASIC) chips 398, or the sub-system modules 190 in case of replacing the application specific integrated-circuit (ASIC) chips 398, and the vertical-through-via (VTV) connectors 467. The frontside interconnection scheme for a device (FISD) 101 may include (1) one or more interconnection metal layers 27 coupling to the micro-bumps or micro-pads 34 of each of the application specific integrated-circuit (ASIC) chips 398, or the sub-system modules 190 in case of replacing the application specific integrated-circuit (ASIC) chips 398, and the micro-bumps or micro-pads 34 of each of the vertical-through-via (VTV) connectors 467, and (2) one or more polymer layers 42, i.e., insulating dielectric layers, each between neighboring two of its interconnection metal layers 27, between a bottommost one of its interconnection metal layers 27 and a planar surface composed of the top surface of the polymer layer 92, the top surface of the insulating dielectric layer 257 of each of the application specific integrated-circuit (ASIC) chips 398, or the sub-system modules 190 in case of replacing the application specific integrated-circuit (ASIC) chips 398, and the top surface of the insulating dielectric layer 257 of each of the vertical-through-via (VTV) connectors 467, or on and above a topmost one of its interconnection metal layers 27, wherein the topmost one of its interconnection metal layers 27 may be patterned with multiple metal pads at bottoms of multiple openings 42*a* in the topmost one of its polymer layers 42. Each of the interconnection metal layers 27 may include (1) a copper layer 40 having lower portions in openings in one of the polymer layers 42 having a thickness of between 0.3 μm and 20 μm and upper portions having a thickness 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*. Each of the interconnection metal layers 27 of its frontside interconnection scheme for a device (FISD) 101 may have the same specification as that of the second interconnection scheme 588 of the first type of semiconductor integrated-circuit (IC) chip 100 as illustrated in FIG. 3A, and each of the polymer layers 42 of its frontside interconnection scheme for a device (FISD) 101 may have the same specification as that of the second interconnection scheme 588 of the first type of semiconductor integrated-circuit (IC) chip 100 as illustrated in FIG. 3A. Each of the interconnection metal layers 27 of the frontside interconnection scheme for a device (FISD) 101 may extend horizontally across an edge of each of the application specific integrated-circuit (ASIC) chips 398, or the sub-system modules 190 in case of replacing the application specific integrated-circuit (ASIC) chips 398, an edge of each of the vertical-through-via (VTV) connectors 467 and an edge of each of the dummy semiconductor chips 367.

Next, referring to FIGS. 34D and 34F, multiple metal bumps or pads 580, i.e., metal contacts, in an array, which may be of one of the first through fourth types having the same specification as the first through fourth types of micro-bumps or micro-pillars 34 as illustrated in FIG. 1A respectively, may have the adhesion layer 26*a* formed on the metal pads of the topmost one of the interconnection metal layers 27 of the frontside interconnection scheme for a device (FISD) 101 at the bottoms of the respective openings 42*a* in the topmost one of the polymer layers 42 of the frontside interconnection scheme for a device (FISD) 101.

Next, the glass or silicon substrate 589 as seen in FIG. 34D may be released from the sacrificial bonding layer 591. For example, in the case that the sacrificial bonding layer 591 is the material of light-to-heat conversion (LTHC) and the substrate 589 is made of glass, a laser light, such as YAG laser having a wavelength of about 1064 nm, an output power between 20 and 50 W and a spot size of 0.3 mm in diameter at a focal point, may be generated to pass from the backside of the glass substrate 589 to the sacrificial bonding layer 591 through the glass substrate 589 to scan the sacrificial bonding layer 591 at a speed of 8.0 m/s, for example, such that the sacrificial bonding layer 591 may be decomposed and thus the glass substrate 589 may be easily released from the sacrificial bonding layer 591. Next, an adhesive peeling tape (not shown) may be attached to a bottom surface of the remainder of the sacrificial bonding layer 591. Next, the adhesive peeling tape may be peeled off to pull off the remainder of the sacrificial bonding layer 591 attached to the adhesive peeling tape off such that the bottom surface of the semiconductor substrate 2 of each of the application specific integrated-circuit (ASIC) chips 398, or the bottom surface of the application specific integrated-circuit (ASIC) chip 399 of each of the operation units 190 in case of replacing the application specific integrated-circuit (ASIC) chips 398, a bottom surface of the insulating dielectric layer 357 of each of the vertical-through-via (VTV) connectors 467, a bottom surface of each of the micro-bumps or micro-pads 35 of each of the vertical-through-via (VTV) connectors 467, a bottom surface of the polymer layer 92 and the bottom surface of each of the dummy semiconductor chips 367 may be exposed and coplanar. Next, the polymer layers 42 of the frontside interconnection scheme for a device (FISD) 101 and the polymer layer 92 may be cut or diced to separate multiple individual units (only one is shown) each for a first type of stacking unit 421 as shown in FIGS. 34E and 34F by a laser cutting process or mechanical cutting process.

2. Structure for Second Type of Stacking Unit

Figure 34G:
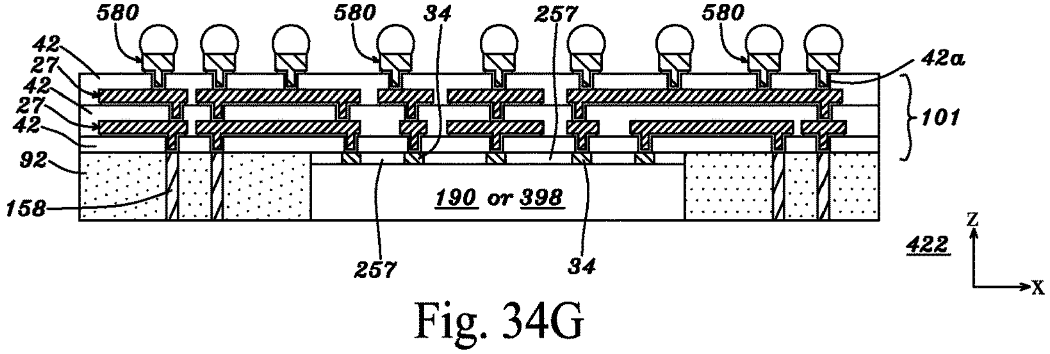
FIG. 34G is a schematically cross-sectional view showing a second type of stacking unit in an x-z plane in accordance with an embodiment of the present application.

FIG. 34G is a schematically cross-sectional view showing a second type of stacking unit in an x-z plane in accordance with an embodiment of the present application. Referring to FIG. 34G, a second type of stacking unit 422 may have a structure similar to the first type of stacking unit 421 as illustrated in FIGS. 34E and 34F. For an element indicated by the same reference number shown in FIGS. 34A-34G, the specification of the element as seen in FIG. 34G may be referred to that of the element as illustrated in FIGS. 34A-34F. The difference between the first and second types of stacking units 421 and 422 is that the second type of stacking unit 422 may further include multiple through polymer vias (TPVs) 158, i.e., metal posts, to replace each of the vertical-through-via (VTV) connectors 467 of the first type of stacking unit 421. For the second type of stacking unit 422, the interconnection metal layers 27 of its frontside interconnection scheme for a device (FISD) 101 may couple one of more of its through polymer vias (TPVs) 158 to one of the micro-bumps or micro-pads 34 of its application specific integrated-circuit (ASIC) chip 398, or its sub-system module 190 in case of replacing its application specific integrated-circuit (ASIC) chip 398, or to one of its metal bumps or pads 580. Each of its through polymer vias (TPVs) 158 may vertically extend through and in contact with its polymer layer 92, wherein each of its through polymer vias (TPVs) 158 may be a copper or metal post having a height between 30 μm and 200 μm or between 30 μm and 800 μm and a largest transverse dimension, such as diameter or width, between 10 μm and 200 μm or between 20 μm and 100 μm. Each of its through polymer vias (TPVs) 158, i.e., copper or metal posts, may have a top surface coplanar to the top surface of its polymer layer 92 and the top surface of the copper layer 32 of each of the micro-bumps or micro-pads 34 of each of its application specific integrated-circuit (ASIC) chips 398, or the sub-system modules 190 in case of replacing the application specific integrated-circuit (ASIC) chips 398, and a bottom surface coplanar to the backside of its application specific integrated-circuit (ASIC) chips 398, or the bottom surface of the application specific integrated-circuit (ASIC) chip 399 of its operation unit 190 in case of replacing its application specific integrated-circuit (ASIC) chips 398, and the bottom surface of its polymer layer 92.

3. Structure for Third Type of Stacking Unit and Process for Forming the Same

Figure 35A:
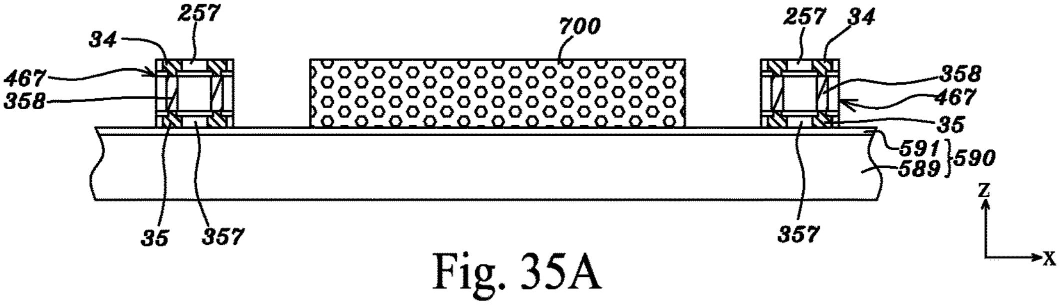
FIGS. 35A-35D are schematically cross-sectional views showing a process for forming a third type of stacking unit in an x-z plane in accordance with an embodiment of the present application.

FIGS. 35A-35D are schematically cross-sectional views showing a process for forming a third type of stacking unit in an x-z plane in accordance with an embodiment of the present application. Referring to FIG. 35A, a temporary substrate 590 may be provided with the same specification as the temporary substrate 590 as illustrated in FIG. 34A. Next, multiple micro heat pipes 700 (only one is shown), each of which may be any of the first type of micro heat pipes 700 for the first through eighth alternatives as illustrated in FIGS. 16C, 17C, 18C, 19C, 20E, 21E, 22B and 23C and the second type of micro heat pipes 700 for the first through seventh alternatives as illustrated in FIGS. 25-31, may be provided each with a bottom surface attached to the sacrificial bonding layer 591 of the temporary substrate 590, wherein each of the micro heat pipes 700 may have a thickness between 100 and 400 micrometers. Further, multiple vertical-through-via (VTV) connectors 467, each having the same specification as the second type of vertical-through-via (VTV) connector 467 as illustrated in FIG. 4B, each may have the insulating dielectric layer 357 at the backside thereof attached to the sacrificial bonding layer 591 of the temporary substrate 590 and the micro-bumps or micro-pads 35 at the backside thereof attached to the sacrificial bonding layer 591 of the temporary substrate 590.

Figure 35B:
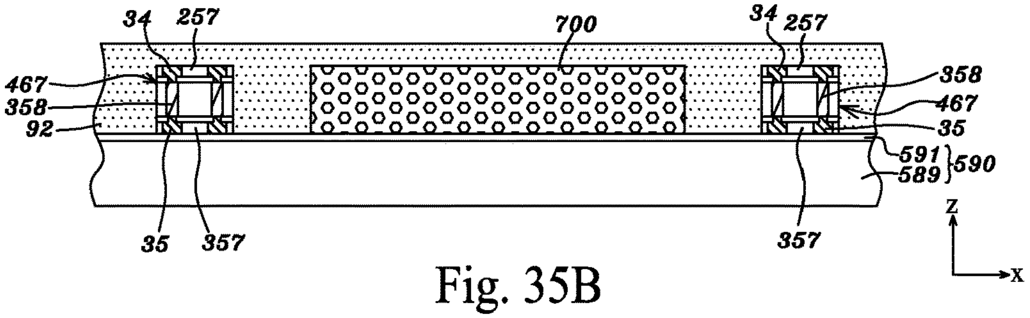

Next, referring to FIG. 35B, a polymer layer 92, or insulating dielectric layer, may be applied to fill a gap between each neighboring two of the micro heat pipes 700 and vertical-through-via (VTV) connectors 467 and to cover the micro heat pipes 700 and the insulating dielectric layer 257 and micro-bumps or micro-pads 34 of each of the vertical-through-via (VTV) connectors 467 by methods, for example, spin-on coating, screen-printing, dispensing or molding. The polymer layer 92 may have the same specification as that of the first type of stacking unit 421 illustrated in FIGS. 34A-34E.

Figure 35C:
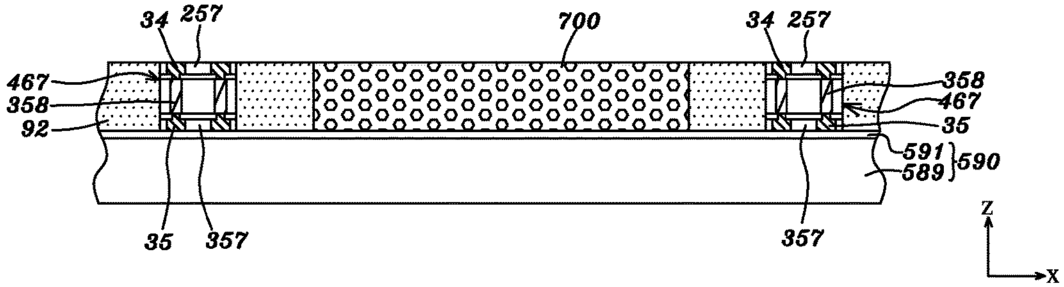

Next, referring to FIG. 35C, a chemical mechanical polishing (CMP), polishing or grinding process may be applied to remove a top portion of the polymer layer 92 and to planarize a top surface of the polymer layer 92, a top surface of each of the micro heat pipes 700, a top surface of the insulating dielectric layer 257 of each of the vertical-through-via (VTV) connectors 467 and a top surface of the copper layer 32 of each of the micro-bumps or micro-pads 34 of each of the vertical-through-via (VTV) connectors 467. Thereby, the top surface of each of the micro heat pipes 700, the top surface of the insulating dielectric layer 257 of each of the vertical-through-via (VTV) connectors 467 and the top surface of the copper layer 32 of each of the micro-bumps or micro-pads 34 of each of the vertical-through-via (VTV) connectors 467 may be exposed.

Figure 35D:
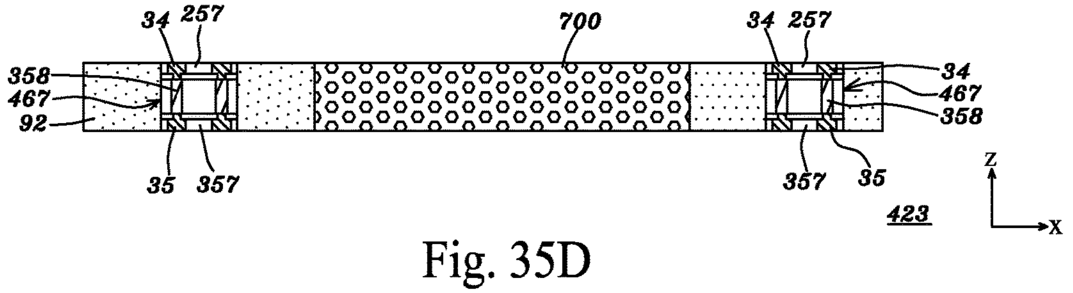

Next, the glass or silicon substrate 589 as seen in FIG. 35C may be released from the sacrificial bonding layer 591. The detail step therefor may be referred to the step of releasing the glass or silicon substrate 589 as illustrated in FIG. 34D. Next, an adhesive peeling tape (not shown) may be attached to a bottom surface of the remainder of the sacrificial bonding layer 591. Next, the adhesive peeling tape may be peeled off to pull off the remainder of the sacrificial bonding layer 591 attached to the adhesive peeling tape such that the bottom surface of each of the micro heat pipes 700, a bottom surface of the insulating dielectric layer 357 of each of the vertical-through-via (VTV) connectors 467, a bottom surface of each of the micro-bumps or micro-pads 35 of each of the vertical-through-via (VTV) connectors 467 and a bottom surface of the polymer layer 92 may be exposed and coplanar. Next, the polymer layer 92 may be cut or diced to separate multiple individual units (only one is shown) each for a third type of stacking unit 423 as shown in FIG. 35D by a laser cutting process or mechanical cutting process.

4. Structure for Fourth Type of Stacking Unit

Figure 35E:
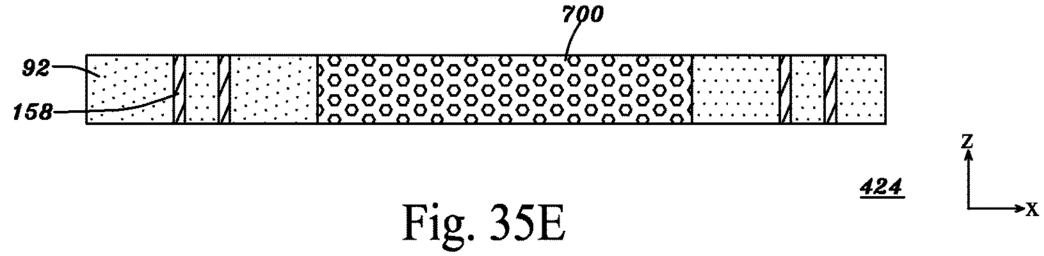
FIG. 35E is a schematically cross-sectional view showing a fourth type of stacking unit in an x-z plane in accordance with an embodiment of the present application.

FIG. 35E is a schematically cross-sectional view showing a fourth type of stacking unit in an x-z plane in accordance with an embodiment of the present application. Referring to FIG. 35E, a fourth type of stacking unit 424 may have a structure similar to the third type of stacking unit 423 as illustrated in FIG. 35D. For an element indicated by the same reference number shown in FIGS. 35A-35E, the specification of the element as seen in FIG. 35E may be referred to that of the element as illustrated in FIGS. 35A-35D. The difference between the third and fourth types of stacking units 423 and 424 is that the fourth type of stacking unit 424 may further include multiple through polymer vias (TPVs) 158, i.e., metal posts, to replace each of the vertical-through-via (VTV) connectors 467 of the third type of stacking unit 423. For the third type of stacking unit 424, each of its through polymer vias (TPVs) 158 may vertically extend through its polymer layer 92, wherein each of its through polymer vias (TPVs) 158 may be a copper or metal post having a height between 30 μm and 200 μm or between 30 μm and 800 μm and a largest transverse dimension, such as diameter or width, between 10 μm and 200 μm or between 20 μm and 100 μm. Each of its through polymer vias (TPVs) 158, i.e., copper or metal posts, may have a top surface coplanar to the top surface of its polymer layer 92 and the top surface of its micro heat pipe 700 and a bottom surface coplanar to the bottom surface of its polymer layer 92 and the bottom surface of its micro heat pipe 700.

5. Structure for Fifth Type of Stacking Unit

Figure 36A:
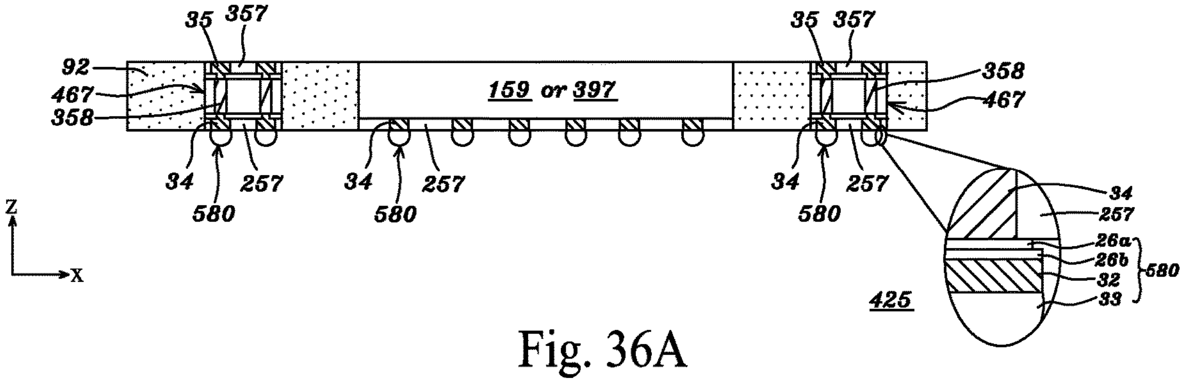
FIG. 36A is a schematically cross-sectional view showing a fifth type of stacking unit in an x-z plane in accordance with an embodiment of the present application.
Figure 36B:
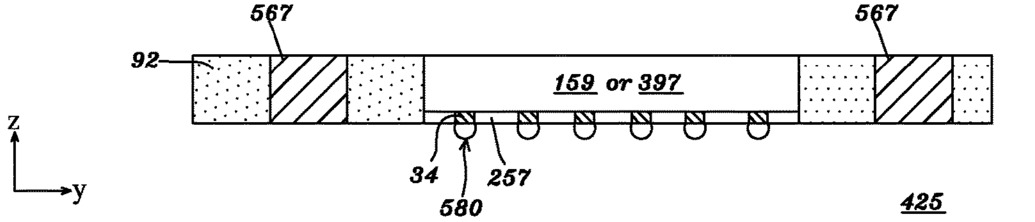
FIG. 36B is a schematically cross-sectional view showing fifth and sixth types of stacking units in an y-z plane in accordance with an embodiment of the present application.

FIG. 36A is a schematically cross-sectional view showing a fifth type of stacking unit in an x-z plane in accordance with an embodiment of the present application. FIG. 36B is a schematically cross-sectional view showing fifth and sixth types of stacking units in an y-z plane in accordance with an embodiment of the present application. Referring to FIGS. 36A and 36B, a fifth type of stacking unit 425 may include (1) a memory module 159 having the same specification as the second type of memory module 159 illustrated in FIG. 5B, wherein its memory module 159 may be replaced with a known-good memory or application-specific-integrated-circuit (ASIC) chip 397, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip or power-management integrated-circuit (IC) chip, having the same specification as the second type of semiconductor integrated-circuit (IC) chip 100 illustrated in FIG. 3B to be turned upside down, wherein its known-good memory or application-specific-integrated-circuit (ASIC) chip 397 may include analog circuits, mixed-mode signal circuits, radio-frequency (RF) circuits, and/or transmitter, receiver or transceiver circuits therein, (2) multiple vertical-through-via (VTV) connectors 467 each having the same specification as the second type of vertical-through-via (VTV) connector 467 illustrated in FIG. 4B and being turned upside down, (3) multiple metal plates 567 each made of a copper plate or aluminum plate, wherein each of its metal plates 567 may be a shape of cuboid having a side surface facing its memory module 159, or its known-good memory or ASIC chip 397 in case of replacing its memory module 159, and a width vertical to the surface of said each of its metal plates 567, wherein the side surface of said each of the metal plates 567 may have two longitudinal edges at top and bottom thereof respectively, each extending in a length of ranging from 2 millimeters to 2 centimeters and the width of said each of its metal plates 567 may range from 500 micrometers to 5 millimeters, (4) a polymer layer 92, or insulating dielectric layer, between each neighboring two of its memory module 159, or its known-good memory or ASIC chip 397 in case of replacing its memory module 159, its vertical-through-via (VTV) connectors 467 and its metal plates 567, wherein its polymer layer 92 may have the same specification as the polymer layer 92 of the first type of stacking unit 421 illustrated in FIGS. 34A-34E, wherein the copper layer 32 of each of the micro-bumps or micro-pads 34 of each of its vertical-through-via (VTV) connectors 467 may have a bottom surface coplanar to a bottom surface of the insulating dielectric layer 257 of each of its vertical-through-via (VTV) connectors 467, a bottom surface of the copper layer 32 of each of the micro-bumps or micro-pads 34 of its memory module 159, or its known-good memory or ASIC chip 397 in case of replacing its memory module 159, a bottom surface of the insulating dielectric layer 257 of its memory module 159, or its known-good memory or ASIC chip 397 in case of replacing its memory module 159, a bottom surface of its polymer layer 92 and a bottom surface of each of its metal plates 567, and wherein the copper layer 32 of each of the micro-bumps or micro-pads 35 of each of its vertical-through-via (VTV) connectors 467 may have a top surface coplanar to a top surface of the insulating dielectric layer 357 of each of its vertical-through-via (VTV) connectors 467, a top surface of the semiconductor substrate 2 of the topmost one of the memory chips 251 of its memory module 159 at a backside thereof, or a top surface of its known-good memory or ASIC chip 397 at a backside thereof in case of replacing its memory module 159, a top surface of its polymer layer 92 and a top surface of each of its metal plates 567, and (5) multiple metal bumps or pads 580, i.e., metal contacts, in an array, which may be of one of the first through fourth types having the same specification as the first through fourth types of micro-bumps or micro-pillars 34 as illustrated in FIG. 3A respectively, each having the adhesion layer **26*a* formed on the bottom surface of the copper layer 32 of one of the micro-bumps or micro-pads 34 of one of its vertical-through-via (VTV) connectors 467**.

6. Structure for Sixth Type of Stacking Unit

Figure 36C:
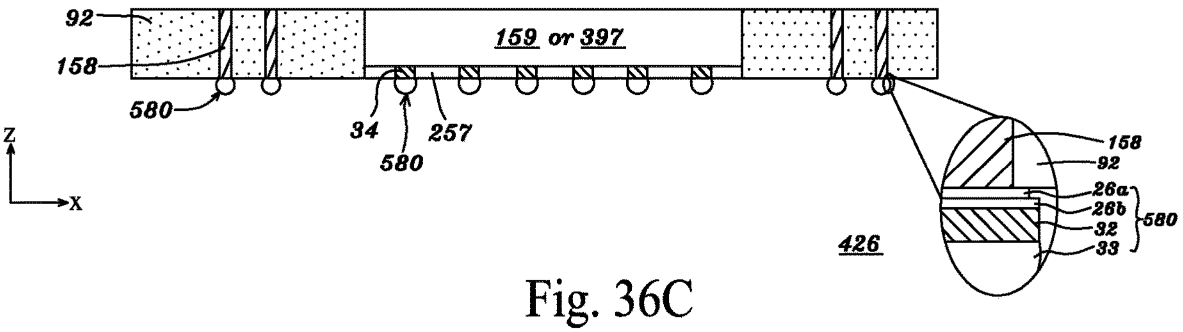
FIG. 36C is a schematically cross-sectional view showing a sixth type of stacking unit in an x-z plane in accordance with an embodiment of the present application.

FIG. 36C is a schematically cross-sectional view showing a sixth type of stacking unit in an x-z plane in accordance with an embodiment of the present application. Referring to FIG. 36C, a sixth type of stacking unit 426 may have a structure similar to the fifth type of stacking unit 425 as illustrated in FIGS. 36A and 36B. For an element indicated by the same reference number shown in FIGS. 36A-36C, the specification of the element as seen in FIG. 36C may be referred to that of the element as illustrated in FIG. 36A or 36B. The difference between the fifth and sixth types of stacking units 425 and 426 is that the sixth type of stacking unit 426 may further include multiple through polymer vias (TPVs) 158, i.e., metal posts, to replace each of the vertical-through-via (VTV) connectors 467 of the fifth type of stacking unit 425. For the sixth type of stacking unit 426, each of its through polymer vias (TPVs) 158 may vertically extend through and in contact with its polymer layer 92, wherein each of its through polymer vias (TPVs) 158 may be a copper or metal post having a height between 30 μm and 200 μm or between 30 μm and 800 μm and a largest transverse dimension, such as diameter or width, between 10 μm and 200 μm or between 20 μm and 100 μm. Each of its through polymer vias (TPVs) 158, i.e., copper or metal posts, may have a top surface coplanar to the top surface of the semiconductor substrate 2 of the topmost one of the memory chips 251 of its memory module 159 at the backside thereof, or the top surface of its known-good memory chip 397 or known-good ASIC chip 396 at the backside thereof in case of replacing its memory module 159, the top surface of its polymer layer 92 and the top surface of each of its metal plates 567, and a bottom surface coplanar to the bottom surface of the copper layer 32 of each of the micro-bumps or micro-pads 34 of its memory module 159, or its known-good memory chip 397 or known-good ASIC chip 396 in case of replacing its memory module 159, the bottom surface of the insulating dielectric layer 257 of its memory module 159, or its known-good memory chip 397 or known-good ASIC chip 396 in case of replacing its memory module 159, the bottom surface of its polymer layer 92 and the bottom surface of each of its metal plates 567. Each of its metal bumps or pads 580 may have the adhesion layer 26*a* formed on the bottom surface of one of its through polymer vias (TPVs) 158.

7. Structure for Seventh Type of Stacking Unit

Figure 36D:
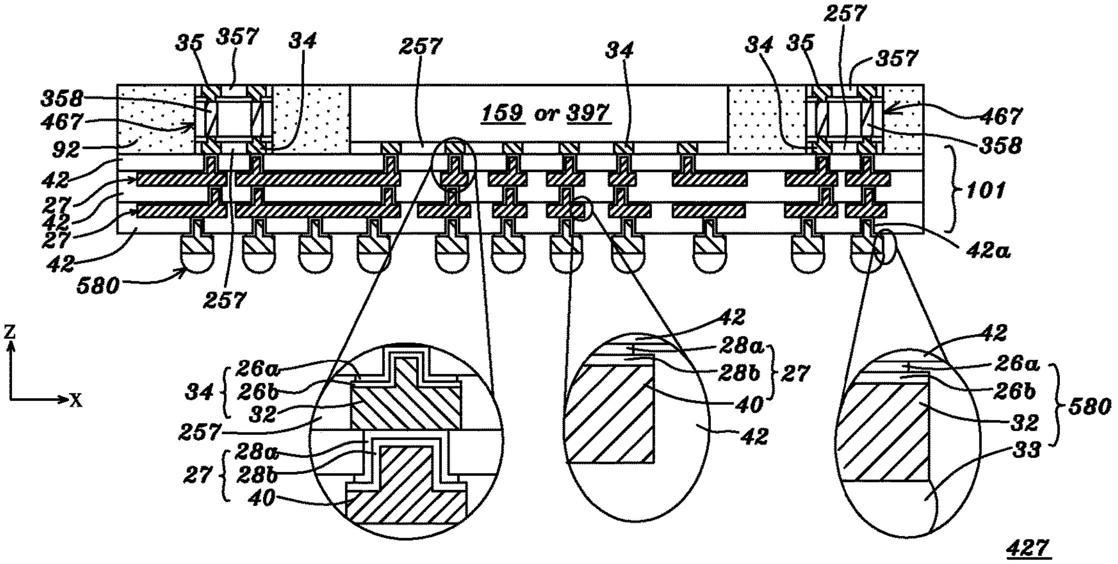
FIGS. 36D and 36E are schematically cross-sectional views showing a seventh type of stacking unit in x-z and y-z planes in accordance with an embodiment of the present application.
Figure 36E:
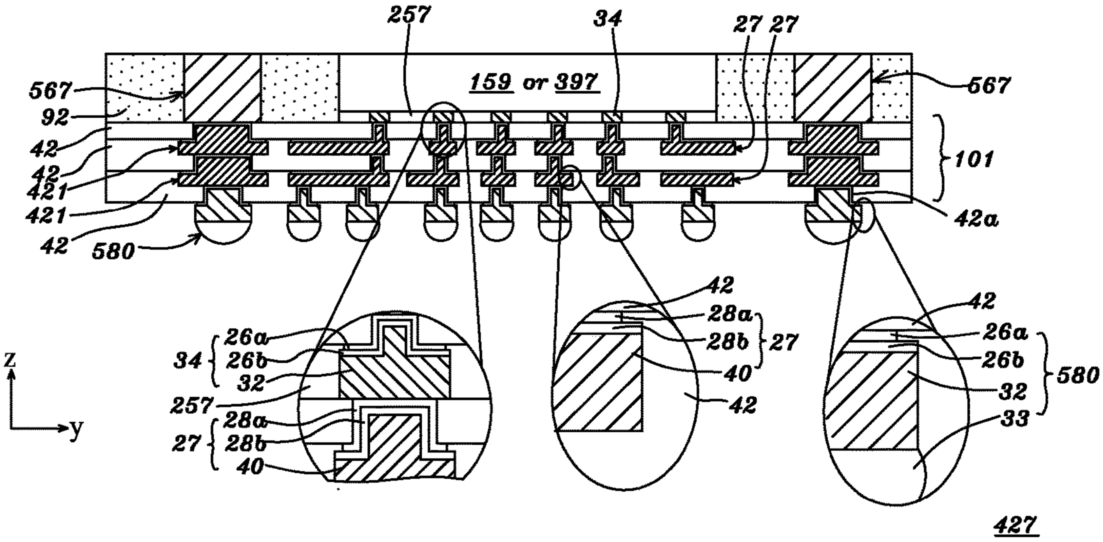

FIG. 36D is a schematically cross-sectional view showing a seventh type of stacking unit in an x-z plane in accordance with an embodiment of the present application. FIG. 36E is a schematically cross-sectional view showing a seventh type of stacking unit in an y-z plane in accordance with an embodiment of the present application. Referring to FIGS. 36D and 36E, a seventh type of stacking unit 427 may have a structure similar to the fifth type of stacking unit 425 as illustrated in FIGS. 36A and 36B. For an element indicated by the same reference number shown in FIGS. 36A, 36B, 36D and 36E, the specification of the element as seen in FIG. 36D or 36E may be referred to that of the element as illustrated in FIG. 36A or 36B. The difference between the fifth and seventh types of stacking units 425 and 427 is that the seventh type of stacking unit 427 may further include a frontside interconnection scheme for a device (FISD) 101 on the bottom surface of its polymer layer 92, the bottom surface of the copper layer 32 of each of the micro-bumps or micro-pads 34 of each of its vertical-through-via (VTV) connectors 467, the bottom surface of the insulating dielectric layer 257 of each of its vertical-through-via (VTV) connectors 467, the bottom surface of the copper layer 32 of each of the micro-bumps or micro-pads 34 of its memory module 159, or its known-good memory chip 397 or known-good ASIC chip 396 in case of replacing its memory module 159, the bottom surface of the insulating dielectric layer 257 of its memory module 159, or its known-good memory chip 397 or known-good ASIC chip 396 in case of replacing its memory module 159, and the bottom surface of each of its metal plates 567. For the seventh type of stacking unit 427, its frontside interconnection scheme for a device (FISD) 101 may include (1) one or more interconnection metal layers 27 coupling to the micro-bumps or micro-pads 34 of each of its memory module 159, or its known-good memory chip 397 or known-good ASIC chip 396 in case of replacing its memory module 159, and the micro-bumps or micro-pads 34 of each of its vertical-through-via (VTV) connectors 467, and (2) one or more polymer layers 42, i.e., insulating dielectric layers, each between neighboring two of the interconnection metal layers 27 of its frontside interconnection scheme for a device (FISD) 101, between a topmost one of the interconnection metal layers 27 of its frontside interconnection scheme for a device (FISD) 101 and a planar surface composed of the bottom surface of the insulating dielectric layer 257 of each of its vertical-through-via (VTV) connectors 467, the bottom surface of the insulating dielectric layer 257 of its memory module 159, or its known-good memory chip 397 or known-good ASIC chip 396 in case of replacing its memory module 159, and the bottom surface of its polymer layer 92, or on and under a bottommost one of the interconnection metal layers 27 of its frontside interconnection scheme for a device (FISD) 101, wherein the bottommost one of the interconnection metal layers 27 of its frontside interconnection scheme for a device (FISD) 101 may be patterned with multiple metal pads at tops of multiple openings 42*a* in the bottommost one of the polymer layers 42 of its frontside interconnection scheme for a device (FISD) 101. Each of the interconnection metal layers 27 of its frontside interconnection scheme for a device (FISD) 101 may include (1) a copper layer 40 having upper portions in openings in one of the polymer layers 42 of its frontside interconnection scheme for a device (FISD) 101, having a thickness of between 0.3 μm and 20 μm, and lower portions having a thickness 0.3 μm and 20 μm under and on said one of the polymer layers 42, (2) an adhesion layer 28*a*, such as titanium or titanium nitride having a thickness of between 1 nm and 50 nm, at a top and sidewall of each of the upper portions of the copper layer 40 thereof and at a top of each of the lower portions of the copper layer 40 thereof, and (3) a seed layer 28*b*, such as copper, between the copper layer 40 and adhesion layer 28*a* thereof, wherein said each of the lower portions of the copper layer 40 thereof may have a sidewall not covered by the adhesion layer 28*a*. Each of the interconnection metal layers 27 of its frontside interconnection scheme for a device (FISD) 101 may have a metal line or trace with a thickness between, for example, 0.3 μm and 40 μm, 0.5 μm and 30 μm, 1 μm and 20 μm, 1 μm and 15 μm, 1 μm and 10 μm, or 0.5 μm to 5 μm, or greater than or equal to 0.3 μm, 0.7 μm, 1 μm, 2 μm, 3 μm, 5 μm, 7 μm or 10 μm and a width between, for example, 0.3 μm and 40 μm, 0.5 μm and 30 μm, 1 μm and 20 μm, 1 μm and 15 μm, 1 μm and 10 μm, or 0.5 μm to 5 μm, or greater than or equal to 0.3 μm, 0.7 μm, 1 μm, 2 μm, 3 μm, 5 μm, 7 μm or 10 μm. Each of the polymer layer 42 of its frontside interconnection scheme for a device (FISD) 101 may be a layer of polyimide, BenzoCycloButene (BCB), parylene, polybenzoxazole (PBO), epoxy-based material or compound, photo epoxy SU-8, elastomer or silicone, having a thickness between, for example, 0.3 μm and 50 μm, 0.3 μm and 30 μm, 0.5 μm and 20 μm, 1 μm and 10 μm, or 0.5 um and 5 μm, or thicker than or equal to 0.3 μm, 0.5 μm, 0.7 μm, 1 μm, 1.5 μm, 2 μm, 3 μm or 5 μm. One of the interconnection metal layers 27 of its frontside interconnection scheme for a device (FISD) may have two planes used respectively for power and ground planes of a power supply and/or used as a heat dissipater or spreader for the heat dissipation or spreading, wherein each of the two planes may have a thickness, for example, between 5 μm and 50 μm, 5 μm and 30 μm, 5 μm and 20 μm, or 5 μm and 15 μm, or greater than or equal to 5 μm, 10 μm, 20 μm, or 30 μm. The two planes may be layout as interlaced or interleaved shaped structures in a plane or may be layout in a fork shape. Each of the interconnection metal layers 27 of its frontside interconnection scheme for a device (FISD) 101 may extend horizontally under across an edge of its memory module 159, or its known-good memory chip 397 or known-good ASIC chip 396 in case of replacing its memory module 159, and an edge of each of its vertical-through-via (VTV) connectors 467.

Referring to FIG. 36E, for the seventh type of stacking unit 427, each of the interconnection metal layers 27 of its frontside interconnection scheme for a device (FISD) 101 may have a metal via 271 vertically under one of its metal plates 567, wherein the metal via 271 may couple to said one of its metal plates 567 and may not couple to its vertical-through-via (VTV) connectors 467 and its memory module 159, or its known-good memory chip 397 or known-good ASIC chip 396 in case of replacing its memory module 159, and wherein the metal via 271 may be stacked with a metal via 271 of another of the interconnection metal layers 27 of its frontside interconnection scheme for a device (FISD) 101 vertically under said one of its metal plates 567.

8. Structure for Eighth Type of Stacking Unit

Figure 37A:
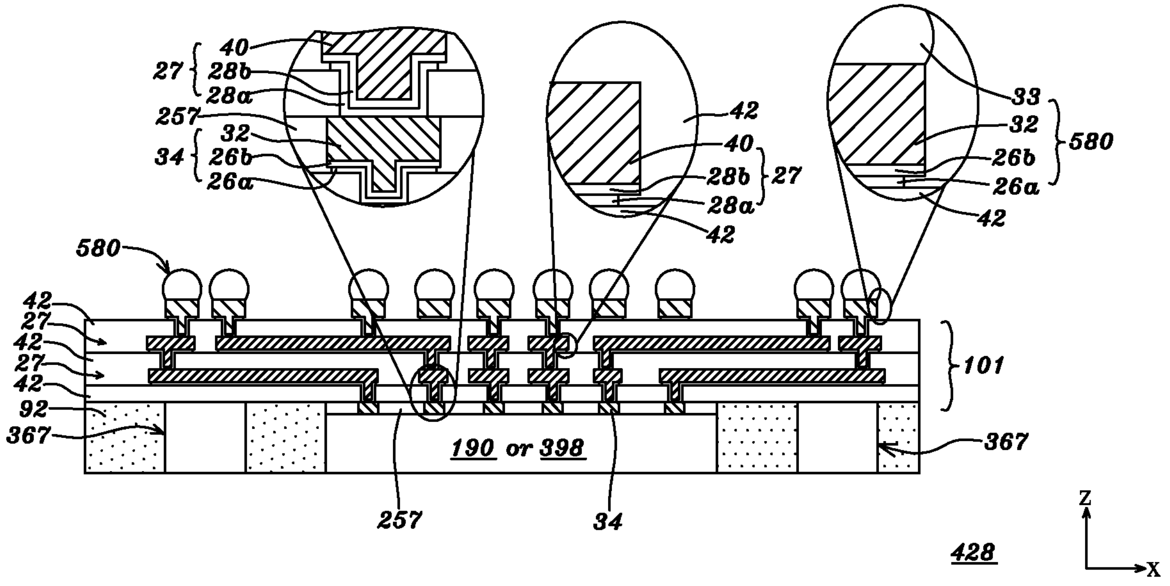
FIGS. 37A and 37B are schematically cross-sectional views showing an eighth type of stacking unit in x-z and y-z planes in accordance with an embodiment of the present application.
Figure 37B:
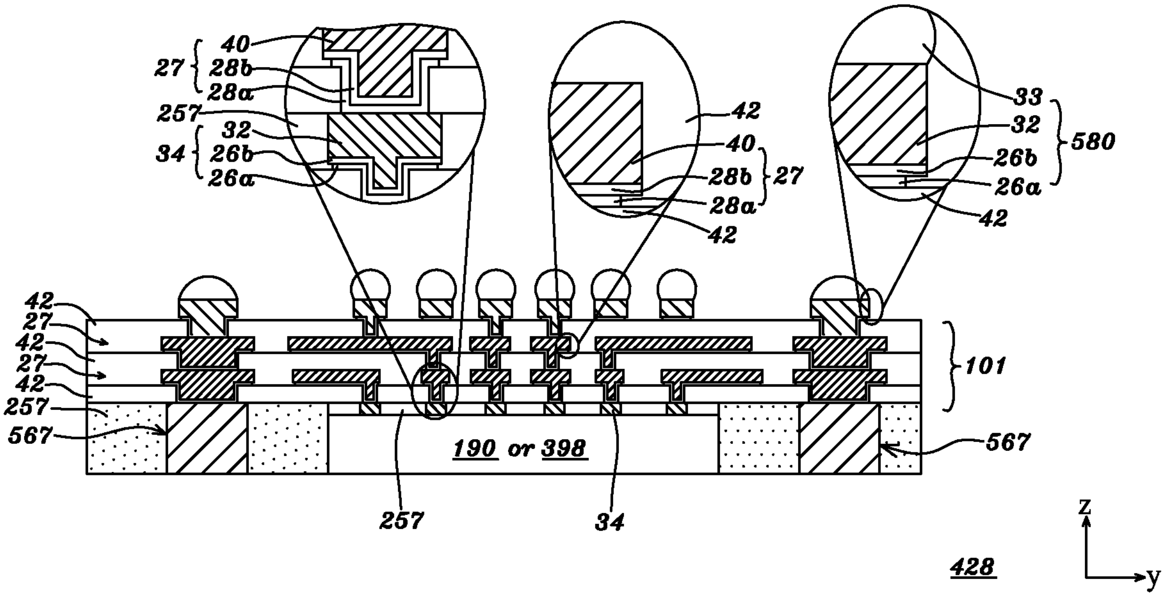

FIG. 37A is a schematically cross-sectional view showing an eighth type of stacking unit in an x-z plane in accordance with an embodiment of the present application. FIG. 37B is a schematically cross-sectional view showing an eighth type of stacking unit in an y-z plane in accordance with an embodiment of the present application. Referring to FIGS. 37A and 37B, an eighth type of stacking unit 428 may have a structure similar to the first type of stacking unit 421 as illustrated in FIGS. 34E and 34F. For an element indicated by the same reference number shown in FIGS. 34A-34F, 37A and 37B, the specification of the element as seen in FIG. 37A or 37B may be referred to that of the element as illustrated in FIGS. 26A-26F. The difference between the first and eighth types of stacking units 421 and 428 is that the second type of stacking unit 422 may include multiple dummy semiconductor chips 367 and metal plates 567 arranged around its application specific integrated-circuit (ASIC) chip 398, or its sub-system module 190 in case of replacing its application specific integrated-circuit (ASIC) chip 398, in the same horizontal level and may not include the vertical-through-via (VTV) connectors 467 of the first type of stacking unit 421. For the eighth type of stacking unit 428, each of the interconnection metal layers 27 of its frontside interconnection scheme for a device (FISD) 101 may have a metal via 271 vertically over one of its metal plates 567, wherein the metal via 271 may couple to said one of its metal plates 567 and may not couple to its application specific integrated-circuit (ASIC) chip 398, or its sub-system module 190 in case of replacing its application specific integrated-circuit (ASIC) chip 398, and wherein the metal via 271 may be stacked with a metal via 271 of another of the interconnection metal layers 27 of its frontside interconnection scheme for a device (FISD) 101 vertically over said one of its metal plates 567. Each of its metal plates 567 may be a shape of cuboid having a side surface facing its application specific integrated-circuit (ASIC) chip 398, or its sub-system module 190 in case of replacing its application specific integrated-circuit (ASIC) chip 398, and a width vertical to the surface of said each of its metal plates 567, wherein the side surface of said each of the metal plates 567 may have two longitudinal edges at top and bottom thereof respectively, each extending in a length of ranging from 2 millimeters to 2 centimeters and the width of said each of its metal plates 567 may range from 500 micrometers to 5 millimeters.

9. Structure for Ninth Type of Stacking Unit

Figure 38:
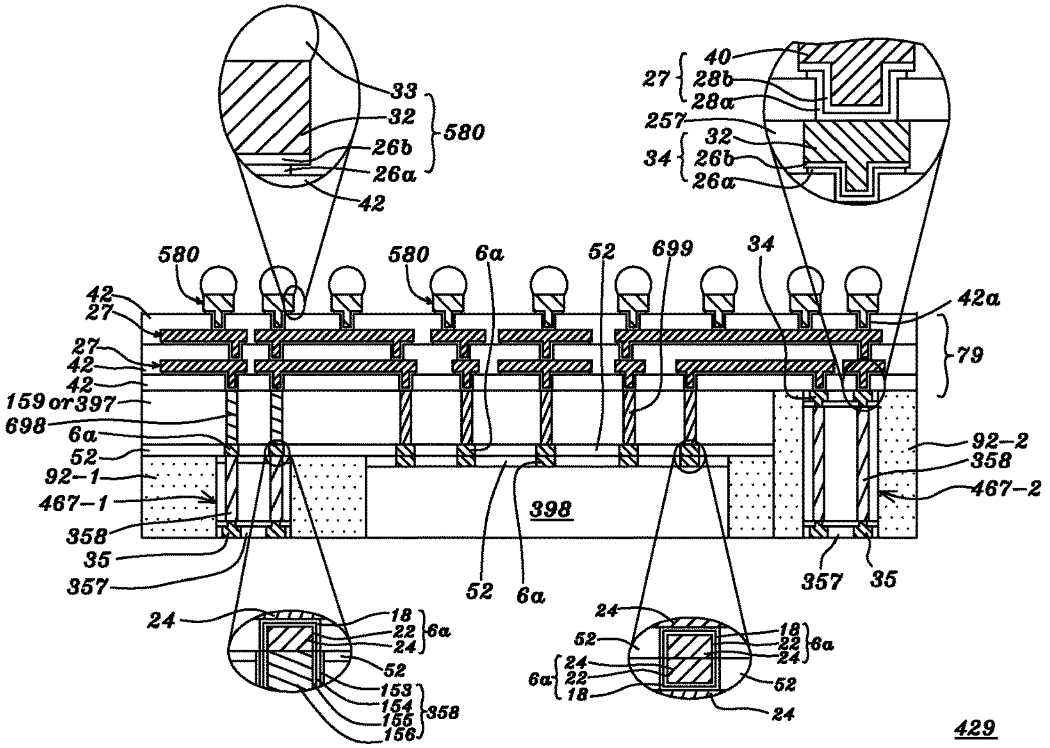
FIG. 38 is a schematically cross-sectional view showing a ninth type of stacking unit in accordance with an embodiment of the present application.

FIG. 38 is a schematically cross-sectional view showing a ninth type of stacking unit in accordance with an embodiment of the present application. Referring to FIG. 38, a ninth type of stacking unit 429 may include (1) a memory module 159 having the same specification as the third type of memory module 159 illustrated in FIG. 5C, (2) an application specific integrated-circuit (ASIC) chip 398 having the same specification as the third type of semiconductor integrated-circuit (IC) chip 100 illustrated in FIG. 3C, wherein the application specific integrated-circuit (ASIC) chip 398 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example, and (3) a first vertical-through-via (VTV) connector 467-1 having the same specification as the third type of vertical-through-via (VTV) connector 467 illustrated in FIG. 4C.

Referring to FIG. 38, for the ninth type of stacking unit 429, the control chip 688 of its memory module 159 may be bonded to its application specific integrated-circuit (ASIC) chip 398 using an oxide-to-oxide and metal-to-metal direct bonding method. The oxide-to-oxide and metal-to-metal direct bonding method may include (1) oxide-to-oxide bonding the insulating bonding layer 52 of the control chip 688 of its memory module 159 to the insulating bonding layer 52 of its application specific integrated-circuit (ASIC) chip 398, and (2) metal-to-metal bonding, e.g., copper-to-copper bonding, the metal pads 6*a*, such as copper pads, of the control chip 688 of its memory module 159 to the metal pads 6*a*, such as copper pads, of its application specific integrated-circuit (ASIC) chip 398. The control chip 688 of its memory module 159 may have the semiconductor devices 4 such as transistors at the active surface of the semiconductor substrate 2 thereof as illustrated in FIG. 5C, and the active surface of the semiconductor substrate 2 of the control chip 688 of its memory module 159 may face an active surface of the semiconductor substrate 2 of its application specific integrated-circuit (ASIC) logic chip 398, wherein its application specific integrated-circuit (ASIC) logic chip 398 may have the semiconductor devices 4 such as transistors at the active surface of the semiconductor substrate 2 thereof as illustrated in FIG. 3C. The control chip 688 of its memory module 159 may be provided with the insulating bonding layer 52 bonded to the insulating bonding layer 52 of its first vertical-through-via (VTV) connector 467-1 by oxide-to-oxide bonding and the metal pads 6*a* bonded to the metal pads 6*a* of its first vertical-through-via (VTV) connector 467-1 by metal-to-metal bonding, e.g., copper-to-copper bonding.

Alternatively, referring to FIG. 38, its memory module 159 may be replaced with a known-good memory or application-specific-integrated-circuit (ASIC) chip 397, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip or power-management integrated-circuit (IC) chip. For the ninth type of stacking unit 429, its known-good memory or application-specific-integrated-circuit (ASIC) chip 397 in case of replacing its memory module 159 may have the same specification as the third type of semiconductor integrated-circuit (IC) chip 100 illustrated in FIG. 3C to be turned upside down, and may be bonded to its application specific integrated-circuit (ASIC)

chip 398 using an oxide-to-oxide and metal-to-metal direct bonding method. The oxide-to-oxide and metal-to-metal direct bonding method may include (1) oxide-to-oxide bonding the insulating bonding layer 52 at the active side of its known-good memory or application-specific-integrated-circuit (ASIC) chip 397 to the insulating bonding layer 52 of its application specific integrated-circuit (ASIC) chip 398, and (2) metal-to-metal bonding, e.g., copper-to-copper bonding, the metal pads 6*a*, such as copper pads, at the active side of its known-good memory or application-specific-integrated-circuit (ASIC) chip 397 to the metal pads 6*a*, such as copper pads, of its application specific integrated-circuit (ASIC) chip 398. For the ninth type of stacking unit 429, its known-good memory or application-specific-integrated-circuit (ASIC) chip 397 in case of replacing its memory module 159 may include analog circuits, mixed-mode signal circuits, radio-frequency (RF) circuits, and/or transmitter, receiver or transceiver circuits therein. For the ninth type of stacking unit 429, its known-good memory or ASIC chip 397 in case of replacing its memory module 159 may have the semiconductor devices 4 such as transistors at the active surface of the semiconductor substrate 2 thereof as illustrated in FIG. 3C, and the active surface of the semiconductor substrate 2 of its known-good memory chip may face an active surface of the semiconductor substrate 2 of its application specific integrated-circuit (ASIC) logic chip 398, wherein its application specific integrated-circuit (ASIC) logic chip 398 may have the semiconductor devices 4 such as transistors at the active surface of the semiconductor substrate 2 thereof as illustrated in FIG. 3C. For the ninth type of stacking unit 429, its known-good memory or ASIC chip 397 in case of replacing its memory module 159 may be bonded to its first vertical-through-via (VTV) connector 467-1 using an oxide-to-oxide and metal-to-metal direct bonding method. The oxide-to-oxide and metal-to-metal direct bonding method may include (1) oxide-to-oxide bonding the insulating bonding layer 52 at the active side of its known-good memory or application-specific-integrated-circuit (ASIC) chip 397 to the insulating bonding layer 52 of its first vertical-through-via (VTV) connector 467-1, and (2) metal-to-metal bonding, e.g., copper-to-copper bonding, the metal pads 6*a*, such as copper pads, at the active side of its known-good memory or application-specific-integrated-circuit (ASIC) chip 397 to the metal pads 6*a*, such as copper pads, of its first vertical-through-via (VTV) connector 467-1.

Alternatively, for the ninth type of stacking unit 429, its memory module 159 may have the same specification as the first type of memory module 159 illustrated in FIG. 5A, its known-good memory or ASIC chip 397 in case of replacing its memory module 159 may have the same specification as the first type of semiconductor integrated-circuit chip 100 illustrated in FIG. 3A, its first vertical-through-via (VTV) connector 467-1 may have the same specification as the first type of vertical-through-via (VTV) connector 467 illustrated in FIG. 4A and its application specific integrated-circuit (ASIC) chip 398 may have the same specification as the first type of semiconductor integrated-circuit (IC) chip as illustrated in FIG. 3A, wherein each of its application specific integrated-circuit (ASIC) chip 398 and first vertical-through-via (VTV) connector 467-1 may be provided with the first, second, third or fourth type of micro-bumps or micro-pads 34 each bonded to one of the first, second, third or fourth type of micro-bumps or micro-pads 34 of its memory module 159, or known-good memory or ASIC chip 397 in case of replacing its memory module 159 to form a bonded metal bump or contact 168 therebetween by a step for one of the first through fourth cases as illustrated in FIGS. 5A, 6A and 6B in which each of its application specific integrated-circuit (ASIC) chip 398 and first vertical-through-via (VTV) connector 467-1 may be considered as the upper one of the memory chips 251 of the memory module 159 illustrated in FIGS. 5A, 6A and 6B, and its memory module 159, or known-good memory or ASIC chip 397 in case of replacing its memory module 159, may be considered as the lower one of the memory chips 251 or the control chip 688 of the memory module 159 illustrated in FIGS. 5A, 6A and 6B. In this case, the ninth type of stacking unit 429 may further include an underfill, e.g., polymer layer, between its application specific integrated-circuit (ASIC) chip 398 and its memory module 159, or known-good memory or ASIC chip 397 in case of replacing its memory module 159, and between its first vertical-through-via (VTV) connector 467-1 and its memory module 159, or known-good memory or ASIC chip 397 in case of replacing its memory module 159, covering a sidewall of each of its bonded metal bumps or contacts 168 between its application specific integrated-circuit (ASIC) chip 398 and its memory module 159, or known-good memory or ASIC chip 397 in case of replacing its memory module 159, or between its first vertical-through-via (VTV) connector 467-1 and its memory module 159, or known-good memory or ASIC chip 397 in case of replacing its memory module 159.

Referring to FIG. 38, the ninth type of stacking unit 429 may include a first polymer layer 92-1, e.g., resin or compound, on the insulating bonding layer 52 of the control chip 688 of its memory module 159 or on the insulating bonding layer 52 of its known-good memory or ASIC chip 397 in case of replacing its memory module 159, wherein its first polymer layer 92-1 may have the same specification as the polymer layer 92 of the first type of stacking unit 421 illustrated in FIGS. 34A-34E. For the ninth type of stacking unit 429, its first polymer layer 92-1 may have a portion between its memory module 159, or its known-good memory or ASIC chip 397 in case of replacing its memory module 159, and its first vertical-through-via (VTV) connector 467-1, and its first polymer layer 92-1 may have a bottom surface coplanar to a bottom surface of its application specific integrated-circuit (ASIC) logic chip 398 and a bottom surface of its first vertical-through-via (VTV) connector 467-1. For more elaboration, the copper layer 32 of each of the micro-bumps or micro-pads 35 of its first vertical-through-via (VTV) connector 467-1 may have a bottom surface coplanar to the bottom surface of its first polymer layer 92-1 and a bottom surface of the insulating dielectric layer 357 of its first vertical-through-via (VTV) connector 467-1.

Referring to FIG. 38, the ninth type of stacking unit 429 may include (1) a second vertical-through-via (VTV) connector 467-2 having the same specification as the second type of vertical-through-via (VTV) connector 467 illustrated in FIG. 3B, and (2) a second polymer layer 92-2, e.g., resin or compound, bonded to a sidewall of its first polymer layer 92-1, a sidewall of its second vertical-through-via (VTV) connector 467-2 and a sidewall of the molding compound 695 and control chip of its memory module 159, or a sidewall of its known-good memory or ASIC chip 397 in case of replacing its memory module 159, wherein its second polymer layer 92-2 may have the same specification as its first polymer layer 92-1. For the ninth type of stacking unit 429, its second polymer layer 92-2 may have a portion between its second vertical-through-via (VTV) connector 467-2 and its first polymer layer 92-1 and between its second vertical-through-via (VTV) connector 467-2 and its memory module 159, or its known-good memory or ASIC chip 397 in case of replacing its memory module 159. Its second polymer layer 92-2 may have a bottom surface coplanar to the bottom surface of its first polymer layer 92-1, the bottom surface of the copper layer 32 of each of the micro-bumps or micro-pads 35 of its first vertical-through-via (VTV) connector 467-1, the bottom surface of the insulating dielectric layer 357 of its first vertical-through-via (VTV) connector 467-1, a bottom surface of the copper layer 32 of each of the micro-bumps or micro-pads 35 of its second vertical-through-via (VTV) connector 467-2 and a bottom surface of the insulating dielectric layer 357 of its second vertical-through-via (VTV) connector 467-2. Its memory module 159, or its known-good memory or ASIC chip 397 in case of replacing its memory module 159, may be ground or polished from the backside thereof such that the insulating lining layer 153, adhesion layer 154 and seed layer 155 of the topmost one of the memory chips 251 of its memory module 159 at the backside thereof, or the insulating lining layer 153, adhesion layer 154 and seed layer 155 of its known-good memory or ASIC chip 397 in case of replacing its memory module 159, may be removed. Thus, a backside of the copper layer 156 of each of the through silicon vias (TSVs) 157 of the topmost one of the memory chips 251 of its memory module 159, or a backside of the copper layer 156 of each of the through silicon vias (TSVs) 157 of its known-good memory or ASIC chip 397 in case of replacing its memory module 159, may be coplanar to the top surface of the topmost one of the memory chips 251 of its memory module 159, or the top surface of its known-good memory or ASIC chip 397 in case of replacing its memory module 159, and a top surface of its second polymer layer 92-2. The insulating lining layer 153, adhesion layer 154 and seed layer 155 of each of the through silicon vias (TSVs) 157 of the topmost one of the memory chips 251 of its memory module 159, or the insulating lining layer 153, adhesion layer 154 and seed layer 155 of each of the through silicon vias (TSVs) 157 of its known-good memory or ASIC chip 397 in case of replacing its memory module 159, may be left at a sidewall of the copper layer 156 of each of the through silicon vias (TSVs) 157 of the topmost one of the memory chips 251 of its memory module 159, or a sidewall of the copper layer 156 of each of the through silicon vias (TSVs) 157 of its known-good memory or ASIC chip 397 in case of replacing its memory module 159. The copper layer 32 of each of the micro-bumps or micro-pads 34 of its second vertical-through-via (VTV) connector 467-2 may have a top surface coplanar to the top surface of its second polymer layer 92-2, a top surface of the insulating dielectric layer 257 of its second vertical-through-via (VTV) connector 467-2 and the top surface of the topmost one of the memory chips 251 of its memory module 159, or the top surface of its known-good memory or ASIC chip 397 in case of replacing its memory module 159. For more elaboration, the top surface of the copper layer 32 of each of the micro-bumps or micro-pads 34 of its second vertical-through-via (VTV) connector 467-2 may be coplanar to the backside of the copper layer 156 of each of the through silicon vias (TSVs) 157 of the topmost one of the memory chips 251 of its memory module 159, or the backside of the copper layer 156 of each of the through silicon vias (TSVs) 157 of its known-good memory or ASIC chip 397 in case of replacing its memory module 159.

Referring to FIG. 38, the ninth type of stacking unit 429 may include a backside interconnection scheme for a device (BISD) 79 on its memory module 159, or its known-good memory or ASIC chip 397 in case of replacing its memory module 159, its second vertical-through-via (VTV) connector 467-2 and its second polymer layer 92-2. For the ninth type of stacking unit 429, its backside interconnection scheme 79 may include (1) one or more interconnection metal layers 27 coupling to the micro-bumps or micro-pads 34 of its second vertical-through-via (VTV) connector 467-2 and the through silicon vias (TSVs) 157 of the memory chips 251 and control chip 688 of its memory module 159, or the through silicon vias (TSVs) 157 of its known-good memory or ASIC chip 397 in case of replacing its memory module 159, and (2) one or more polymer layers 42, i.e., insulating dielectric layers, each between neighboring two of the interconnection metal layers 27 of its backside interconnection scheme for a device (BISD) 79, between a bottommost one of the interconnection metal layers 27 of its backside interconnection scheme for a device (BISD) 79 and a planar surface composed of the top surface of the semiconductor substrate 2 of the topmost one of the memory chips 251 of its memory module 159, or the top surface of the semiconductor substrate 2 of its known-good memory or ASIC chip 397 in case of replacing its memory module 159, the top surface of the copper layer 32 of each of the micro-bumps or micro-pads 34 of its second vertical-through-via (VTV) connector 467-2, the top surface of the insulating dielectric layer 257 of its second vertical-through-via (VTV) connector 467-2 and the top surface of its second polymer layer 92-2, or on and above a topmost one of the interconnection metal layers 27 of its backside interconnection scheme for a device (BISD) 79, wherein the topmost one of the interconnection metal layers 27 of its backside interconnection scheme for a device (BISD) 79 may have multiple metal pads at bottoms of multiple openings 42*a* in the topmost one of the polymer layers 42 of its backside interconnection scheme for a device (BISD) 79. Each of the interconnection metal layers 27 of its backside interconnection scheme for a device (BISD) 79 may have the same specification as that of the second interconnection scheme 588 of the first type of semiconductor integrated-circuit (IC) chip 100 as illustrated in FIG. 3A, and each of the polymer layers 42 of its backside interconnection scheme for a device (BISD) 79 may have the same specification as that of the second interconnection scheme 588 of the first type of semiconductor integrated-circuit (IC) chip 100 as illustrated in FIG. 3A. Each of the interconnection metal layers 27 of its backside interconnection scheme for a device (BISD) 79 may extend horizontally across an edge of its memory module 159, or its known-good memory or ASIC chip 397 in case of replacing its memory module 159, and an edge of its second vertical-through-via (VTV) connector 467-2.

Referring to FIG. 38, the ninth type of stacking unit 429 may include multiple metal bumps or pads 580, i.e., metal contacts, in an array which may be of one of the first through fourth types having the same specification as the first through fourth types of micro-bumps or micro-pillars 34 as illustrated in FIG. 3A respectively, each having the adhesion layer 26*a* formed on one of the metal pads of the topmost one of the interconnection metal layers 27 of its backside interconnection scheme for a device (BISD) 79 at the bottoms of the openings 42*a* in the topmost one of the polymer layers 42 of its backside interconnection scheme for a device (BISD) 79.

Referring to FIG. 38, for the ninth type of stacking unit 429, each of the memory chips 251 and control chip 688 of its memory module 159, or its known-good memory or ASIC chip 397 in case of replacing its memory module 159, may have multiple small I/O circuits each coupling to one of multiple small I/O circuits of its application specific integrated-circuit (ASIC) chip 398 through, in sequence, one of the bonded metal pads 6*a* of its memory module 159, or its known-good memory or ASIC chip 397 in case of replacing its memory module 159, and one of the bonded metal pads 6*a* of its application specific integrated-circuit (ASIC) chip 398 for data transmission therebetween with a data bit width of equal to or greater than 64, 128, 256, 512, 1024, 2048, 4096, 8K, or 16K, wherein each of the small I/O circuits of each of the memory chips 251 and control chip 688 of its memory module 159, or its known-good memory or ASIC chip 397 in case of replacing its memory module 159, and each of the small I/O circuits of its application specific integrated-circuit (ASIC) chip 398 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Alternatively, each of the small I/O circuits of each of the memory chips 251 and control chip 688 of its memory module 159, or its known-good memory or ASIC chip 397 in case of replacing its memory module 159, and each of the small I/O circuits of its application specific integrated-circuit (ASIC) chip 398 may have an I/O power efficiency smaller than 0.5 pico-Joules per bit, per switch or per voltage swing, or between 0.01 and 0.5 pico-Joules per bit, per switch or per voltage swing. Further, its application specific integrated-circuit (ASIC) chip 398 may include multiple programmable logic cells (LC) 2014 therein each as seen in FIG. 1 and multiple configurable switches 379 therein each as seen in FIG. 2, employed for a hardware accelerator or machine-learning operator. Further, its memory module 159, or known-good memory or logic chip or known-good ASIC chip, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store a password or key and a cryptography block or circuit configured (1) to encrypt, in accordance with the password or key, configuration data transmitted from or stored in the memory cells 490 for the look-up tables (LUT) 210 of the programmable logic cells (LC) 2014 of its application specific integrated-circuit (ASIC) logic chip 398 or the memory cells 362 of the programmable switch cells 379 of its application specific integrated-circuit (ASIC) logic chip 398 as encrypted configuration data to be passed to its metal bumps or pads 580 and (2) to decrypt, in accordance with the password or key, encrypted configuration data from its metal bumps or pads 580 as decrypted configuration data to be passed to and stored in the memory cells 490 for the look-up tables (LUT) 210 of the programmable logic cells (LC) 2014 of its application specific integrated-circuit (ASIC) logic chip 398 or the memory cells 362 of the programmable switch cells 379 of its application specific integrated-circuit (ASIC) logic chip 398. Further, its memory module 159, or known-good memory or logic chip or known-good ASIC chip, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store configuration data therein to be passed to the memory cells 490 for the look-up tables (LUT) 210 of the programmable logic cells (LC) 2014 of its application specific integrated-circuit (ASIC) logic chip 398 to be stored therein for programming or configuring the programmable logic cells (LC) 2014 of its application specific integrated-circuit (ASIC) logic chip 398 or to the memory cells 362 of the programmable switch cells 379 of its application specific integrated-circuit (ASIC) logic chip 398 to be stored therein for programming or configuring the programmable switch cells 379 of its application specific integrated-circuit (ASIC) logic chip 398. Further, its memory module 159, or known-good memory or logic chip or known-good ASIC chip, may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its application specific integrated-circuit (ASIC) logic chip 398.

Referring to FIG. 38, for the ninth type of stacking unit 429, each of the memory chips 251 and control chip 688 of its memory module 159, or its known-good memory or ASIC chip 397 in case of replacing its memory module 159, may have multiple large input/output (I/O) circuits each coupling to one of its metal bumps or pads 580 for signal transmission or power or ground delivery through each of the interconnection metal layers 27 of its backside interconnection scheme for a device (BISD) 79, wherein each of the large input/output (I/O) circuits of each of the memory chips 251 and control chip 688 of its memory module 159, or its known-good memory or ASIC chip 397 in case of replacing its memory module 159, may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of each of the memory chips 251 and control chip 688 of its memory module 159, or its known-good memory or ASIC chip 397 in case of replacing its memory module 159, may have an I/O power efficiency greater than 3, 5 or 10 pico-Joules per bit, per switch or per voltage swing. Further, its application specific integrated-circuit (ASIC) logic chip 398 may have multiple large input/output (I/O) circuits each coupling to one of its metal bumps or pads 580 for signal transmission or power or ground delivery through, in sequence, one of the dedicated vertical bypasses 698 or its memory module 159 as illustrated in FIG. 5C, or one of the through silicon vias (TSVs) 157 of its known-good memory or ASIC chip 397 in case of replacing its memory module 159, and each of the interconnection metal layers 27 of its backside interconnection scheme for a device (BISD) 79, wherein said one of the dedicated vertical bypasses 698 is not connected to any transistor of each of the memory chips 251 and control chip 688 of its memory module 159, or said one of the through silicon vias (TSVs) 157 is not connected to any transistor of its known-good memory or ASIC chip 397 in case of replacing its memory module 159, wherein each of the large input/output (I/O) circuits of its application specific integrated-circuit (ASIC) logic chip 398 may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of its application specific integrated-circuit (ASIC) logic chip 398 may have an I/O power efficiency greater than 3, 5 or 10 pico-Joules per bit, per switch or per voltage swing. One of the vertical interconnects 699 of its memory module 159 as illustrated in FIG. 5C, or one of the through silicon vias (TSVs) 157 of its known-good memory or ASIC chip 397 in case of replacing its memory module 159, may couple to one of its metal bumps or pads 580 through each of the interconnection metal layers 27 of its backside interconnection scheme for a device (BISD) 79 and to its application specific integrated-circuit (ASIC) chip 398 through one of the metal pads 6*a* of the control chip 688 of its memory module 159 as seen in FIG. 5C, or one of the metal pads 6*a* of its known-good memory or ASIC chip 397 in case of replacing its memory module 159.

Referring to FIG. 38, for the ninth type of stacking unit 429, each of the memory chips 251 and control chip 688 of its memory module 159, or its known-good memory or ASIC chip 397 in case of replacing its memory module 159, may be implemented using a semiconductor node or generation less advanced than or equal to, or above or equal to 20 nm, 30 nm, 40 nm, 50 nm, 90 nm, 130 nm, 250 nm, 350 nm or 500 nm; while its application specific integrated-circuit (ASIC) logic chip 398 may be implemented using a semiconductor node or generation more advanced than or equal to, or below or equal to 20 nm or 10 nm, and for example using a semiconductor node or generation of 16 nm, 14 nm, 12 nm, 10 nm, 7 nm, 5 nm, 3 nm or 2 nm. The semiconductor technology node or generation used in each of the memory chips 251 and control chip 688 of its memory module 159, or its known-good memory or ASIC chip 397 in case of replacing its memory module 159, may be 1, 2, 3, 4, 5 or greater than 5 nodes or generations older, more matured or less advanced than that used in its application specific integrated-circuit (ASIC) logic chip 398. Transistors used in each of the memory chips 251 and control chip 688 of its memory module 159, or its known-good memory or ASIC chip 397 in case of replacing its memory module 159, may be provided with fully depleted silicon-on-insulator (FDSOI) metal-oxide-semiconductor field effect transistors (MOSFETs), partially depleted silicon-on-insulator (PD-SOI) MOSFETs or a planar MOSFETs. Transistors used in each of the memory chips 251 and control chip 688 of its memory module 159, or its known-good memory or ASIC chip 397 in case of replacing its memory module 159, may be different from that used in its application specific integrated-circuit (ASIC) logic chip 398; each of the memory chips 251 and control chip 688 of its memory module 159, or its known-good memory or ASIC chip 397 in case of replacing its memory module 159, may use planar MOSFETs, while its application specific integrated-circuit (ASIC) logic chip 398 may use fin field effect transistors (FINFETs) or gate-all-around field effect transistors (GAAFETs). A power supply voltage (Vcc) applied in each of the memory chips 251 and control chip 688 of its memory module 159, or its known-good memory or ASIC chip 397 in case of replacing its memory module 159, may be greater than or equal to 1.5, 2.0, 2.5, 3, 3.3, 4, or 5 voltages, while a power supply voltage (Vcc) applied in its application specific integrated-circuit (ASIC) logic chip 398 may be smaller than or equal to 1.8, 1.5 or 1 voltage. The power supply voltage applied in each of the memory chips 251 and control chip 688 of its memory module 159, or its known-good memory or ASIC chip 397 in case of replacing its memory module 159, may be higher than that applied in its application specific integrated-circuit (ASIC) logic chip 398. A gate oxide of a field effect transistor (FET) of each of the memory chips 251 and control chip 688 of its memory module 159, or its known-good memory or ASIC chip 397 in case of replacing its memory module 159, may have a physical thickness greater than or equal to 5 nm, 6 nm, 7.5 nm, 10 nm, 12.5 nm, or 15 nm, while a gate oxide of a field effect transistor (FET) of its application specific integrated-circuit (ASIC) logic chip 398 may have a physical thickness less than 4.5 nm, 4 nm, 3 nm or 2 nm. The thickness of the gate oxide of the field effect transistor (FET) of each of the memory chips 251 and control chip 688 of its memory module 159, or its known-good memory or ASIC chip 397 in case of replacing its memory module 159, may be greater than that of its application specific integrated-circuit (ASIC) logic chip 398.

For more elaboration, referring to FIG. 38, for the ninth type of stacking unit 429, its known-good memory or ASIC chip 397 in case of replacing its memory module 159 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in an old technology node when its application specific integrated-circuit (ASIC) logic chip 398 is redesigned using a new technology node or for new application. Alternatively, its known-good memory or ASIC chip 397 in case of replacing its memory module 159 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in a new technology node when its application specific integrated-circuit (ASIC) logic chip 398 is redesigned using a new technology node for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example. Alternatively, each of the memory chips 251 and control chip 688 of its memory module 159, or its known-good memory or ASIC chip 397 in case of replacing its memory module 159, may use an old technology node to cooperate with its application specific integrated-circuit (ASIC) logic chip 398 manufactured using a new technology node. Alternatively, each of the memory chips 251 and control chip 688 of its memory module 159, or its known-good memory or ASIC chip 397 in case of replacing its memory module 159, may use an old technology node to cooperate with its application specific integrated-circuit (ASIC) logic chip 398 for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example. Alternatively, a technology process for forming its known-good memory or ASIC chip 397 in case of replacing its memory module 159 may not be compatible to that for forming its application specific integrated-circuit (ASIC) logic chip 398, wherein its known-good memory or ASIC chip 397 in case of replacing its memory module 159 may be a high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip.

10. Structure for Tenth Type of Stacking Unit

Figure 39:
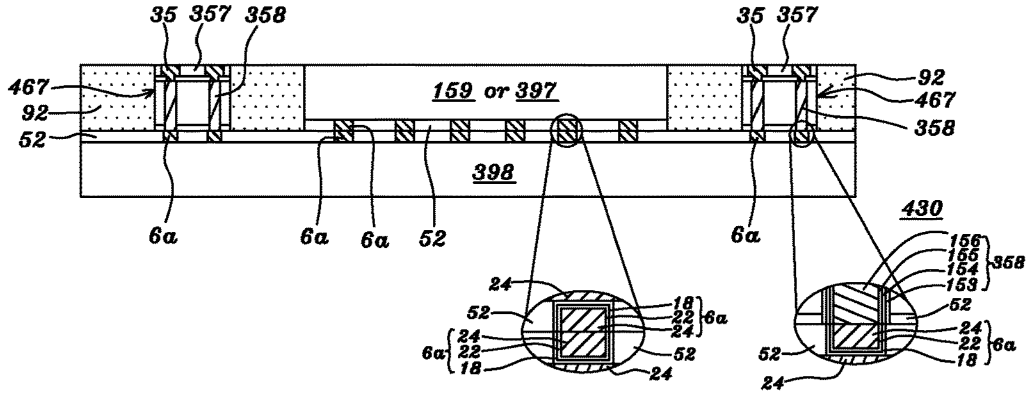
FIG. 39 is a schematically cross-sectional view showing a tenth type of stacking unit in accordance with an embodiment of the present application.

FIG. 39 is a schematically cross-sectional view showing a tenth type of stacking unit in accordance with an embodiment of the present application. Referring to FIG. 39, a tenth type of stacking unit 430 may include (1) a memory module 159 having the same specification as the third type of memory module 159 illustrated in FIG. 5C, (2) an application specific integrated-circuit (ASIC) chip 398 having the same specification as the third type of semiconductor integrated-circuit (IC) chip 100 illustrated in FIG. 3C, wherein the application specific integrated-circuit (ASIC) chip 398 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example, and (3) multiple vertical-through-via (VTV) connectors 467 each having the same specification as the third type of vertical-through-via (VTV) connector 467 illustrated in FIG. 4C to be turned upside down.

Referring to FIG. 39, for the tenth type of stacking unit 430, its application specific integrated-circuit (ASIC) chip 398 may be provided with the insulating bonding layer 52 bonded to the insulating bonding layer 52 of the control chip 688 of its memory module 159 by oxide-to-oxide bonding and the metal pads 6*a* bonded to the metal pads 6*a* of the control chip 688 of its memory module 159 by metal-to-metal bonding, e.g., copper-to-copper bonding. The control chip 688 of its memory module 159 may have the semiconductor devices 4 such as transistors at the active surface of the semiconductor substrate 2 thereof as illustrated in FIG. 5C, and the active surface of the semiconductor substrate 2 of the control chip 688 of its memory module 159 may face an active surface of the semiconductor substrate 2 of its application specific integrated-circuit (ASIC) logic chip 398, wherein its application specific integrated-circuit (ASIC) logic chip 398 may have the semiconductor devices 4 such as transistors at the active surface of the semiconductor substrate 2 thereof as illustrated in FIG. 3C. Each of its vertical-through-via (VTV) connectors 467 may be provided with the insulating bonding layer 52 bonded to the insulating bonding layer 52 of the control chip 688 of its memory module 159 by oxide-to-oxide bonding and the metal pads 6*a* bonded to the metal pads 6*a* of the control chip 688 of its memory module 159 by metal-to-metal bonding, e.g., copper-to-copper bonding.

Alternatively, referring to FIG. 39, for the tenth type of stacking unit 430, its memory module 159 may be replaced with a known-good memory or application-specific-integrated-circuit (ASIC) chip 397, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip or power-management integrated-circuit (IC) chip. For the tenth type of stacking unit 430, its known-good memory or application-specific-integrated-circuit (ASIC) chip 397 in case of replacing its memory module 159 may have the same specification as the third type of semiconductor integrated-circuit (IC) chip 100 illustrated in FIG. 3C and may be bonded to its application specific integrated-circuit (ASIC) chip 398 and each of its vertical-through-via (VTV) connectors 467 using an oxide-to-oxide and metal-to-metal direct bonding method. The oxide-to-oxide and metal-to-metal direct bonding method may include (1) oxide-to-oxide bonding the insulating bonding layer 52 at the active side of its known-good memory or application-specific-integrated-circuit (ASIC) chip 397 to the insulating bonding layer 52 of its application specific integrated-circuit (ASIC) chip 398 and to the insulating bonding layer 52 of each of its vertical-through-via (VTV) connectors 467, and (2) metal-to-metal bonding, e.g., copper-to-copper bonding, the metal pads 6*a*, such as copper pads, at the active side of its known-good memory or application-specific-integrated-circuit (ASIC) chip 397 to the metal pads 6*a*, such as copper pads, of its application specific integrated-circuit (ASIC) chip 398 and to the metal pads 6*a*, such as copper pads, of each of its vertical-through-via (VTV) connectors 467. For the tenth type of stacking unit 430, its known-good memory or application-specific-integrated-circuit (ASIC) chip 397 may include analog circuits, mixed-mode signal circuits, radio-frequency (RF) circuits, and/or transmitter, receiver or transceiver circuits therein. For the tenth type of stacking unit 430, its known-good memory or ASIC chip 397 in case of replacing its memory module 159 may have the semiconductor devices 4 such as transistors at the active surface of the semiconductor substrate 2 thereof as illustrated in FIG. 3C, and the active surface of the semiconductor substrate 2 of its known-good memory chip may face an active surface of the semiconductor substrate 2 of its application specific integrated-circuit (ASIC) logic chip 398, wherein its application specific integrated-circuit (ASIC) logic chip 398 may have the semiconductor devices 4 such as transistors at the active surface of the semiconductor substrate 2 thereof as illustrated in FIG. 3C.

Alternatively, for the tenth type of stacking unit 430, its memory module 159 may have the same specification as the first type of memory module 159 illustrated in FIG. 5A, its known-good memory or ASIC chip 397 in case of replacing its memory module 159 may have the same specification as the first type of semiconductor integrated-circuit chip 100 illustrated in FIG. 3A, each of its vertical-through-via (VTV) connectors 467 may have the same specification as the first type of vertical-through-via (VTV) connector 467 illustrated in FIG. 4A and its application specific integrated-circuit (ASIC) chip 398 may have the same specification as the first type of semiconductor integrated-circuit (IC) chip as illustrated in FIG. 3A, wherein each of its vertical-through-via (VTV) connectors 467 and its memory module 159, or known-good memory or ASIC chip 397 in case of replacing its memory module 159, may be provided with the first, second, third or fourth type of micro-bumps or micro-pads 34 each bonded to one of the first, second, third or fourth type of micro-bumps or micro-pads 34 of its application specific integrated-circuit (ASIC) chip 398 to form a bonded metal bump or contact 168 therebetween by a step for one of the first through fourth cases as illustrated in FIGS. 5A, 6A and 6B in which each of its vertical-through-via (VTV) connectors 467 and its memory module 159, or known-good memory or ASIC chip 397 in case of replacing its memory module 159, may be considered as the upper one of the memory chips 251 of the memory module 159 illustrated in FIGS. 5A, 6A and 6B, and its application specific integrated-circuit (ASIC) chip 398 may be considered as the lower one of the memory chips 251 or the control chip 688 of the memory module 159 illustrated in FIGS. 5A, 6A and 6B. In this case, the tenth type of stacking unit 430 may further include an underfill, e.g., polymer layer, between its application specific integrated-circuit (ASIC) chip 398 and its memory module 159, or known-good memory or ASIC chip 397 in case of replacing its memory module 159, and between its application specific integrated-circuit (ASIC) chip 398 and each of its vertical-through-via (VTV) connectors 467, covering a sidewall of each of its bonded metal bumps or contacts 168 between its application specific integrated-circuit (ASIC) chip 398 and its memory module 159, or known-good memory or ASIC chip 397 in case of replacing its memory module 159, or between its application specific integrated-circuit (ASIC) chip 398 and vertical-through-via (VTV) connector 467.

Referring to FIG. 39, the tenth type of stacking unit 430 may include a polymer layer 92, e.g., resin or compound, on the insulating bonding layer 52 of the control chip 688 of its memory module 159 or on the insulating bonding layer 52 of its known-good memory or ASIC chip 397 in case of replacing its memory module 159, wherein its polymer layer 92 may have the same specification as the first polymer layer 92-1 of the ninth type of stacking unit 429. For the tenth type of stacking unit 430, its polymer layer 92 may have a portion between its memory module 159, or its known-good memory or ASIC chip 397 in case of replacing its memory module 159, and one of its vertical-through-via (VTV) connectors 467, and its polymer layer 92 may have a top surface coplanar to a top surface of its application specific integrated-circuit (ASIC) logic chip 398 and a top surface of each of its vertical-through-via (VTV) connectors 467. For more elaboration, the copper layer 32 of each of the micro-bumps or micro-pads 35 of each of its vertical-through-via (VTV) connectors 467 may have a top surface coplanar to the top surface of its polymer layer 92 and a top surface of the insulating dielectric layer 357 of each of its vertical-through-via (VTV) connectors 467.

Referring to FIG. 39, for the tenth type of stacking unit 430, each of the memory chips 251 and control chip 688 of its memory module 159, or its known-good memory or ASIC chip 397 in case of replacing its memory module 159, may have multiple small I/O circuits each coupling to one of multiple small I/O circuits of its application specific integrated-circuit (ASIC) chip 398 through, in sequence, one of the bonded metal pads 6*a* of its memory module 159, or its known-good memory or ASIC chip 397 in case of replacing its memory module 159, and one of the bonded metal pads 6*a* of its application specific integrated-circuit (ASIC) chip 398 for data transmission therebetween with a data bit width of equal to or greater than 64, 128, 256, 512, 1024, 2048, 4096, 8K, or 16K, wherein each of the small I/O circuits of each of the memory chips 251 and control chip 688 of its memory module 159, or its known-good memory or ASIC chip 397 in case of replacing its memory module 159, and each of the small I/O circuits of its application specific integrated-circuit (ASIC) chip 398 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Alternatively, each of the small I/O circuits of each of the memory chips 251 and control chip 688 of its memory module 159, or its known-good memory or ASIC chip 397 in case of replacing its memory module 159, and each of the small I/O circuits of its application specific integrated-circuit (ASIC) chip 398 may have an I/O power efficiency smaller than 0.5 pico-Joules per bit, per switch or per voltage swing, or between 0.01 and 0.5 pico-Joules per bit, per switch or per voltage swing. Further, its application specific integrated-circuit (ASIC) chip 398 may include multiple programmable logic cells (LC) 2014 therein each as seen in FIG. 1 and multiple configurable switches 379 therein each as seen in FIG. 2, employed for a hardware accelerator or machine-learning operator. Further, its memory module 159, or known-good memory or logic chip or known-good ASIC chip, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store a password or key and its application specific integrated-circuit (ASIC) chip 398 include a cryptography block or circuit configured (1) to encrypt, in accordance with the password or key, configuration data transmitted from or stored in the memory cells 490 for the look-up tables (LUT) 210 of the programmable logic cells (LC) 2014 of its application specific integrated-circuit (ASIC) logic chip 398 or the memory cells 362 of the programmable switch cells 379 of its application specific integrated-circuit (ASIC) logic chip 398 as encrypted configuration data to be passed to the micro-bumps or micro-pads 35 of each of its vertical-through-via (VTV) connectors 467 through the vertical through vias (VTVs) 358 of each of its vertical-through-via (VTV) connectors 467 and (2) to decrypt, in accordance with the password or key, encrypted configuration data transmitted from the micro-bumps or micro-pads 35 of each of its vertical-through-via (VTV) connectors 467 through the vertical through vias (VTVs) 358 of each of its vertical-through-via (VTV) connectors 467 as decrypted configuration data to be passed to and stored in the memory cells 490 for the look-up tables (LUT) 210 of the programmable logic cells (LC) 2014 of its application specific integrated-circuit (ASIC) logic chip 398 or the memory cells 362 of the programmable switch cells 379 of its application specific integrated-circuit (ASIC) logic chip 398. Further, its memory module 159, or known-good memory or logic chip or known-good ASIC chip, may include multiple non-volatile memory cells, such as NAND memory cells, NOR memory cells, resistive-random-access-memory (RRAM) cells, magnetoresistive-random-access-memory (MRAM)

cells, ferroelectric-random-access-memory (FRAM) cells or phase-change-random-access-memory (PCM) cells, configured to store configuration data therein to be passed to the memory cells 490 for the look-up tables (LUT) 210 of the programmable logic cells (LC) 2014 of its application specific integrated-circuit (ASIC) logic chip 398 to be stored therein for programming or configuring the programmable logic cells (LC) 2014 of its application specific integrated-circuit (ASIC) logic chip 398 or to the memory cells 362 of the programmable switch cells 379 of its application specific integrated-circuit (ASIC) logic chip 398 to be stored therein for programming or configuring the programmable switch cells 379 of its application specific integrated-circuit (ASIC) logic chip 398. Further, its memory module 159, or known-good memory or logic chip or known-good ASIC chip, may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its application specific integrated-circuit (ASIC) logic chip 398.

Referring to FIG. 39, for the tenth type of stacking unit 430, its application specific integrated-circuit (ASIC) logic chip 398 may have multiple large input/output (I/O) circuits each coupling to one of the micro-bumps or micro-pads 35 of one of its vertical-through-via (VTV) connectors 467 through one of the vertical through vias (VTVs) 358 of said one of its vertical-through-via (VTV) connectors 467 for signal transmission or power or ground delivery, wherein each of the large input/output (I/O) circuits of its application specific integrated-circuit (ASIC) logic chip 398 may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of its application specific integrated-circuit (ASIC) logic chip 398 may have an I/O power efficiency greater than 3, 5 or 10 pico-Joules per bit, per switch or per voltage swing.

Referring to FIG. 39, for the tenth type of stacking unit 430, each of the memory chips 251 and control chip 688 of its memory module 159, or its known-good memory or ASIC chip 397 in case of replacing its memory module 159, may be implemented using a semiconductor node or generation less advanced than or equal to, or above or equal to 20 nm, 30 nm, 40 nm, 50 nm, 90 nm, 130 nm, 250 nm, 350 nm or 500 nm; while its application specific integrated-circuit (ASIC) logic chip 398 may be implemented using a semiconductor node or generation more advanced than or equal to, or below or equal to 20 nm or 10 nm, and for example using a semiconductor node or generation of 16 nm, 14 nm, 12 nm, 10 nm, 7 nm, 5 nm, 3 nm or 2 nm. The semiconductor technology node or generation used in each of the memory chips 251 and control chip 688 of its memory module 159, or its known-good memory or ASIC chip 397 in case of replacing its memory module 159, may be 1, 2, 3, 4, 5 or greater than 5 nodes or generations older, more matured or less advanced than that used in its application specific integrated-circuit (ASIC) logic chip 398. Transistors used in each of the memory chips 251 and control chip 688 of its memory module 159, or its known-good memory or ASIC chip 397 in case of replacing its memory module 159, may be provided with fully depleted silicon-on-insulator (FDSOI) metal-oxide-semiconductor field effect transistors (MOSFETs), partially depleted silicon-on-insulator (PD-SOI) MOSFETs or a planar MOSFETs. Transistors used in each of the memory chips 251 and control chip 688 of its memory module 159, or its known-good memory or ASIC chip 397 in case of replacing its memory module 159, may be different from that used in its application specific integrated-circuit (ASIC) logic chip 398; each of the memory chips 251 and control chip 688 of its memory module 159, or its known-good memory or ASIC chip 397 in case of replacing its memory module 159, may use planar MOSFETs, while its application specific integrated-circuit (ASIC) logic chip 398 may use fin field effect transistors (FINFETs) or gate-all-around field effect transistors (GAAFETs). A power supply voltage (Vcc) applied in each of the memory chips 251 and control chip 688 of its memory module 159, or its known-good memory or ASIC chip 397 in case of replacing its memory module 159, may be greater than or equal to 1.5, 2.0, 2.5, 3, 3.3, 4, or 5 voltages, while a power supply voltage (Vcc) applied in its application specific integrated-circuit (ASIC) logic chip 398 may be smaller than or equal to 1.8, 1.5 or 1 voltage. The power supply voltage applied in each of the memory chips 251 and control chip 688 of its memory module 159, or its known-good memory or ASIC chip 397 in case of replacing its memory module 159, may be higher than that applied in its application specific integrated-circuit (ASIC) logic chip 398. A gate oxide of a field effect transistor (FET) of each of the memory chips 251 and control chip 688 of its memory module 159, or its known-good memory or ASIC chip 397 in case of replacing its memory module 159, may have a physical thickness greater than or equal to 5 nm, 6 nm, 7.5 nm, 10 nm, 12.5 nm, or 15 nm, while a gate oxide of a field effect transistor (FET) of its application specific integrated-circuit (ASIC) logic chip 398 may have a physical thickness less than 4.5 nm, 4 nm, 3 nm or 2 nm. The thickness of the gate oxide of the field effect transistor (FET) of each of the memory chips 251 and control chip 688 of its memory module 159, or its known-good memory or ASIC chip 397 in case of replacing its memory module 159, may be greater than that of its application specific integrated-circuit (ASIC) logic chip 398.

For more elaboration, referring to FIG. 39, for the tenth type of stacking unit 430, its known-good memory or ASIC chip 397 in case of replacing its memory module 159 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in an old technology node when its application specific integrated-circuit (ASIC) logic chip 398 is redesigned using a new technology node or for new application. Alternatively, its known-good memory or ASIC chip 397 in case of replacing its memory module 159 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in a new technology node when its application specific integrated-circuit (ASIC) logic chip 398 is redesigned using a new technology node for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example. Alternatively, each of the memory chips 251 and control chip 688 of its memory module 159, or its known-good memory or ASIC chip 397 in case of replacing its memory module 159, may use an old technology node to cooperate with its application specific integrated-circuit (ASIC) logic chip 398 manufactured using a new technology node. Alternatively, each of the memory chips 251 and control chip 688 of its memory module 159, or its known-good memory or ASIC chip 397 in case of replacing its memory module 159, may use an old technology node to cooperate with its application specific integrated-circuit (ASIC) logic chip 398 for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example. Alternatively, a technology process for forming its known-good memory or ASIC chip 397 in case of replacing its memory module 159 may not be compatible to that for forming its application specific integrated-circuit (ASIC) logic chip 398, wherein its known-good memory or ASIC chip 397 in case of replacing its memory module 159 may be a high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip.

11. Structure for Eleventh Type of Stacking Unit

Figure 40:
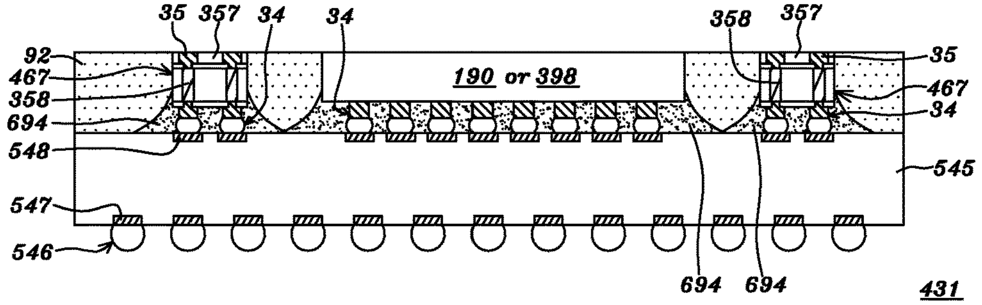
FIG. 40 is a schematically cross-sectional view showing an eleventh type of stacking unit in accordance with an embodiment of the present application.

FIG. 40 is a schematically cross-sectional view showing an eleventh type of stacking unit in accordance with an embodiment of the present application. Referring to FIG. 40, an eleventh type of stacking unit 431 may include (1) a circuit board 545 having multiple patterned metal layers (not shown) and multiple polymer layers, i.e., insulating dielectric layers, (not shown) each between neighboring two of the patterned metal layers of its circuit board 545, (2) multiple solder balls 546 each attached to a metal pad 547 of a bottommost one of the patterned metal layers of its circuit board 545, (3) an application specific integrated-circuit (ASIC) chip 398 provided over its circuit board 545, having the same specification as the first type of semiconductor integrated-circuit (IC) chip 100 illustrated in FIG. 3A to be turned upside down, wherein its application specific integrated-circuit (ASIC) chip 398 may have the micro-bumps or micro-pads 34 each bonded to a metal pad 548 of a topmost one of the patterned metal layers of its circuit board 545, wherein its application specific integrated-circuit (ASIC) chip 398 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example, wherein its application specific integrated-circuit (ASIC) chip 398 may be alternatively replaced with the first type of sub-system module 190 as illustrated in FIG. 7A provided over its circuit board 545 and turned upside down, having the micro-bumps or micro-pads 34 each bonded to one of the metal pads 548 of a topmost one of the patterned metal layers of its circuit board 545, (4) multiple of the first type of vertical-through-via (VTV) connectors 467 as illustrated in FIG. 7A provided over its circuit board 545 and turned upside down, having the micro-bumps or micro-pads 34 each bonded to the topmost one of the patterned metal layers of its circuit board 545, (5) an underfill 694, e.g., polymer layer, provided between its circuit board 545 and each of its application specific integrated-circuit (ASIC) chip 398, or its first type of sub-system module 190 in case of replacing its application specific integrated-circuit (ASIC) chip 398, and its first type of vertical-through-via (VTV) connectors 467, covering a sidewall of each of the micro-bumps or micro-pads 34 of each of its application specific integrated-circuit (ASIC) chip 398, of its first type of sub-system module 190 in case of replacing its application specific integrated-circuit (ASIC) chip 398, and its first type of vertical-through-via (VTV) connectors 467, (6) a polymer layer 92, or insulating dielectric layer, provided over its circuit board 545 and between each neighboring two of its application specific integrated-circuit (ASIC) chips 398, or the sub-system modules 190 in case of replacing its application specific integrated-circuit (ASIC) chip 398, and its vertical-through-via (VTV) connectors 467, wherein its polymer layer 92 may have the same specification as the polymer layer 92 of the first type of stacking unit 421 illustrated in FIGS. 34A-34E, wherein the copper layer 32 of each of the micro-bumps or micro-pads 35 of each of its vertical-through-via (VTV) connectors 467 may have a top surface coplanar to a top surface of the insulating dielectric layer 357 of each of its vertical-through-via (VTV) connectors 467, a top surface of the semiconductor substrate 2 of its application specific integrated-circuit (ASIC) chip 398, or a top surface of the semiconductor substrate 2 of the application specific integrated-circuit (ASIC) chip 399 of its first type of sub-system module 190 in case of replacing its application specific integrated-circuit (ASIC) chip 398, and a top surface of its polymer layer 92.

Specification for Chip Package

1. Structure for First Type of Chip Package

Figure 41A:
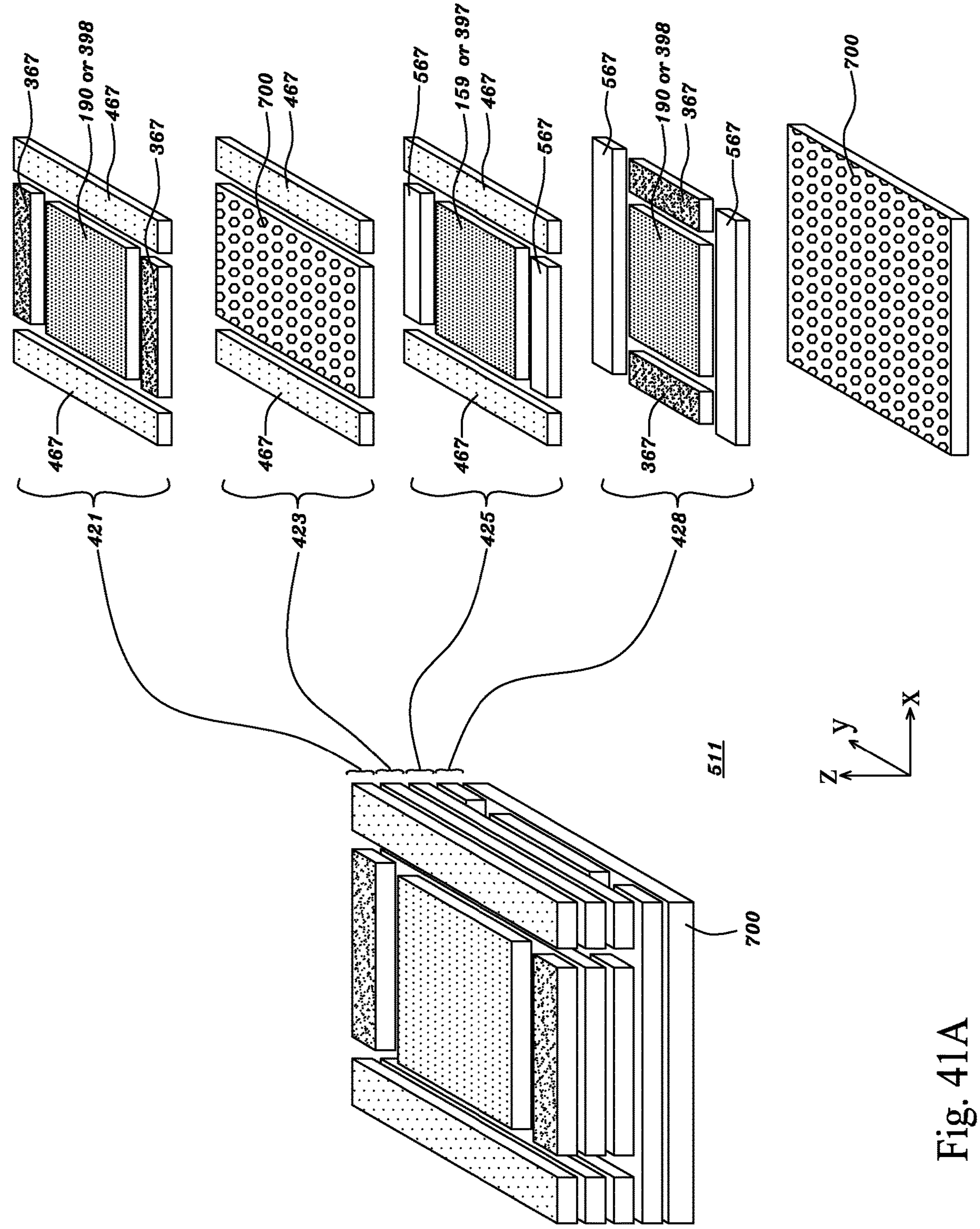
FIG. 41A is a schematically perspective view showing a first type of chip package in accordance with an embodiment of the present application.
Figure 41B:
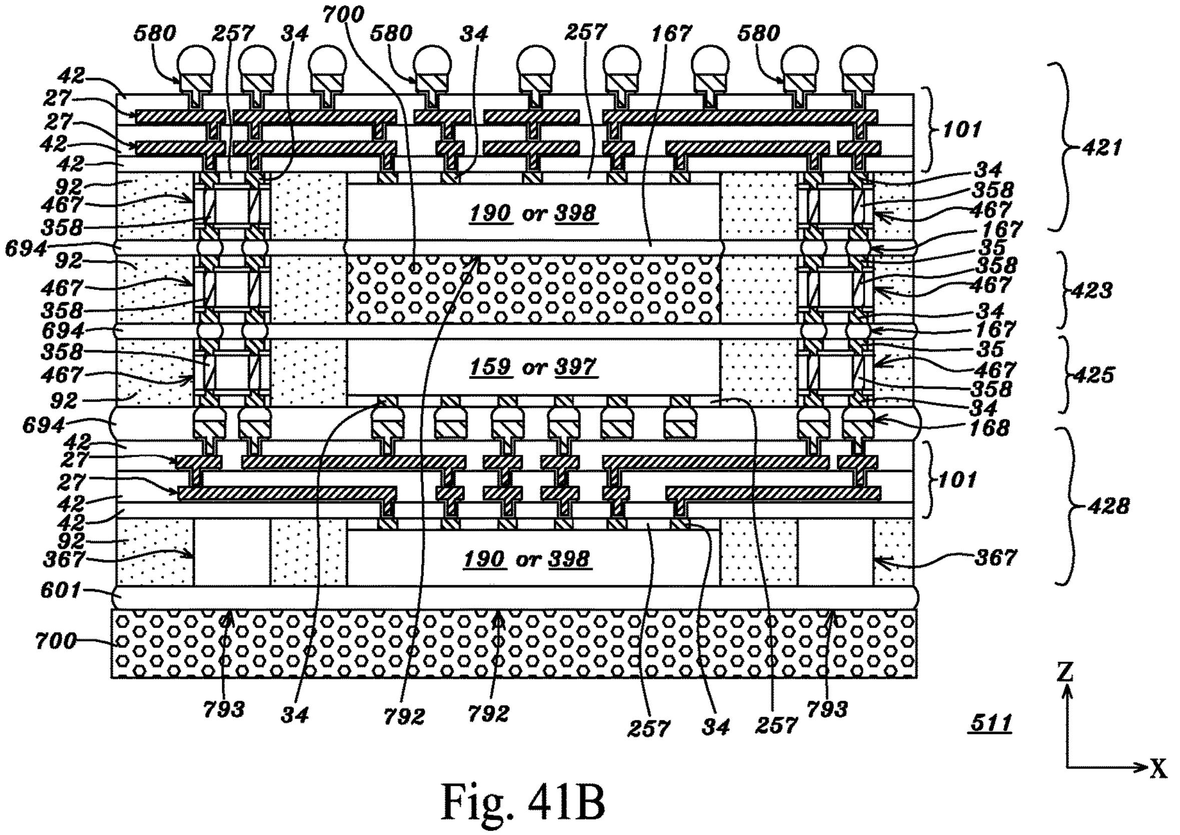
FIG. 41B is a schematically cross-sectional view showing a first type of chip package in an x-z plane in accordance with an embodiment of the present application.
Figure 41C:
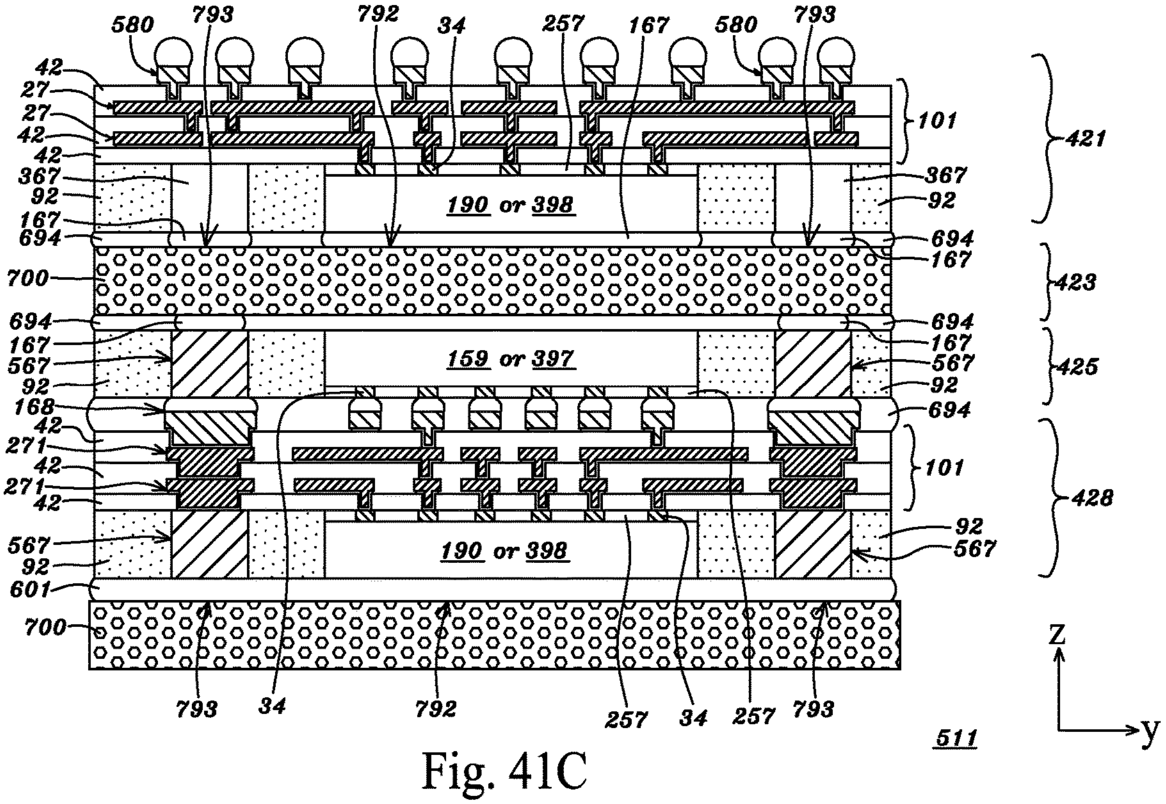
FIG. 41C is a schematically cross-sectional view showing first and second types of chip packages in a y-z plane in accordance with an embodiment of the present application.

FIG. 41A is a schematically perspective view showing a first type of chip package in accordance with an embodiment of the present application. FIG. 41B is a schematically cross-sectional view showing a first type of chip package in an x-z plane in accordance with an embodiment of the present application. FIG. 41C is a schematically cross-sectional view showing first and second types of chip packages in a y-z plane in accordance with an embodiment of the present application. Referring to FIGS. 41A, 41B and 41C, a first type of chip package 511 may include (1) the eighth type of stacking unit 428 as illustrated in FIGS. 37A and 37B, (2) the fifth type of stacking unit 425 as illustrated in FIGS. 36A and 36B provided over its eighth type of stacking unit 428, having the metal bumps or pads 580 each bonded to one of the metal bumps or pads 580 of its eighth type of stacking unit 428 to form a bonded metal bump or contact 168 by a step for one of the first through fourth cases as illustrated in FIGS. 5A, 6A and 6B in which its fifth type of stacking unit 425 may be considered as the upper one of the memory chips 251 of the memory module 159 illustrated in FIGS. 5A, 6A and 6B, and its eighth type of stacking unit 428 may be considered as the lower one of the memory chips 251 or the control chip 688 of the memory module 159 illustrated in FIGS. 5A, 6A and 6B, wherein an underfill 694, e.g., polymer layer, may be provided between its fifth and eighth types of stacking units 425 and 428, covering a sidewall of each of its bonded metal bumps or contacts 168 between its fifth and eighth types of stacking units 425 and 428, (3) the third type of stacking unit 423 as illustrated in FIG. 35D provided over its fifth type of stacking unit 425, wherein a tin-containing bump 167 may be provided with a top end joining the bottom surface of each of the micro-bumps or micro-pads 35 of each of the vertical-through-via (VTV) connectors 467 of its third type of stacking unit 423 and a bottom end joining the top surface of one of the micro-bumps or micro-pads 35 of one of the vertical-through-via (VTV) connectors 467 of its fifth type of stacking unit 425, and a tin-containing bump 167 may be provided with a top end acting as the cold region 793, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, joining the micro heat pipe 700 of its third type of stacking unit 423 at the bottom surface thereof and a bottom end joining the top surface of each of the metal plates 567 of its fifth type of stacking unit 425, wherein an underfill 694, e.g., polymer layer, may be provided between its third and fifth types of stacking units 423 and 425, covering a sidewall of each of its tin-containing bumps 167 between its third and fifth types of stacking units 423 and 425, (4) the first type of stacking unit 421 as illustrated in FIGS. 34E and 34F provided over its third type of stacking unit 423, wherein a tin-containing bump 167 may be provided with a top end joining the bottom surface of each of the micro-bumps or micro-pads 35 of each of the vertical-through-via (VTV) connectors 467 of its first type of stacking unit 421 and a bottom end joining the top surface of one of the micro-bumps or micro-pads 34 of one of the vertical-through-via (VTV) connectors 467 of its third type of stacking unit 423, a tin-containing bump 167 may be provided with a top end joining the bottom surface of the semiconductor substrate 2 of the application specific integrated-circuit (ASIC) chip 398 of its first type of stacking unit 421, or the bottom surface of the application specific integrated-circuit (ASIC) chip 399 of the operation unit 190 of its first type of stacking unit 421 in case of replacing the application specific integrated-circuit (ASIC) chip 398 of its first type of stacking unit 421, and a bottom end acting as the hot region 792, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, joining the micro heat pipe 700 of its third type of stacking unit 423 at the top surface thereof, and a tin-containing bump 167 may be provided with a top end joining the bottom surface of each of the dummy semiconductor chips 367 of its first type of stacking unit 421 and a bottom end acting as the cold region 793, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, joining the micro heat pipe 700 of its third type of stacking unit 423 at the top surface thereof, wherein an underfill 694, e.g., polymer layer, may be provided between its first and third types of stacking units 421 and 423, covering a sidewall of each of its tin-containing bumps 167 between its first and third types of stacking units 421 and 423, and (5) another micro heat pipe 700, which may be any of the first type of micro heat pipes 700 for the first through eighth alternatives as illustrated in FIGS. 16C, 17C, 18C, 19C, 20E, 21E, 22B and 23C and the second type of micro heat pipes 700 for the first through seventh alternatives as illustrated in FIGS. 25-31, having a thickness between 100 and 400 micrometers provided at its bottom and under its eighth type of stacking unit 428, wherein a thermally conductive adhesive or layer 601, such as a tin-containing material, may be provided with a top end joining the bottom surface of the semiconductor substrate 2 of the application specific integrated-circuit (ASIC) chip 398 of its eighth type of stacking unit 428, or the bottom surface of the application specific integrated-circuit (ASIC) chip 399 of the operation unit 190 of its eighth type of stacking unit 428 in case of replacing the application specific integrated-circuit (ASIC) chip 398 of its eighth type of stacking unit 428, the bottom surface of each of the dummy semiconductor chips 367 of its eighth type of stacking unit 428 and the bottom surface of each of the metal plates 567 of its eighth type of stacking unit 428, and a bottom end joining a top surface of its micro heat pipe 700 at its bottom. The application specific integrated-circuit (ASIC) chip 398 of its eighth type of stacking unit 428, or the bottom surface of the application specific integrated-circuit (ASIC) chip 399 of the operation unit 190 of its eighth type of stacking unit 428 in case of replacing the application specific integrated-circuit (ASIC) chip 398 of its eighth type of stacking unit 428, may act as the hot region 792, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, aligned with its micro heat pipe 700 at its bottom. Each of the dummy semiconductor chips 367 of its eighth type of stacking unit 428 may act as the cold region 793, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, aligned with its micro heat pipe 700 at its bottom.

Alternatively, referring to FIGS. 41A, 41B and 41C, for the first type of chip package 511, its fifth type of stacking unit 425 may be replaced with the seventh type of stacking unit 427 as illustrated in FIGS. 36D and 36E provided over its eighth type of stacking unit 428, having the metal bumps or pads 580 each bonded to one of the metal bumps or pads 580 of its eighth type of stacking unit 428 to form a bonded metal bump or contact 168 by a step for one of the first through fourth cases as illustrated in FIGS. 5A, 6A and 6B in which its seventh type of stacking unit 427 may be considered as the upper one of the memory chips 251 of the memory module 159 illustrated in FIGS. 5A, 6A and 6B, and its eighth type of stacking unit 428 may be considered as the lower one of the memory chips 251 or the control chip 688 of the memory module 159 illustrated in FIGS. 5A, 6A and 6B, wherein an underfill 694, e.g., polymer layer, may be provided between its seventh and eighth types of stacking units 427 and 428, covering a sidewall of each of its bonded metal bumps or contacts 168 between its seventh and eighth types of stacking units 427 and 428. Its third type of stacking unit 423 may be provided over its seventh type of stacking unit 427, wherein a tin-containing bump 167 may be provided with a top end joining the bottom surface of each of the micro-bumps or micro-pads 35 of each of the vertical-through-via (VTV) connectors 467 of its third type of stacking unit 423 and a bottom end joining the top surface of one of the micro-bumps or micro-pads 35 of one of the vertical-through-via (VTV) connectors 467 of its seventh type of stacking unit 427, and a tin-containing bump 167 may be provided with a top end acting as the cold region 793, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, joining the micro heat pipe 700 of its third type of stacking unit 423 at the bottom surface thereof and a bottom end joining the top surface of each of the metal plates 567 of its seventh type of stacking unit 427, wherein an underfill 694, e.g., polymer layer, may be provided between its third and seventh types of stacking units 423 and 427, covering a sidewall of each of its tin-containing bumps 167 between its third and seventh types of stacking units 423 and 427.

Referring to FIGS. 41A, 41B and 41C, for the first type of chip package 511 or its alternative, each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may have multiple small I/O circuits each coupling to one of multiple small I/O circuits of the application specific integrated-circuit (ASIC) chip 398 of its eighth type of stacking unit 428 through, in sequence, one of the micro-bumps or micro-pads 34 of the control chip 688 of the memory module 159 of its fifth or seventh type of stacking unit 425 or 427, or one of the micro-bumps or micro-pads 34 of the known-good memory or ASIC chip 397 of its fifth or seventh type of stacking unit 425 or 427 in case of replacing the memory module 159 of its fifth or seventh type of stacking unit 425 or 427, each of the interconnection metal layers 27 of the frontside interconnection scheme for a device (FISD) 101 of its seventh type of stacking unit 427 for its alternative, one of its bonded metal bumps or contacts 168 between its fifth or seventh type of stacking unit 425 or 427 and its eighth type of stacking unit 428, each of the interconnection metal layers 27 of the frontside interconnection scheme for a device (FISD) 101 of its eighth type of stacking unit 428 and one of the micro-bumps or micro-pads 34 of the application specific integrated-circuit (ASIC) chip 398 of its eighth type of stacking unit 428 for data transmission therebetween with a data bit width of equal to or greater than 64, 128, 256, 512, 1024, 2048, 4096, 8K, or 16K, wherein each of the small I/O circuits of each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, and each of the small I/O circuits of the application specific integrated-circuit (ASIC) chip 398 of its eighth type of stacking unit 428 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Alternatively, each of the small I/O circuits of each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, and each of the small I/O circuits of the application specific integrated-circuit (ASIC) chip 398 of its eighth type of stacking unit 428 may have an I/O power efficiency smaller than 0.5 pico-Joules per bit, per switch or per voltage swing, or between 0.01 and 0.5 pico-Joules per bit, per switch or per voltage swing. Further, the application specific integrated-circuit (ASIC) chip 398 of its eighth type of stacking unit 428 may include multiple programmable logic cells (LC) 2014 therein each as seen in FIG. 1 and multiple configurable switches 379 therein each as seen in FIG. 2, employed for a hardware accelerator or machine-learning operator. Further, the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store a password or key therein and the application specific integrated-circuit (ASIC) chip 398 of its eighth type of stacking unit 428 may include a cryptography block or circuit configured (1) to encrypt, in accordance with the password or key, configuration data transmitted from or stored in the memory cells 490 for the look-up tables (LUT) 210 of the programmable logic cells (LC) 2014 of the application specific integrated-circuit (ASIC) logic chip 398 of its eighth type of stacking unit 428 or the memory cells 362 of the programmable switch cells 379 of the application specific integrated-circuit (ASIC) logic chip 398 of its eighth type of stacking unit 428 as encrypted configuration data to be passed to the metal bumps or pads 580 of its first type of stacking unit 421 and (2) to decrypt, in accordance with the password or key, encrypted configuration data from the metal bumps or pads 580 of its first type of stacking unit 421 as decrypted configuration data to be passed to and stored in the memory cells 490 for the look-up tables (LUT) 210 of the programmable logic cells (LC) 2014 of the application specific integrated-circuit (ASIC) logic chip 398 of its eighth type of stacking unit 428 or the memory cells 362 of the programmable switch cells 379 of the application specific integrated-circuit (ASIC) logic chip 398 of its eighth type of stacking unit 428. Further, the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store configuration data therein to be passed to the memory cells 490 for the look-up tables (LUT) 210 of the programmable logic cells (LC) 2014 of the application specific integrated-circuit (ASIC) logic chip 398 of its eighth type of stacking unit 428 to be stored therein for programming or configuring the programmable logic cells (LC) 2014 of the application specific integrated-circuit (ASIC) logic chip 398 of its eighth type of stacking unit 428 or to the memory cells 362 of the programmable switch cells 379 of the application specific integrated-circuit (ASIC) logic chip 398 of its eighth type of stacking unit 428 to be stored therein for programming or configuring the programmable switch cells 379 of the application specific integrated-circuit (ASIC) logic chip 398 of its eighth type of stacking unit 428. Further, the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to the application specific integrated-circuit (ASIC) logic chip 398 of its eighth type of stacking unit 428.

Referring to FIGS. 41A, 41B and 41C, for the first type of chip package 511, each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may have multiple large input/output (I/O) circuits each coupling to one of the metal bumps or pads 580 of its first type of stacking unit 421 for signal transmission or power or ground delivery (1) through, in sequence, one or more of the interconnection metal layers 27 of the frontside interconnection scheme for a device (FISD) 101 of its eighth type of stacking unit 428, one of the vertical through vias (VTVs) 358 of one of the vertical-through-via (VTV) connectors 467 of its fifth type of stacking unit 425, one of the vertical through vias (VTVs) 358 of one of the vertical-through-via (VTV) connectors 467 of its third type of stacking unit 423, one of the vertical through vias (VTVs) 358 of one of the vertical-through-via (VTV) connectors 467 of its first type of stacking unit 421 and each of the interconnection metal layers 27 of the frontside interconnection scheme for a device (FISD) 101 of its first type of stacking unit 421, or for its alternative (2) through, in sequence, one or more of the interconnection metal layers 27 of the frontside interconnection scheme for a device (FISD) 101 of its seventh type of stacking unit 427, one of the vertical through vias (VTVs) 358 of one of the vertical-through-via (VTV) connectors 467 of its seventh type of stacking unit 427, one of the vertical through vias (VTVs) 358 of one of the vertical-through-via (VTV) connectors 467 of its third type of stacking unit 423, one of the vertical through vias (VTVs) 358 of one of the vertical-through-via (VTV) connectors 467 of its first type of stacking unit 421 and each of the interconnection metal layers 27 of the frontside interconnection scheme for a device (FISD) 101 of its first type of stacking unit 421, wherein each of the large input/output (I/O) circuits of each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may have an I/O power efficiency greater than 3, 5 or 10 pico-Joules per bit, per switch or per voltage swing. Further, the application specific integrated-circuit (ASIC) logic chip 398 of its eighth type of stacking unit 428 may have multiple large input/output (I/O) circuits each coupling to one of the metal bumps or pads 580 of its first type of stacking unit 421 for signal transmission or power or ground delivery through, in sequence, each of the interconnection metal layers 27 of the frontside interconnection scheme for a device (FISD) 101 of its eighth type of stacking unit 428, each of the interconnection metal layers 27 of the frontside interconnection scheme for a device (FISD) 101 of its seventh type of stacking unit 427 for its alternative, one of the vertical through vias (VTVs) 358 of one of the vertical-through-via (VTV) connectors 467 of its fifth or seventh type of stacking unit 425 or 427, one of the vertical through vias (VTVs) 358 of one of the vertical-through-via (VTV) connectors 467 of its third type of stacking unit 423, one of the vertical through vias (VTVs) 358 of one of the vertical-through-via (VTV) connectors 467 of its first type of stacking unit 421 and each of the interconnection metal layers 27 of the frontside interconnection scheme for a device (FISD) 101 of its first type of stacking unit 421, wherein each of the large input/output (I/O) circuits of the application specific integrated-circuit (ASIC) logic chip 398 of its eighth type of stacking unit 428 may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of the application specific integrated-circuit (ASIC) logic chip 398 of its eighth type of stacking unit 428 may have an I/O power efficiency greater than 3, 5 or 10 pico-Joules per bit, per switch or per voltage swing.

Referring to FIGS. 41A, 41B and 41C, for the first type of chip package 511, each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may be implemented using a semiconductor node or generation less advanced than or equal to, or above or equal to 20 nm, 30 nm, 40 nm, 50 nm, 90 nm, 130 nm, 250 nm, 350 nm or 500 nm; while the application specific integrated-circuit (ASIC) logic chip 398 of its eighth type of stacking unit 428 may be implemented using a semiconductor node or generation more advanced than or equal to, or below or equal to 20 nm or 10 nm, and for example using a semiconductor node or generation of 16 nm, 14 nm, 12 nm, 10 nm, 7 nm, 5 nm, 3 nm or 2 nm. The semiconductor technology node or generation used in each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may be 1, 2, 3, 4, 5 or greater than 5 nodes or generations older, more matured or less advanced than that used in the application specific integrated-circuit (ASIC) logic chip 398 of its eighth type of stacking unit 428. Transistors used in each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may be provided with fully depleted silicon-on-insulator (FDSOI) metal-oxide-semiconductor field effect transistors (MOSFETs), partially depleted silicon-on-insulator (PDSOI) MOSFETs or a planar MOSFETs. Transistors used in each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may be different from that used in the application specific integrated-circuit (ASIC) logic chip 398 of its eighth type of stacking unit 428; each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may use planar MOSFETs, while the application specific integrated-circuit (ASIC) logic chip 398 of its eighth type of stacking unit 428 may use fin field effect transistors (FINFETs) or gate-all-around field effect transistors (GAAFETs). A power supply voltage (Vcc) applied in each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may be greater than or equal to 1.5, 2.0, 2.5, 3, 3.3, 4, or 5 voltages, while a power supply voltage (Vcc) applied in the application specific integrated-circuit (ASIC) logic chip 398 of its eighth type of stacking unit 428 may be smaller than or equal to 1.8, 1.5 or 1 voltage. The power supply voltage applied in each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may be higher than that applied in the application specific integrated-circuit (ASIC) logic chip 398 of its eighth type of stacking unit 428. A gate oxide of a field effect transistor (FET) of each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may have a physical thickness greater than or equal to 5 nm, 6 nm, 7.5 nm, 10 nm, 12.5 nm, or 15 nm, while a gate oxide of a field effect transistor (FET) of the application specific integrated-circuit (ASIC) logic chip 398 of its eighth type of stacking unit 428 may have a physical thickness less than 4.5 nm, 4 nm, 3 nm or 2 nm. The thickness of the gate oxide of the field effect transistor (FET) of each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may be greater than that of the application specific integrated-circuit (ASIC) logic chip 398 of its eighth type of stacking unit 428.

For more elaboration, referring to FIGS. 41A, 41B and 41C, for the first type of chip package 511, the known-good memory or ASIC chip 397 of its fifth or seventh type of stacking unit 425 or 427 in case of replacing the memory module 159 of its fifth or seventh type of stacking unit 425 or 427 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in an old technology node when the application specific integrated-circuit (ASIC) logic chip 398 of its eighth type of stacking unit 428 is redesigned using a new technology node or for new application. Alternatively, the known-good memory or ASIC chip 397 of its fifth or seventh type of stacking unit 425 or 427 in case of replacing the memory module 159 of its fifth or seventh type of stacking unit 425 or 427 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in a new technology node when the application specific integrated-circuit (ASIC) logic chip 398 of its eighth type of stacking unit 428 is redesigned using a new technology node for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example. Alternatively, each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may use an old technology node to cooperate with the application specific integrated-circuit (ASIC) logic chip 398 of its eighth type of stacking unit 428 manufactured using a new technology node. Alternatively, each of the memory chips 251 and control chip 688 of the memory module 159 of its fifth or seventh type of stacking unit 425 or 427, or the known-good memory or ASIC chip 397 of its fifth or seventh type of stacking unit 425 or 427 in case of replacing the memory module 159 of its fifth or seventh type of stacking unit 425 or 427, may use an old technology node to cooperate with the application specific integrated-circuit (ASIC) logic chip 398 of its eighth type of stacking unit 428 for different applications for a field-programmable-gate-array (FPGA)

integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example. Alternatively, a technology process for forming the known-good memory or ASIC chip 397 of its fifth or seventh type of stacking unit 425 or 427 in case of replacing the memory module 159 of its fifth or seventh type of stacking unit 425 or 427 may not be compatible to that for forming the application specific integrated-circuit (ASIC) logic chip 398 of its eighth type of stacking unit 428, wherein the known-good memory or ASIC chip 397 of its fifth or seventh type of stacking unit 425 or 427 in case of replacing the memory module 159 of its fifth or seventh type of stacking unit 425 or 427 may be a high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip.

2. Structure for Second Type of Chip Package

Figure 41D:
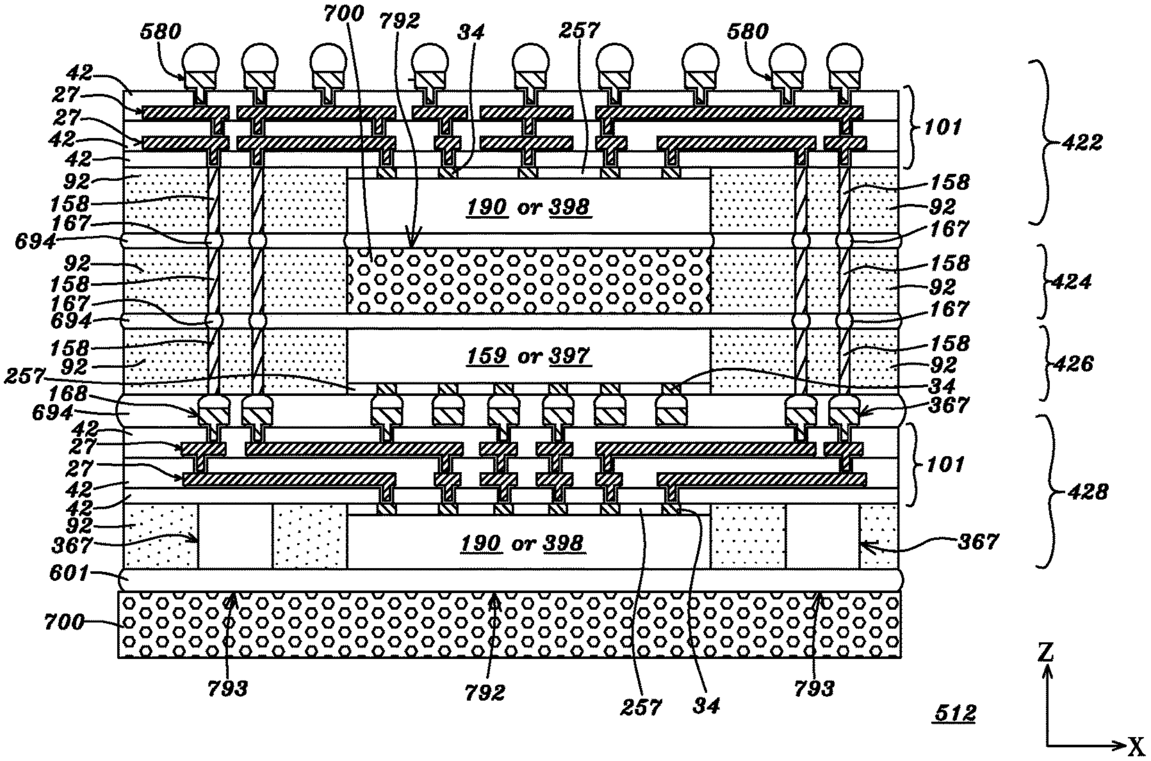
FIG. 41D is a schematically cross-sectional view showing a second type of chip package in an x-z plane in accordance with an embodiment of the present application.

FIG. 41D is a schematically cross-sectional view showing a second type of chip package in an x-z plane in accordance with an embodiment of the present application. Referring to FIGS. 41C and 41D, a second type of chip package 512 may include (1) the eighth type of stacking unit 428 as illustrated in FIGS. 37A and 37B, (2) the sixth type of stacking unit 426 as illustrated in FIGS. 36B and 36C provided over its eighth type of stacking unit 428, having the metal bumps or pads 580 each bonded to one of the metal bumps or pads 580 of its eighth type of stacking unit 428 to form a bonded metal bump or contact 168 by a step for one of the first through fourth cases as illustrated in FIGS. 5A, 6A and 6B in which its sixth type of stacking unit 426 may be considered as the upper one of the memory chips 251 of the memory module 159 illustrated in FIGS. 5A, 6A and 6B, and its eighth type of stacking unit 428 may be considered as the lower one of the memory chips 251 or the control chip 688 of the memory module 159 illustrated in FIGS. 5A, 6A and 6B, wherein an underfill 694, e.g., polymer layer, may be provided between its sixth and eighth types of stacking units 426 and 428, covering a sidewall of each of its bonded metal bumps or contacts 168 between its sixth and eighth types of stacking units 426 and 428, (3) the fourth type of stacking unit 424 as illustrated in FIG. 35D provided over its sixth type of stacking unit 426, wherein a tin-containing bump 167 may be provided with a top end joining the bottom surface of each of the through polymer vias (TPVs) 158 of its fourth type of stacking unit 424 and a bottom end joining the top surface of one of the through polymer vias (TPVs) 158 of its sixth type of stacking unit 426, and a tin-containing bump 167 may be provided with a top end acting as the cold region 793, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, joining the bottom surface of the micro heat pipe 700 of its fourth type of stacking unit 423 and a bottom end joining the top surface of each of the metal plates 567 of its sixth type of stacking unit 426, wherein an underfill 694, e.g., polymer layer, may be provided between its fourth and sixth types of stacking units 424 and 426, covering a sidewall of each of its tin-containing bumps 167 between its fourth and sixth types of stacking units 424 and 426, (4) the second type of stacking unit 422 as illustrated in FIGS. 34F and 34G provided over its fourth type of stacking unit 424, wherein a tin-containing bump 167 may be provided with a top end joining the bottom surface of each of the through polymer vias (TPVs) 158 of its second type of stacking unit 422 and a bottom end joining the top surface of one of the through polymer vias (TPVs) 158 of its fourth type of stacking unit 424, a tin-containing bump 167 may be provided with a top end joining the bottom surface of the semiconductor substrate 2 of the application specific integrated-circuit (ASIC) chip 398 of its second type of stacking unit 422, or the bottom surface of the application specific integrated-circuit (ASIC) chip 399 of the operation unit 190 of its second type of stacking unit 422 in case of replacing the application specific integrated-circuit (ASIC) chip 398 of its second type of stacking unit 422, and a bottom end acting as the hot region 792, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, joining the micro heat pipe 700 of its fourth type of stacking unit 424 at the top surface thereof, and a tin-containing bump 167 may be provided with a top end joining the bottom surface of each of the dummy semiconductor chips 367 of its second type of stacking unit 422 and a bottom end acting as the cold region 793, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, joining the micro heat pipe 700 of its fourth type of stacking unit 424 at the top surface thereof, wherein an underfill 694, e.g., polymer layer, may be provided between its second and fourth types of stacking units 422 and 424, covering a sidewall of each of its tin-containing bumps 167 between its second and fourth types of stacking units 422 and 424, and (5) another micro heat pipe 700, which may be any of the first type of micro heat pipes 700 for the first through eighth alternatives as illustrated in FIGS. 16C, 17C, 18C, 19C, 20E, 21E, 22B and 23C and the second type of micro heat pipes 700 for the first through seventh alternatives as illustrated in FIGS. 25-31, having a thickness between 100 and 400 micrometers provided at its bottom and under its eighth type of stacking unit 428, wherein a thermally conductive adhesive or layer 601, such as a tin-containing material, may be provided with a top end joining the bottom surface of the semiconductor substrate 2 of the application specific integrated-circuit (ASIC) chip 398 of its eighth type of stacking unit 428, or the bottom surface of the application specific integrated-circuit (ASIC) chip 399 of the operation unit 190 of its eighth type of stacking unit 428 in case of replacing the application specific integrated-circuit (ASIC) chip 398 of its eighth type of stacking unit 428, the bottom surface of each of the dummy semiconductor chips 367 of its eighth type of stacking unit 428 and the bottom surface of each of the metal plates 567 of its eighth type of stacking unit 428, and a bottom end joining a top surface of its micro heat pipe 700 at its bottom. The application specific integrated-circuit (ASIC) chip 398 of its eighth type of stacking unit 428, or the bottom surface of the application specific integrated-circuit (ASIC) chip 399 of the operation unit 190 of its eighth type of stacking unit 428 in case of replacing the application specific integrated-circuit (ASIC) chip 398 of its eighth type of stacking unit 428, may act as the hot region 792, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, aligned with its micro heat pipe 700 at its bottom. Each of the dummy semiconductor chips 367 of its eighth type of stacking unit 428 may act as the cold region 793, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, aligned with its micro heat pipe 700 at its bottom.

Referring to FIG. 41D, for the second type of chip package 512, each of the memory chips 251 and control chip 688 of the memory module 159 of its sixth type of stacking unit 426, or the known-good memory or ASIC chip 397 of its sixth type of stacking unit 426 in case of replacing the memory module 159 of its sixth type of stacking unit 426, may have multiple small I/O circuits each coupling to one of multiple small I/O circuits of the application specific integrated-circuit (ASIC) chip 398 of its eighth type of stacking unit 428 through, in sequence, one of the micro-bumps or micro-pads 34 of the control chip 688 of the memory module 159 of its sixth type of stacking unit 426, or one of the micro-bumps or micro-pads 34 of the known-good memory or ASIC chip 397 of its sixth type of stacking unit 426 in case of replacing the memory module 159 of its sixth type of stacking unit 426, one of its bonded metal bumps or contacts 168 between its sixth and eighth types of stacking units 426 and 428, each of the interconnection metal layers 27 of the frontside interconnection scheme for a device (FISD) 101 of its eighth type of stacking unit 428 and one of the micro-bumps or micro-pads 34 of the application specific integrated-circuit (ASIC) chip 398 of its eighth type of stacking unit 428 for data transmission therebetween with a data bit width of equal to or greater than 64, 128, 256, 512, 1024, 2048, 4096, 8K, or 16K, wherein each of the small I/O circuits of each of the memory chips 251 and control chip 688 of the memory module 159 of its sixth type of stacking unit 426, or the known-good memory or ASIC chip 397 of its sixth type of stacking unit 426 in case of replacing the memory module 159 of its sixth type of stacking unit 426, and each of the small I/O circuits of the application specific integrated-circuit (ASIC) chip 398 of its eighth type of stacking unit 428 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Alternatively, each of the small I/O circuits of each of the memory chips 251 and control chip 688 of the memory module 159 of its sixth type of stacking unit 426, or the known-good memory or ASIC chip 397 of its sixth type of stacking unit 426 in case of replacing the memory module 159 of its sixth type of stacking unit 426, and each of the small I/O circuits of the application specific integrated-circuit (ASIC) chip 398 of its eighth type of stacking unit 428 may have an I/O power efficiency smaller than 0.5 pico-Joules per bit, per switch or per voltage swing, or between 0.01 and 0.5 pico-Joules per bit, per switch or per voltage swing. Further, the application specific integrated-circuit (ASIC) chip 398 of its eighth type of stacking unit 428 may include multiple programmable logic cells (LC) 2014 therein each as seen in FIG. 1 and multiple configurable switches 379 therein each as seen in FIG. 2, employed for a hardware accelerator or machine-learning operator. Further, the memory module 159 of its sixth type of stacking unit 426, or the known-good memory or ASIC chip 397 of its sixth type of stacking unit 426 in case of replacing the memory module 159 of its sixth type of stacking unit 426, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store a password or key therein and the application specific integrated-circuit (ASIC) chip 398 of its eighth type of stacking unit 428 may include a cryptography block or circuit configured (1) to encrypt, in accordance with the password or key, configuration data transmitted from or stored in the memory cells 490 for the look-up tables (LUT) 210 of the programmable logic cells (LC) 2014 of the application specific integrated-circuit (ASIC) logic chip 398 of its eighth type of stacking unit 428 or the memory cells 362 of the programmable switch cells 379 of the application specific integrated-circuit (ASIC) logic chip 398 of its eighth type of stacking unit 428 as encrypted configuration data to be passed to the metal bumps or pads 580 of its first type of stacking unit 421 and (2) to decrypt, in accordance with the password or key, encrypted configuration data from the metal bumps or pads 580 of its first type of stacking unit 421 as decrypted configuration data to be passed to and stored in the memory cells 490 for the look-up tables (LUT) 210 of the programmable logic cells (LC) 2014 of the application specific integrated-circuit (ASIC) logic chip 398 of its eighth type of stacking unit 428 or the memory cells 362 of the programmable switch cells 379 of the application specific integrated-circuit (ASIC) logic chip 398 of its eighth type of stacking unit 428. Further, the memory module 159 of its sixth type of stacking unit 426, or the known-good memory or ASIC chip 397 of its sixth type of stacking unit 426 in case of replacing the memory module 159 of its sixth type of stacking unit 426, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store configuration data therein to be passed to the memory cells 490 for the look-up tables (LUT) 210 of the programmable logic cells (LC) 2014 of the application specific integrated-circuit (ASIC) logic chip 398 of its eighth type of stacking unit 428 to be stored therein for programming or configuring the programmable logic cells (LC) 2014 of the application specific integrated-circuit (ASIC) logic chip 398 of its eighth type of stacking unit 428 or to the memory cells 362 of the programmable switch cells 379 of the application specific integrated-circuit (ASIC) logic chip 398 of its eighth type of stacking unit 428 to be stored therein for programming or configuring the programmable switch cells 379 of the application specific integrated-circuit (ASIC) logic chip 398 of its eighth type of stacking unit 428. Further, the memory module 159 of its sixth type of stacking unit 426, or the known-good memory or ASIC chip 397 of its sixth type of stacking unit 426 in case of replacing the memory module 159 of its sixth type of stacking unit 426, may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to the application specific integrated-circuit (ASIC) logic chip 398 of its eighth type of stacking unit 428.

Referring to FIG. 41D, for the second type of chip package 512, each of the memory chips 251 and control chip 688 of the memory module 159 of its sixth type of stacking unit 426, or the known-good memory or ASIC chip 397 of its sixth type of stacking unit 426 in case of replacing the memory module 159 of its sixth type of stacking unit 426, may have multiple large input/output (I/O) circuits each coupling to one of the metal bumps or pads 580 of its first type of stacking unit 421 for signal transmission or power or ground delivery (1) through, in sequence, one or more of the interconnection metal layers 27 of the frontside interconnection scheme for a device (FISD) 101 of its eighth type of stacking unit 428, one of the through polymer vias (TPVs) 158 of its sixth type of stacking unit 426, one of the through polymer vias (TPVs) 158 of its fourth type of stacking unit 424, one of the through polymer vias (TPVs) 158 of its second type of stacking unit 422 and each of the interconnection metal layers 27 of the frontside interconnection scheme for a device (FISD) 101 of its second type of stacking unit 422, wherein each of the large input/output (I/O) circuits of each of the memory chips 251 and control chip 688 of the memory module 159 of its sixth type of stacking unit 426, or the known-good memory or ASIC chip 397 of its sixth type of stacking unit 426 in case of replacing the memory module 159 of its sixth type of stacking unit 426, may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of each of the memory chips 251 and control chip 688 of the memory module 159 of its sixth type of stacking unit 426, or the known-good memory or ASIC chip 397 of its sixth type of stacking unit 426 in case of replacing the memory module 159 of its sixth type of stacking unit 426, may have an I/O power efficiency greater than 3, 5 or 10 pico-Joules per bit, per switch or per voltage swing. Further, the application specific integrated-circuit (ASIC) logic chip 398 of its eighth type of stacking unit 428 may have multiple large input/output (I/O) circuits each coupling to one of the metal bumps or pads 580 of its first type of stacking unit 421 for signal transmission or power or ground delivery through, in sequence, each of the interconnection metal layers 27 of the frontside interconnection scheme for a device (FISD) 101 of its eighth type of stacking unit 428, one of the through polymer vias (TPVs) 158 of its sixth type of stacking unit 426, one of the through polymer vias (TPVs) 158 of its fourth type of stacking unit 424, one of the through polymer vias (TPVs) 158 of its second type of stacking unit 422 and each of the interconnection metal layers 27 of the frontside interconnection scheme for a device (FISD) 101 of its second type of stacking unit 422, wherein each of the large input/output (I/O) circuits of the application specific integrated-circuit (ASIC) logic chip 398 of its eighth type of stacking unit 428 may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of the application specific integrated-circuit (ASIC) logic chip 398 of its eighth type of stacking unit 428 may have an I/O power efficiency greater than 3, 5 or 10 pico-Joules per bit, per switch or per voltage swing.

Specification for First and Second Types of Chip Packages

For each of the first type of chip package 511 as seen in FIGS. 41A, 41B and 41C and the second type of chip package 512 as seen in FIG. 41D, each of the memory chips 251 and control chip 688 of the memory module 159 of its fifth, sixth or seventh type of stacking unit 425, 426 or 427, or the known-good memory or ASIC chip 397 of its fifth, sixth or seventh type of stacking unit 425, 426 or 427 in case of replacing the memory module 159 of its fifth, sixth or seventh type of stacking unit 425, 426 or 427, may be implemented using a semiconductor node or generation less advanced than or equal to, or above or equal to 20 nm, 30 nm, 40 nm, 50 nm, 90 nm, 130 nm, 250 nm, 350 nm or 500 nm; while the application specific integrated-circuit (ASIC) logic chip 398 of its eighth type of stacking unit 428 may be implemented using a semiconductor node or generation more advanced than or equal to, or below or equal to 20 nm or 10 nm, and for example using a semiconductor node or generation of 16 nm, 14 nm, 12 nm, 10 nm, 7 nm, 5 nm, 3 nm or 2 nm. The semiconductor technology node or generation used in each of the memory chips 251 and control chip 688 of the memory module 159 of its fifth, sixth or seventh type of stacking unit 425, 426 or 427, or the known-good memory or ASIC chip 397 of its fifth, sixth or seventh type of stacking unit 425, 426 or 427 in case of replacing the memory module 159 of its fifth, sixth or seventh type of stacking unit 425, 426 or 427, may be 1, 2, 3, 4, 5 or greater than 5 nodes or generations older, more matured or less advanced than that used in the application specific integrated-circuit (ASIC) logic chip 398 of its eighth type of stacking unit 428. Transistors used in each of the memory chips 251 and control chip 688 of the memory module 159 of its fifth, sixth or seventh type of stacking unit 425, 426 or 427, or the known-good memory or ASIC chip 397 of its fifth, sixth or seventh type of stacking unit 425, 426 or 427 in case of replacing the memory module 159 of its fifth, sixth or seventh type of stacking unit 425, 426 or 427, may be provided with fully depleted silicon-on-insulator (FDSOI) metal-oxide-semiconductor field effect transistors (MOSFETs), partially depleted silicon-on-insulator (PDSOI) MOSFETs or a planar MOSFETs. Transistors used in each of the memory chips 251 and control chip 688 of the memory module 159 of its fifth, sixth or seventh type of stacking unit 425, 426 or 427, or the known-good memory or ASIC chip 397 of its fifth, sixth or seventh type of stacking unit 425, 426 or 427 in case of replacing the memory module 159 of its fifth, sixth or seventh type of stacking unit 425, 426 or 427, may be different from that used in the application specific integrated-circuit (ASIC) logic chip 398 of its eighth type of stacking unit 428; each of the memory chips 251 and control chip 688 of the memory module 159 of its fifth, sixth or seventh type of stacking unit 425, 426 or 427, or the known-good memory or ASIC chip 397 of its fifth, sixth or seventh type of stacking unit 425, 426 or 427 in case of replacing the memory module 159 of its fifth, sixth or seventh type of stacking unit 425, 426 or 427, may use planar MOSFETs, while the application specific integrated-circuit (ASIC) logic chip 398 of its eighth type of stacking unit 428 may use fin field effect transistors (FINFETs) or gate-all-around field effect transistors (GAAFETs). A power supply voltage (Vcc) applied in each of the memory chips 251 and control chip 688 of the memory module 159 of its fifth, sixth or seventh type of stacking unit 425, 426 or 427, or the known-good memory or ASIC chip 397 of its fifth, sixth or seventh type of stacking unit 425, 426 or 427 in case of replacing the memory module 159 of its fifth, sixth or seventh type of stacking unit 425, 426 or 427, may be greater than or equal to 1.5, 2.0, 2.5, 3, 3.3, 4, or 5 voltages, while a power supply voltage (Vcc) applied in the application specific integrated-circuit (ASIC) logic chip 398 of its eighth type of stacking unit 428 may be smaller than or equal to 1.8, 1.5 or 1 voltage. The power supply voltage applied in each of the memory chips 251 and control chip 688 of the memory module 159 of its fifth, sixth or seventh type of stacking unit 425, 426 or 427, or the known-good memory or ASIC chip 397 of its fifth, sixth or seventh type of stacking unit 425, 426 or 427 in case of replacing the memory module 159 of its fifth, sixth or seventh type of stacking unit 425, 426 or 427, may be higher than that applied in the application specific integrated-circuit (ASIC) logic chip 398 of its eighth type of stacking unit 428. A gate oxide of a field effect transistor (FET) of each of the memory chips 251 and control chip 688 of the memory module 159 of its fifth, sixth or seventh type of stacking unit 425, 426 or 427, or the known-good memory or ASIC chip 397 of its fifth, sixth or seventh type of stacking unit 425, 426 or 427 in case of replacing the memory module 159 of its fifth, sixth or seventh type of stacking unit 425, 426 or 427, may have a physical thickness greater than or equal to 5 nm, 6 nm, 7.5 nm, 10 nm, 12.5 nm, or 15 nm, while a gate oxide of a field effect transistor (FET) of the application specific integrated-circuit (ASIC) logic chip 398 of its eighth type of stacking unit 428 may have a physical thickness less than 4.5 nm, 4 nm, 3 nm or 2 nm. The thickness of the gate oxide of the field effect transistor (FET) of each of the memory chips 251 and control chip 688 of the memory module 159 of its fifth, sixth or seventh type of stacking unit 425, 426 or 427, or the known-good memory or ASIC chip 397 of its fifth, sixth or seventh type of stacking unit 425, 426 or 427 in case of replacing the memory module 159 of its fifth, sixth or seventh type of stacking unit 425, 426 or 427, may be greater than that of the application specific integrated-circuit (ASIC) logic chip 398 of its eighth type of stacking unit 428.

For more elaboration, for each of the first type of chip package 511 as seen in FIGS. 41A, 41B and 41C and the second type of chip package 512 as seen in FIG. 41D, the known-good memory or ASIC chip 397 of its fifth, sixth or seventh type of stacking unit 425, 426 or 427 in case of replacing the memory module 159 of its fifth, sixth or seventh type of stacking unit 425, 426 or 427 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in an old technology node when the application specific integrated-circuit (ASIC) logic chip 398 of its eighth type of stacking unit 428 is redesigned using a new technology node or for new application. Alternatively, the known-good memory or ASIC chip 397 of its fifth, sixth or seventh type of stacking unit 425, 426 or 427 in case of replacing the memory module 159 of its fifth, sixth or seventh type of stacking unit 425, 426 or 427 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in a new technology node when the application specific integrated-circuit (ASIC) logic chip 398 of its eighth type of stacking unit 428 is redesigned using a new technology node for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example. Alternatively, each of the memory chips 251 and control chip 688 of the memory module 159 of its fifth, sixth or seventh type of stacking unit 425, 426 or 427, or the known-good memory or ASIC chip 397 of its fifth, sixth or seventh type of stacking unit 425, 426 or 427 in case of replacing the memory module 159 of its fifth, sixth or seventh type of stacking unit 425, 426 or 427, may use an old technology node to cooperate with the application specific integrated-circuit (ASIC) logic chip 398 of its eighth type of stacking unit 428 manufactured using a new technology node. Alternatively, each of the memory chips 251 and control chip 688 of the memory module 159 of its fifth, sixth or seventh type of stacking unit 425, 426 or 427, or the known-good memory or ASIC chip 397 of its fifth, sixth or seventh type of stacking unit 425, 426 or 427 in case of replacing the memory module 159 of its fifth, sixth or seventh type of stacking unit 425, 426 or 427, may use an old technology node to cooperate with the application specific integrated-circuit (ASIC) logic chip 398 of its eighth type of stacking unit 428 for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC) chip, for example. Alternatively, a technology process for forming the known-good memory or ASIC chip 397 of its fifth, sixth or seventh type of stacking unit 425, 426 or 427 in case of replacing the memory module 159 of its fifth, sixth or seventh type of stacking unit 425, 426 or 427 may not be compatible to that for forming the application specific integrated-circuit (ASIC) logic chip 398 of its eighth type of stacking unit 428, wherein the known-good memory or ASIC chip 397 of its fifth, sixth or seventh type of stacking unit 425, 426 or 427 in case of replacing the memory module 159 of its fifth, sixth or seventh type of stacking unit 425, 426 or 427 may be a high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip.

3. Structure for Third Type of Chip Package

Figure 42:
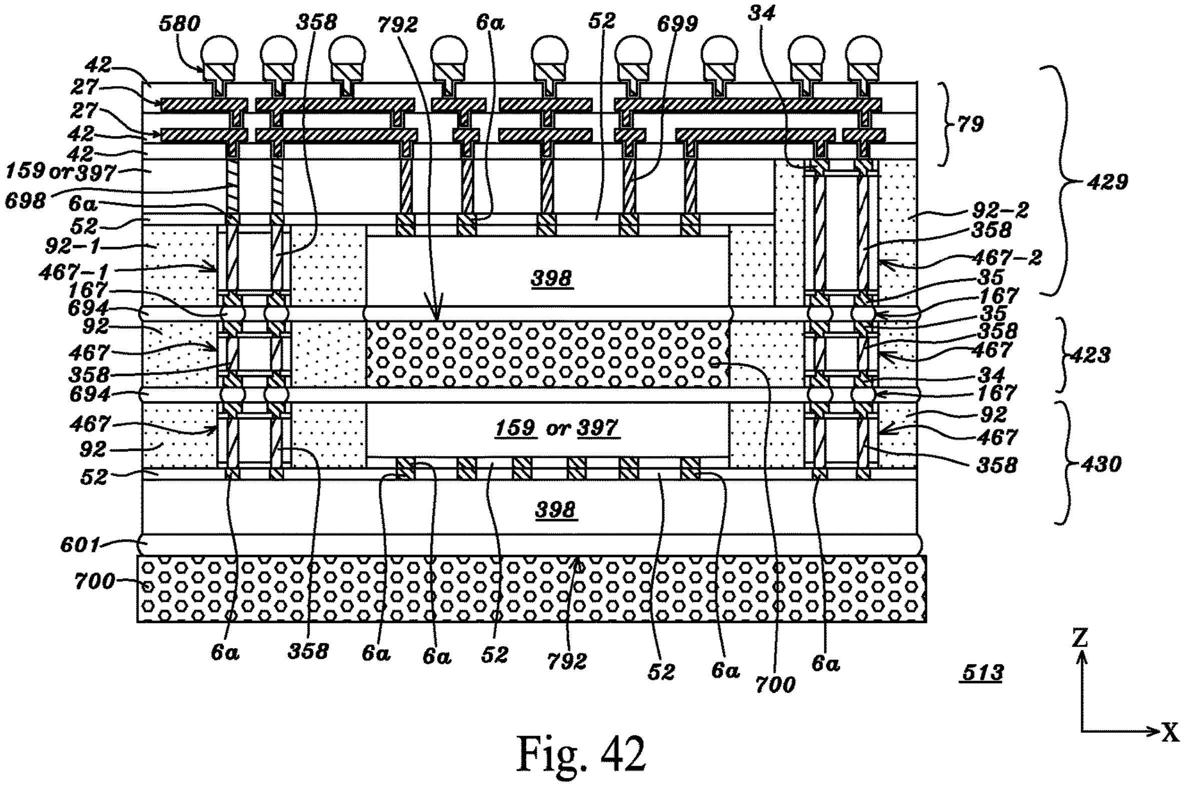
FIG. 42 is a schematically cross-sectional view showing a third type of chip package in accordance with an embodiment of the present application.

FIG. 42 is a schematically cross-sectional view showing a third type of chip package in accordance with an embodiment of the present application. Referring to FIG. 42, a third type of chip package 513 may include (1) the tenth type of stacking unit 430 as illustrated in FIG. 39, (2) the third type of stacking unit 423 as illustrated in FIG. 35D provided over its tenth type of stacking unit 430, wherein a tin-containing bump 167 may be provided with a top end joining the bottom surface of each of the micro-bumps or micro-pads 35 of each of the vertical-through-via (VTV) connectors 467 of its third type of stacking unit 423 and a bottom end joining the top surface of one of the micro-bumps or micro-pads 35 of one of the vertical-through-via (VTV) connectors 467 of its tenth type of stacking unit 430, wherein an underfill 694, e.g., polymer layer, may be provided between its third and tenth types of stacking units 423 and 430, covering a sidewall of each of its tin-containing bumps 167 between its third and tenth types of stacking units 423 and 430, (3) the ninth type of stacking unit 429 as illustrated in FIG. 39 provided over its third type of stacking unit 423, wherein a tin-containing bump 167 may be provided with a top end joining the bottom surface of each of the micro-bumps or micro-pads 35 of each of the first and second vertical-through-via (VTV) connectors 467-1 and 467-2 of its ninth type of stacking unit 429 and a bottom end joining the top surface of one of the micro-bumps or micro-pads 34 of one of the vertical-through-via (VTV) connectors 467 of its third type of stacking unit 423, and a tin-containing bump 167 may be provided with a top end joining the bottom surface of the semiconductor substrate 2 of the application specific integrated-circuit (ASIC) chip 398 of its ninth type of stacking unit 429 and a bottom end acting as the hot region 792, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, joining the micro heat pipe 700 of its third type of stacking unit 423 at the top surface thereof, wherein an underfill 694, e.g., polymer layer, may be provided between its third and ninth types of stacking units 423 and 429, covering a sidewall of each of its tin-containing bumps 167 between its third and ninth types of stacking units 423 and 429, and (5) another micro heat pipe 700, which may be any of the first type of micro heat pipes 700 for the first through eighth alternatives as illustrated in FIGS. 16C, 17C, 18C, 19C, 20E, 21E, 22B and 23C and the second type of micro heat pipes 700 for the first through seventh alternatives as illustrated in FIGS. 25-31, having a thickness between 100 and 400 micrometers provided at its bottom and under its tenth type of stacking unit 430, wherein a thermally conductive adhesive or layer 601, such as a tin-containing material, may be provided with a top end joining the bottom surface of the semiconductor substrate 2 of the application specific integrated-circuit (ASIC) chip 398 of its tenth type of stacking unit 430 and a bottom end joining a top surface of its micro heat pipe 700 at its bottom. The application specific integrated-circuit (ASIC) chip 398 of its tenth type of stacking unit 430 may act as the hot region 792, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, aligned with its micro heat pipe 700 at its bottom.

Referring to FIG. 42, for the third type of chip package 513, the application specific integrated-circuit (ASIC) logic chip 398 of its tenth type of stacking unit 430 may have multiple large input/output (I/O) circuits each coupling to one of the metal bumps or pads 580 of its ninth type of stacking unit 429 for signal transmission or power or ground delivery (1) through, in sequence, one of the vertical through vias (VTVs) 358 of one of the vertical-through-via (VTV) connectors 467 of its tenth type of stacking unit 430, one of the vertical through vias (VTVs) 358 of one of the vertical-through-via (VTV) connectors 467 of its third type of stacking unit 423, one of the vertical through vias (VTVs) 358 of the second vertical-through-via (VTV) connector 467-2 of its ninth type of stacking unit 429 and each of the interconnection metal layers 27 of the backside interconnection scheme for a device (BISD) 79 of its ninth type of stacking unit 429, or (2) through, in sequence, one of the vertical through vias (VTVs) 358 of one of the vertical-through-via (VTV) connectors 467 of its tenth type of stacking unit 430, one of the vertical through vias (VTVs) 358 of one of the vertical-through-via (VTV) connectors 467 of its third type of stacking unit 423, one of the vertical through vias (VTVs) 358 of the first vertical-through-via (VTV) connector 467-1 of its ninth type of stacking unit 429, one of the dedicated vertical bypasses 698 of the memory module 159 of its ninth type of stacking unit 429, or one of the through silicon vias (TSVs) 157 of its known-good memory or ASIC chip 397 in case of replacing its memory module 159, and each of the interconnection metal layers 27 of the backside interconnection scheme for a device (BISD) 79 of its ninth type of stacking unit 429, wherein each of the large input/output (I/O) circuits of the application specific integrated-circuit (ASIC) logic chip 398 of its tenth type of stacking unit 430 may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of the application specific integrated-circuit (ASIC) logic chip 398 of its tenth type of stacking unit 430 may have an I/O power efficiency greater than 3, 5 or 10 pico-Joules per bit, per switch or per voltage swing.

4. Structure for Fourth Type of Chip Package

Figure 43A:
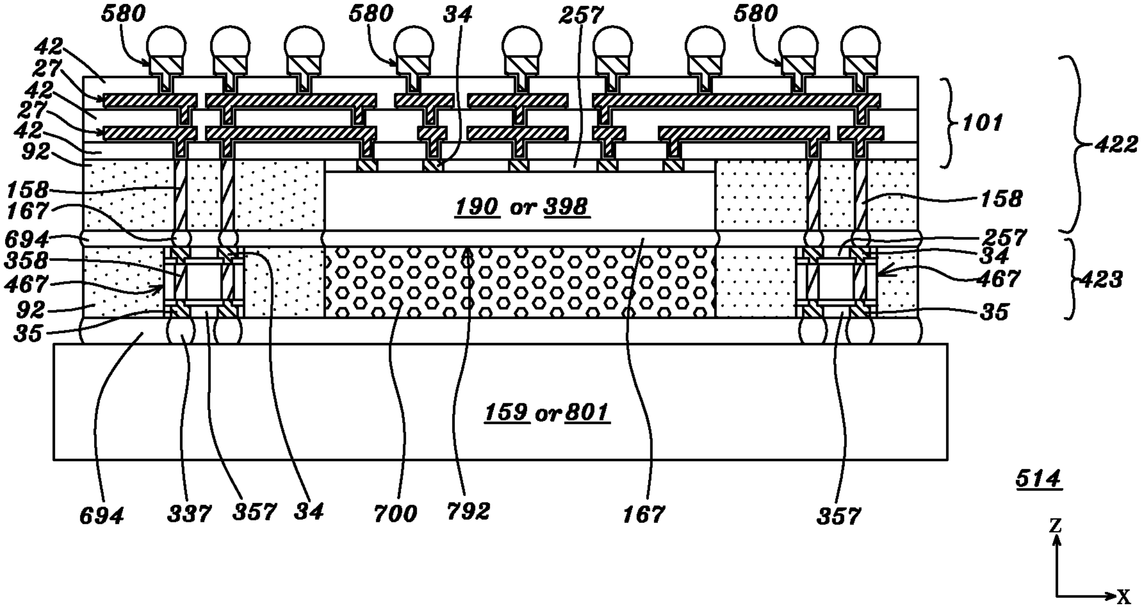
FIG. 43A is a schematically cross-sectional view showing a fourth type of chip package in an x-z plane in accordance with an embodiment of the present application.
Figure 43B:
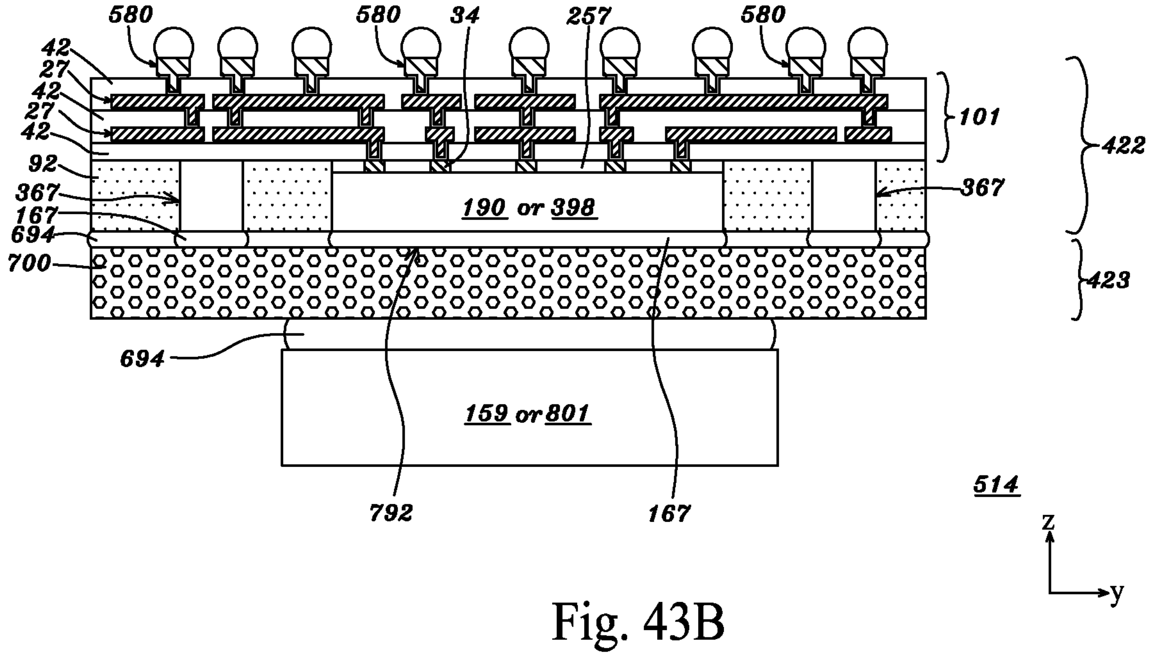
FIG. 43B is a schematically cross-sectional view showing a fourth types of chip package in a y-z plane in accordance with an embodiment of the present application.

FIG. 43A is a schematically cross-sectional view showing a fourth type of chip package in an x-z plane in accordance with an embodiment of the present application. FIG. 43B is a schematically cross-sectional view showing a fourth types of chip package in a y-z plane in accordance with an embodiment of the present application. Referring to FIGS. 43A and 43B, a fourth type of chip package 514 may include (1) the fourth type of memory module 159 as illustrated in FIG. 5D to be turned upside down, wherein its fourth type of memory module 159 may be replaced with (i) the first or second type of optical input/output (I/O) module 801 as illustrated in FIG. 5E or in FIGS. 5F and 5G to be turned upside down or (ii) an analog module, i.e., analog chip package, having the same specification as the first type of optical input/output (I/O) module 801 as illustrated in FIG. 5E to be turned upside down, but wherein the difference between its analog module and first type of optical input/ output (I/O) module 801 is that its analog module may include an analog integrated-circuit (IC) chip to replace the optical input/output (I/O) chip 802 of its first type of optical input/output (I/O) module 801, wherein the analog integrated-circuit (IC) chip of its analog module may have analog circuits, mixed-mode signal circuits, radio-frequency (RF) circuits, and/or transmitter, receiver or transceiver circuits therein, (2) the third type of stacking unit 423 as illustrated in FIG. 35D provided over its fourth type of memory module 159, or its first or second type of optical input/output (I/O) module 801 or analog module in case of replacing its fourth type of memory module 159, wherein its fourth type of memory module 159, or its first or second type of optical input/output (I/O) module 801 or analog module in case of replacing its fourth type of memory module 159, may have the solder balls 337 each bonded to the bottom surface of one of the micro-bumps or micro-pads 35 of one of the vertical-through-via (VTV) connectors 467 of its third type of stacking unit 423, wherein an underfill 694, e.g., polymer layer, may be provided between its third type of stacking unit 423 and its fourth type of memory module 159, or between its third type of stacking unit 423 and its first or second type of optical input/output (I/O) module 801 or analog module in case of replacing its fourth type of memory module 159, covering a sidewall of each of the solder balls 337 of its fourth type of memory module 159, or a sidewall of each of the solder balls 337 of its first or second type of optical input/output (I/O) module 801 or analog module in case of replacing its fourth type of memory module 159, and (3) the second type of stacking unit 422 as illustrated in FIGS. 34F and 34G provided over its third type of stacking unit 423, wherein a tin-containing bump 167 may be provided with a top end joining the bottom surface of each of the through polymer vias (TPVs) 158 of its second type of stacking unit 422 and a bottom end joining the top surface of one of the micro-bumps or micro-pads 34 of one of the vertical-through-via (VTV) connectors 467 of its third type of stacking unit 423, a tin-containing bump 167 may be provided with a top end joining the bottom surface of the semiconductor substrate 2 of the application specific integrated-circuit (ASIC) chip 398 of its second type of stacking unit 422, or the bottom surface of the application specific integrated-circuit (ASIC) chip 399 of the operation unit 190 of its second type of stacking unit 422 in case of replacing the application specific integrated-circuit (ASIC) chip 398 of its second type of stacking unit 422, and a bottom end acting as the hot region 792, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, joining the micro heat pipe 700 of its third type of stacking unit 423 at the top surface thereof, and a tin-containing bump 167 may be provided with a top end joining the bottom surface of each of the dummy semiconductor chips 367 of its second type of stacking unit 422 and a bottom end acting as the cold region 793, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, joining the micro heat pipe 700 of its third type of stacking unit 423 at the top surface thereof, wherein an underfill 694, e.g., polymer layer, may be provided between its second and third types of stacking units 422 and 423, covering a sidewall of each of its tin-containing bumps 167 between its second and third types of stacking units 422 and 423.

5. Structure for Fifth Type of Chip Package

Figure 43C:
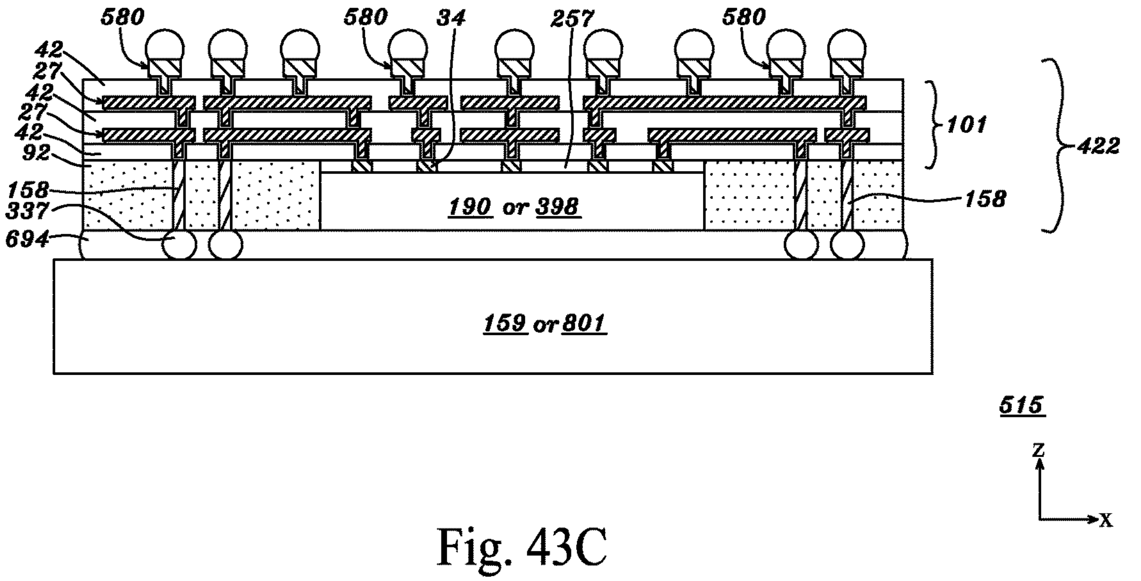
FIG. 43C is a schematically cross-sectional view showing a fifth type of chip package in accordance with an embodiment of the present application.

FIG. 43C is a schematically cross-sectional view showing a fifth type of chip package in accordance with an embodiment of the present application. Referring to FIG. 43C, a fifth type of chip package 515 may have a similar structure to the fourth type of chip package 514 illustrated in FIGS. 43A and 43B. For an element indicated by the same reference number shown in FIGS. 43A-43C, the specification of the element as seen in FIG. 43C may be referred to that of the element as illustrated in FIG. 43A or 43B. The difference between the fourth and fifth types of chip packages 514 and 515 is that the fifth type of chip package 515 may be provided without the third type of stacking unit 423 of the fourth type of chip package 514. Thus, for the fifth type of chip package 515, its second type of stacking unit 422 as illustrated in FIGS. 34F and 34G may be provided over its fourth type of memory module 159, or its first or second type of optical input/output (I/O) module 801 or analog module in case of replacing its fourth type of memory module 159, wherein its fourth type of memory module 159, or its first or second type of optical input/output (I/O) module 801 or analog module in case of replacing its fourth type of memory module 159, may have the solder balls 337 each bonded to the bottom surface of one of the through polymer vias (TPVs) 158 of its second type of stacking unit 422, wherein an underfill 694, e.g., polymer layer, may be provided between its second type of stacking unit 422 and its fourth type of memory module 159, or between its second type of stacking unit 422 and its first or second type of optical input/output (I/O) module 801 or analog module in case of replacing its fourth type of memory module 159, covering a sidewall of each of the solder balls 337 of its fourth type of memory module 150, or a sidewall of each of the solder balls 337 of its first or second type of optical input/output (I/O) module 801 or analog module in case of replacing its fourth type of memory module 159.

Specification for Fourth and Fifth Types of Chip Packages

For each of the fourth type of chip package 514 as seen in FIGS. 43A and 43B and the fifth type of chip package 515 as seen in FIG. 43C, each of the memory integrated-circuit (IC) chips 261 of its fourth type of memory module 159 may couple to the application specific integrated-circuit (ASIC) chip 398 of its second type of stacking unit 422 through multiple data paths, (1) each composed of, in sequence for the fourth type of chip package 514 as seen in FIGS. 43A and 43B, one of the wirebonded wires 333 of its fourth type of memory module 159, each of the patterned metal layers of the circuit board or ball-grid-array (BGA) substrate 335 of its fourth type of memory module 159, one of the vertical through vias (VTVs) 358 of one of the vertical-through-via (VTV) connectors 467 of its third type of stacking unit 423, one of the through polymer vias (TPVs) 158 of its second type of stacking unit 422 and one or more of the interconnection metal layers 27 of the frontside interconnection scheme for a device (FISD) 101 of its second type of stacking unit 422, or (2) each composed of, in sequence for the fifth type of chip package 515 as seen in FIG. 43C, one of the wirebonded wires 333 of its fourth type of memory module 159, each of the patterned metal layers of the circuit board or ball-grid-array (BGA) substrate 335 of its fourth type of memory module 159, one of the through polymer vias (TPVs) 158 of its second type of stacking unit 422 and one or more of the interconnection metal layers 27 of the frontside interconnection scheme for a device (FISD) 101 of its second type of stacking unit 422, for data transmission therebetween with a data bit width of equal to or greater than 64, 128, 256, 512, 1024, 2048, 4096, 8K, or 16K. Further, the application specific integrated-circuit (ASIC) chip 398 of its second type of stacking unit 422 may include multiple programmable logic cells (LC) 2014 therein each as seen in FIG. 1 and multiple configurable switches 379 therein each as seen in FIG. 2, employed for a hardware accelerator or machine-learning operator. Further, each of the memory integrated-circuit (IC) chips 261 of its fourth type of memory module 159 may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store a password or key therein and the application specific integrated-circuit (ASIC) chip 398 of its second type of stacking unit 422 may include a cryptography block or circuit configured (1) to encrypt, in accordance with the password or key, configuration data transmitted from or stored in the memory cells 490 for the look-up tables (LUT) 210 of the programmable logic cells (LC) 2014 of the application specific integrated-circuit (ASIC) logic chip 398 of its second type of stacking unit 422 or the memory cells 362 of the programmable switch cells 379 of the application specific integrated-circuit (ASIC) logic chip 398 of its second type of stacking unit 422 as encrypted configuration data to be passed to the metal bumps or pads 580 of its second type of stacking unit 422 and (2) to decrypt, in accordance with the password or key, encrypted configuration data from the metal bumps or pads 580 of its second type of stacking unit 422 as decrypted configuration data to be passed to and stored in the memory cells 490 for the look-up tables (LUT) 210 of the programmable logic cells (LC) 2014 of the application specific integrated-circuit (ASIC) logic chip 398 of its second type of stacking unit 422 or the memory cells 362 of the programmable switch cells 379 of the application specific integrated-circuit (ASIC) logic chip 398 of its second type of stacking unit 422. Further, each of the memory integrated-circuit (IC) chips 261 of its fourth type of memory module 159 may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store configuration data therein to be passed to the memory cells 490 for the look-up tables (LUT) 210 of the programmable logic cells (LC) 2014 of the application specific integrated-circuit (ASIC) logic chip 398 of its second type of stacking unit 422 to be stored therein for programming or configuring the programmable logic cells (LC) 2014 of the application specific integrated-circuit (ASIC) logic chip 398 of its second type of stacking unit 422 or to the memory cells 362 of the programmable switch cells 379 of the application specific integrated-circuit (ASIC) logic chip 398 of its second type of stacking unit 422 to be stored therein for programming or configuring the programmable switch cells 379 of the application specific integrated-circuit (ASIC) logic chip 398 of its second type of stacking unit 422.

Alternatively, for each of the fourth type of chip package 514 as seen in FIGS. 43A and 43B and the fifth type of chip package 515 as seen in FIG. 43C, in case that its first type of optical input/output (I/O) module 801 replaces its fourth type of memory module 159, each of the first, second, third or fourth type of micro-bumps or micro-pads 34 of the optical input/output (I/O) chip 802 of its first type of optical input/output (I/O) module 801 may couple to the application specific integrated-circuit (ASIC) chip 398 of its second type of stacking unit 422 through an interconnection path (1) composed of, in sequence for the fourth type of chip package 514 as seen in FIGS. 43A and 43B, each of the patterned metal layers of the circuit board or ball-grid-array (BGA) substrate 335 of its first type of optical input/output (I/O) module 801, one of the vertical through vias (VTVs) 358 of one of the vertical-through-via (VTV) connectors 467 of its third type of stacking unit 423, one of the through polymer vias (TPVs) 158 of its second type of stacking unit 422 and one or more of the interconnection metal layers 27 of the frontside interconnection scheme for a device (FISD) 101 of its second type of stacking unit 422, or (2) composed of, in sequence for the fifth type of chip package 515 as seen in FIG. 43C, each of the patterned metal layers of the circuit board or ball-grid-array (BGA) substrate 335 of its first type of optical input/output (I/O) module 801, one of the through polymer vias (TPVs) 158 of its second type of stacking unit 422 and one or more of the interconnection metal layers 27 of the frontside interconnection scheme for a device (FISD) 101 of its second type of stacking unit 422. Thereby, the input optical signals transmitted from the optical fiber 809 as illustrated in FIG. 5E may be transformed into input electric signals by the optical input/output (I/O) chip 802 of its first type of optical input/output (I/O) module 801 to be transmitted through the interconnection path to the application specific integrated-circuit (ASIC) chip 398 of its second type of stacking unit 422. Alternatively, output electrical signals transmitted from the application specific integrated-circuit (ASIC) chip 398 of its second type of stacking unit 422 through the interconnection path may be transformed into the output optical signals as illustrated in FIG. 5E by the optical input/output (I/O) chip 802 of its first type of optical input/output (I/O) module 801 to be transmitted to the optical fiber 809. Alternatively, the interconnection path may be provided for power supply, ground reference or clock transmission.

Alternatively, for each of the fourth type of chip package 514 as seen in FIGS. 43A and 43B and the fifth type of chip package 515 as seen in FIG. 43C, in case that its second type of optical input/output (I/O) module 801 replaces its fourth type of memory module 159, the semiconductor integrated-circuit (IC) chip 821 of its second type of optical input/output (I/O) module 801 may couple to the application specific integrated-circuit (ASIC) chip 398 of its second type of stacking unit 422 through a first interconnection path (1) composed of, in sequence for the fourth type of chip package 514 as seen in FIGS. 43A and 43B, one or more of its wirebonded wires 333, each of the patterned metal layers of the circuit board or ball-grid-array (BGA) substrate 335 of its first type of optical input/output (I/O) module 801, one of the vertical through vias (VTVs) 358 of one of the vertical-through-via (VTV) connectors 467 of its third type of stacking unit 423, one of the through polymer vias (TPVs) 158 of its second type of stacking unit 422 and one or more of the interconnection metal layers 27 of the frontside interconnection scheme for a device (FISD) 101 of its second type of stacking unit 422, or (2) composed of, in sequence for the fifth type of chip package 515 as seen in FIG. 43C, one or more of its wirebonded wires 333, each of the patterned metal layers of the circuit board or ball-grid-array (BGA) substrate 335 of its first type of optical input/output (I/O) module 801, one of the through polymer vias (TPVs) 158 of its second type of stacking unit 422 and one or more of the interconnection metal layers 27 of the frontside interconnection scheme for a device (FISD) 101 of its second type of stacking unit 422. Thereby, the semiconductor integrated-circuit (IC) chip 821 of its second type of optical input/output (I/O) module 801 may generate, in accordance with the output electrical signals transmitted from the application specific integrated-circuit (ASIC) chip 398 of its second type of stacking unit 422 through the first interconnection path, the two electrical voltages V1 and V2 as illustrated in FIGS. 5F and 5G to be applied to the first and second metal pieces of the patterned metal layer 818 of the semiconductor integrated-circuit (IC) chip 811 of its second type of optical input/output (I/O) module 801 through two of its wirebonded wires 333 respectively. Alternatively, the first interconnection path may be provided for power supply, ground reference or clock transmission. Further, the semiconductor integrated-circuit (IC) chip 831 of its second type of optical input/output (I/O) module 801 may couple to the application specific integrated-circuit (ASIC) chip 398 of its second type of stacking unit 422 through a second interconnection path (1) composed of, in sequence for the fourth type of chip package 514 as seen in FIGS. 43A and 43B, one or more of its wirebonded wires 333, each of the patterned metal layers of the circuit board or ball-grid-array (BGA) substrate 335 of its first type of optical input/output (I/O) module 801, one of the vertical through vias (VTVs) 358 of one of the vertical-through-via (VTV) connectors 467 of its third type of stacking unit 423, one of the through polymer vias (TPVs) 158 of its second type of stacking unit 422 and one or more of the interconnection metal layers 27 of the frontside interconnection scheme for a device (FISD) 101 of its second type of stacking unit 422, or (2) composed of, in sequence for the fifth type of chip package 515 as seen in FIG. 43C, one or more of its wirebonded wires 333, each of the patterned metal layers of the circuit board or ball-grid-array (BGA) substrate 335 of its first type of optical input/output (I/O) module 801, one of the through polymer vias (TPVs) 158 of its second type of stacking unit 422 and one or more of the interconnection metal layers 27 of the frontside interconnection scheme for a device (FISD) 101 of its second type of stacking unit 422. Thereby, the semiconductor integrated-circuit (IC) chip 831 of its second type of optical input/output (I/O) module 801 may detect or receive the input optical signals transmitted from the optical fiber(s) 852 and transform the input optical signals into the input electrical signals as illustrated in FIGS. 5F and 5G to be transmitted to the application specific integrated-circuit (ASIC) chip 398 of its second type of stacking unit 422 through the second interconnection path. Alternatively, the second interconnection path may be provided for power supply, ground reference or clock transmission.

For each of the fourth type of chip package 514 as seen in FIGS. 43A and 43B and the fifth type of chip package 515 as seen in FIG. 43C, each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be implemented using a semiconductor node or generation less advanced than or equal to, or above or equal to 20 nm, 30 nm, 40 nm, 50 nm, 90 nm, 130 nm, 250 nm, 350 nm or 500 nm; while the application specific integrated-circuit (ASIC) logic chip 398 of its second type of stacking unit 422 may be implemented using a semiconductor node or generation more advanced than or equal to, or below or equal to 20 nm or 10 nm, and for example using a semiconductor node or generation of 16 nm, 14 nm, 12 nm, 10 nm, 7 nm, 5 nm, 3 nm or 2 nm. The semiconductor technology node or generation used in each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be 1, 2, 3, 4, 5 or greater than 5 nodes or generations older, more matured or less advanced than that used in the application specific integrated-circuit (ASIC) logic chip 398 of its second type of stacking unit 422. Transistors used in each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be provided with fully depleted silicon-on-insulator (FDSOI) metal-oxide-semiconductor field effect transistors (MOSFETs), partially depleted silicon-on-insulator (PD-SOI) MOSFETs or a planar MOSFETs. Transistors used in each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be different from that used in the application specific integrated-circuit (ASIC) logic chip 398 of its second type of stacking unit 422; each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may use planar MOSFETs, while the application specific integrated-circuit (ASIC) logic chip 398 of its second type of stacking unit 422 may use fin field effect transistors (FINFETs) or gate-all-around field effect transistors (GAAFETs). A power supply voltage (Vcc) applied in each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be greater than or equal to 1.5, 2.0, 2.5, 3, 3.3, 4, or 5 voltages, while a power supply voltage (Vcc) applied in the application specific integrated-circuit (ASIC) logic chip 398 of its second type of stacking unit 422 may be smaller than or equal to 1.8, 1.5 or 1 voltage. The power supply voltage applied in each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be higher than that applied in the application specific integrated-circuit (ASIC) logic chip 398 of its second type of stacking unit 422. A gate oxide of a field effect transistor (FET) of each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may have a physical thickness greater than or equal to 5 nm, 6 nm, 7.5 nm, 10 nm, 12.5 nm, or 15 nm, while a gate oxide of a field effect transistor (FET) of the application specific integrated-circuit (ASIC) logic chip 398 of its second type of stacking unit 422 may have a physical thickness less than 4.5 nm, 4 nm, 3 nm or 2 nm. The thickness of the gate oxide of the field effect transistor (FET) of each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be greater than that of the application specific integrated-circuit (ASIC) logic chip 398 of its second type of stacking unit 422.

6. Structure for Sixth Type of Chip Package

Figure 44A:
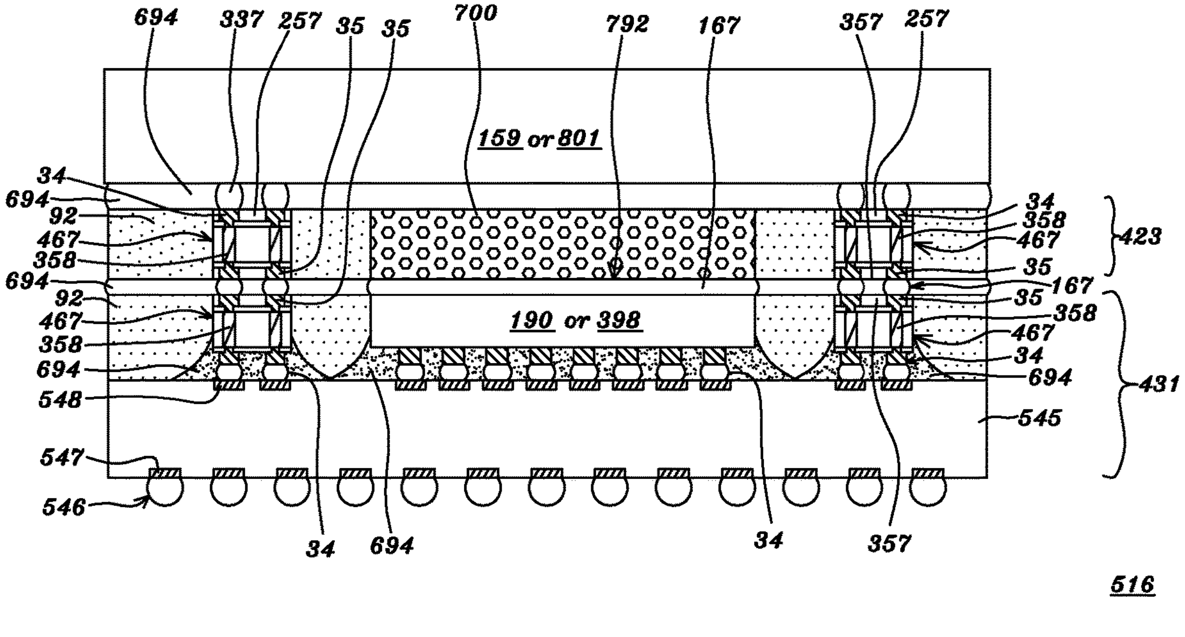
FIG. 44A is a schematically cross-sectional view showing a sixth type of chip package in accordance with an embodiment of the present application.

FIG. 44A is a schematically cross-sectional view showing a sixth type of chip package in accordance with an embodiment of the present application. Referring to FIG. 44A, a sixth type of chip package 516 may include (1) the eleventh type of stacking unit 431 as illustrated in FIG. 40, (2) the third type of stacking unit 423 as illustrated in FIG. 35D provided over its eleventh type of stacking unit 431, wherein a tin-containing bump 167 may be provided with a top end joining the bottom surface of each of the micro-bumps or micro-pads 35 of each of the vertical-through-via (VTV) connectors 467 of its third type of stacking unit 423 and a bottom end joining the top surface of one of the micro-bumps or micro-pads 35 of one of the vertical-through-via (VTV) connectors 467 of its eleventh type of stacking unit 431, and a tin-containing bump 167 may be provided with a top end acting as the hot region 792, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, joining the micro heat pipe 700 of its third type of stacking unit 423 at the bottom surface thereof and a bottom end joining the top surface of the semiconductor substrate 2 of the application specific integrated-circuit (ASIC) chip 398 of its eleventh type of stacking unit 431, or the top surface of the semiconductor substrate 2 of the application specific integrated-circuit (ASIC) chip 399 of the first type of sub-system module 190 of its eleventh type of stacking unit 431 in case of replacing the application specific integrated-circuit (ASIC) chip 398 of its eleventh type of stacking unit 431, wherein an underfill 694, e.g., polymer layer, may be provided between its third and eleventh types of stacking units 423 and 431, covering a sidewall of each of its tin-containing bumps 167 between its third and eleventh types of stacking units 423 and 431, and (3) the fourth type of memory module 159 as illustrated in FIG. 5D provided over its third type of stacking unit 431, having the solder balls 337 each bonded to the top surface of one of the micro-bumps or micro-pads 34 of one of the vertical-through-via (VTV) connectors 467 of its third type of stacking unit 423, wherein its fourth type of memory module 159 may be replaced with (i) the first or second type of optical input/output (I/O) module 801 as illustrated in FIG. 5E or in FIGS. 5F and 5G having the solder balls 337 each bonded to the top surface of one of the micro-bumps or micro-pads 34 of one of the vertical-through-via (VTV) connectors 467 of its third type of stacking unit 423, or (ii) an analog module, i.e., analog chip package, having the same specification as the first type of optical input/output (I/O) module 801 as illustrated in FIG. 5E, but wherein the difference between its analog module and first type of optical input/output (I/O) module 801 is that its analog module may include an analog integrated-circuit (IC) chip to replace the optical input/output (I/O) chip 802 of its first type of optical input/output (I/O) module 801, wherein the analog integrated-circuit (IC) chip of its analog module may have analog circuits, mixed-mode signal circuits, radio-frequency (RF) circuits, and/or transmitter, receiver or transceiver circuits therein, wherein its analog module may have the solder balls 337 each bonded to the top surface of one of the micro-bumps or micro-pads 34 of one of the vertical-through-via (VTV) connectors 467 of its third type of stacking unit 423, wherein an underfill 694, e.g., polymer layer, may be provided between its third type of stacking unit 423 and its fourth type of memory module 159, or between its third type of stacking unit 423 and its first or second type of optical input/output (I/O) module 801 or analog module in case of replacing its fourth type of memory module 159, covering a sidewall of each of the solder balls 337 of its fourth type of memory module 159, or a sidewall of each of the solder balls 337 of its first or second type of optical input/output (I/O) module 801 or analog module in case of replacing its fourth type of memory module 159.

7. Structure for Seventh Type of Chip Package

Figure 44B:
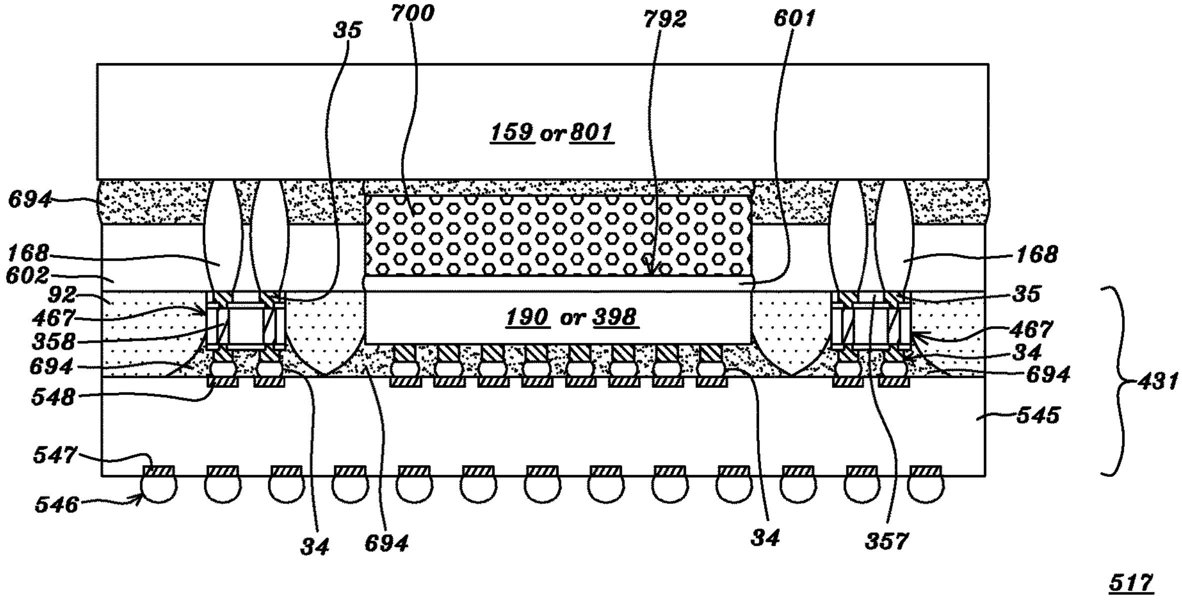
FIG. 44B is a schematically cross-sectional view showing a seventh type of chip package in accordance with an embodiment of the present application.

FIG. 44B is a schematically cross-sectional view showing a seventh type of chip package in accordance with an embodiment of the present application. Referring to FIG. 44B, a seventh type of chip package 517 may include (1) the eleventh type of stacking unit 431 as illustrated in FIG. 40, (2) a micro heat pipe 700 having a bottom surface thereof bonded to the top surface of the semiconductor substrate 2 of the application specific integrated-circuit (ASIC) chip 398 of its eleventh type of stacking unit 431, which acts as the hot region 792, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, or the top surface of the semiconductor substrate 2 of the application specific integrated-circuit (ASIC) chip 399 of the first type of sub-system module 190 of its eleventh type of stacking unit 431 in case of replacing the application specific integrated-circuit (ASIC) chip 398 of its eleventh type of stacking unit 431, via a thermally conductive adhesive or layer 601, such as a tin-containing material, wherein the micro heat pipe 700 may have a thickness between 100 and 400 micrometers, (3) the fourth type of memory module 159 as illustrated in FIG. 5D over its eleventh type of stacking unit 431 and micro heat pipe 700, having the solder balls 337 each bonded to a solder cap preformed on the top surface of one of the micro-bumps or micro-pads 35 of one of the vertical-through-via (VTV) connectors 467 of its eleventh type of stacking unit 431 to form a bonded metal bump or contact 168 between its fourth type of memory module 159 and said one of the micro-bumps or micro-pads 35 of said one of the vertical-through-via (VTV) connectors 467 of its eleventh type of stacking unit 431, wherein its fourth type of memory module 159 may be replaced with (i) the first or second type of optical input/output (I/O) module 801 as illustrated in FIG. 5E or in FIGS. 5F and 5G or (ii) an analog module, i.e., analog chip package, having the same specification as the first type of optical input/output (I/O) module 801 as illustrated in FIG. 5E, but wherein the difference between its analog module and first type of optical input/output (I/O) module 801 is that its analog module may include an analog integrated-circuit (IC) chip to replace the optical input/output (I/O) chip 802 of its first type of optical input/output (I/O) module 801, wherein the analog integrated-circuit (IC) chip of its analog module may have analog circuits, mixed-mode signal circuits, radio-frequency (RF) circuits, and/or transmitter, receiver or transceiver circuits therein, wherein its first or second type of optical input/output (I/O) module 801 or analog module in case of replacing its fourth type of memory module 159 may be provided over its eleventh type of stacking unit 431 and micro heat pipe 700, having the solder balls 337 each bonded to a solder cap preformed on the top surface of one of the micro-bumps or micro-pads 35 of one of the vertical-through-via (VTV) connectors 467 of its eleventh type of stacking unit 431 to form a bonded metal bump or contact 168 between its first or second type of optical input/output (I/O) module 801 or analog module and said one of the micro-bumps or micro-pads 35 of said one of the vertical-through-via (VTV) connectors 467 of its eleventh type of stacking unit 431, (4) a solder mask 602, i.e., polymer layer or insulating dielectric layer, on the top surface of the polymer layer 92 of its eleventh type of stacking unit 431, wherein each of multiple openings in its solder mask 602 may accommodate its micro heat pipe 700 or one of its bonded metal bumps or contacts 168 therein, and (5) an underfill 694, e.g., polymer layer, provided between its solder mask 602 and its fourth type of memory module 159, or its first or second type of optical input/output (I/O) module 801 or analog module in case of replacing its fourth type of memory module 159, and between its micro heat pipe 700 and its fourth type of memory module 159, or its first or second type of optical input/output (I/O) module 801 or analog module in case of replacing its fourth type of memory module 159, covering a sidewall of each of its bonded metal bumps or contacts 168 and a sidewall of its micro heat pipe 700.

8. Structure for Eighth Type of Chip Package

Figure 44C:
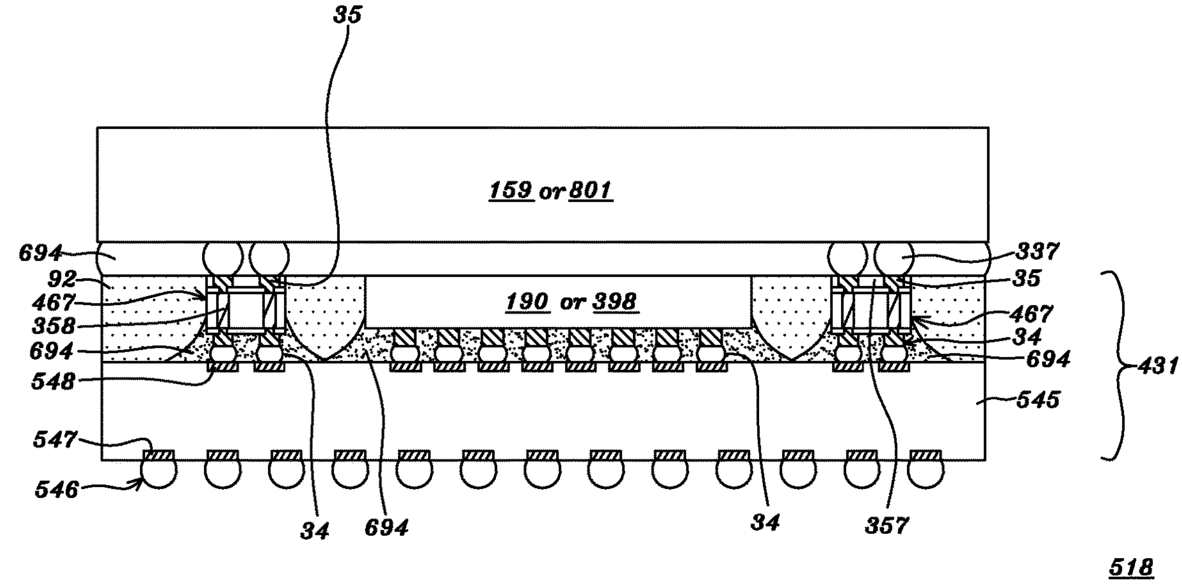
FIG. 44C is a schematically cross-sectional view showing an eighth type of chip package in accordance with an embodiment of the present application.

FIG. 44C is a schematically cross-sectional view showing an eighth type of chip package in accordance with an embodiment of the present application. Referring to FIG. 44C, an eighth type of chip package 518 may have a similar structure to the sixth type of chip package 516 illustrated in FIG. 44A. For an element indicated by the same reference number shown in FIGS. 44A and 44C, the specification of the element as seen in FIG. 44C may be referred to that of the element as illustrated in FIG. 44A. The difference between the sixth and eighth types of chip packages 516 and 518 is that the eighth type of chip package 518 may be provided without the third type of stacking unit 423 of the sixth type of chip package 516. Thus, for the eighth type of chip package 518, its fourth type of memory module 159 may be provided over its eleventh type of stacking unit 431, having the solder balls 337 each bonded to the top surface of one of the micro-bumps or micro-pads 35 of one of the vertical-through-via (VTV) connectors 467 of its eleventh type of stacking unit 431, wherein its fourth type of memory module 159 may be replaced with the first or second type of optical input/output (I/O) module 801 as illustrated in FIG. 5E or in FIGS. 5F and 5G or analog module having the solder balls 337 each bonded to the top surface of one of the micro-bumps or micro-pads 35 of one of the vertical-through-via (VTV) connectors 467 of its eleventh type of stacking unit 431, wherein an underfill 694, e.g., polymer layer, may be provided between its eleventh type of stacking unit 431 and its fourth type of memory module 159, or between its eleventh type of stacking unit 431 and its first or second type of optical input/output (I/O) module 801 or analog module in case of replacing its fourth type of memory module 159, covering a sidewall of each of the solder balls 337 of its fourth type of memory module 159, or a sidewall of each of the solder balls 337 of its first or second type of optical input/output (I/O) module 801 or analog module in case of replacing its fourth type of memory module 159.

Specification for Sixth, Seventh and Eighth Types of Chip Packages

For each of the sixth type of chip package 516 as seen in FIG. 44A, the seventh type of chip package 517 as seen in FIG. 44B and the eighth type of chip package 516 as seen in FIG. 44C, each of the memory integrated-circuit (IC) chips 261 of its fourth type of memory module 159 may couple to the application specific integrated-circuit (ASIC) chip 398 of its eleventh type of stacking unit 431 through multiple data paths, (1) each composed of, in sequence for the sixth type of chip package 516 as seen in FIG. 44A, one of the wirebonded wires 333 of its fourth type of memory module 159, each of the patterned metal layers of the circuit board or ball-grid-array (BGA) substrate 335 of its fourth type of memory module 159, one of the solder balls 337 of its fourth type of memory module 159, one of the vertical through vias (VTVs) 358 of one of the vertical-through-via (VTV) connectors 467 of its third type of stacking unit 423, one of the vertical through vias (VTVs) 358 of one of the vertical-through-via (VTV) connectors 467 of its eleventh type of stacking unit 431 and one or more of the patterned metal layers of the circuit board 545 of its eleventh type of stacking unit 431, (2) each composed of, in sequence for the seventh type of chip package 517 as seen in FIG. 44B, one of the wirebonded wires 333 of its fourth type of memory module 159, each of the patterned metal layers of the circuit board or ball-grid-array (BGA) substrate 335 of its fourth type of memory module 159, one of its bonded metal bumps or contacts 168, one of the vertical through vias (VTVs) 358 of one of the vertical-through-via (VTV) connectors 467 of its eleventh type of stacking unit 431 and one or more of the patterned metal layers of the circuit board 545 of its eleventh type of stacking unit 431, or (3) each composed of, in sequence for the eighth type of chip package 518 as seen in FIG. 44C, one of the wirebonded wires 333 of its fourth type of memory module 159, each of the patterned metal layers of the circuit board or ball-grid-array (BGA) substrate 335 of its fourth type of memory module 159, one of the solder balls 337 of its fourth type of memory module 159, one of the vertical through vias (VTVs) 358 of one of the vertical-through-via (VTV) connectors 467 of its eleventh type of stacking unit 431 and one or more of the patterned metal layers of the circuit board 545 of its eleventh type of stacking unit 431, for data transmission therebetween with a data bit width of equal to or greater than 64, 128, 256, 512, 1024, 2048, 4096, 8K, or 16K. Further, the application specific integrated-circuit (ASIC) chip 398 of its eleventh type of stacking unit 431 may include multiple programmable logic cells (LC) 2014 therein each as seen in FIG. 1 and multiple configurable switches 379 therein each as seen in FIG. 2, employed for a hardware accelerator or machine-learning operator. Further, each of the memory integrated-circuit (IC) chips 261 of its fourth type of memory module 159 may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store a password or key therein and the application specific integrated-circuit (ASIC) chip 398 of its eleventh type of stacking unit 431 may include a cryptography block or circuit configured (1) to encrypt, in accordance with the password or key, configuration data transmitted from or stored in the memory cells 490 for the look-up tables (LUT) 210 of the programmable logic cells (LC) 2014 of the application specific integrated-circuit (ASIC) logic chip 398 of its eleventh type of stacking unit 431 or the memory cells 362 of the programmable switch cells 379 of the application specific integrated-circuit (ASIC) logic chip 398 of its eleventh type of stacking unit 431 as encrypted configuration data to be passed to the solder balls 546 of its eleventh type of stacking unit 431 and (2) to decrypt, in accordance with the password or key, encrypted configuration data from the solder balls 546 of its eleventh type of stacking unit 431 as decrypted configuration data to be passed to and stored in the memory cells 490 for the look-up tables (LUT) 210 of the programmable logic cells (LC) 2014 of the application specific integrated-circuit (ASIC) logic chip 398 of its eleventh type of stacking unit 431 or the memory cells 362 of the programmable switch cells 379 of the application specific integrated-circuit (ASIC) logic chip 398 of its eleventh type of stacking unit 431. Further, each of the memory integrated-circuit (IC) chips 261 of its fourth type of memory module 159 may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store configuration data therein to be passed to the memory cells 490 for the look-up tables (LUT) 210 of the programmable logic cells (LC) 2014 of the application specific integrated-circuit (ASIC) logic chip 398 of its eleventh type of stacking unit 431 to be stored therein for programming or configuring the programmable logic cells (LC) 2014 of the application specific integrated-circuit (ASIC) logic chip 398 of its eleventh type of stacking unit 431 or to the memory cells 362 of the programmable switch cells 379 of the application specific integrated-circuit (ASIC) logic chip 398 of its eleventh type of stacking unit 431 to be stored therein for programming or configuring the programmable switch cells 379 of the application specific integrated-circuit (ASIC) logic chip 398 of its eleventh type of stacking unit 431.

Alternatively, for each of the sixth type of chip package 516 as seen in FIG. 44A, the seventh type of chip package 517 as seen in FIG. 44B and the eighth type of chip package 516 as seen in FIG. 44C, in case that its first type of optical input/output (I/O) module 801 replaces its fourth type of memory module 159, each of the first, second, third or fourth type of micro-bumps or micro-pads 34 of the optical input/output (I/O) chip 802 of its first type of optical input/output (I/O) module 801 may couple to the application specific integrated-circuit (ASIC) chip 398 of its eleventh type of stacking unit 431 through an interconnection path (1) composed of, in sequence for the sixth type of chip package 516 as seen in FIG. 44A, each of the patterned metal layers of the circuit board or ball-grid-array (BGA) substrate 335 of its first type of optical input/output (I/O) module 801, one of the solder balls 337 of its first type of optical input/output (I/O) module 801, one of the vertical through vias (VTVs) 358 of one of the vertical-through-via (VTV) connectors 467 of its third type of stacking unit 423, one of the vertical through vias (VTVs) 358 of one of the vertical-through-via (VTV) connectors 467 of its eleventh type of stacking unit 431 and one or more of the patterned metal layers of the circuit board 545 of its eleventh type of stacking unit 431, (2) composed of, in sequence for the seventh type of chip package 517 as seen in FIG. 44B, each of the patterned metal layers of the circuit board or ball-grid-array (BGA) substrate 335 of its first type of optical input/output (I/O) module 801, one of its bonded metal bumps or contacts 168, one of the vertical through vias (VTVs) 358 of one of the vertical-through-via (VTV) connectors 467 of its eleventh type of stacking unit 431 and one or more of the patterned metal layers of the circuit board 545 of its eleventh type of stacking unit 431, or (3) composed of, in sequence for the eighth type of chip package 518 as seen in FIG. 448C, each of the patterned metal layers of the circuit board or ball-grid-array (BGA) substrate 335 of its first type of optical input/output (I/O) module 801, one of the solder balls 337 of its first type of optical input/output (I/O) module 801, one of the vertical through vias (VTVs) 358 of one of the vertical-through-via (VTV) connectors 467 of its eleventh type of stacking unit 431 and one or more of the patterned metal layers of the circuit board 545 of its eleventh type of stacking unit 431. Thereby, the input optical signals transmitted from the optical fiber 809 as illustrated in FIG. 5E may be transformed into input electric signals by the optical input/output (I/O) chip 802 of its first type of optical input/output (I/O) module 801 to be transmitted through the interconnection path to the application specific integrated-circuit (ASIC) chip 398 of its eleventh type of stacking unit 431. Alternatively, output electrical signals transmitted from the application specific integrated-circuit (ASIC) chip 398 of its eleventh type of stacking unit 431 through the interconnection path may be transformed into the output optical signals as illustrated in FIG. 5E by the optical input/output (I/O) chip 802 of its first type of optical input/output (I/O) module 801 to be transmitted to the optical fiber 809. Alternatively, the interconnection path may be provided for power supply, ground reference or clock transmission.

Alternatively, for each of the sixth type of chip package 516 as seen in FIG. 44A, the seventh type of chip package 517 as seen in FIG. 44B and the eighth type of chip package 516 as seen in FIG. 44C, in case that its second type of optical input/output (I/O) module 801 replaces its fourth type of memory module 159, the semiconductor integrated-circuit (IC) chip 821 of its second type of optical input/output (I/O) module 801 may couple to the application specific integrated-circuit (ASIC) chip 398 of its eleventh type of stacking unit 431 through a first interconnection path (1) composed of, in sequence for the sixth type of chip package 516 as seen in FIG. 44A, one or more of its wirebonded wires 333, each of the patterned metal layers of the circuit board or ball-grid-array (BGA) substrate 335 of its first type of optical input/output (I/O) module 801, one of the solder balls 337 of its first type of optical input/output (I/O) module 801, one of the vertical through vias (VTVs) 358 of one of the vertical-through-via (VTV) connectors 467 of its third type of stacking unit 423, one of the vertical through vias (VTVs) 358 of one of the vertical-through-via (VTV) connectors 467 of its eleventh type of stacking unit 431 and one or more of the patterned metal layers of the circuit board 545 of its eleventh type of stacking unit 431, (2) composed of, in sequence for the seventh type of chip package 517 as seen in FIG. 44B, one or more of its wirebonded wires 333, each of the patterned metal layers of the circuit board or ball-grid-array (BGA) substrate 335 of its first type of optical input/output (I/O) module 801, one of its bonded metal bumps or contacts 168, one of the vertical through vias (VTVs) 358 of one of the vertical-through-via (VTV) connectors 467 of its eleventh type of stacking unit 431 and one or more of the patterned metal layers of the circuit board 545 of its eleventh type of stacking unit 431, or (3) composed of, in sequence for the eighth type of chip package 518 as seen in FIG. 44C, one or more of its wirebonded wires 333, each of the patterned metal layers of the circuit board or ball-grid-array (BGA) substrate 335 of its first type of optical input/output (I/O) module 801, one of the solder balls 337 of its first type of optical input/output (I/O) module 801, one of the vertical through vias (VTVs) 358 of one of the vertical-through-via (VTV) connectors 467 of its eleventh type of stacking unit 431 and one or more of the patterned metal layers of the circuit board 545 of its eleventh type of stacking unit 431. Thereby, the semiconductor integrated-circuit (IC) chip 821 of its second type of optical input/output (I/O) module 801 may generate, in accordance with the output electrical signals transmitted from the application specific integrated-circuit (ASIC) chip 398 of its eleventh type of stacking unit 431 through the first interconnection path, the two electrical voltages V1 and V2 as illustrated in FIGS. 5F and 5G to be applied to the first and second metal pieces of the patterned metal layer 818 of the semiconductor integrated-circuit (IC) chip 811 of its second type of optical input/output (I/O) module 801 through two of its wirebonded wires 333 respectively. Alternatively, the first interconnection path may be provided for power supply, ground reference or clock transmission. Further, the semiconductor integrated-circuit (IC) chip 831 of its second type of optical input/output (I/O) module 801 may couple to the application specific integrated-circuit (ASIC) chip 398 of its eleventh type of stacking unit 431 through a second interconnection path (1) composed of, in sequence for the sixth type of chip package 516 as seen in FIG. 44A, one or more of its wirebonded wires 333, each of the patterned metal layers of the circuit board or ball-grid-array (BGA) substrate 335 of its first type of optical input/output (I/O) module 801, one of the solder balls 337 of its first type of optical input/output (I/O) module 801, one of the vertical through vias (VTVs) 358 of one of the vertical-through-via (VTV) connectors 467 of its third type of stacking unit 423, one of the vertical through vias (VTVs) 358 of one of the vertical-through-via (VTV) connectors 467 of its eleventh type of stacking unit 431 and one or more of the patterned metal layers of the circuit board 545 of its eleventh type of stacking unit 431, (2) composed of, in sequence for the seventh type of chip package 517 as seen in FIG. 44B, one or more of its wirebonded wires 333, each of the patterned metal layers of the circuit board or ball-grid-array (BGA) substrate 335 of its first type of optical input/output (I/O) module 801, one of its bonded metal bumps or contacts 168, one of the vertical through vias (VTVs) 358 of one of the vertical-through-via (VTV) connectors 467 of its eleventh type of stacking unit 431 and one or more of the patterned metal layers of the circuit board 545 of its eleventh type of stacking unit 431, or (3) composed of, in sequence for the eighth type of chip package 518 as seen in FIG. 44C, one or more of its wirebonded wires 333, each of the patterned metal layers of the circuit board or ball-grid-array (BGA) substrate 335 of its first type of optical input/output (I/O) module 801, one of the solder balls 337 of its first type of optical input/output (I/O) module 801, one of the vertical through vias (VTVs) 358 of one of the vertical-through-via (VTV) connectors 467 of its eleventh type of stacking unit 431 and one or more of the patterned metal layers of the circuit board 545 of its eleventh type of stacking unit 431. Thereby, the semiconductor integrated-circuit (IC) chip 831 of its second type of optical input/output (I/O) module 801 may detect or receive the input optical signals transmitted from the optical fiber(s) 852 and transform the input optical signals into the input electrical signals as illustrated in FIGS. 5F and 5G to be transmitted to the application specific integrated-circuit (ASIC) chip 398 of its eleventh type of stacking unit 431 through the second interconnection path. Alternatively, the second interconnection path may be provided for power supply, ground reference or clock transmission.

For each of the sixth type of chip package 516 as seen in FIG. 44A, the seventh type of chip package 517 as seen in FIG. 44B and the eighth type of chip package 516 as seen in FIG. 44C, each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be implemented using a semiconductor node or generation less advanced than or equal to, or above or equal to 20 nm, 30 nm, 40 nm, 50 nm, 90 nm, 130 nm, 250 nm, 350 nm or 500 nm; while the application specific integrated-circuit (ASIC) logic chip 398 of its eleventh type of stacking unit 431 may be implemented using a semiconductor node or generation more advanced than or equal to, or below or equal to 20 nm or 10 nm, and for example using a semiconductor node or generation of 16 nm, 14 nm, 12 nm, 10 nm, 7 nm, 5 nm, 3 nm or 2 nm. The semiconductor technology node or generation used in each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be 1, 2, 3, 4, 5 or greater than 5 nodes or generations older, more matured or less advanced than that used in the application specific integrated-circuit (ASIC) logic chip 398 of its eleventh type of stacking unit 431. Transistors used in each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be provided with fully depleted silicon-on-insulator (FDSOI) metal-oxide-semiconductor field effect transistors (MOSFETs), partially depleted silicon-on-insulator (PDSOI) MOSFETs or a planar MOSFETs. Transistors used in each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be different from that used in the application specific integrated-circuit (ASIC) logic chip 398 of its eleventh type of stacking unit 431; each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may use planar MOSFETs, while the application specific integrated-circuit (ASIC) logic chip 398 of its eleventh type of stacking unit 431 may use fin field effect transistors (FINFETs) or gate-all-around field effect transistors (GAAFETs). A power supply voltage (Vcc) applied in each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be greater than or equal to 1.5, 2.0, 2.5, 3, 3.3, 4, or 5 voltages, while a power supply voltage (Vcc) applied in the application specific integrated-circuit (ASIC) logic chip 398 of its eleventh type of stacking unit 431 may be smaller than or equal to 1.8, 1.5 or 1 voltage. The power supply voltage applied in each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be higher than that applied in the application specific integrated-circuit (ASIC) logic chip 398 of its eleventh type of stacking unit 431. A gate oxide of a field effect transistor (FET) of each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may have a physical thickness greater than or equal to 5 nm, 6 nm, 7.5 nm, 10 nm, 12.5 nm, or 15 nm, while a gate oxide of a field effect transistor (FET) of the application specific integrated-circuit (ASIC) logic chip 398 of its eleventh type of stacking unit 431 may have a physical thickness less than 4.5 nm, 4 nm, 3 nm or 2 nm. The thickness of the gate oxide of the field effect transistor (FET) of each of the memory integrated-circuit (IC) chips 261 of its fourth type of memory module 159, or the optical input/output (I/O) chip 802 of its first type of optical input/output (I/O) module 801, each of the semiconductor integrated-circuit (IC) chips 811, 821 and 831 of its second type of optical input/output (I/O) module 801 or the analog integrated-circuit (IC) chip of its analog module in case of replacing its fourth type of memory module 159, may be greater than that of the application specific integrated-circuit (ASIC) logic chip 398 of its eleventh type of stacking unit 431.

Structure for Assembly for Chip Package and Micro Heat Pipe

Figure 45A:
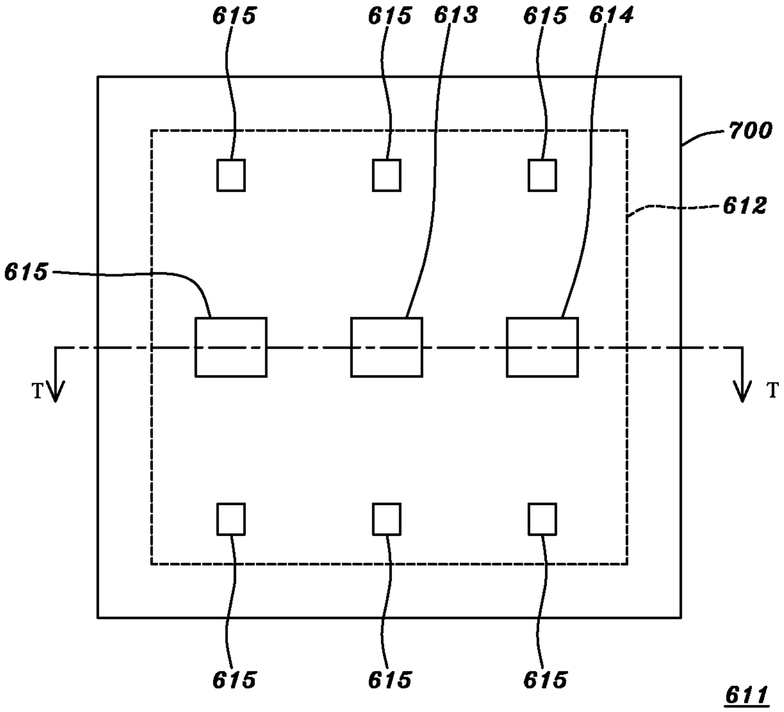
FIG. 45A is a schematically top view showing an electronic assembly for a chip package and micro heat pipe in accordance with an embodiment of present application.
Figure 45B:
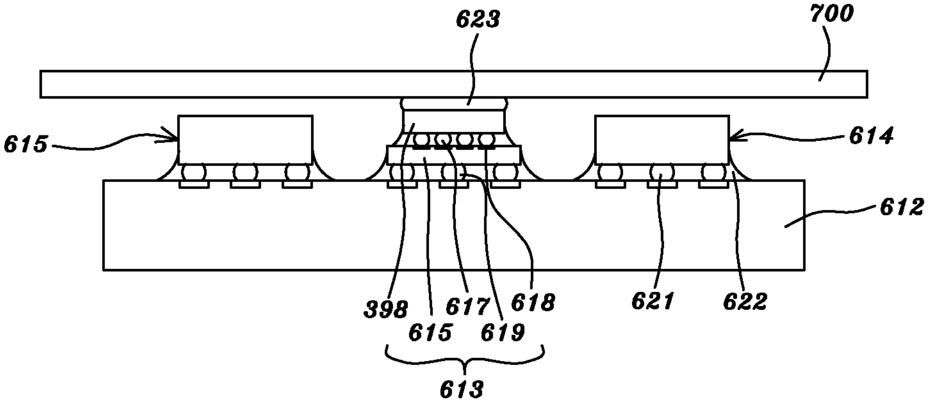

FIG. 45A is a schematically top view showing an electronic assembly for a chip package and micro heat pipe in accordance with an embodiment of present application. FIG. 45B is a schematically cross-sectional view showing an electronic assembly for a chip package and micro heat pipe in accordance with an embodiment of present application, wherein FIG. 45B is a schematically cross-sectional view cut along a cross-sectional line T-T in FIG. 45A. Referring to FIGS. 45A and 45B, an electronic assembly 611 may include (1) a printed circuit board (PCB) 612, (2) a high-power chip package 613 mounted to and over a top surface of its printed circuit board (PCB) 612, (3) a low-power chip package 614 mounted to and over the top surface of its printed circuit board (PCB) 612, (4) multiple passive devices 615, each of which may be a resistor, capacitor or inductor, mounted to and over the top surface of its printed circuit board (PCB) 612 and (5) a micro heat pipe 700 mounted to a top of its high-power chip package 613, wherein its micro heat pipe 700 may horizontally extend over its high-power and low-power chip packages 613 and 614 and passive devices 615 and beyond multiple edges of its printed circuit board (PCB) 612. For the electronic assembly 611, its high-power chip package 613 may include (1) a ball-grid-array (BGA) substrate 616, (2) an application specific integrated-circuit (ASIC) chip 398 having the same specification as the first type of semiconductor integrated-circuit (IC) chip 100 as illustrated in FIG. 3A to be turned upside down to have the micro-bumps or micro-pads 34 thereof each bonded to a solder layer (not shown) formed on the ball-grid-array (BGA) substrate 616 of its high-power chip package 613 into a bonded metal contact 617 between the application specific integrated-circuit (ASIC) chip 398 and ball-grid-array (BGA) substrate 616 of its high-power chip package 613, (3) an underfill 618, e.g., polymer layer, between the application specific integrated-circuit (ASIC) chip 398 and ball-grid-array (BGA) substrate 616 of its high-power chip package 613, covering a sidewall of each of the boded metal contacts 617 and (4) multiple solder balls 619, such as a tin-containing alloy, at a bottom of the ball-grid-array (BGA) substrate 616 of its high-power chip package 613 to be mounted to the top surface of its printed circuit board (PCB) 612 such that the solder balls 619 of its high-power chip package 613 may be formed between the ball-grid-array (BGA) substrate 616 of its high-power chip package 613 and the top surface of its printed circuit board (PCB) 612. The electronic assembly 611 may further include an underfill 620, e.g., polymer layer, between the ball-grid-array (BGA) substrate 616 of its high-power chip package 613 and the top surface of its printed circuit board (PCB) 612, covering a sidewall of each of the solder balls 619 of its high-power chip package 613. The application specific integrated-circuit (ASIC) chip 398 of its high-power chip package 613 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip, micro-control-unit (MCU) integrated-circuit (IC) chip or digital-signal-processing (DSP) integrated-circuit (IC)

chip, for example. Further, for the electronic assembly 611, its micro heat pipe 700 may be mounted to a backside of the application specific integrated-circuit (ASIC) chip 398 of its high-power chip package 613, which acts as the hot region 792, as illustrated in any of FIGS. 16C, 17C, 18C, 19C, 20E, 21E, 22B and 23C in case for the first type of micro heat pipes for the first through eighth alternatives or as illustrated in any of FIGS. 25-31 in case for the second type of micro heat pipes for the first through seventh alternatives, via a thermal glue 623.

Referring to FIGS. 45A and 45B, for the electronic assembly 611, its low-power chip package 614 may include a known-good memory or application-specific-integrated-circuit (ASIC) chip, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip or power-management integrated-circuit (IC) chip, packaged therein. Its low-power chip package 614 may further include multiple solder balls 621, such as a tin-containing alloy, at a bottom thereof to be mounted to the top surface of its printed circuit board (PCB) 612. The electronic assembly 611 may further include an underfill 622, e.g., polymer layer, between its low-power chip package 614 and the top surface of its printed circuit board (PCB) 612, covering a sidewall of each of the solder balls 621 of its low-power chip package 614.

Referring to FIGS. 45A and 45B, the electronic assembly 611 may further include (1) multiple solder contacts 624, such as a tin-containing alloy, each bonding one of the terminals of one of its passive devices 615 to the top surface of its printed circuit board (PCB) 612 and (2) an underfill 625, e.g., polymer layer, between each of its passive devices 615 and the top surface of its printed circuit board (PCB) 612, covering a sidewall of each of its solder contacts 624.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof

What is claimed is:

1. A chip package comprising:

a circuit substrate;

a plurality of first solder balls at a bottom of the chip package and under the circuit substrate;

a sub-system package over the circuit substrate, wherein the sub-system package comprises:

a first interconnection scheme comprising a first interconnection metal layer, a second interconnection metal layer over the first interconnection metal layer and an insulating dielectric layer between the first and second interconnection metal layers, a first metal bump at a bottom of the sub-system package, under and coupling to the first interconnection scheme and bonded to the circuit substrate, a first integrated-circuit (IC) chip over and coupling to the first interconnection scheme, and a second integrated-circuit (IC) chip over and coupling to the first integrated-circuit (IC) chip; and an optical module over the circuit substrate, wherein the optical module comprises:

a second interconnection scheme, a plurality of second solder balls at a bottom of the optical module, under the second interconnection scheme and coupling to the circuit substrate, and an optical chip over and coupling to the second interconnection scheme, wherein the optical chip comprises a silicon layer and an optical waveguide having a portion in the silicon layer and the optical chip further comprises an insulating layer on a top surface of the silicon layer and over the optical waveguide, wherein the optical waveguide is configured to be coupled to an optical fiber by a first optical signal, wherein the optical fiber is configured to transmit the first optical signal from above the insulating layer to the optical waveguide under the insulating layer.

2. The chip package of claim 1, wherein the first metal bump comprises tin.

3. The chip package of claim 1, wherein the first second interconnection metal layer has a copper layer and an adhesion metal layer at a top of the copper layer and not at a sidewall of the copper layer, wherein the copper layer has a thickness between 0.3 and 20 micrometers.

4. The chip package of claim 1 further comprising a first insulating bonding layer at a top of the first integrated-circuit (IC) chip and a first copper pad in an opening in the first insulating bonding layer and at the top of the first integrated-circuit (IC) chip, wherein the second integrated-circuit (IC) chip comprises a second insulating bonding layer at a bottom of the second integrated-circuit (IC) chip and bonded to the first insulating bonding layer and a second copper pad in an opening in the second insulating bonding layer, at the bottom of the second integrated-circuit (IC) chip and bonded to the first copper pad.

5. The chip package of claim 1, wherein the second integrated-circuit (IC) chip comprises a second metal bump at a bottom of the second integrated-circuit (IC) chip and over and coupling to the first integrated-circuit (IC) chip, wherein the second metal bump comprises a first tin-containing cap at its bottom.

6. The chip package of claim 5, wherein the second metal bump further comprises a copper layer over the first tin-containing cap and with a thickness between 1 and 20 micrometers.

7. The chip package of claim 5, wherein the first integrated-circuit (IC) chip further comprises a third metal bump at a top of the first integrated-circuit (IC) chip and having a copper layer with a thickness between 2 and 20 micrometers, wherein the second metal bump is bonded to the third metal bump.

8. The chip package of claim 7, wherein the third metal bump further comprises a second tin-containing cap over the copper layer and bonded to the first tin-containing cap of the second metal bump.

9. The chip package of claim 1, wherein the first integrated-circuit (IC) chip comprises a silicon substrate, a transistor at a top of the silicon substrate and a third interconnection scheme over the silicon substrate.

10. The chip package of claim 1, wherein the first integrated-circuit (IC) chip comprises a silicon substrate and a through silicon via (TSV) vertically in the silicon substrate.

11. The chip package of claim 1, wherein the first integrated-circuit (IC) chip is a memory chip.

12. The chip package of claim 1, wherein the first integrated-circuit (IC) chip is a dynamic-random-access-memory (DRAM) chip.

13. The chip package of claim 1, wherein the first integrated-circuit (IC) chip is a logic chip.

14. The chip package of claim 1, wherein the second integrated-circuit (IC) chip is a logic chip.

15. The chip package of claim 1, wherein the optical chip further comprises an optical modulator under the insulating layer and having a portion in the silicon layer, wherein the optical modulator is configured to transmit a second optical signal to the optical fiber.

16. The chip package of claim 1, wherein the optical chip further comprises a photodetector under the insulating layer, wherein the photodetector is configured to be coupled to the optical fiber by the first optical signal.

17. The chip package of claim 1, wherein the optical chip further comprises an optical grating coupler under the insulating layer and having a portion in the silicon layer, wherein the optical grating coupler is configured to be coupled to the optical fiber by the first optical signal.

18. The chip package of claim 1, wherein the insulating layer of the optical chip comprises silicon oxide.

19. The chip package of claim 1, wherein the sub-system package further comprises a first sealing layer over the first interconnection scheme and at a same horizontal level as the first integrated-circuit (IC) chip.

20. The chip package of claim 19, wherein the first sealing layer comprises a molding compound.

21. The chip package of claim 19, wherein the second integrated-circuit (IC) chip is further over the first sealing layer and across an edge of the first integrated-circuit (IC) chip.

22. The chip package of claim 19 further comprising a second sealing layer over the circuit substrate and at a same horizontal level as the sub-system package.

23. The chip package of claim 22, wherein the second sealing layer comprises a molding compound.

24. The chip package of claim 1, wherein the first integrated-circuit (IC) chip is an input/output (I/O) chip and the second integrated-circuit (IC) chip is a logic chip.

25. The chip package of claim 1, wherein the first integrated-circuit (IC) chip is an input/output (I/O) chip and the second integrated-circuit (IC) chip is a graphic-processing-unit (GPU) integrated-circuit (IC) chip.

26. The chip package of claim 1, wherein the circuit substrate comprises a plurality of metal pads at a top of the circuit substrate, wherein the first metal bump at the bottom of the sub-system package is bonded to one of the plurality of metal pads and each of the plurality of second solder balls at the bottom of the optical module couples to one of the plurality of metal pads.

27. The chip package of claim 1, wherein the optical module couples to the sub-system package through the circuit substrate.

28. The chip package of claim 1, wherein the optical module is further over the first interconnection scheme of the sub-system package.

* * * * *